US012692280B2

(12) United States Patent
Hoshi

(10) Patent No.: US 12,692,280 B2
(45) Date of Patent: Jul. 28, 2026

(54) LIGHT EMITTING DIODE

(71) Applicant: Samsung Display Co., Ltd., Yongin-si (KR)

(72) Inventor: Keigo Hoshi, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 1045 days.

(21) Appl. No.: 17/720,576

(22) Filed: Apr. 14, 2022

(65) Prior Publication Data

US 2023/0113459 A1 Apr. 13, 2023

(30) Foreign Application Priority Data

Aug. 18, 2021 (KR) ........................ 10-2021-0108533

(51) Int. Cl.
*H01L 51/50* (2006.01)
*C07F 5/02* (2006.01)
(Continued)

(52) U.S. Cl.
CPC ........... *C07F 5/027* (2013.01); *H10K 50/805* (2023.02); *H10K 85/321* (2023.02); *H10K 85/657* (2023.02)

(58) Field of Classification Search
None
See application file for complete search history.

(56) References Cited

U.S. PATENT DOCUMENTS 9,166,176 B2 10/2015 Hatakeyama et al.
12,058,928 B2 8/2024 Hayano
(Continued)

FOREIGN PATENT DOCUMENTS

CN 111518122 8/2020
CN 113185541 A 7/2021
(Continued)

*Primary Examiner* — Gregory D Clark
(74) *Attorney, Agent, or Firm* — Womble Bond Dickinson (US) LLP

(57) ABSTRACT

A light emitting diode of an embodiment includes a first electrode, a second electrode, and at least one functional layer disposed between the first electrode and the second electrode, wherein the at least one functional layer includes a polycyclic compound represented by Formula A or Formula B, thereby showing high emission efficiency properties and improved life characteristics.

[Formula A]

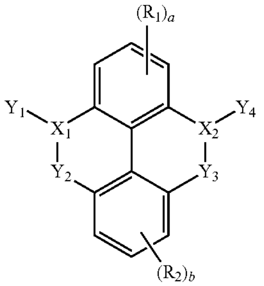

[Formula B]

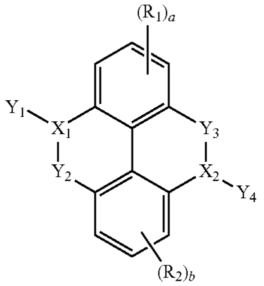

19 Claims, 6 Drawing Sheets

(51) Int. Cl.

| | |
|---|---|
| ***H10K 50/805*** | (2023.01) |
| ***H10K 85/30*** | (2023.01) |
| ***H10K 85/60*** | (2023.01) |

(56) References Cited

U.S. PATENT DOCUMENTS

| | | | | |
|---|---|---|---|---|
| 12,167,683 | B2 | 12/2024 | Hayano | |
| 2015/0097162 | A1 | 4/2015 | Ono et al. | |
| 2020/0185626 | A1 | 6/2020 | Yuuki | |
| 2020/0291291 | A1* | 9/2020 | Parham | C09K 11/06 |
| 2021/0143332 | A1 | 5/2021 | Hayano | |
| 2021/0202861 | A1* | 7/2021 | Hayano | H10K 85/657 |

FOREIGN PATENT DOCUMENTS

| | | | |
|---|---|---|---|
| JP | 6449434 | | 1/2019 |
| KR | 10-2014-0008395 | A | 1/2014 |
| KR | 10-2015-0056567 | A | 5/2015 |
| KR | 10-2020-0071192 | | 6/2020 |
| KR | 10-2021-0043054 | A | 4/2021 |
| KR | 10-2021-0057263 | | 5/2021 |
| KR | 10-2021-0083464 | A | 7/2021 |
| WO | 2016/143819 | | 9/2016 |

* cited by examiner

LIGHT EMITTING DIODE

CROSS-REFERENCE TO RELATED APPLICATION(S)

This application claims priority to and benefits of Korean Patent Application No. 10-2021-0108533 under 35 U.S.C. § 119, filed on Aug. 18, 2021 in the Korean Intellectual Property Office, the entire contents of which are incorporated herein by reference.

BACKGROUND

1. Technical Field

The disclosure herein relates to a light emitting diode including a novel polycyclic compound in an emission layer.

2. Description of the Related Art

Active development continues for an organic electroluminescence display device as an image display device. The organic electroluminescence display device is a so-called self-luminescent display device in which holes and electrons respectively injected from a first electrode and a second electrode recombine in an emission layer so that a light emitting material in the emission layer emits light to achieve display.

In the application of a light emitting diode to an image display device, there is a demand for increasing efficiency, and continuous development is required on materials for a light emitting diode which is capable of stably achieving such characteristics.

Recently in order to implement a light emitting diode with high efficiency, techniques on phosphorescence emission which uses energy in a triplet state or delayed fluorescence emission which uses the generating phenomenon of singlet excitons by the collision of triplet excitons (triplet-triplet annihilation, TTA) are being developed, and development on a material for thermally activated delayed fluorescence (TADF) using delayed fluorescence phenomenon is being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting diode showing high efficiency and long-life characteristics.

An embodiment provides a light emitting diode which may include a first electrode, a second electrode disposed on the first electrode, and an emission layer disposed between the first electrode and the second electrode, and including a polycyclic compound. The polycyclic compound may include a first aromatic hydrocarbon ring, a second aromatic hydrocarbon ring directly bonded to the first aromatic hydrocarbon ring, a first atom directly bonded to the first aromatic hydrocarbon ring, a second atom directly bonded to the first aromatic hydrocarbon ring or to the second aromatic hydrocarbon ring, a first compound directly bonded to the first atom, a second compound directly bonded to the first atom, a third compound directly bonded to the second atom, and a fourth compound directly bonded to the second atom. The first atom and the second atom may each independently be B, Al, or Ga, at least one the first compound or the second compound may include a heteroatom, at least one of the third compound or the fourth compound may include a heteroatom, at least one of the first to fourth compounds may be combined with an adjacent group to form a ring, and the first electrode and the second electrode may each independently include at least one selected from Ag, Mg, Cu, Al, Pt, Pd, Au, Ni, Nd, Ir, Cr, Li, Ca, LiF, Mo, Ti, W, In, Sn, Zn, oxides thereof, compounds thereof, and mixtures thereof.

In an embodiment, the first atom and the second atom may each be a boron atom (B).

In an embodiment, the first aromatic hydrocarbon ring and the second aromatic hydrocarbon ring may each independently be a substituted or unsubstituted benzene ring.

In an embodiment, the first compound to the fourth compound may each independently be $O(R_{1a})_{m1}$, $N(R_{1b})_{m2}$, $P(R_{1c})_{m3}$, $P(=O)(R_{1d})_{m4}$, $P(=S)(R_{1e})_{m5}$, $S(R_{1f})_{m6}$, $Si(R_{1g})_{m7}$, $Al(R_{1h})_{m8}$, $Ga(R_{1i})_{m9}$, $As(R_{1j})_{m10}$, $Ge(R_{1k})_{m11}$, or $C(R_{1l})_{m12}$, $R_{1a}$ to $R_{1l}$ may each independently be a hydrogen atom, a deuterium atom, a halogen atom, a cyano group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, m1 and m6 may each independently be 0 or 1, m2, m3, m4, m5, m8, m9, and m10 may each independently be an integer from 0 to 2, and m7, m11, and m12 may each independently be an integer from 0 to 3.

In an embodiment, the first compound or the second compound may be directly bonded to the second aromatic hydrocarbon ring to form a ring.

In an embodiment, in the case where the second atom is directly bonded to the first aromatic hydrocarbon ring, the third compound or the fourth compound may be directly bonded to the second aromatic hydrocarbon ring to form a ring.

In an embodiment, in the case where the second atom is directly bonded to the second aromatic hydrocarbon ring, the third compound or the fourth compound may be directly bonded to the first aromatic hydrocarbon ring to form a ring.

In an embodiment, the second aromatic hydrocarbon ring may be directly bonded to the first aromatic hydrocarbon ring at an ortho position with respect to the first atom.

In an embodiment, the polycyclic compound may be represented by Formula A or Formula B.

[Formula A]

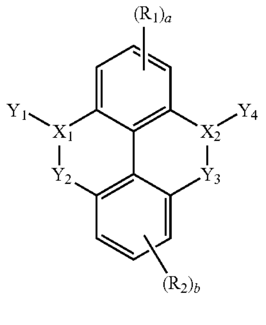

-continued

[Formula B]

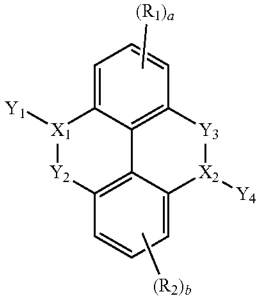

In Formula A and Formula B, $X_1$ and $X_2$ may each independently be B, Al, or Ga, $Y_1$, $Y_2$, $Y_3$, and $Y_4$ may each independently be $O(R_{1a})_{m1}$, $N(R_{1b})_{m2}$, $P(R_{1c})_{m3}$, $P(=O)(R_{1d})_{m4}$, $P(=S)(R_{1e})_{m5}$, $S(R_{1f})_{m6}$, $Si(R_{1g})_{m7}$, $Al(R_{1h})_{m8}$, $Ga(R_{1i})_{m9}$, $As(R_{1j})_{m10}$, $Ge(R_{1k})_{m11}$, or $C(R_{1l})_{m12}$, $R_1$, $R_2$, and $R_{1a}$ to $R_{1l}$ may each independently be a hydrogen atom, a deuterium atom, a halogen atom, a cyano group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, a and b may each independently be an integer from 0 to 3, m1 and m6 may each independently be 0 or 1, m2, m3, m4, m5, m8, m9, and m10 may each independently be an integer from 0 to 2, and m7, m11, and m12 may each independently be an integer from 0 to 3.

In an embodiment, the emission layer may include a dopant and a host, and the dopant may include the polycyclic compound.

In an embodiment, the emission layer may emit blue light.

In an embodiment, the emission layer may emit thermally activated delayed fluorescence.

In an embodiment, the polycyclic compound may include any one selected from Compound Group 1, which is explained below.

Another embodiment provides a light emitting diode which may include a first electrode, a second electrode disposed on the first electrode, and at least one functional layer disposed between the first electrode and the second electrode, wherein the first electrode and the second electrode may each independently include at least one selected from Ag, Mg, Cu, Al, Pt, Pd, Au, Ni, Nd, Ir, Cr, Li, Ca, LiF, Mo, Ti, W, In, Sn, Zn, oxides thereof, compounds thereof, and mixtures thereof, and the at least one functional layer may include a polycyclic compound represented by Formula A or Formula B.

[Formula A]

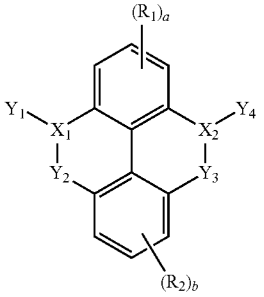

[Formula B]

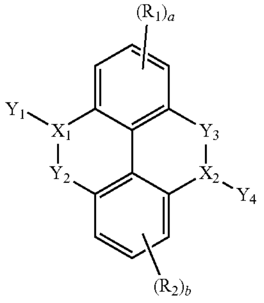

In Formula A and Formula B, $X_1$ and $X_2$ may each independently be B, Al, or Ga, $Y_1$, $Y_2$, $Y_3$, and $Y_4$ may each independently be $O(R_{1a})_{m1}$, $N(R_{1b})_{m2}$, $P(R_{1c})_{m3}$, $P(=O)(R_{1d})_{m4}$, $P(=S)(R_{1e})_{m5}$, $S(R_{1f})_{m6}$, $Si(R_{1g})_{m7}$, $Al(R_{1h})_{m8}$, $Ga(R_{1i})_{m9}$, $As(R_{1j})_{m10}$, $Ge(R_{1k})_{m11}$, or $C(R_{1l})_{m12}$, $R_1$, $R_2$, and $R_{1a}$ to $R_{1l}$ may each independently be a hydrogen atom, a deuterium atom, a halogen atom, a cyano group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, a and b may each independently be an integer from 0 to 3, m1 and m6 may each independently be 0 or 1, m2, m3, m4, m5, m8, m9, and m10 may each independently be an integer from 0 to 2, and m7, m11, and m12 may each independently be an integer from 0 to 3.

In an embodiment, the polycyclic compound represented by Formula A may be represented by Formula A-1, and the polycyclic compound represented by Formula B may be represented by Formula B-1.

[Formula A-1]

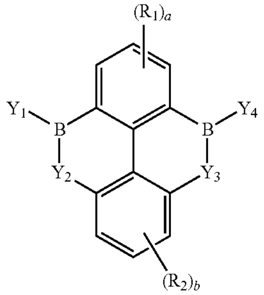

-continued

[Formula B-1]

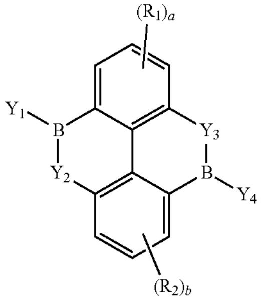

In Formula A-1 and Formula B-1, $Y_1$ to $Y_4$, $R_1$, $R_2$, a, and b may be the same as defined in Formula A and Formula B.

In an embodiment, the polycyclic compound represented by Formula A may be represented by Formula A-2, and the polycyclic compound represented by Formula B may be represented by Formula B-2.

[Formula A-2]

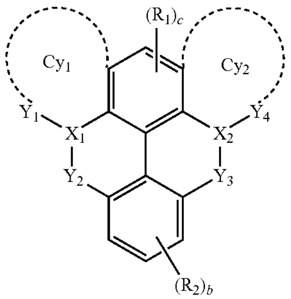

-continued

[Formula B-2]

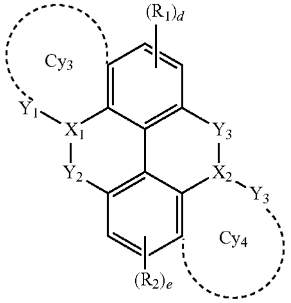

In Formula A-2 and Formula B-2, $Cy_1$, $Cy_2$, $Cy_3$, and $Cy_4$ may each independently be a substituted or unsubstituted aromatic hydrocarbon ring, c may be 0 or 1, d and e may each independently be an integer from 0 to 2, and $X_1$, $X_2$, $Y_1$ to $Y_4$, $R_1$, $R_2$, and b may be the same as defined in Formula A and Formula B.

In an embodiment, the polycyclic compound represented by Formula A or Formula B may be represented by any one of Formula C-1 to Formula C-6.

[Formula C-1]

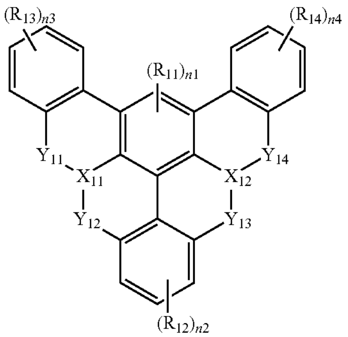

[Formula C-2]

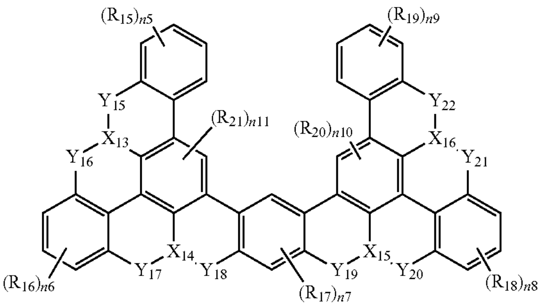

[Formula C-3]

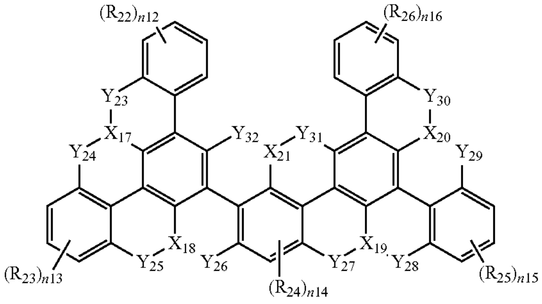

[Formula C-4]

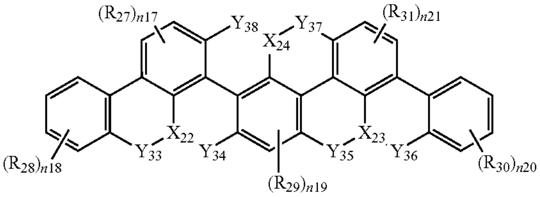

-continued

[Formula C-5]

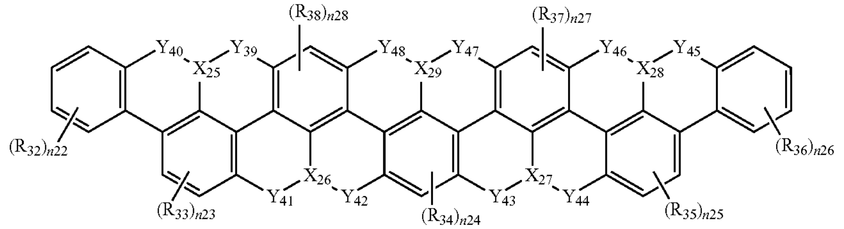

[Formula C-6]

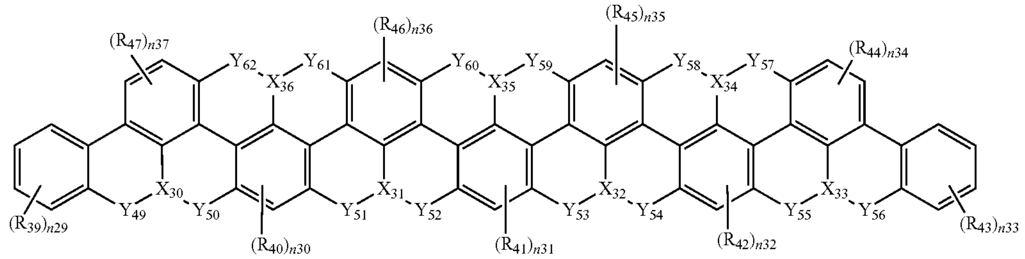

In Formula C-1 to Formula C-6, $X_{11}$ to $X_{36}$ may each independently be B, Al, or Ga, $Y_{11}$ to $Y_{62}$ may each independently be $O(R_{1a})_{m1}$, $N(R_{1b})_{m2}$, $P(R_{1c})_{m3}$, $P(=O)(R_{1d})_{m4}$, $P(=S)(R_{1e})_{m5}$, $S(R_{1f})_{m6}$, $Si(R_{1g})_{m7}$, $Al(R_{1h})_{m8}$, $Ga(R_{1i})_{m9}$, $As(R_{1j})_{m10}$, $Ge(R_{1k})_{m11}$, or $C(R_{1l})_{m12}$, $R_{11}$ to $R_{47}$, and $R_{1a}$ to $R_{1l}$ may each independently be a hydrogen atom, a deuterium atom, a halogen atom, a cyano group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, n1, n10, n11, n14, n19, n24, n27, n28, n30, n31, n32, n35, and n36 may each independently be 0 or 1, n7, n17, n21, n23, n25, n34, and n37 may each independently be an integer from 0 to 2, n2, n6, n8, n13, and n15 may each independently be an integer from 0 to 3, n3, n4, n5, n9, n12, n16, n18, n20, n22, n26, n29, and n33 may each independently be an integer from 0 to 4, m1 and m6 may each independently be 0 or 1, m2, m3, m4, m5, m8, m9, and m10 may each independently be an integer from 0 to 2, and m7, m11, and m12 may each independently be an integer from 0 to 3.

In an embodiment, the polycyclic compound represented by any one of Formula C-1 to Formula C-6 may be represented by any one of Formula D-1 to Formula D-6.

[Formula D-1]

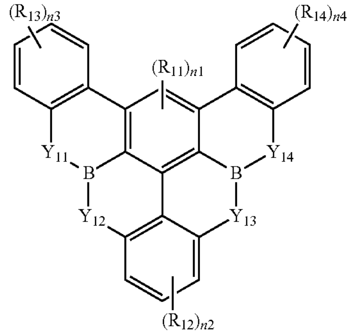

[Formula D-2]

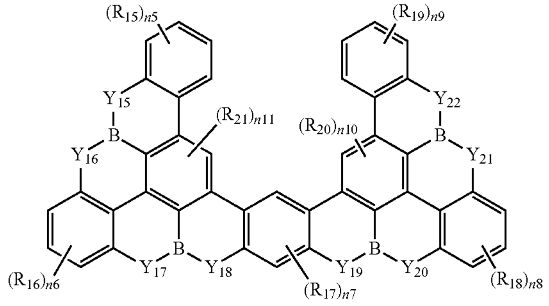

[Formula D-3]

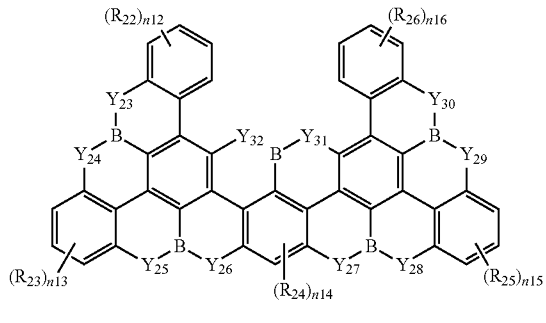

[Formula D-4]

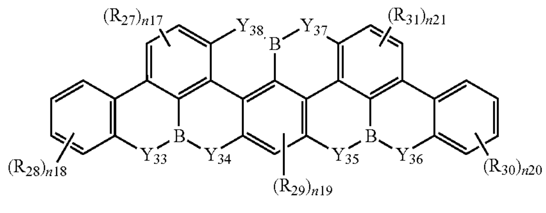

-continued

[Formula D-5]

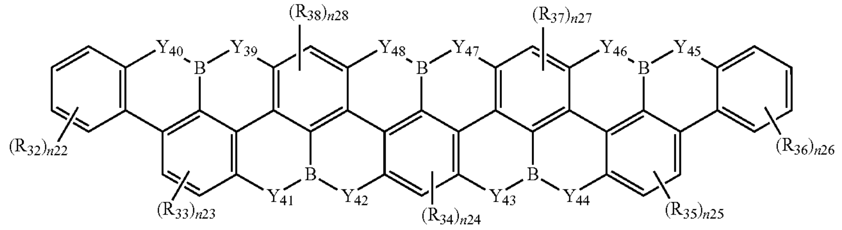

[Formula D-6]

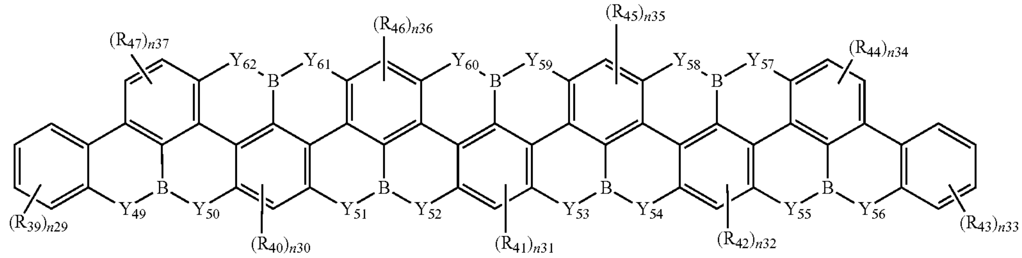

In Formula D-1 to Formula D-6, $Y_{11}$ to $Y_{62}$, $R_{11}$ to $R_{47}$, and n1 to n37 may be the same as defined in Formula C-1 to Formula C-6.

In an embodiment, $Y_{11}$ to $Y_{62}$ may each independently be $O(R_{1a})_{m1}$, $N(R_{1b})_{m2}$, $S(R_{1f})_{m6}$, or $C(R_{1l})_{m12}$.

In an embodiment, the polycyclic compound represented by Formula A or Formula B may include any one selected from Compound Group 1, which is explained below.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
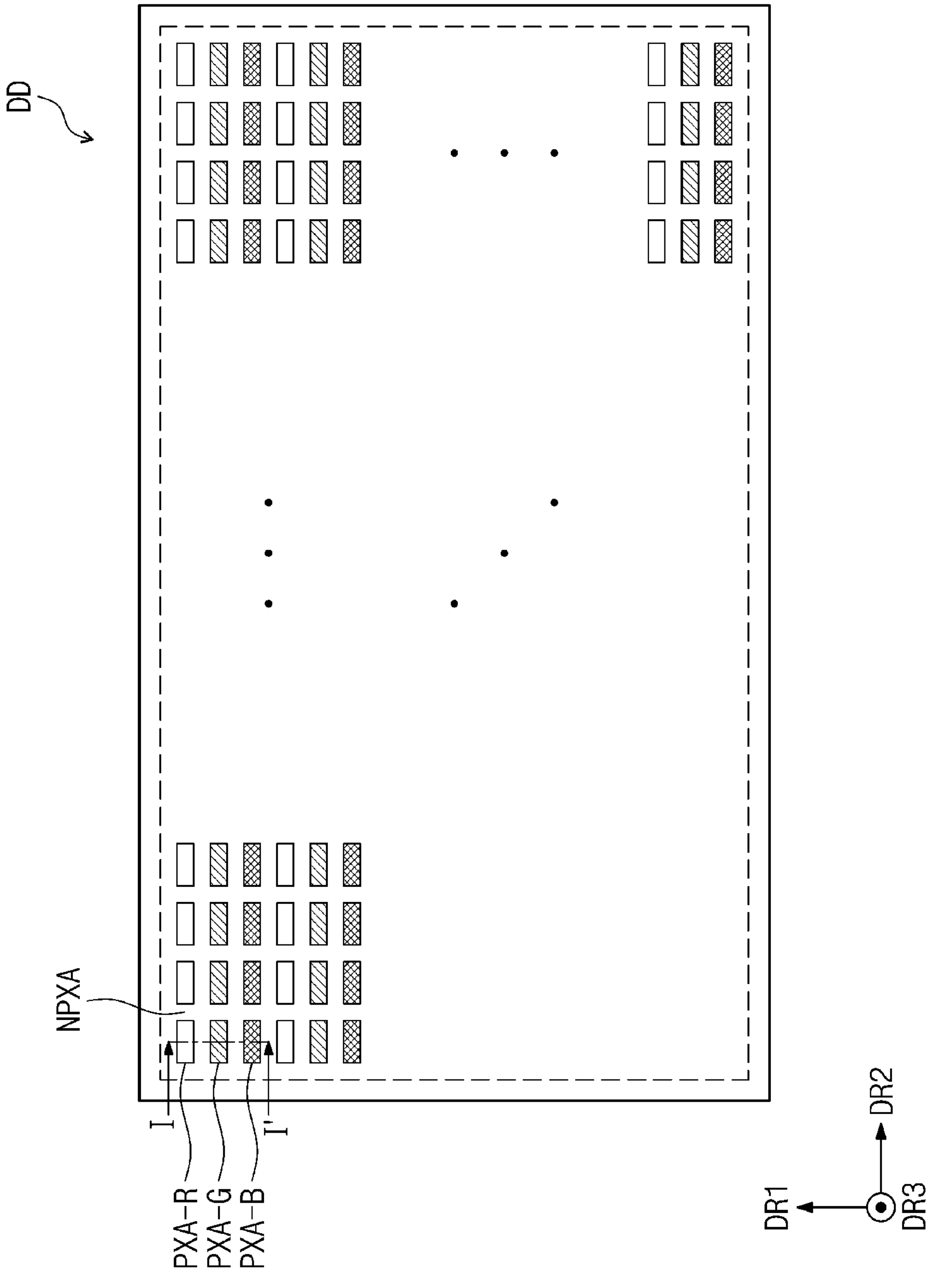
FIG. 1 is a plan view showing a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the specification, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the specification, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In the specification, the term "substituted or unsubstituted" may mean a group that is substituted or unsubstituted with at least one substituent selected from the group consisting of a deuterium atom, a halogen atom, a cyano group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents listed above may itself be substituted or unsubstituted. For example, a biphenyl group may be interpreted as an aryl group, or may be interpreted as a phenyl group substituted with a phenyl group.

In the specification, the term "combined with an adjacent group to form a ring" may mean a group that is combined with an adjacent group to form a substituted or unsubstituted hydrocarbon ring or a substituted or unsubstituted heterocycle. The hydrocarbon ring may be an aliphatic hydrocarbon ring or an aromatic hydrocarbon ring. The heterocycle may be an aliphatic heterocycle or an aromatic heterocycle. The hydrocarbon ring and the heterocycle may each independently be monocyclic or polycyclic. A ring that is formed by the combination of adjacent groups may itself be combined with another ring to form a spiro structure.

In the specification, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other. For example, in 4,5-dimethylphenanthrene, two methyl groups may be interpreted as "adjacent groups" to each other.

In the specification, examples of a halogen atom may include a fluorine atom, a chlorine atom, a bromine atom, or an iodine atom.

In the specification, an alkyl group may be a linear, a branched, or a cyclic type. The number of carbon atoms in the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the specification, the alkyl group may be a linear, or branched type. The carbon number of the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, 1-methylpentyl, 3-methylpentyl, 2-ethylpentyl, 4-methyl-2-pentyl, n-hexyl, 1-methylhexyl, 2-ethylhexyl, 2-butylhexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the specification, a cycloalkyl group may be a cyclic alkyl group. The number of carbon atoms in the cycloalkyl group may be 3 to 50, 3 to 30, 3 to 20, or 3 to 10. Examples of the cycloalkyl group may include a cyclopropyl group, a cyclobutyl group, a cyclopentyl group, a cyclohexyl group, a 4-methylcyclohexyl group, a 4-t-butylcyclohexyl group, a cycloheptyl group, a cyclooctyl group, a cyclononyl group, a cyclodecyl group, a norbornyl group, a 1-adamantyl group, a 2-adamantyl group, an isobornyl group, a bicycloheptyl group, etc., without limitation.

In the specification, an alkenyl group may be a hydrocarbon group including one or more carbon-carbon double bonds in the middle or at a terminus of an alkyl group having 2 or more carbon atoms. The alkenyl group may be a linear chain or a branched chain. The number of carbon atoms in the alkenyl group is not specifically limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the specification, an alkynyl group may be a hydrocarbon group including one or more carbon-carbon triple bonds in the middle or at a terminus of an alkyl group having 2 or more carbon atoms. The alkynyl group may be a linear chain or a branched chain. The number of carbon atoms in the alkynyl group is not specifically limited, but may be 2 to 30, 2 to 20, or 2 to 10. Examples of the alkynyl group may include an ethynyl group, a propynyl group, etc., without limitation.

In the specification, a hydrocarbon ring group may be any functional group or substituent derived from an aliphatic hydrocarbon ring. For example, the hydrocarbon ring group may be a saturated hydrocarbon ring group having 5 to 20 ring-forming carbon atoms.

In the specification, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the specification, a fluorenyl group may be substituted, and two substituents may be combined with each other to form a spiro structure. Examples of substituted fluorenyl groups are as follows, but embodiments are not limited thereto.

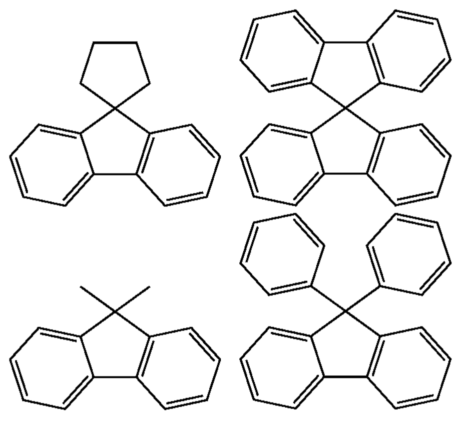

In the specification, a heterocyclic group may be any functional group or substituent derived from a ring including one or more of B, O, N, P, S, Si, Se, Al, Ga, As, or Ge as heteroatoms. The heterocyclic group may be an aliphatic heterocyclic group or an aromatic heterocyclic group. The aromatic heterocyclic group may be a heteroaryl group. The aliphatic heterocyclic group and the aromatic heterocyclic group may each independently be monocyclic or polycyclic. If the heterocyclic group includes two or more heteroatoms, the two or more heteroatoms may be the same or different. The heterocyclic group may be a monocyclic heterocyclic group or a polycyclic heterocyclic group, and the heterocyclic group may be a heteroaryl group. The number of ring-forming carbon atoms in the heterocyclic group may be 2 to 30, 2 to 20, and 2 to 10.

In the specification, an aliphatic heterocyclic group may include one or more of B, O, N, P, S, Si, Se, Al, Ga, As, or Ge as heteroatoms. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., without limitation.

In the specification, a heteroaryl group may include one or more of B, O, N, P, S, Si, Se, Al, Ga, As, or Ge as heteroatoms. If the heteroaryl group includes two or more heteroatoms, the two or more heteroatoms may be the same or different. The heteroaryl group may be a monocyclic heterocyclic group or polycyclic heterocyclic group. The number of ring-forming carbon atoms in the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxazole, oxadiazole, thiadiazole, phenothiazine, dibenzosilole, dibenzofuran, etc., without limitation.

In the specification, the above explanation on the aryl group may be applied to an arylene group, except that the arylene group is a divalent group. The above explanation on the heteroaryl group may be applied to a heteroarylene group, except that the heteroarylene group is a divalent group.

In the specification, a silyl group may be an alkyl silyl group or an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the specification, the number of carbon atoms in an amino group is not specifically limited, but may be 1 to 30. The amino group may be an alkyl amino group, an aryl amino group, or a heteroaryl amino group. Examples of the amino group mat include a methylamino group, a dimethylamino group, a phenylamino group, a diphenylamino group, a naphthylamino group, a 9-methyl-anthracenylamino group, a triphenylamino group, etc., without limitation.

In the specification, the number of carbon atoms in a carbonyl group is not specifically limited, but may be 1 to 40, 1 to 30, or 1 to 20. For example, the carbonyl group may have one of the structures below, but is not limited thereto.

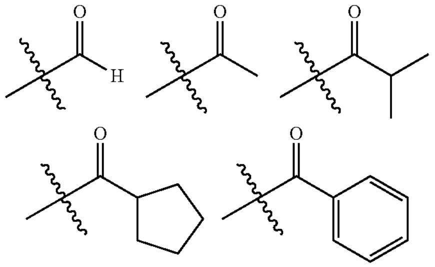

In the specification, the number of carbon atoms in a sulfinyl group or a sulfonyl group is not specifically limited, but may be 1 to 30. The sulfinyl group may be an alkyl sulfinyl group or an aryl sulfinyl group. The sulfonyl group may be an alkyl sulfonyl group or an aryl sulfonyl group.

In the specification, a thio group may be an alkyl thio group or an aryl thio group. The thio group may be a sulfur atom that is combined with an alkyl group or an aryl group combined as described above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., without limitation.

In the specification, an oxy group may be an oxygen atom that is combined with an alkyl group or an aryl group as described above. The oxy group may be an alkoxy group or an aryl oxy group. The alkoxy group may be a linear, a branched, or a cyclic chain. The number of carbon atoms in the alkoxy group is not specifically limited but may be, for example, 1 to 20, or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc. However, embodiments are not limited thereto.

In the specification, a boron group may be a boron atom that is combined with an alkyl group or an aryl group as described above. The boron group may be an alkyl boron group or an aryl boron group. Examples of the boron group may include a trimethylboron group, a triethylboron group, a t-butyldimethylboron group, a triphenylboron group, a diphenylboron group, a phenylboron group, etc., without limitation.

In the specification, an alkenyl group may be a linear chain or a branched chain. The number of carbon atoms in the alkenyl group is not specifically limited but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the specification, the number of carbon atoms in an amine group is not specifically limited, but may be 1 to 30. The amine group may be an alkyl amine group or an aryl amine group. Examples of the amine group may include a methylamine group, a dimethylamine group, a phenylamine group, a diphenylamine group, a naphthylamine group, a 9-methyl-anthracenylamine group, a triphenylamine group, etc., without limitation.

In the specification, an amine group may be understood to include an amino group and a nitro group.

In the specification, the alkyl group in an alkylthio group, an alkylsulfoxy group, an alkylaryl group, an alkylamino group, an alkylboron group, an alkyl silyl group, or an alkyl amine group may be the same as the examples of the above-described alkyl group.

In the specification, the aryl group in an aryloxy group, an arylthio group, an arylsulfoxy group, an aryl amino group, an arylboron group, an aryl silyl group, or an aryl amine group may be the same as the examples of the above-described aryl group.

In the specification, a direct linkage may be a single bond.

In the specification,

 and each indicates a binding site to a neighboring atom.

Hereinafter, embodiments will be explained with reference to the drawings.

Figure 2:
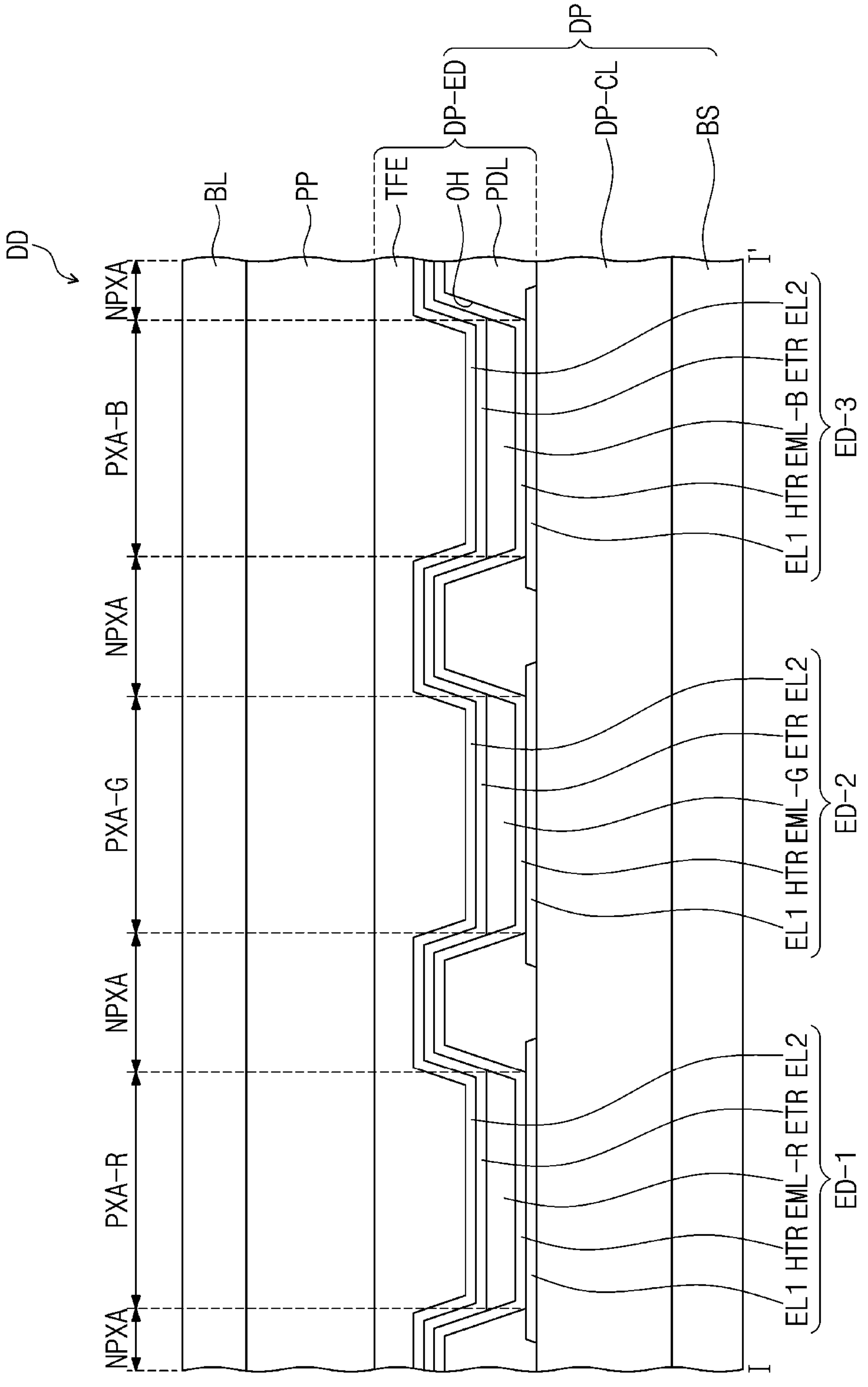
FIG. 2 is a schematic cross-sectional view of a display apparatus according to an embodiment.

FIG. 1 is a plan view showing an embodiment of a display apparatus DD. FIG. 2 is a schematic cross-sectional view of a display apparatus DD of an embodiment. FIG. 2 is a schematic cross-sectional view showing a part corresponding to line I-I' in FIG. 1.

The display apparatus DD may include a display panel DP and an optical layer PP disposed on the display panel DP. The display panel DP includes light emitting diodes ED-1, ED-2, and ED-3. The display apparatus DD may include multiples of each of the light emitting diodes ED-1, ED-2, and ED-3. The optical layer PP may be disposed on the display panel DP and may control light reflected at the display panel DP from an external light. The optical layer PP may include, for example, a polarization layer or a color filter layer. Although not shown in the drawings, in an embodiment, the optical layer PP may be omitted from the display apparatus DD.

A base substrate BL may be disposed on the optical layer PP. The base substrate BL may provide a base surface where the optical layer PP is disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

The display apparatus DD according to an embodiment may further include a plugging layer (not shown). The plugging layer (not shown) may be disposed between a display device layer DP-ED and a base substrate BL. The plugging layer (not shown) may be an organic layer. The plugging layer (not shown) may include at least one among an acrylic resin, a silicon-based resin, or an epoxy-based resin.

The display panel DP may include a base layer BS, a circuit layer DP-CL provided on the base layer BS, and a display device layer DP-ED. The display device layer DP-ED may include a pixel definition layer PDL, light emitting diodes ED-1, ED-2, and ED-3 disposed in the pixel definition layer PDL, and an encapsulating layer TFE disposed on the light emitting diodes ED-1, ED-2, and ED-3.

The base layer BS may provide a base surface where the display device layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL is disposed on the base layer BS, and the circuit layer DP-CL may include transistors (not shown). Each of the transistors (not shown)

may include a control electrode, an input electrode, and an output electrode. For example, the circuit layer DP-CL may include switching transistors and driving transistors for driving the light emitting diodes ED-1, ED-2, and ED-3 of the display device layer DP-ED.

Each of the light emitting diodes ED-1, ED-2, and ED-3 may have a structure of a light emitting diode ED of an embodiment according to FIG. 3 to FIG. 6, which will be explained later. Each of the light emitting diodes ED-1, ED-2, and ED-3 may include a first electrode EL1, a hole transport region HTR, emission layers EML-R, EML-G, and EML-B, an electron transport region ETR, and a second electrode EL2.

FIG. 2 shows an embodiment where the emission layers EML-R, EML-G, and EML-B of light emitting diodes ED-1, ED-2, and ED-3 are disposed in openings OH defined in a pixel definition layer PDL, are and a hole transport region HTR, an electron transport region ETR, and a second electrode EL2 are each provided as common layers in all light emitting diodes ED-1, ED-2, and ED-3. However, embodiments are not limited thereto. Although not shown in FIG. 2, in an embodiment, the hole transport region HTR and the electron transport region ETR may each be patterned and provided in the openings OH defined in the pixel definition layer PDL. For example, in an embodiment, the hole transport region HTR, the emission layers EML-R, EML-G, and EML-B, and the electron transport region ETR of the light emitting diodes ED-1, ED-2, and ED-3 may be patterned by an ink jet printing method and provided.

An encapsulating layer TFE may cover the light emitting diodes ED-1, ED-2, and ED-3. The encapsulating layer TFE may encapsulate the display device layer DP-ED. The encapsulating layer TFE may be a thin film encapsulating layer. The encapsulating layer TFE may be a single layer or a stack of multiple layers. The encapsulating layer TFE may include at least one insulating layer. The encapsulating layer TFE according to an embodiment may include at least one inorganic layer (hereinafter, encapsulating inorganic layer). The encapsulating layer TFE according to an embodiment may include at least one organic layer (hereinafter, encapsulating organic layer) and at least one encapsulating inorganic layer.

The encapsulating inorganic layer may protect the display device layer DP-ED from moisture and/or oxygen, and the encapsulating organic layer may protect the display device layer DP-ED from foreign materials such as dust particles. The encapsulating inorganic layer may include silicon nitride, silicon oxy nitride, silicon oxide, titanium oxide, or aluminum oxide, without specific limitation. The encapsulating organic layer may include an acrylic compound, an epoxy-based compound, etc. The encapsulating organic layer may include a photopolymerizable organic material, without specific limitation.

The encapsulating layer TFE may be disposed on the second electrode EL2 and may be disposed to fill the openings OH.

Referring to FIG. 1 and FIG. 2, the display apparatus DD may include non-luminous areas NPXA and luminous areas PXA-R, PXA-G, and PXA-B. The luminous areas PXA-R, PXA-G, and PXA-B may be areas emitting light produced from the light emitting diodes ED-1, ED-2, and ED-3, respectively. The luminous areas PXA-R, PXA-G, and PXA-B may be separated from each other on a plane.

The luminous areas PXA-R, PXA-G, and PXA-B may be areas separated by the pixel definition layer PDL. The non-luminous areas NPXA may be areas between neighboring luminous areas PXA-R, PXA-G, and PXA-B and may correspond to the pixel definition layer PDL. For example, in an embodiment, each of the luminous areas PXA-R, PXA-G, and PXA-B may correspond to a pixel. The pixel definition layer PDL may separate the light emitting diodes ED-1, ED-2, and ED-3. The emission layers EML-R, EML-G, and EML-B of the light emitting diodes ED-1, ED-2, and ED-3 may be disposed in the openings OH defined in the pixel definition layer PDL and separated from each other.

The luminous areas PXA-R, PXA-G, and PXA-B may be divided into groups according to the color of light produced from each of the light emitting diodes ED-1, ED-2, and ED-3. In the display apparatus DD of an embodiment, shown in FIG. 1 and FIG. 2, three luminous areas PXA-R, PXA-G, and PXA-B respectively emitting red light, green light, and blue light are illustrated as an embodiment. For example, the display apparatus DD of an embodiment may include a red luminous area PXA-R, a green luminous area PXA-G, and a blue luminous area PXA-B, which are separated from each other.

In the display apparatus DD according to an embodiment, the light emitting diodes ED-1, ED-2, and ED-3 may each emit light having different wavelength regions. For example, in an embodiment, the display apparatus DD may include a first light emitting diode ED-1 emitting red light, a second light emitting diode ED-2 emitting green light, and a third light emitting diode ED-3 emitting blue light. For example, each of the red luminous area PXA-R, the green luminous area PXA-G, and the blue luminous area PXA-B of the display apparatus DD may respectively correspond to the first light emitting diode ED-1, the second light emitting diode ED-2, and the third light emitting diode ED-3.

However, embodiments are not limited thereto, and the first to third light emitting diodes ED-1, ED-2, and ED-3 may emit light in a same wavelength region, or at least one thereof may emit light in a different wavelength region. For example, all of the first to third light emitting diodes ED-1, ED-2, and ED-3 may emit blue light.

The luminous areas PXA-R, PXA-G, and PXA-B in the display apparatus DD according to an embodiment may be arranged in a stripe configuration. Referring to FIG. 1, the red luminous areas PXA-R, the green luminous areas PXA-G, and the blue luminous areas PXA-B may be arranged along a second direction DR2. In another embodiment, the red luminous area PXA-R, the green luminous area PXA-G, and the blue luminous area PXA-B may be arranged by turns along a first direction DR1.

In FIG. 1 and FIG. 2, the areas of the luminous areas PXA-R, PXA-G, and PXA-B are shown as being similar to one another, but embodiments are not limited thereto. The areas of the luminous areas PXA-R, PXA-G, and PXA-B may be different from each other according to a wavelength region of light emitted. The areas of the luminous areas PXA-R, PXA-G, and PXA-B may be areas in a plan view that are defined by the first direction DR1 and the second direction DR2.

The arrangement type of the luminous areas PXA-R, PXA-G, and PXA-B is not limited to the configuration shown in FIG. 1, and the arrangement order of the red luminous areas PXA-R, the green luminous areas PXA-G, and the blue luminous areas PXA-B may be provided in various combinations according to the display quality characteristics which are required for the display apparatus DD. For example, the arrangement type of the luminous areas PXA-R, PXA-G, and PXA-B may be a PENTILE™ arrangement type, or a diamond arrangement type.

In an embodiment, the areas of the luminous areas PXA-R, PXA-G and PXA-B may be different in size from each other. For example, in an embodiment, an area of the green luminous area PXA-G may be smaller than an area of the blue luminous area PXA-B, but embodiments are not limited thereto.

Hereinafter, FIG. 3 to FIG. 6 are each a schematic cross-sectional view showing a light emitting diode according to embodiments. The light emitting diode ED according to an embodiment may include a first electrode EL1, a hole transport region HTR, an emission layer EML, an electron transport region ETR, and a second electrode EL2 stacked in that order.

Figure 3:
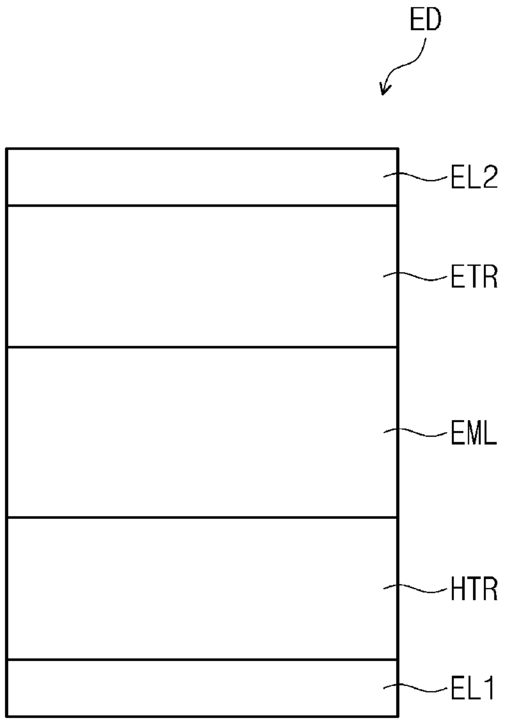
FIG. 3 is a schematic cross-sectional view showing a light emitting diode according to an embodiment.
Figure 4:
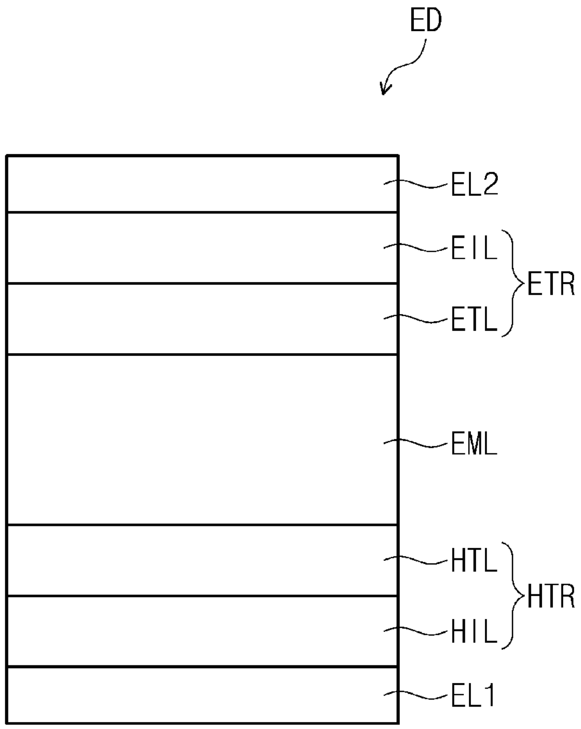
FIG. 4 is a schematic cross-sectional view showing a light emitting diode according to an embodiment.
Figure 5:
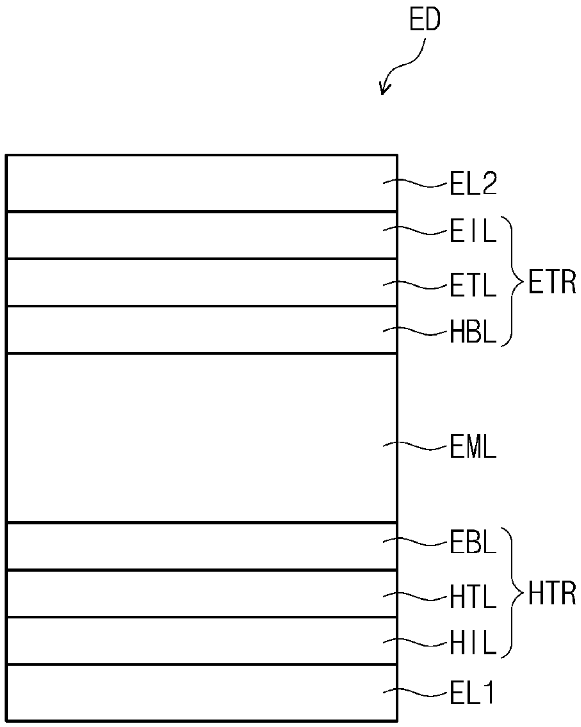
FIG. 5 is a schematic cross-sectional view showing a light emitting diode according to an embodiment.
Figure 6:
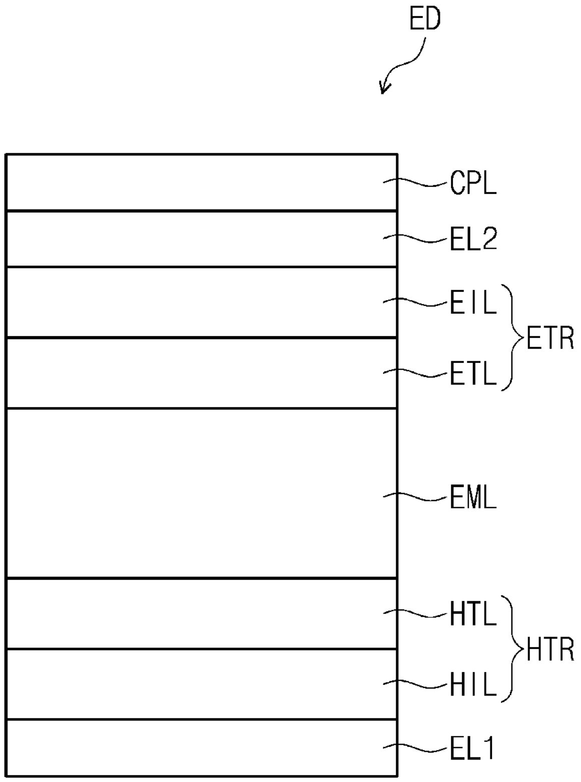
FIG. 6 is a schematic cross-sectional view showing a light emitting diode according to an embodiment.

In comparison to FIG. 3, FIG. 4 shows a schematic cross-sectional view of a light emitting diode ED of an embodiment, wherein a hole transport region HTR includes a hole injection layer HIL and a hole transport layer HTL, and an electron transport region ETR includes an electron injection layer EIL and an electron transport layer ETL. In comparison to FIG. 3, FIG. 5 shows a schematic cross-sectional view of a light emitting diode ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 shows a schematic cross-sectional view of a light emitting diode ED of an embodiment that includes a capping layer CPL disposed on the second electrode EL2.

The first electrode EL1 has conductivity. The first electrode EL1 may be formed using a metal material, a metal alloy, or a conductive compound. The first electrode EL1 may be an anode or a cathode. However, embodiments are not limited thereto. For example, the first electrode EL1 may be a pixel electrode. The first electrode EL1 may be a transmissive electrode, a transflective electrode, or a reflective electrode. If the first electrode EL1 is a transmissive electrode, the first electrode EL1 may include a transparent metal oxide such as indium tin oxide (ITO), indium zinc oxide (IZO), zinc oxide (ZnO), and indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, compounds thereof, or mixtures thereof (for example, a mixture of Ag and Mg). In another embodiment, the first electrode EL1 may have a structure including multiple layers including a reflective layer or a transflective layer formed using the above materials, and a transmissive conductive layer formed using ITO, IZO, ZnO, or ITZO. For example, the first electrode EL1 may include a three-layer structure of ITO/Ag/ITO. However, embodiments are not limited thereto. The first electrode EL1 may include the above-described metal materials, combinations of two or more metal materials selected from the above-described metal materials, or oxides of the above-described metal materials. A thickness of the first electrode EL1 may be in a range of about 700 Å to about 10,000 Å. For example, the thickness of the first electrode EL1 may be in a range of about 1,000 Å to about 3,000 Å.

The hole transport region HTR is provided on the first electrode EL1. The hole transport region HTR may include at least one of a hole injection layer HIL, a hole transport layer HTL, a buffer layer (not shown), an emission auxiliary layer (not shown), or an electron blocking layer EBL. A thickness of the hole transport region HTR may be in a range of about 50 Å to about 15,000 Å.

The hole transport region HTR may be a layer formed of a single material, a layer formed of different materials, or a multilayer structure including layers formed of different materials.

For example, the hole transport region HTR may have the structure of a single layer of a hole injection layer HIL or a hole transport layer HTL, or may have a structure of a single layer formed of a hole injection material and a hole transport material. In other embodiments, the hole transport region HTR may have a structure of a single layer formed of different materials, or may have a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL, are stacked in its respective stated order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1.

[Formula H-1]

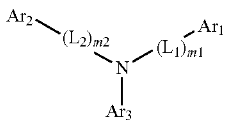

In Formula H-1, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. In Formula H-1, m1 and m2 may each independently be an integer from 0 to 10. If m1 or m2 is 2 or more, multiple $L_1$ groups and multiple $L_2$ groups may each independently be a substituted or unsubstituted arylene group of 6 to 30 ring-forming carbon atoms, or a substituted or unsubstituted heteroarylene group of 2 to 30 ring-forming carbon atoms.

In Formula H-1, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. In Formula H-1, $Ar_3$ may be a substituted or unsubstituted aryl group of 6 to 30 ring-forming carbon atoms.

In an embodiment, the compound represented by Formula H-1 may be a monoamine compound. In another embodiment, the compound represented by Formula H-1 may be a diamine compound in which at least one of $Ar_1$ to $Ar_3$ includes an amine group as a substituent. In still another embodiment, the compound represented by Formula H-1 may be a carbazole-based compound in which at least one of $Ar_1$ or $Ar_2$ includes a substituted or unsubstituted carbazole group, or a fluorene-based compound in which at least one of $Ar_1$ or $Ar_2$ includes a substituted or unsubstituted fluorene group.

The compound represented by Formula H-1 may be any one selected from Compound Group H. However, the compounds shown in Compound Group H are only examples, and the compound represented by Formula H-1 is not limited to the compounds listed in Compound Group H.
[Compound Group H]
H-1-1
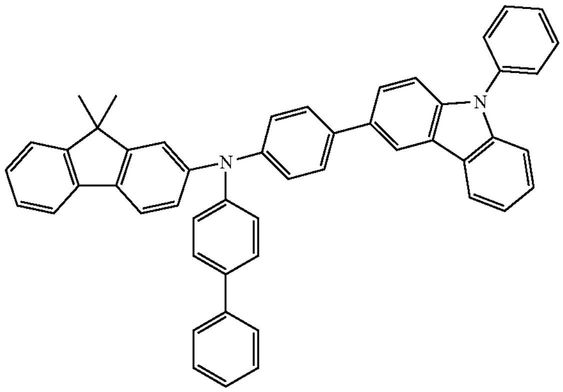
H-1-2
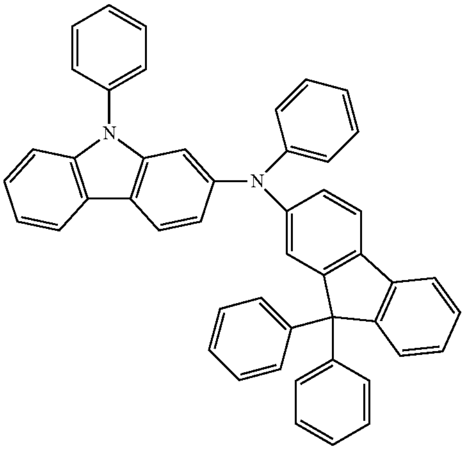
H-1-3
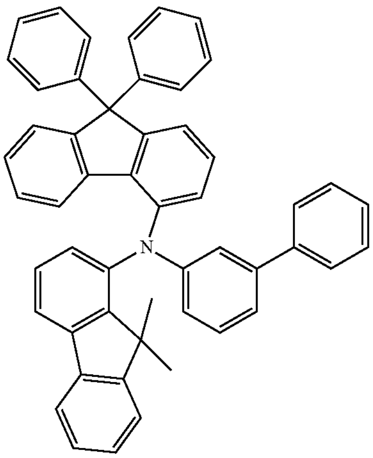
-continued
H-1-4
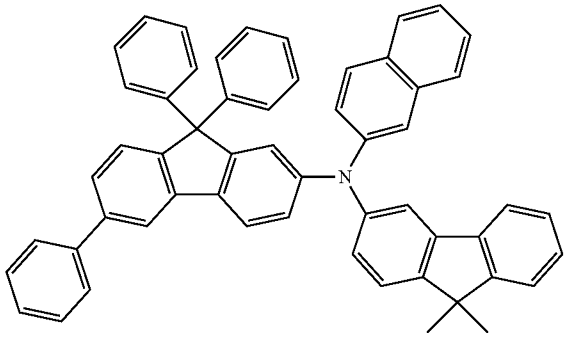
H-1-5
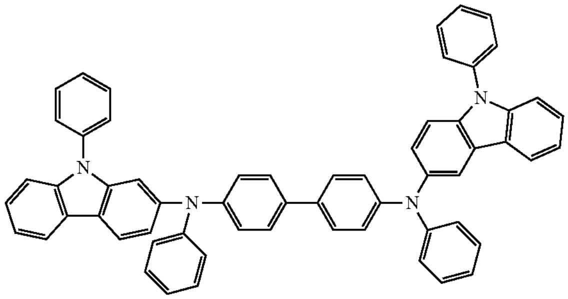
H-1-6
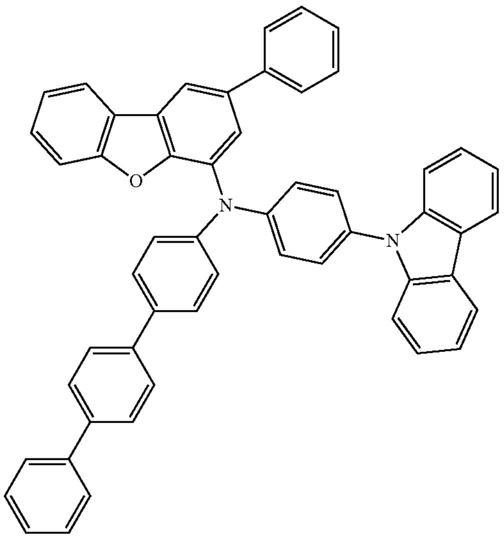

-continued
H-1-7
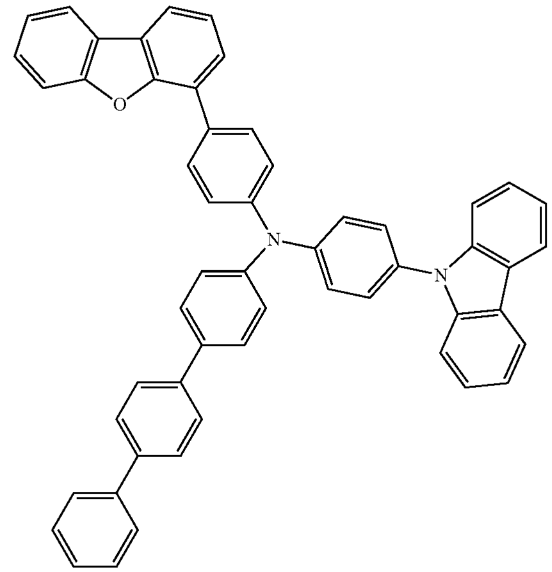
H-1-8
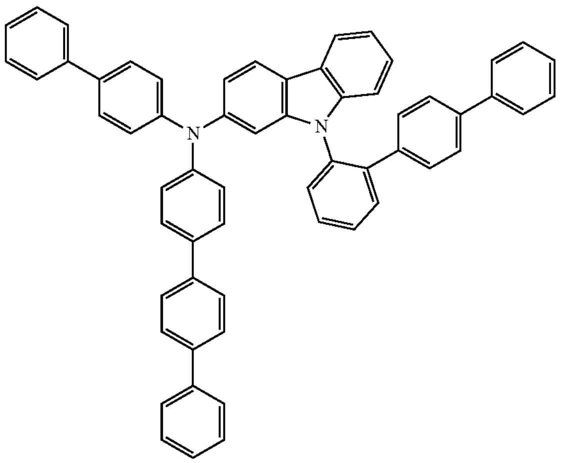
H-1-9
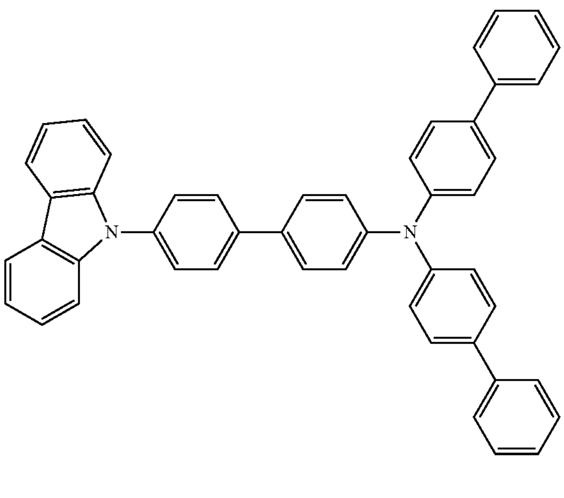
-continued
H-1-10
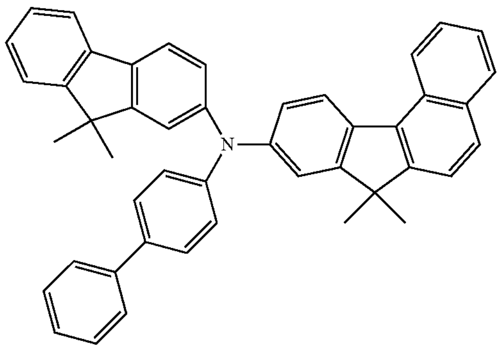
H-1-11
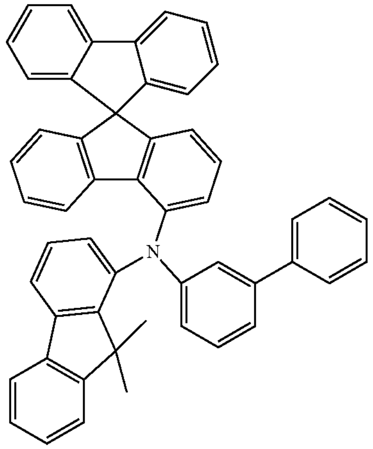
H-1-12
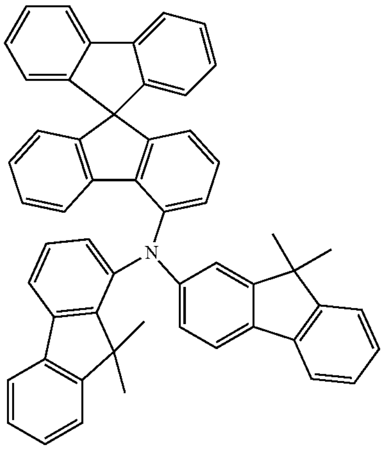
H-1-13
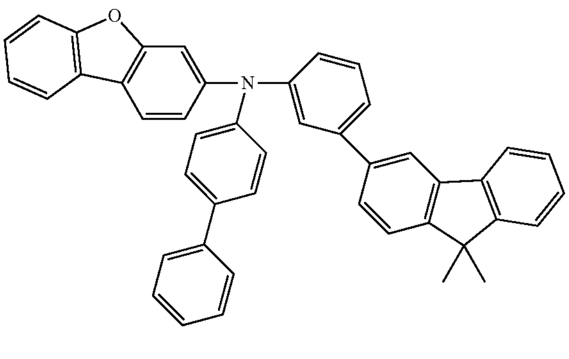

-continued

H-1-14

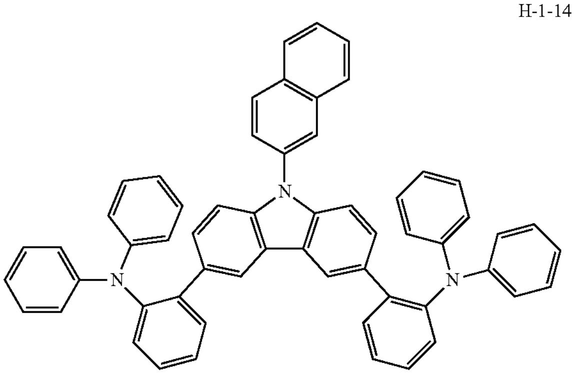

H-1-15

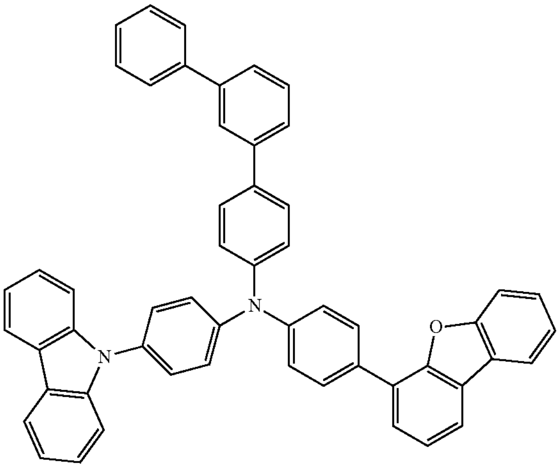

H-1-16

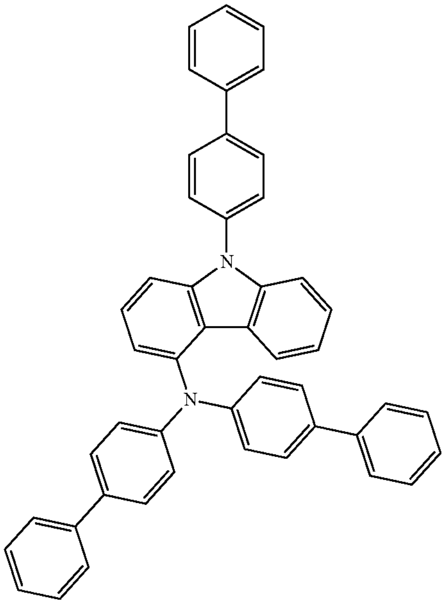

-continued

H-1-17

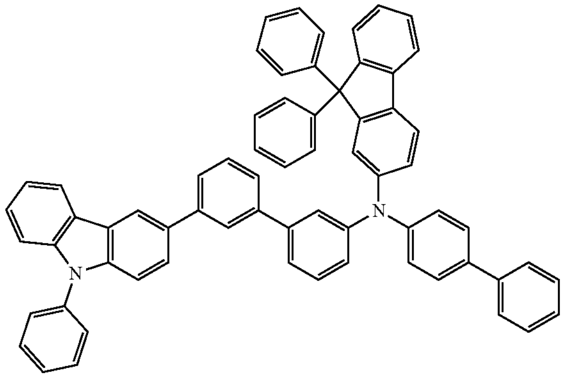

H-1-18

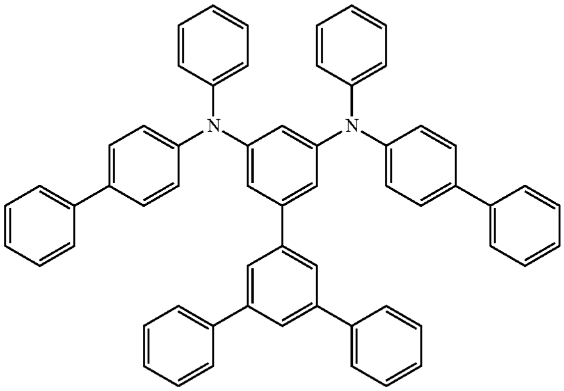

H-1-19

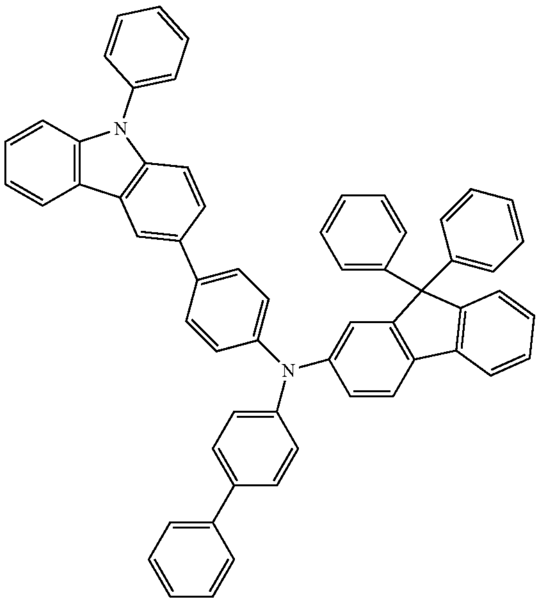

The hole transport region HTR may include a phthalocyanine compound such as copper phthalocyanine, $N^1$,$N^{1'}$-([1,1'-biphenyl]-4,4'-diyl)bis($N^1$-phenyl-$N^4$,$N^4$-di-m-tolylbenzene-1,4-diamine) (DNTPD), 4,4',4"-[tris(3-methylphenyl)phenylamino] triphenylamine (m-MTDATA), 4,4',4"-tris(N,N-diphenylamino)triphenylamine (TDATA), 4,4',4"-tris[N (2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl) borate], and dipyrazino[2,3-f: 2',3'-h] quinoxaline-2,3,6,7,10,11-hexacarbonitrile (HAT-CN).

The hole transport region HTR may include carbazole derivatives such as N-phenyl carbazole and polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4"-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region in at least one of the hole injection layer HIL, hole transport layer HTL, or electron blocking layer EBL.

A thickness of the hole transport region HTR may be in a range of about 100 Å to about 10,000 Å. For example, the thickness of the hole transport region HTR may be in a range of about 100 Å to about 5,000 Å. In the case where the hole transport region HTR includes a hole injection layer HIL, a thickness of the hole injection region HIL may be, for example, in a range of about 30 Å to about 1,000 Å. In the case where the hole transport region HTR includes a hole transport layer HTL, a thickness of the hole transport layer HTL may be in a range of about 30 Å to about 1,000 Å. In the case where the hole transport region HTR includes an electron blocking layer, a thickness of the electron blocking layer EBL may be in a range of about 10 Å to about 1,000 Å. If the thicknesses of the hole transport region HTR, the hole injection layer HIL, the hole transport layer HTL, and the electron blocking layer EBL satisfy the above-described ranges, satisfactory hole transport properties may be achieved without a substantial increase of driving voltage.

The hole transport region HTR may further include a charge generating material to increase conductivity, in addition to the above-described materials. The charge generating material may be dispersed uniformly or non-uniformly in the hole transport region HTR. The charge generating material may be, for example, a p-dopant. The p-dopant may include at least one of metal halide compounds, quinone derivatives, metal oxides, and cyano group-containing compounds, without limitation. For example, the p-dopant may include metal halide compounds such as CuI and RbI, quinone derivatives such as tetracyanoquinodimethane (TCNQ) and 2,3,5,6-tetrafluoro-7,7',8,8-tetracyanoquinodimethane (F4-TCNQ), metal oxides such as tungsten oxide and molybdenum oxide, cyano group-containing compounds such as dipyrazino[2,3-f: 2',3'-h]quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., without limitation.

As described above, the hole transport region HTR may further include at least one of a buffer layer (not shown) or an electron blocking layer EBL, in addition to the hole injection layer HIL and the hole transport layer HTL. The buffer layer (not shown) may increase emission efficiency by compensating for a resonance distance according to a wavelength of light emitted from an emission layer EML. As materials included in the buffer layer (not shown), materials which may be included in the hole transport region HTR may be used. The electron blocking layer EBL may block the injection of electrons from the electron transport region ETR to the hole transport region HTR.

The emission layer EML is provided on the hole transport region HTR. The emission layer EML may have a thickness, for example, in a range of about 100 Å to about 1,000 Å. For example, the emission layer EML may have a thickness in a range of about 100 Å to about 300 Å. The emission layer EML may be a layer formed of a single material, a layer formed of different materials, or a multilayer structure having layers formed of different materials.

The emission layer EML of the light emitting diode ED of an embodiment may include a polycyclic compound of an embodiment.

The polycyclic compound of an embodiment may include a first aromatic hydrocarbon ring, a second aromatic hydrocarbon ring directly bonded to the first aromatic hydrocarbon ring, a first atom directly bonded to the first aromatic hydrocarbon ring, a second atom directly bonded to the first aromatic hydrocarbon ring or to the second aromatic hydrocarbon ring, a first compound directly bonded to the first atom, a second compound directly bonded to the first atom, a third compound directly bonded to the second atom, and a fourth compound directly bonded to the second atom.

In an embodiment, the second aromatic hydrocarbon ring may be directly bonded to the first aromatic hydrocarbon ring at an ortho position with respect to the first atom. However, embodiments are not limited thereto.

In an embodiment, the first atom and the second atom may each independently be B, Al, or Ga. The first atom and the second atom may be the same as or different from each other. For example, in an embodiment, the first atom and the second atom may each be a boron atom (B). For example, the first atom may be B, and the second atom may be Al or Ga. For example, the first atom may be Al, and the second atom may be Ga. However, embodiments are not limited thereto.

In an embodiment, at least one of the first compound or the second compound may include a heteroatom.

In an embodiment, at least one of the third compound or the fourth compound may include a heteroatom.

In an embodiment, the first compound to the fourth compound may each independently be $O(R_{1a})_{m1}$, $N(R_{1b})_{m2}$, $P(R_{1c})_{m3}$, $P(=O)(R_{1d})_{m4}$, $P(=S)(R_{1e})_{m5}$, $S(R_{1f})_{m6}$, $Si(R_{1g})_{m7}$, $Al(R_{1h})_{m8}$, $Ga(R_{1i})_{m9}$, $As(R_{1j})_{m10}$, $Ge(R_{1k})_{m11}$, or $C(R_{1l})_{m12}$. For example, the first compound to the fourth compound may each independently be $O(R_{1a})_{m1}$, $N(R_{1b})_{m2}$, $S(R_{1f})_{m6}$, or $C(R_{1l})_{m12}$.

In the first compound to the fourth compound, $R_{1a}$ to $R_{1l}$ may each independently be a hydrogen atom, a deuterium atom, a halogen atom, a cyano group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In the first compound to the fourth compound, m1 and m6 may each independently be 0 or 1, m2, m3, m4, m5, m8, m9, and m10 may each independently be an integer from 0 to 2, and m7, m11, and m12 may each independently be an integer from 0 to 3.

A case where m1 to m12 are each 0 may be the same as a case where $R_{1a}$ to $R_{1l}$ are each a hydrogen atom.

The first compound and the second compound may be the same as or different from each other. For example, the first compound and the second compound may each independently be a heteroatom. As another example, the first compound may be a heteroatom, and the second compound may not be a heteroatom.

The third compound and the fourth compound may be the same as or different from each other. For example, the third compound and the fourth compound may each independently be a heteroatom. As another example, the third compound may be a heteroatom, and the fourth compound may not be a heteroatom.

For example, the first compound to the fourth compound may each independently be $O(R_{1a})_{m1}$, $N(R_{1b})_{m2}$, or $S(R_{1f})_{m6}$. As another example, the first compound and the third compound may each independently be $O(R_{1a})_{m1}$, $N(R_{1b})_{m2}$, or $S(R_{1f})_{m6}$, and the second compound and the fourth compound may each independently be $C(R_{1l})_{m12}$. For example, in $O(R_{1a})_{m1}$, m1 may be 0. For example, in $N(R_{1b})_{m2}$, m2 may be 1, and $R_{1b}$ may be a substituted or unsubstituted phenyl group, a substituted or unsubstituted biphenyl group, or a substituted or unsubstituted terphenyl group. For example, in $S(R_{1f})_{m6}$, m6 may be 0. For example, in $C(R_{1l})_{m12}$, m12 may be 2, and two $R_{1l}$ groups may each be an unsubstituted methyl group.

In an embodiment, at least one of the first compound, the second compound, the third compound, or the fourth compound may be combined with an adjacent group to form a ring.

In an embodiment, the first compound or the second compound may be directly bonded to the second aromatic hydrocarbon ring to form a ring. For example, the first compound or the second compound may be directly bonded to the second aromatic hydrocarbon ring to form a hexagonal ring.

In an embodiment, in the case where the second atom is directly bonded to the first aromatic hydrocarbon ring, the third compound or the fourth compound may be directly bonded to the second aromatic hydrocarbon ring to form a ring. For example, the third compound or the fourth compound may be directly bonded to the second aromatic hydrocarbon ring to form a hexagonal ring.

In an embodiment, in the case where the second atom is directly bonded to the second aromatic hydrocarbon ring, the third compound or the fourth compound may be directly bonded to the first aromatic hydrocarbon ring to form a ring. For example, the third compound or the fourth compound may be directly bonded to the first aromatic hydrocarbon ring to form a hexagonal ring.

In an embodiment, the first aromatic hydrocarbon ring and the second aromatic hydrocarbon ring may each independently be a substituted or unsubstituted benzene ring. For example, the first aromatic hydrocarbon ring and the second aromatic hydrocarbon ring may each independently be an unsubstituted benzene ring, or a substituted benzene ring which is substituted with a deuterium atom, a cyano group, a substituted or unsubstituted boron group, a substituted or unsubstituted diphenyl amine group, or a substituted or unsubstituted carbazole group.

In an embodiment, the polycyclic compound may be represented by Formula A or Formula B.

[Formula A]

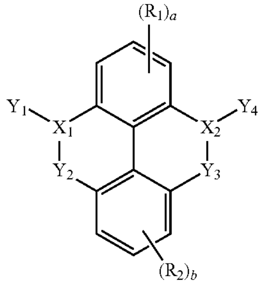

[Formula B]

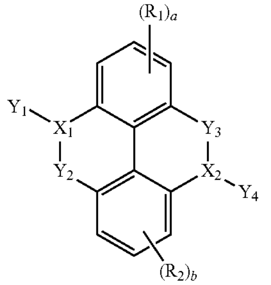

In Formula A and Formula B, $X_1$ and $X_2$ may each independently be B, Al, or Ga. $X_1$ and $X_2$ may be the same as or different from each other. For example, $X_1$ and $X_2$ may each be B. For example, $X_1$ may be B, and $X_2$ may be Al or Ga. For example, $X_1$ may be Al, and $X_2$ may be Ga. However, embodiments are not limited thereto.

In Formula A and Formula B, $Y_1$, $Y_2$, $Y_3$, and $Y_4$ may each independently be $O(R_{1a})_{m1}$, $N(R_{1b})_{m2}$, $P(R_{1c})_{m3}$, $P(=O)(R_{1d})_{m4}$, $P(=S)(R_{1e})_{m5}$, $S(R_{1f})_{m6}$, $Si(R_{1g})_{m7}$, $Al(R_{1h})_{m8}$, $Ga(R_{1i})_{m9}$, $As(R_{1j})_{m10}$, $Ge(R_{1k})_{m11}$, or $C(R_{1l})_{m12}$.

In Formula A and Formula B, $R_{1a}$ to $R_{1l}$ may each independently be a hydrogen atom, a deuterium atom, a halogen atom, a cyano group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula A and Formula B, m1 and m6 may each independently be 0 or 1.

In Formula A and Formula B, m2, m3, m4, m5, m8, m9, and m10 may each independently be an integer from 0 to 2.

In Formula A and Formula B, m7, m11, and m12 may each independently be an integer from 0 to 3.

$Y_1$, $Y_2$, $Y_3$, and $Y_4$ may all be the same, or at least one thereof may be different from the remainder.

For example, $Y_1$, $Y_2$, $Y_3$, and $Y_4$ may each independently be $O(R_{1a})_{m1}$, $N(R_{1b})_{m2}$, $S(R_{1f})_{m6}$, or $C(R_{1l})_{m12}$.

For example, $Y_1$, $Y_2$, $Y_3$, and $Y_4$ may each independently be $O(R_{1a})_{m1}$, $N(R_{1b})_{m2}$, or $S(R_{1f})_{m6}$.

For example, at least one of $Y_1$, $Y_2$, $Y_3$, and $Y_4$ may each be $C(R_{1l})_{m12}$, and the remainder of $Y_1$, $Y_2$, $Y_3$, and $Y_4$ may each independently be $O(R_{1a})_{m1}$, $N(R_{1b})_{m2}$, or $S(R_{1f})_{m6}$.

For example, two of $Y_1$, $Y_2$, $Y_3$, and $Y_4$ may each be $C(R_{1l})_{m12}$, and the remainder of $Y_1$, $Y_2$, $Y_3$, and $Y_4$ may each independently be $O(R_{1a})_{m1}$, $N(R_{1b})_{m2}$, or $S(R_{1f})_{m6}$. For example, $Y_1$ and $Y_3$ may each independently be $O(R_{1a})_{m1}$, $N(R_{1b})_{m2}$, or $S(R_{1f})_{m6}$, and $Y_2$ and $Y_4$ may each be j$C(R_{1l})_{m12}$.

In an embodiment, in $O(R_{1a})_{m1}$, m1 may be 0. In an embodiment, in $N(R_{1b})_{m2}$, m2 may be 1, and $R_{1b}$ may be a substituted or unsubstituted phenyl group, a substituted or unsubstituted biphenyl group, or a substituted or unsubstituted terphenyl group. In an embodiment, in $S(R_{1f})_{m6}$, m6 may be 0. In an embodiment, in $C(R_{1l})_{m12}$, m12 may be 2, and two $R_{1l}$ groups may each be an unsubstituted methyl group.

In Formula A and Formula B, $R_1$ and $R_2$ may each independently be a hydrogen atom, a deuterium atom, a halogen atom, a cyano group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_1$ and $R_2$ may each independently be a hydrogen atom, a deuterium atom, a cyano group, a substituted or unsubstituted boron group, a substituted or unsubstituted diphenyl amine group, or a substituted or unsubstituted carbazole group.

In Formula A and Formula B, a and b may each independently be an integer from 0 to 3. For example, a and b may each independently be 0 or 1. A case where a is 0 may be the same as a case where a is 1 and $R_1$ is a hydrogen atom. A case where b is 0 may be the same as a case where bis 1 and $R_2$ is a hydrogen atom.

In an embodiment, the polycyclic compound represented by Formula A may be represented by Formula A-1, and the polycyclic compound represented by Formula B may be represented by Formula B-1.

[Formula A-1]

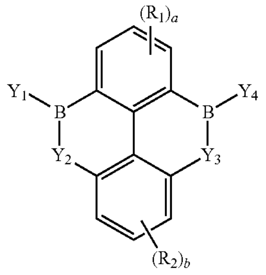

[Formula B-1]

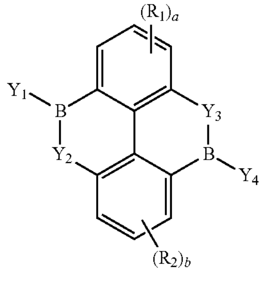

Formula A-1 is an embodiment of Formula A where $X_1$ and $X_2$ are each B.

Formula B-1 is an embodiment of Formula B where $X_1$ and $X_2$ are each B.

In Formula A-1 and Formula B-1, $Y_1$ to $Y_4$, $R_1$, $R_2$, a, and b may be the same as defined in Formula A and Formula B.

The polycyclic compound of an embodiment may include two or more boron atoms to which at least one heteroatom is directly bonded, and a bond dissociation energy of a molecule may increase.

The light emitting diode of an embodiment may include a polycyclic compound in an emission layer and may improve emission efficiency and diode life.

In an embodiment, the polycyclic compound represented by Formula A may be represented by Formula A-2, and the polycyclic compound represented by Formula B may be represented by Formula B-2.

[Formula A-2]

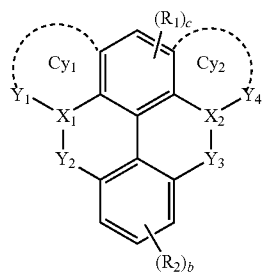

[Formula B-2]

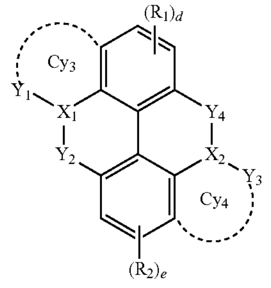

Formula A-2 is an embodiment of Formula A where $Y_1$ and $Y_4$ are each combined with an adjacent group to form a ring.

Formula B-2 is an embodiment of Formula B where $Y_1$ and $Y_3$ are each combined with an adjacent group to form a ring.

In Formula A-2 and Formula B-2, $Cy_1$, $Cy_2$, $Cy_3$, and $Cy_4$ may each independently a substituted or unsubstituted aromatic hydrocarbon ring. For example, $Cy_1$, $Cy_2$, $Cy_3$, and $Cy_4$ may each independently be a substituted or unsubstituted benzene ring.

In Formula A-2, c may be 0 or 1.

In Formula B-2, d and e may each independently be an integer from 0 to 2. For example, d and e may each independently be 0 or 1.

In Formula A-2 and Formula B-2, $X_1$, $X_2$, $Y_1$ to $Y_4$, $R_1$, $R_2$, and b may be the same as defined in Formula A and Formula B.

In an embodiment, the polycyclic compound represented by Formula A or Formula B may be represented by any one of Formula C-1 to Formula C-6.

[Formula C-1]

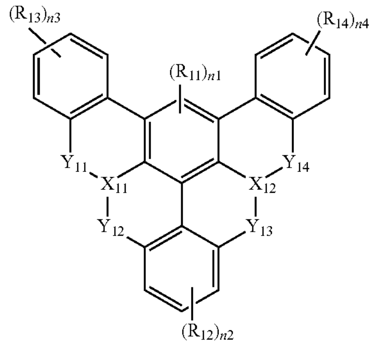

[Formula C-2]

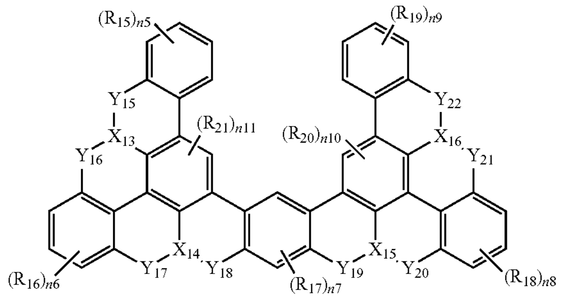

[Formula C-3]

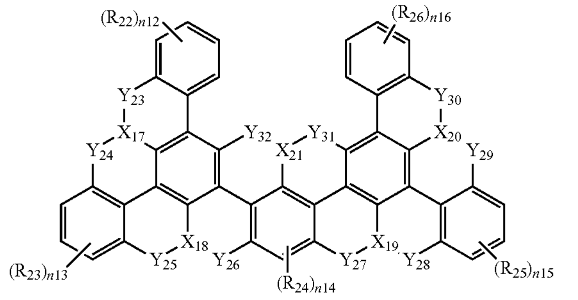

[Formula C-4]

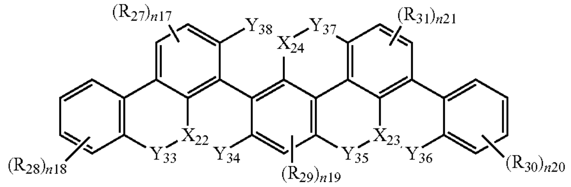

[Formula C-5]

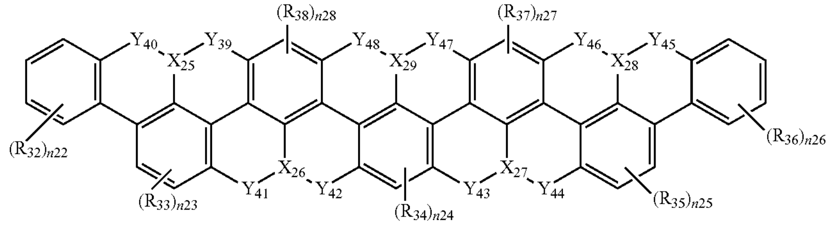

[Formula C-6]

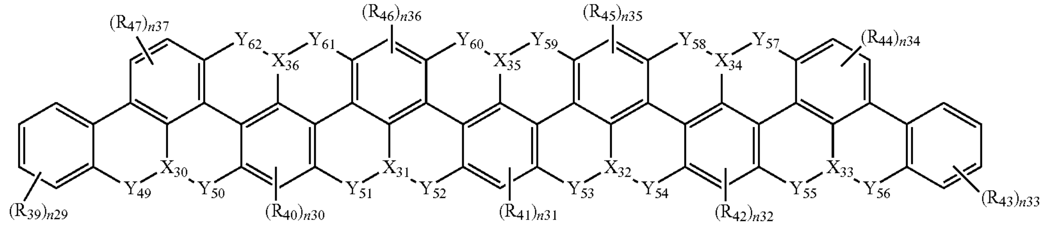

In Formula C-1 to Formula C-6, $X_{11}$ to $X_{36}$ may each independently be B, Al, or Ga. For example, $X_{11}$ to $X_{36}$ may each be B. However, embodiments are not limited thereto. For example, at least one of $X_{11}$ to $X_{36}$ may each independently be Al or Ga, and the remainder of $X_{11}$ to $X_{36}$ may each be B.

In Formula C-1 to Formula C-6, $Y_{11}$ to $Y_{62}$ may each independently be $O(R_{1a})_{m1}$, $N(R_{1b})_{m2}$, $P(R_{1c})_{m3}$, $P(=O)(R_{1d})_{m4}$, $P(=S)(R_{1e})_{m5}$, $S(R_{1f})_{m6}$, $Si(R_{1g})_{m7}$, $Al(R_{1h})_{m8}$, $Ga(R_{1i})_{m9}$, $As(R_{1j})_{m10}$, $Ge(R_{1k})_{m11}$ or $C(R_{1l})_{m12}$. For example, $Y_{11}$ to $Y_{62}$ may be each independently $O(R_{1a})_{m1}$, $N(R_{1b})_{m2}$, $S(R_{1f})_{m6}$, or $C(R_{1l})_{m12}$. For example, $Y_{11}$ to $Y_{62}$ may be each independently $O(R_{1a})_{m1}$, $N(R_{1b})_{m2}$, or $S(R_{1f})_{m6}$.

In Formula C-1 to Formula C-6, $R_{1a}$ to $R_{1l}$ may each independently be a hydrogen atom, a deuterium atom, a halogen atom, a cyano group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_{1a}$ to $R_{1l}$ may each independently be an unsubstituted methyl group, a substituted or unsubstituted phenyl group, a substituted or unsubstituted biphenyl group, or a substituted or unsubstituted terphenyl group.

In Formula C-1 to Formula C-6, m1 and m6 may each independently be 0 or 1.

In Formula C-1 to Formula C-6, m2, m3, m4, m5, m8, m9, and m10 may each independently be an integer from 0 to 2.

In Formula C-1 to Formula C-6, m7, m11, and m12 may each independently be an integer from 0 to 3.

In an embodiment, $R_{1a}$ to $R_{1l}$ may each independently be a group represented by any one of Substituent S1 to Substituent S5.

S1

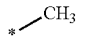

S2

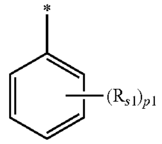

S3

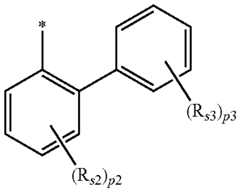

S4

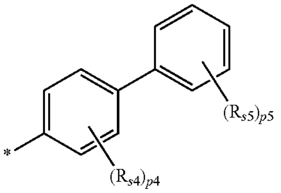

S5

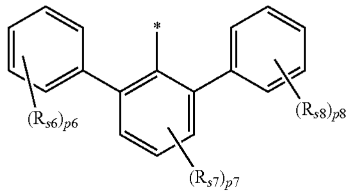

In Substituent S1 to Substituent S5, $R_{s1}$ to $R_{s8}$ may each independently be a hydrogen atom, a deuterium atom, a halogen atom, a cyano group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_{s1}$ to $R_{s8}$ may each independently be a hydrogen atom or a deuterium atom.

In Substituent S2 to Substituent S5, p1, p3, p5, p6 and p8 may each independently be an integer from 0 to 5. For example, p1, p3, p5, p6 and p8 may each independently be 0 or 5.

In Substituent S3 and Substituent S4, p2 and p4 may each independently be an integer from 0 to 4. For example, p2 and p4 may each independently be 0 or 4.

In Substituent S5, p7 may be an integer from 0 to 3. For example, p7 may be 0 or 3.

In an embodiment, two adjacent groups among $Y_{11}$ to $Y_{62}$ may be directly bonded to any one corresponding group among $X_{11}$ to $X_{36}$. For example, $Y_{2k-11}$ and $Y_{2k-10}$ may be directly bonded to $X_k$, wherein k is an integer from 11 to 36. $Y_{2k-11}$ and $Y_{2k-10}$ may be understood as two adjacent groups among $Y_{11}$ to $Y_{62}$. For example, $Y_{11}$ and $Y_{12}$ may be directly bonded to $X_{11}$, and $Y_{13}$ and $Y_{14}$ may be directly bonded to $X_{12}$. For example, $Y_{11}$ and $Y_{12}$ may be two adjacent groups among $Y_{11}$ to $Y_{62}$. For example, $Y_{13}$ and $Y_{14}$ may be two adjacent groups among $Y_{11}$ to $Y_{62}$.

In an embodiment, $Y_{2k-11}$ and $Y_{2k-10}$ may each independently be $O(R_{1a})_{m1}$, $N(R_{1b})_{m2}$, or $S(R_{1f})_{m6}$. In another embodiment, any one among $Y_{2k-11}$ and $Y_{2k-10}$ may be $O(R_{1a})_{m1}$, $N(R_{1b})_{m2}$, or $S(R_{1f})_{m6}$, and the remainder of $Y_{2k-11}$ and $Y_{2k-10}$ may be $C(R_{1l})_{m12}$.

For example, in $O(R_{1a})_{m1}$, m1 may be 0. For example, in $N(R_{1b})_{m2}$, m2 may be 1, and $R_{1b}$ may be a substituted or unsubstituted phenyl group, a substituted or unsubstituted biphenyl group, or a substituted or unsubstituted terphenyl group. For example, in $S(R_{1f})_{m6}$, m6 may be 0. For example, in $C(R_{1l})_{m12}$, m12 may be 2, and two $R_{11}$ may be unsubstituted methyl groups.

In Formula C-1 to Formula C-6, $R_{11}$ to $R_{47}$ may each independently be a hydrogen atom, a deuterium atom, a halogen atom, a cyano group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_{11}$ to $R_{47}$ may each independently be a hydrogen atom, a deuterium atom, a cyano group, an unsubstituted methyl group, an unsubstituted t-butyl group, a substituted or unsubstituted diphenylamine group, a substituted or unsubstituted carbazole group, or a substituted or unsubstituted phenoxazine group.

In Formula C-1 to Formula C-6, n1, n10, n11, n14, n19, n24, n27, n28, n30, n31, n32, n35, and n36 may each independently be 0 or 1.

In Formula C-1 to Formula C-6, n7, n17, n21, n23, n25, n34, and n37 may each independently be an integer from 0 to 2.

In Formula C-1 to Formula C-6, n2, n6, n8, n13, and n15 may each independently be an integer from 0 to 3. For example, n2, n6, n8, n13, and n15 may each independently be 0, 1, or 3.

In Formula C-1 to Formula C-6, n3, n4, n5, n9, n12, n16, n18, n20, n22, n26, n29, and n33 may each independently be an integer from 0 to 4. For example, n3, n4, n5, n9, n12, n16, n18, n20, n22, n26, n29, and n33 may each independently be 0, 1, or 4.

In an embodiment, the polycyclic compound represented by any one of Formula C-1 to Formula C-6 may be represented by any one of Formula D-1 to Formula D-6.

[Formula D-1]

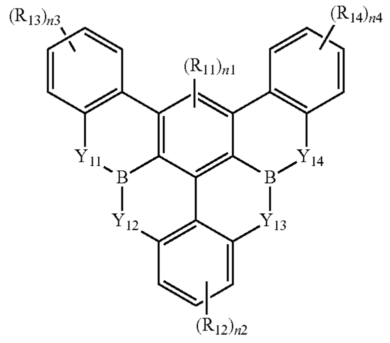

[Formula D-2]

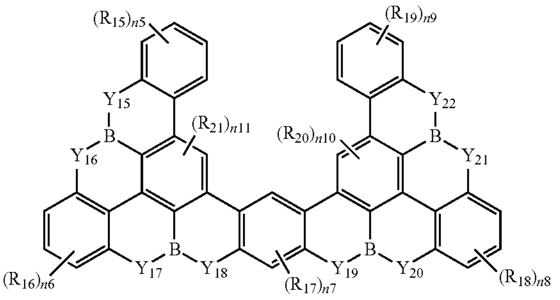

[Formula D-3]

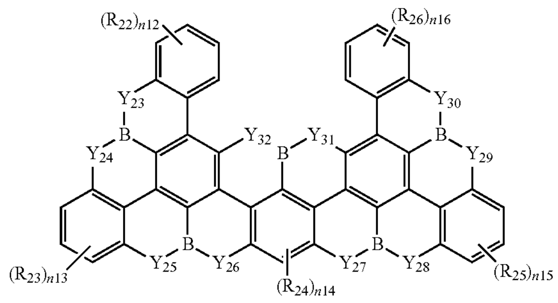

[Formula D-4]

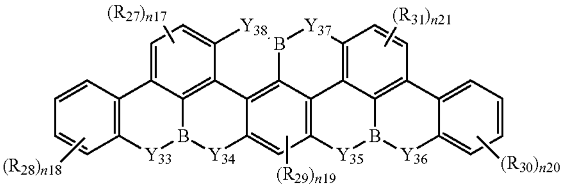

[Formula D-5]

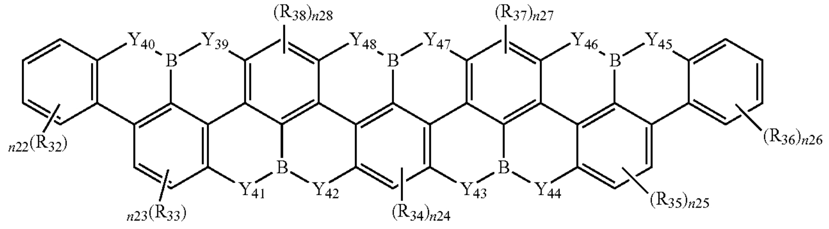

[Formula D-6]

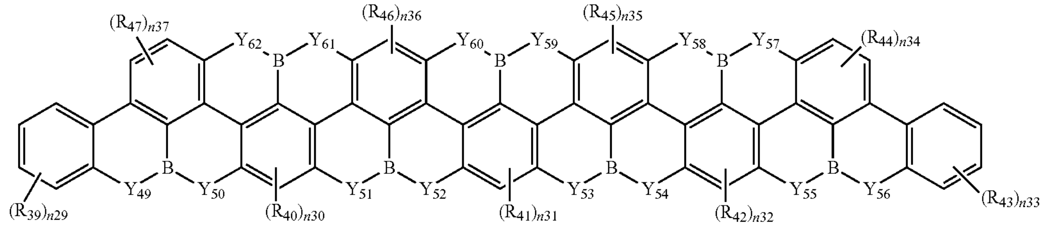

Formula D-1 to Formula D-6 are embodiments of Formula C-1 to Formula C-6, respectively, where $X_1$ to $X_{36}$ are each B. However, embodiments are not limited thereto.

In Formula D-1 to Formula D-6, $Y_{11}$ to $Y_{62}$, $R_{11}$ to $R_{47}$, and n1 to n37 may be the same as defined in Formula C-1 to Formula C-6.

The polycyclic compound of an embodiment may include two or more boron atoms to which at least one heteroatom is directly bonded, and the bond dissociation energy of a molecule may be improved.

The light emitting diode of an embodiment may include a polycyclic compound in an emission layer, and may improve emission efficiency and diode life.

In an embodiment, the polycyclic compound represented by Formula A or Formula B may include any one selected from Compound Group 1.

[Compound Group 1]
A-1
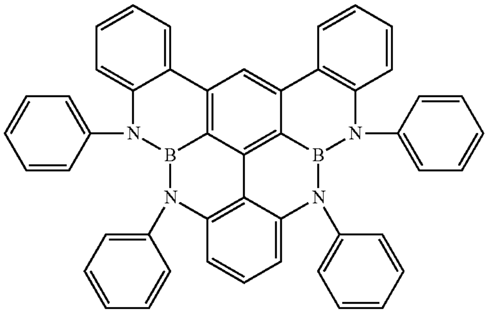
A-2
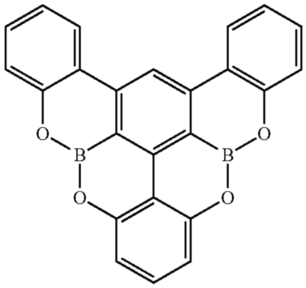
A-3
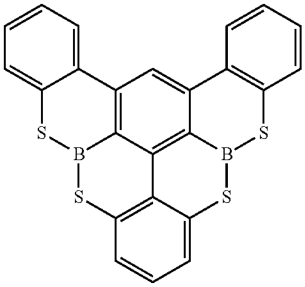
A-4
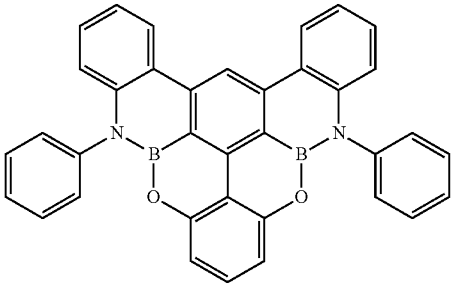
A-5
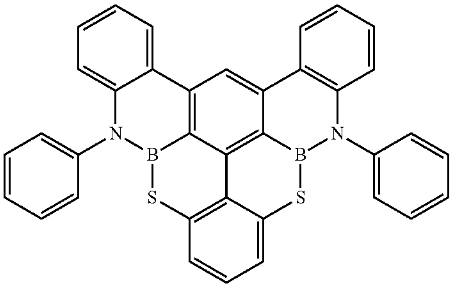
A-6
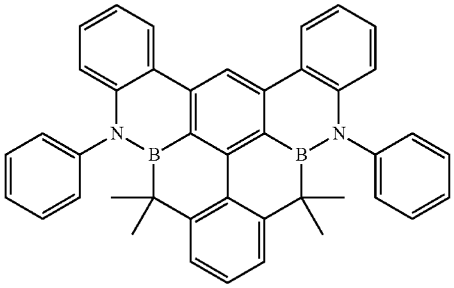
A-7
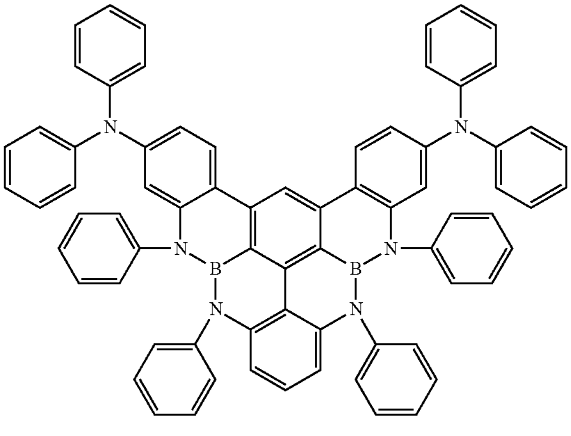
A-8
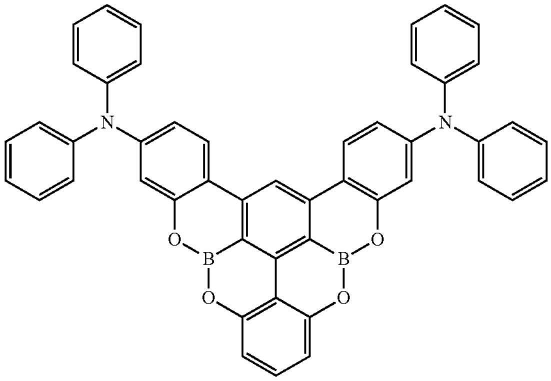

-continued
A-9
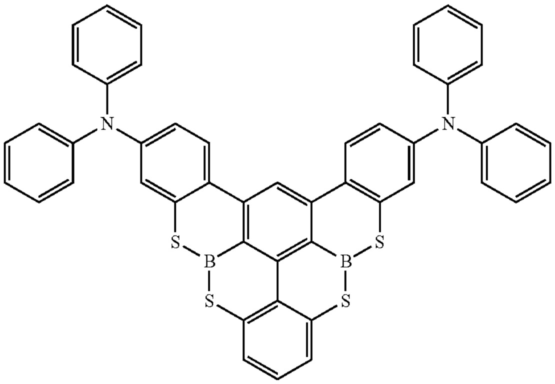
A-10
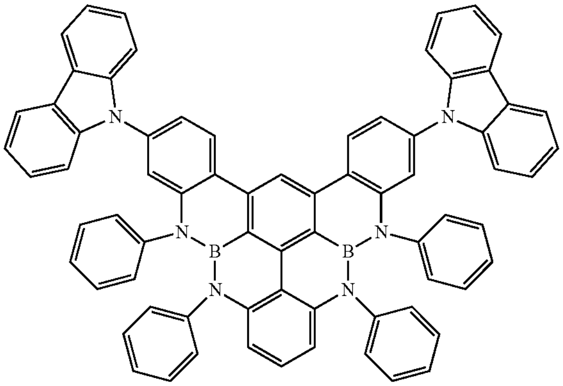
A-11
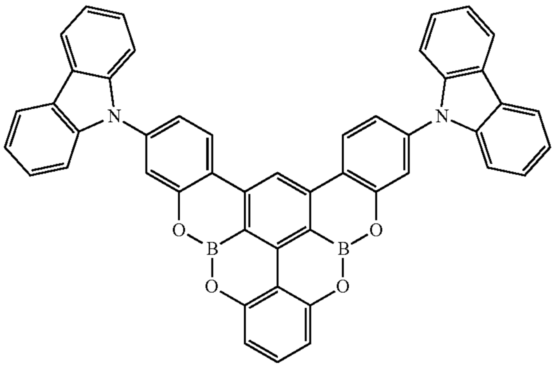
A-12
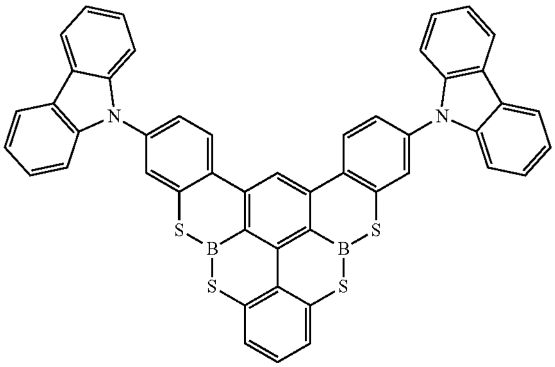
A-13
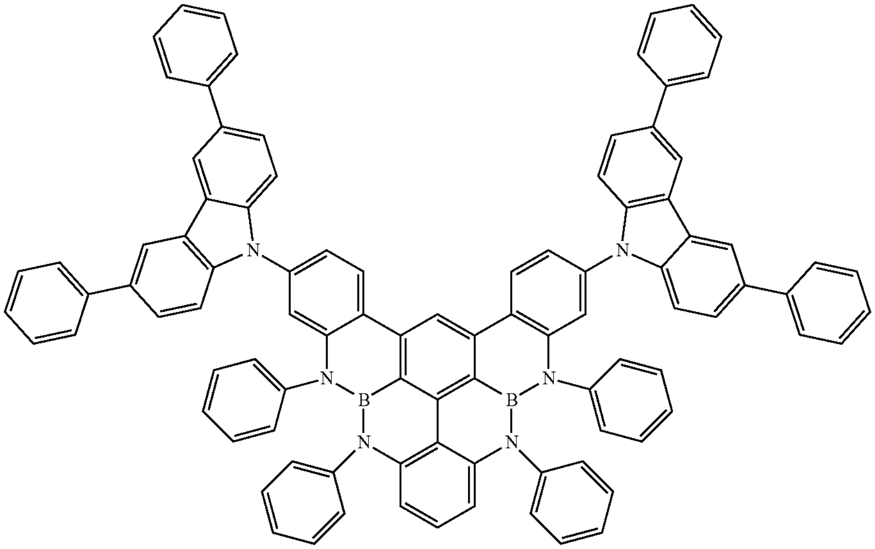

-continued
A-14
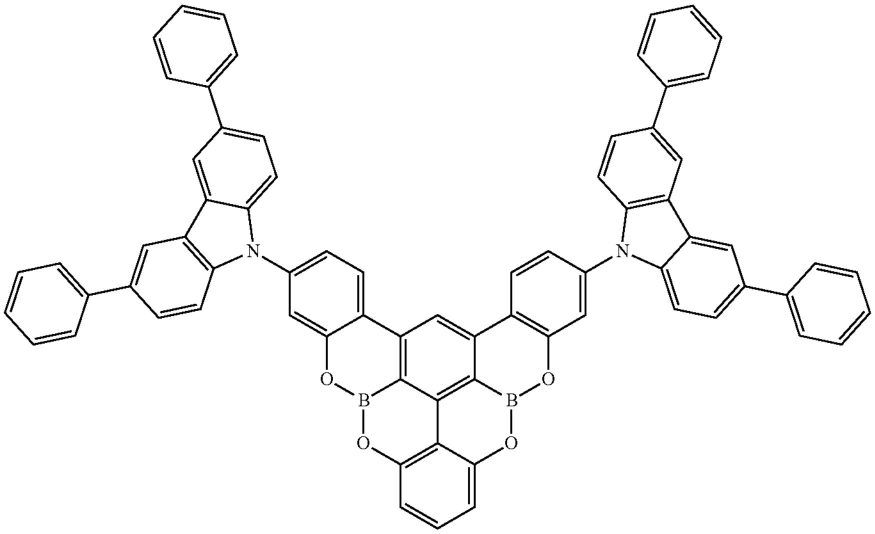
A-15
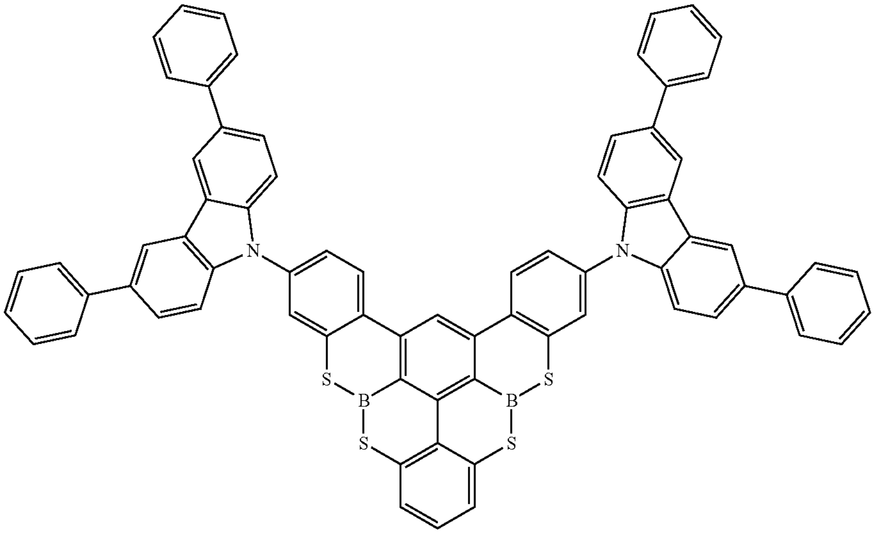
A-16
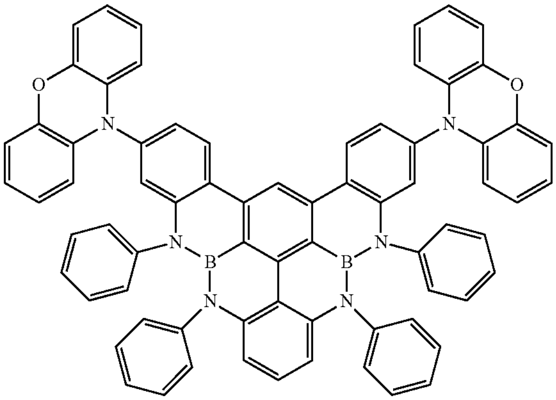
A-17
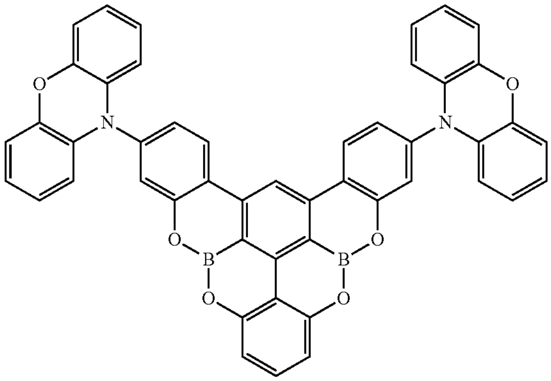

-continued
A-18
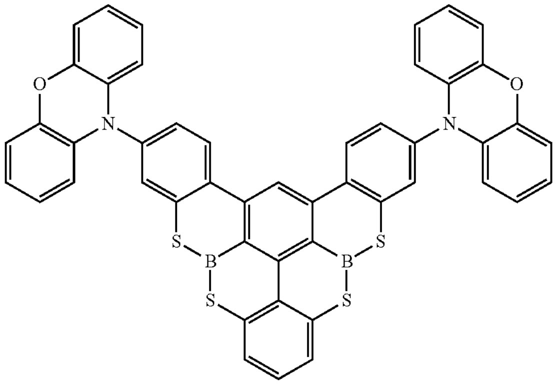
A-19
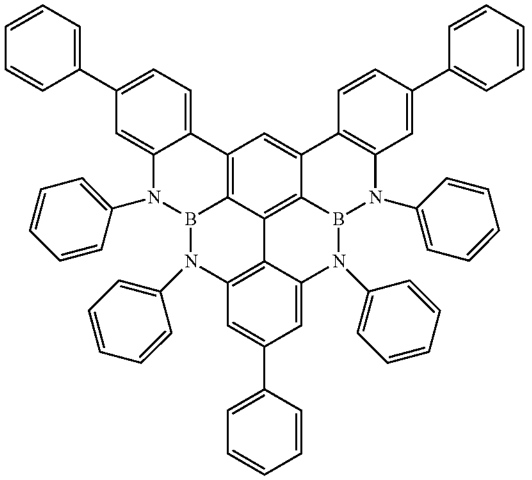
A-20
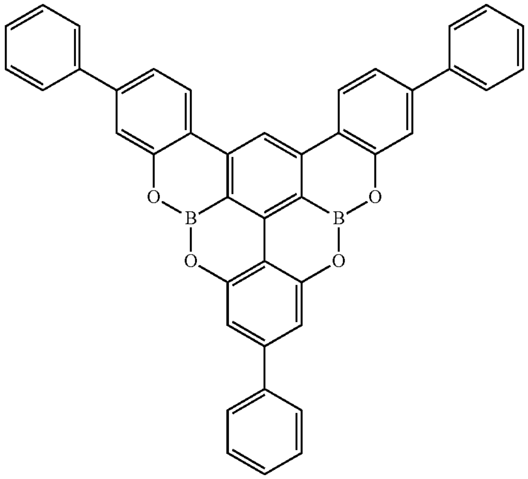
A-21
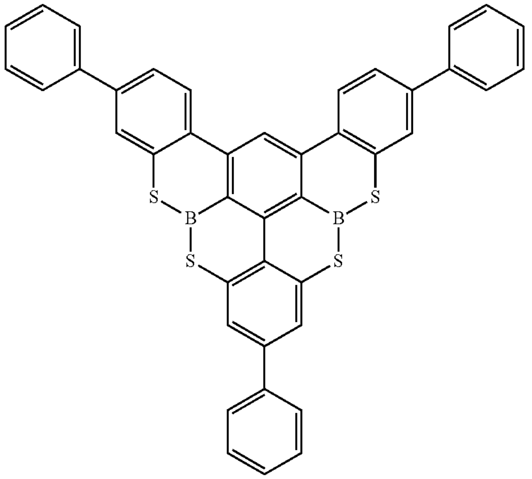
A-22
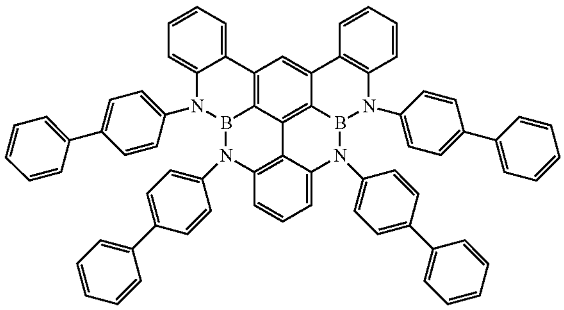
A-23
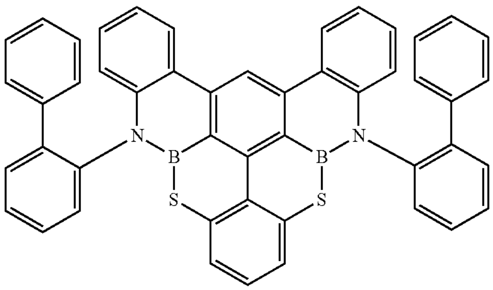

-continued
A-24
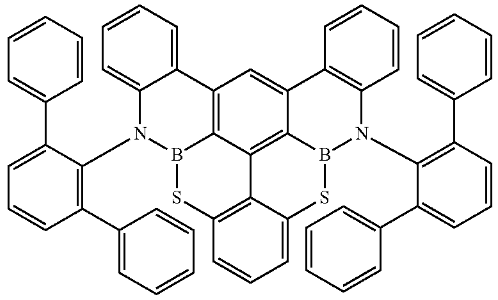
A-25
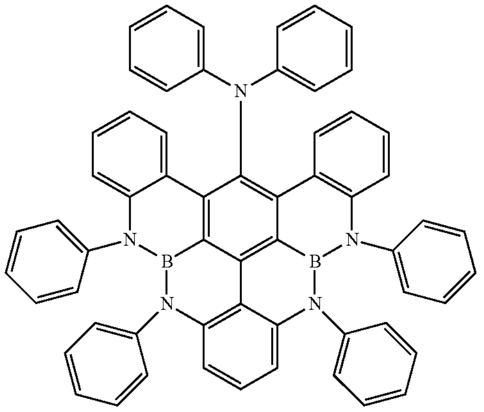
A-26
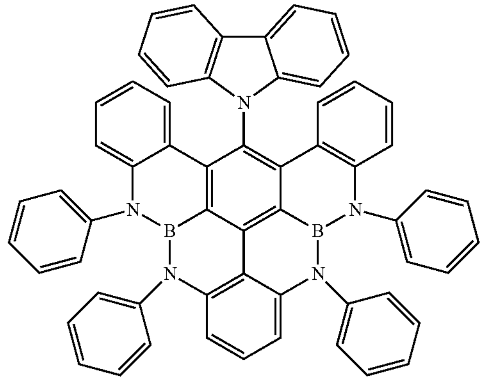
A-27
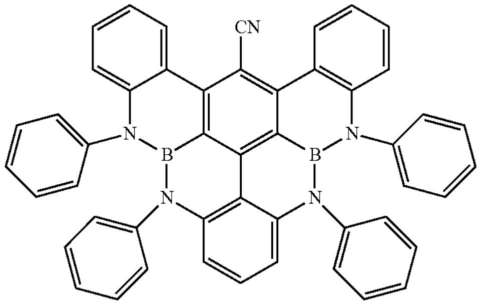
B-1
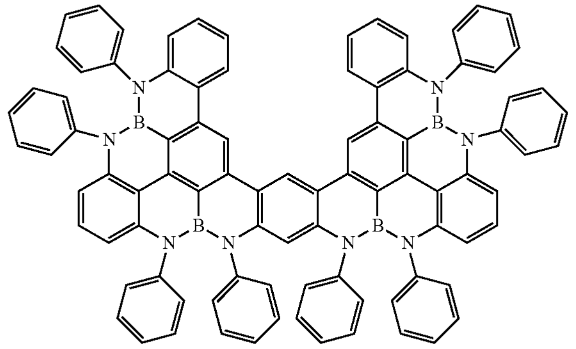
B-2
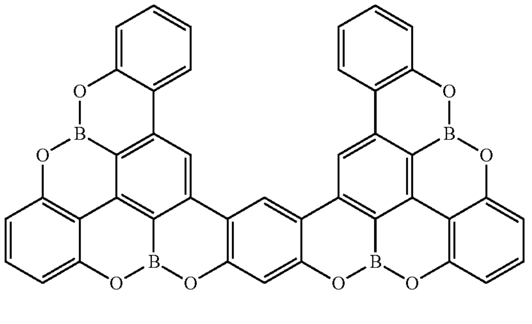
B-3
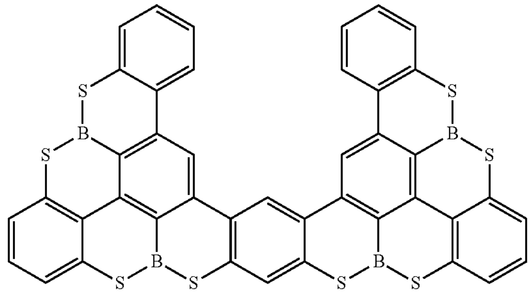
B-4
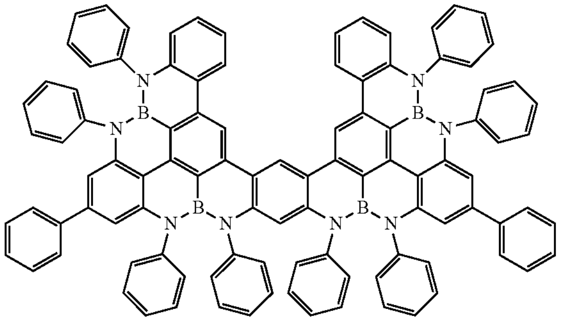

-continued
B-5
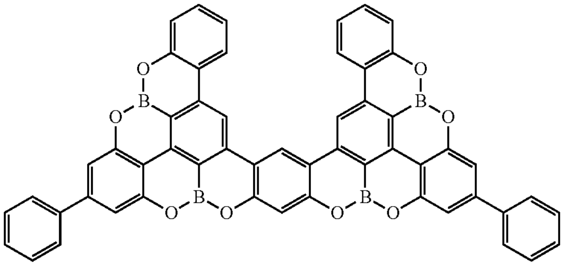
B-6
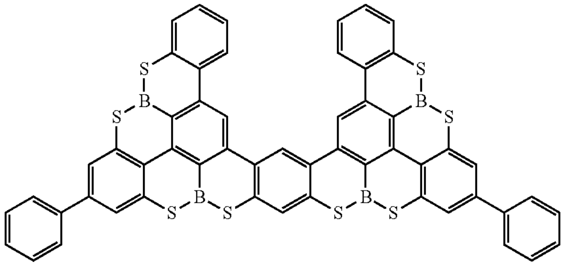
B-7
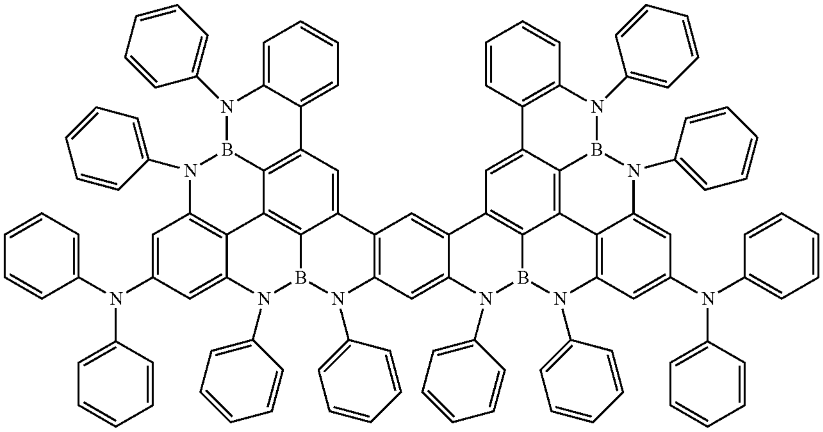
B-8
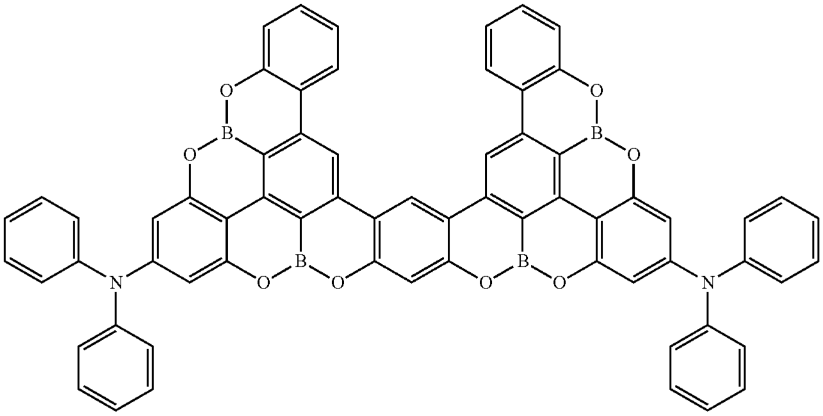
B-9
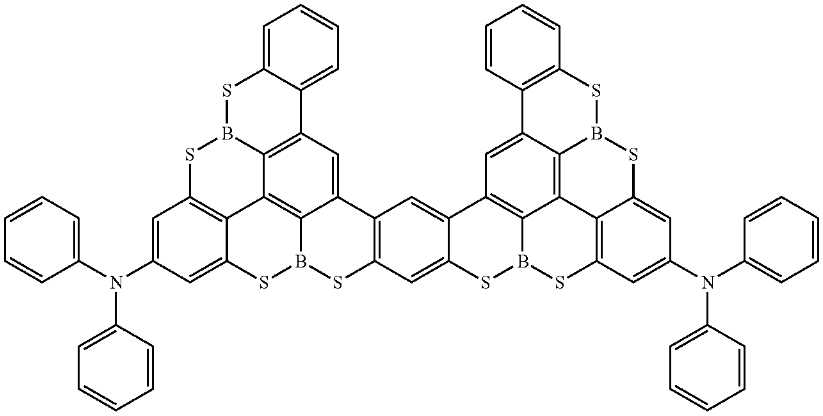

-continued
B-10
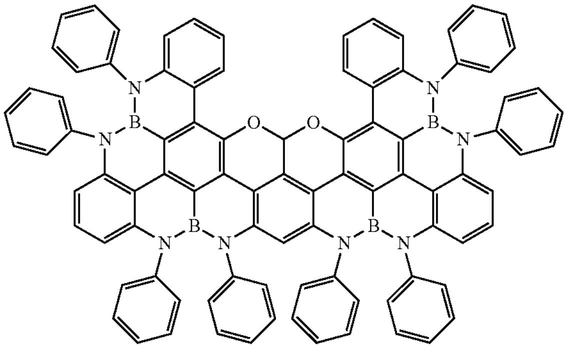
B-11
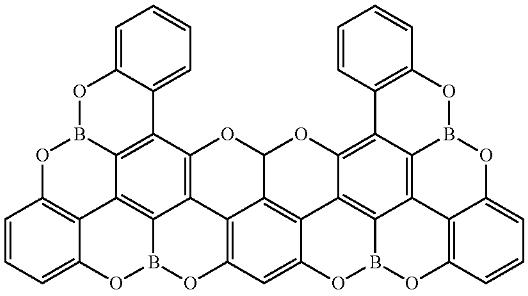
B-12
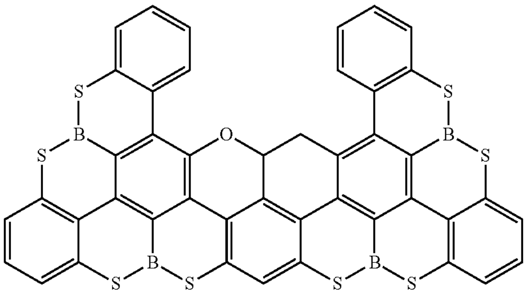
B-13
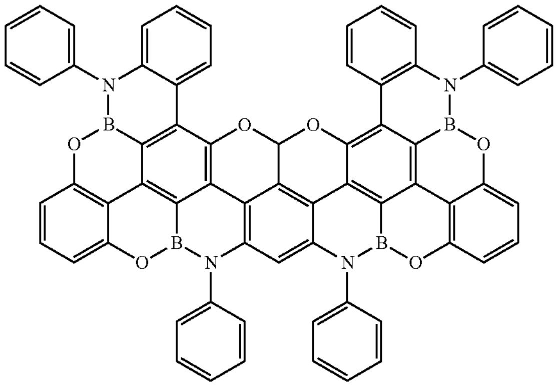
B-14
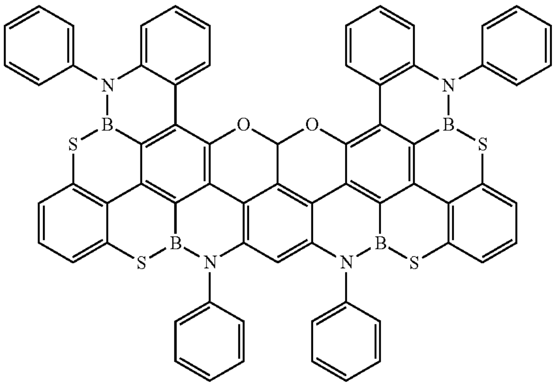
B-15
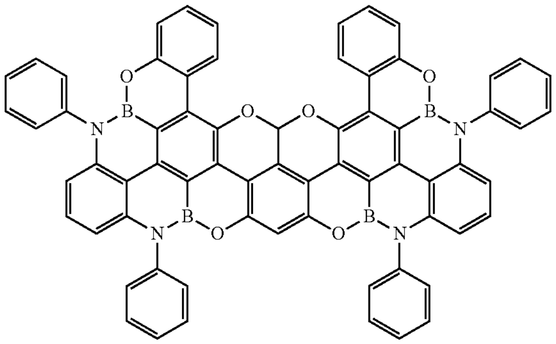
B-16
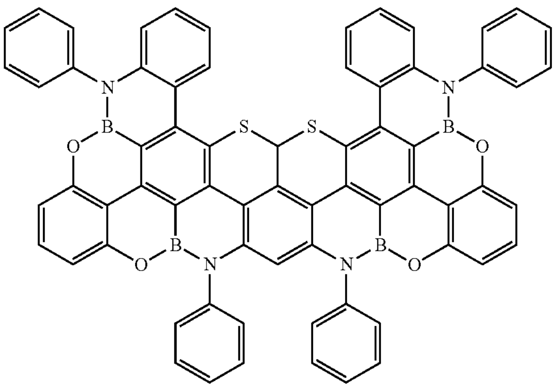
B-17
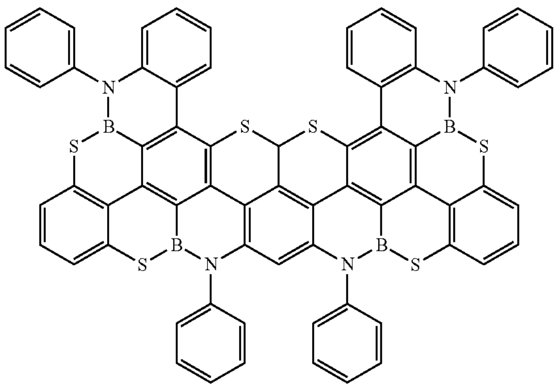

-continued
B-18
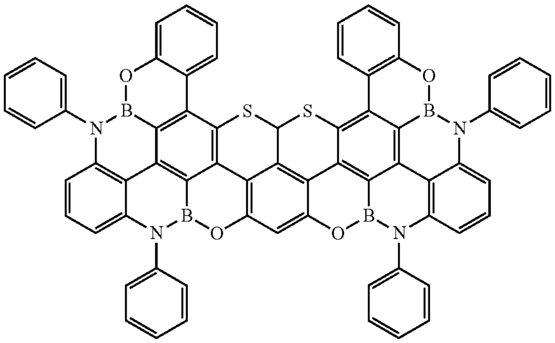
B-19
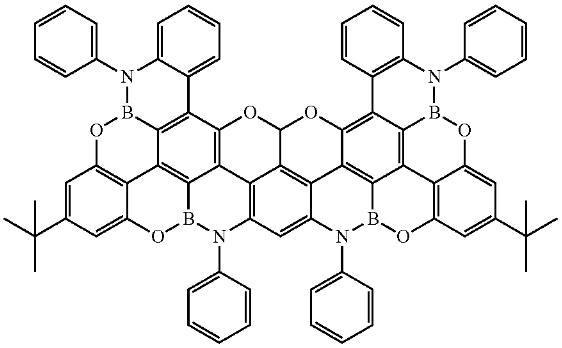
B-20
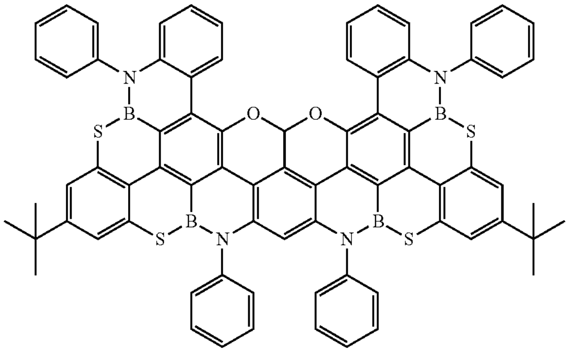
B-21
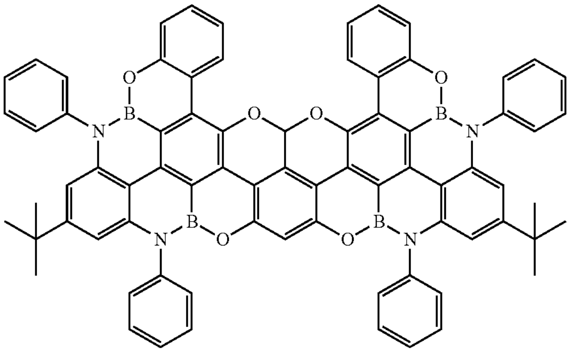
B-22
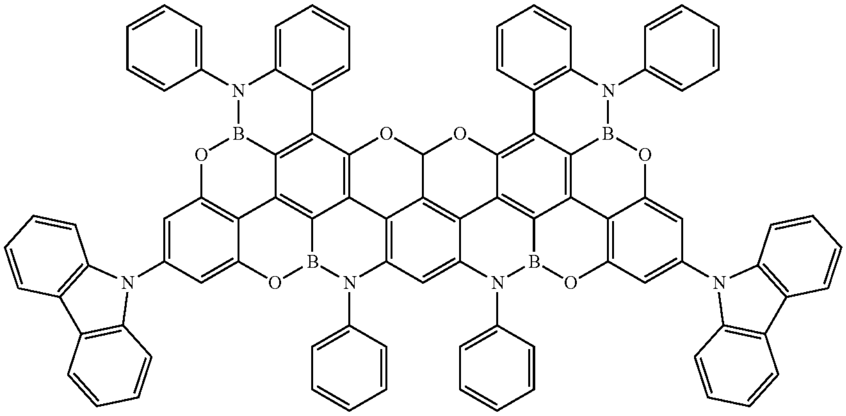
B-23
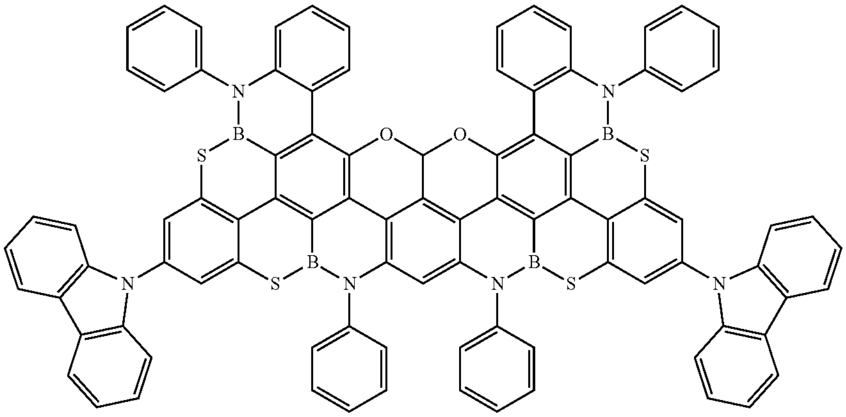

-continued
B-24
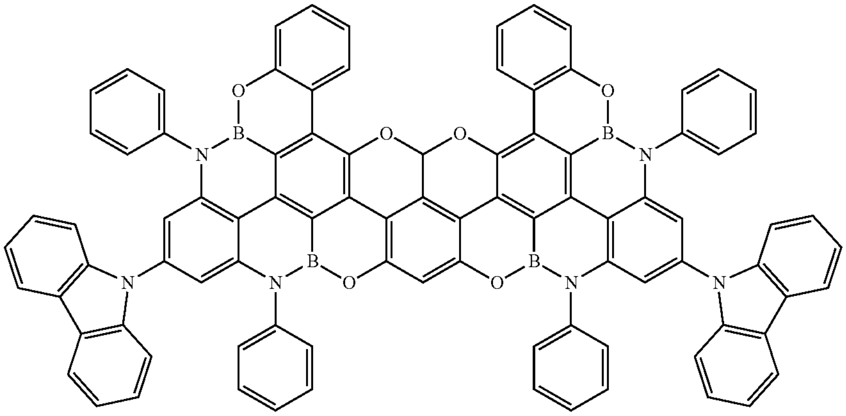
B-25
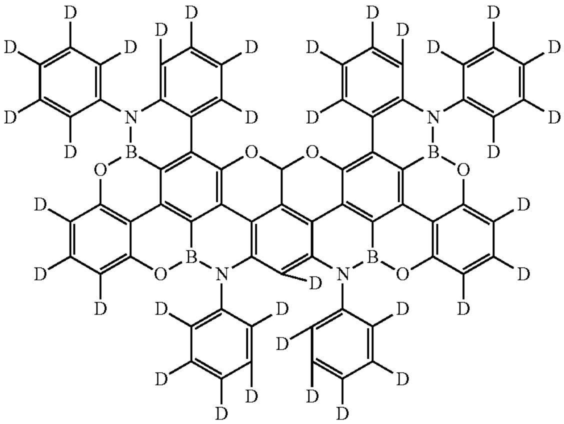
C-1
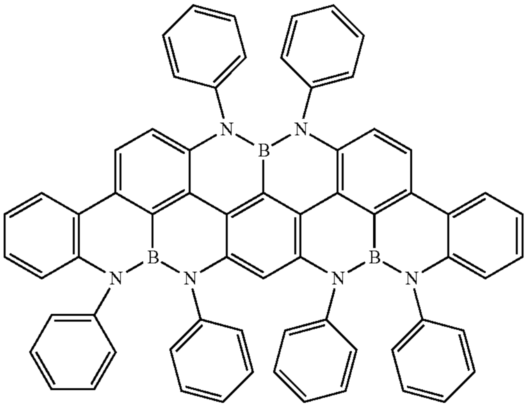
C-2
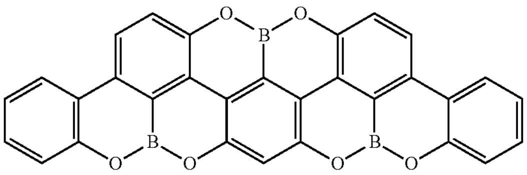
C-3
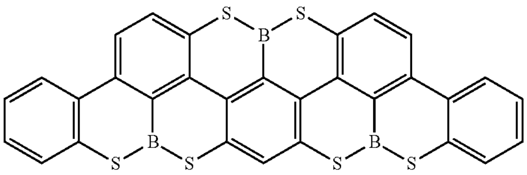
C-4
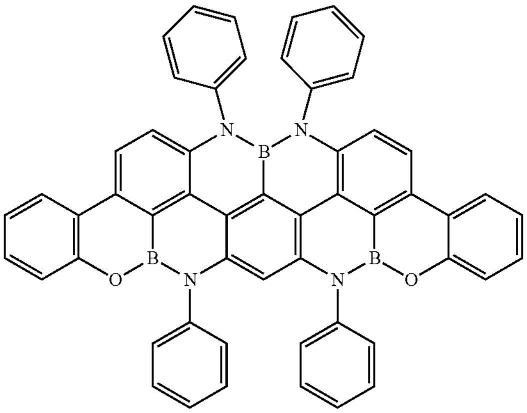
C-5
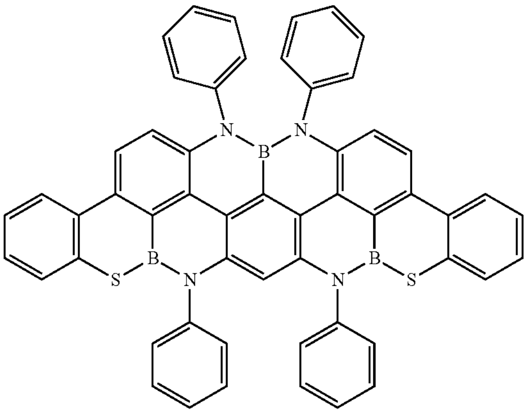

-continued
C-6
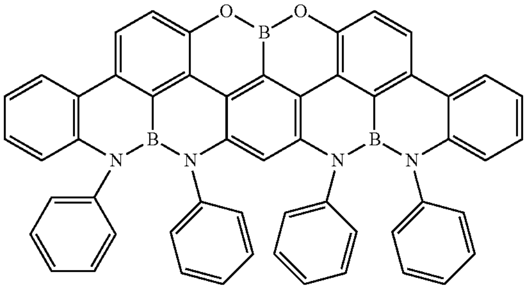
C-7
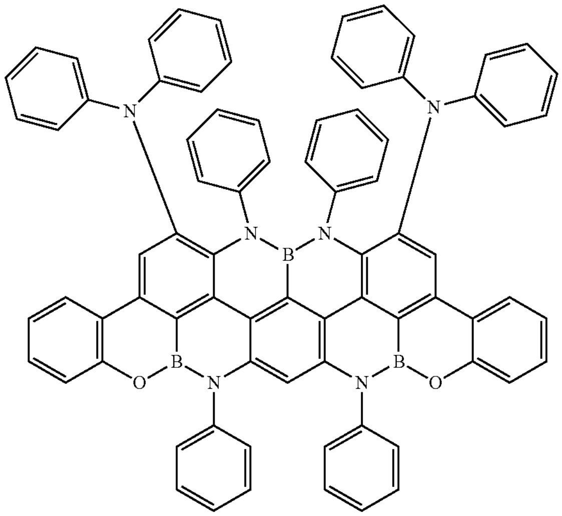
C-8
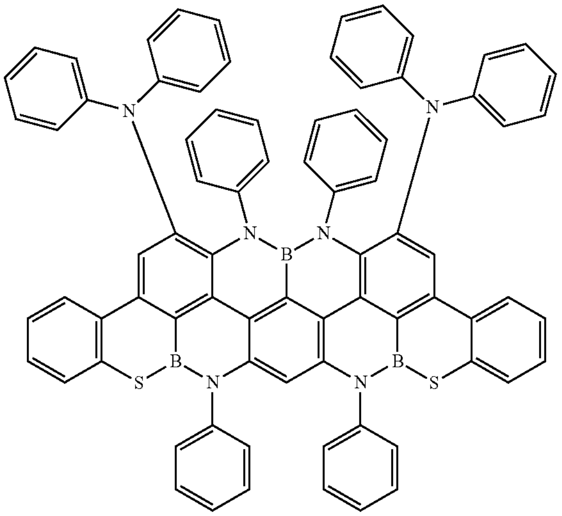
C-9
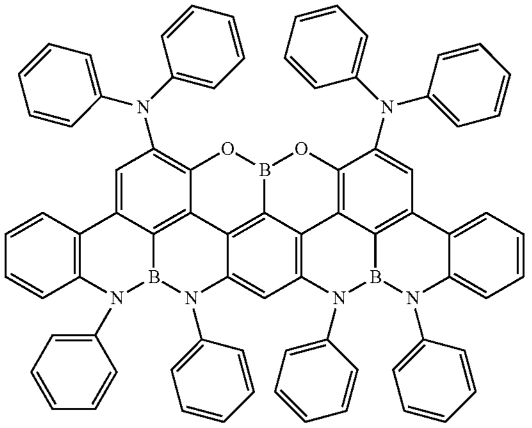
C-10
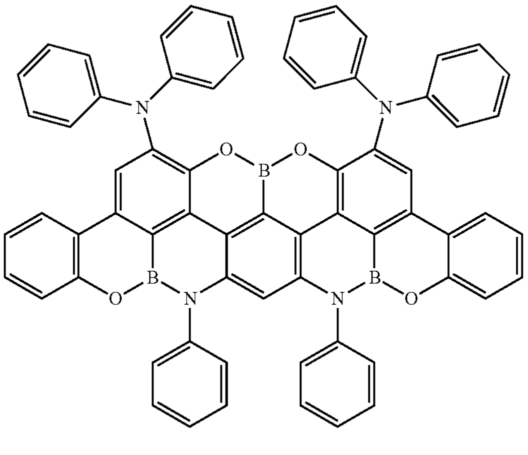
C-11
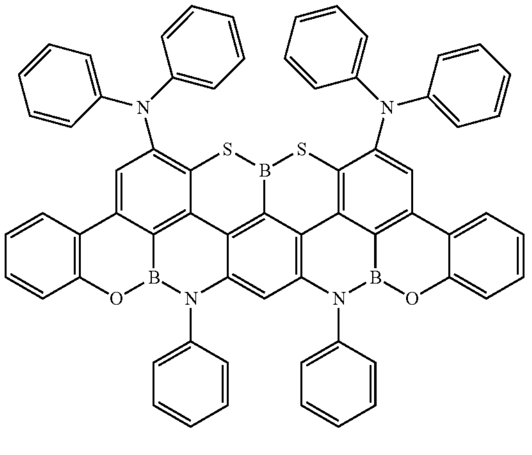

-continued
C-12
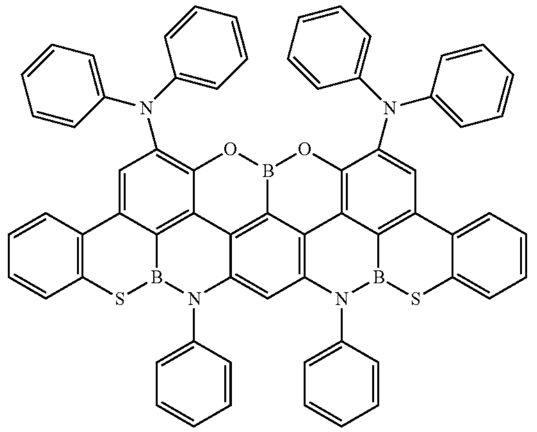
C-13
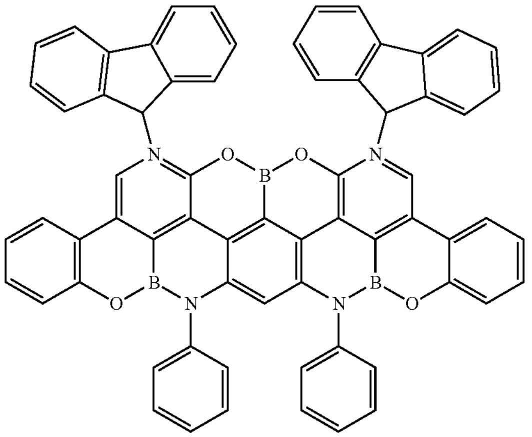
C-14
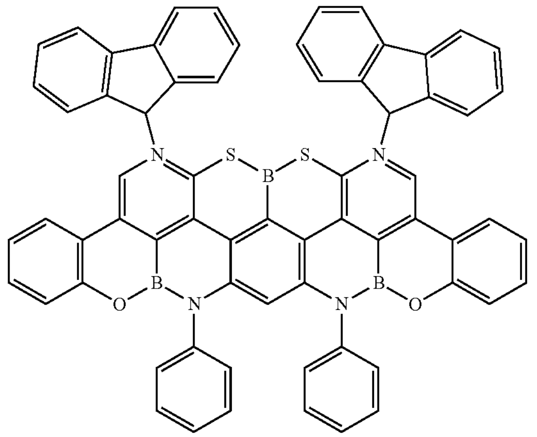
C-15
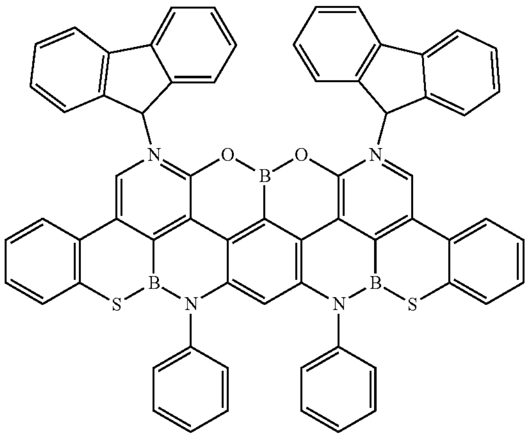
C-16
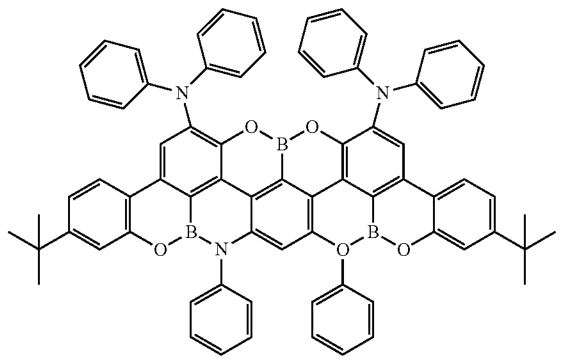
C-17
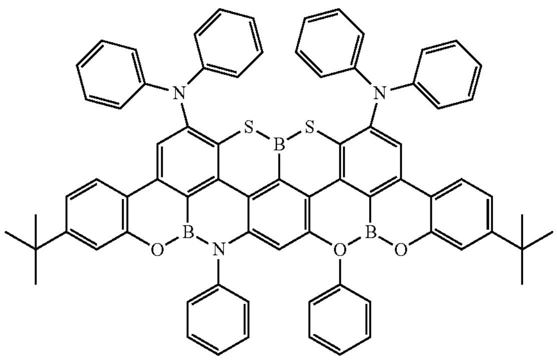
C-18
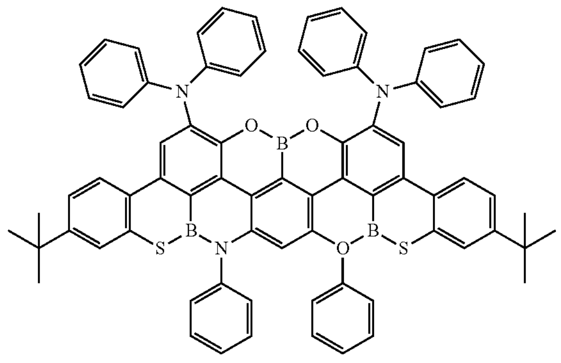
D-1
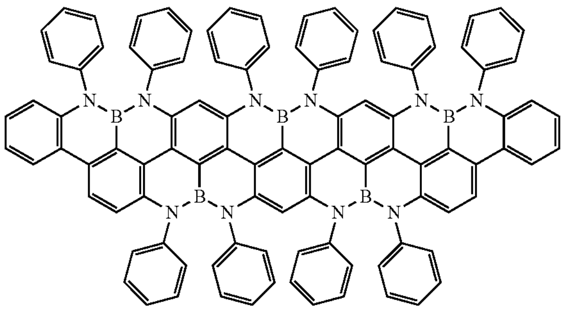

-continued
D-2
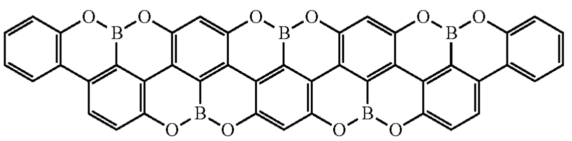
D-3
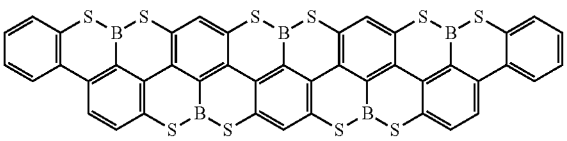
D-4
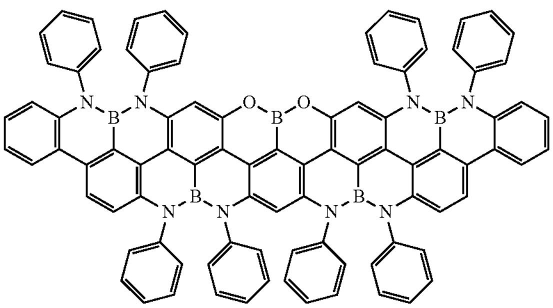
D-5
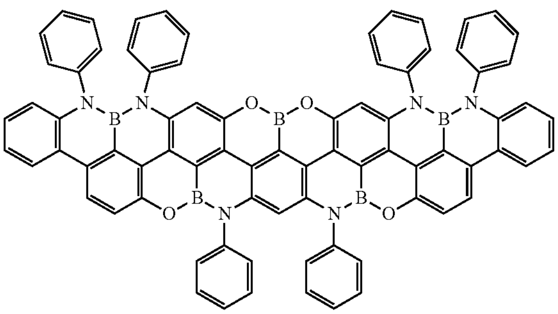
D-6
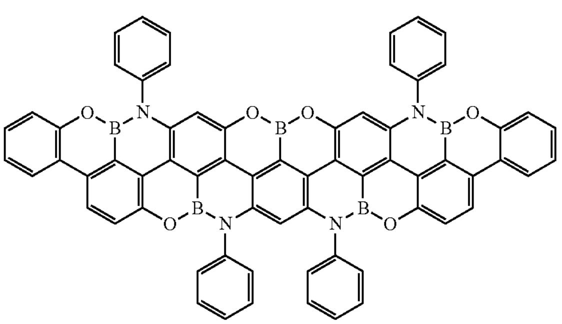
D-7
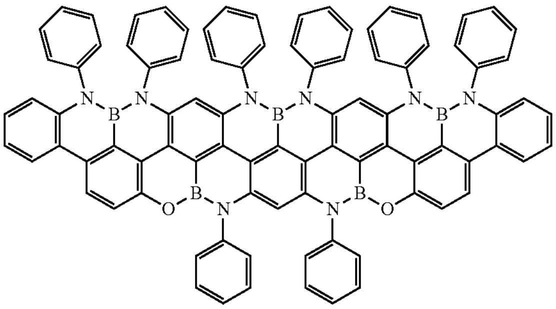
D-8
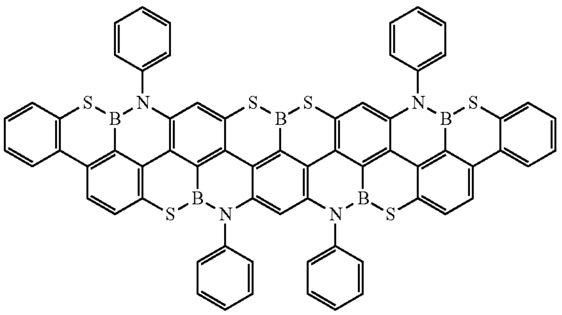
D-9
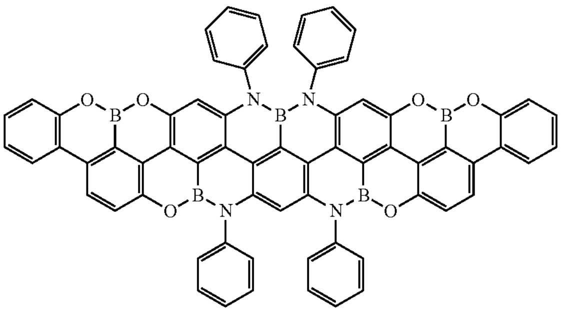
D-10
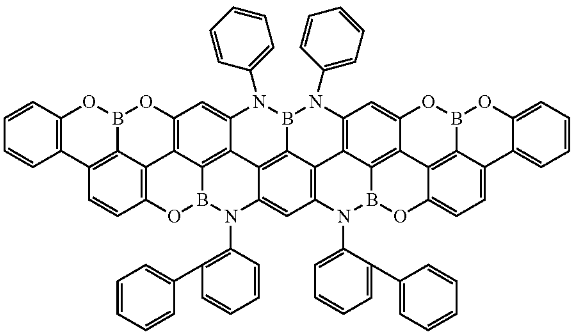
D-11
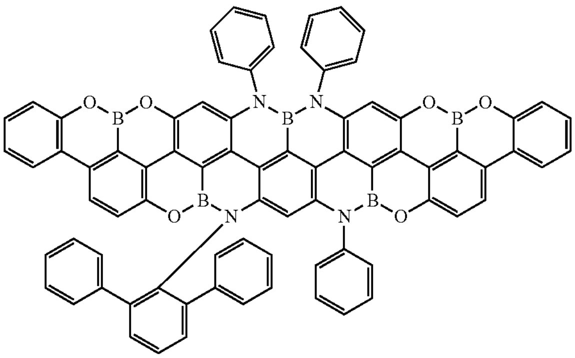

-continued
D-12
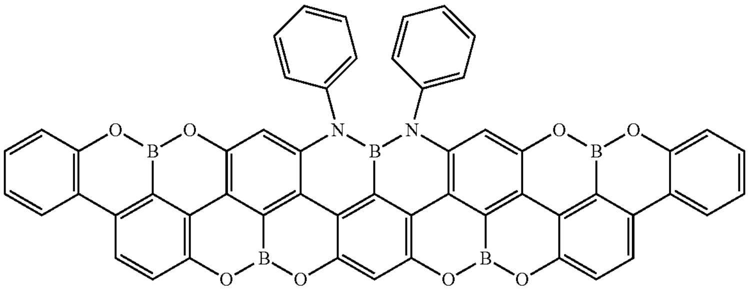
E-1
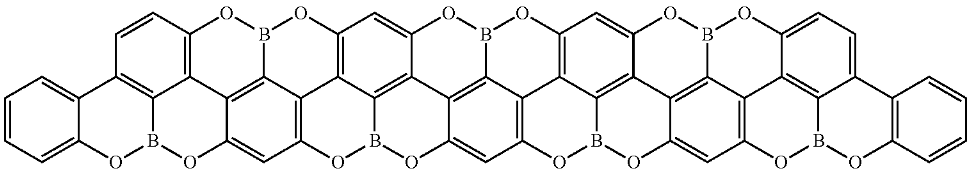
E-2
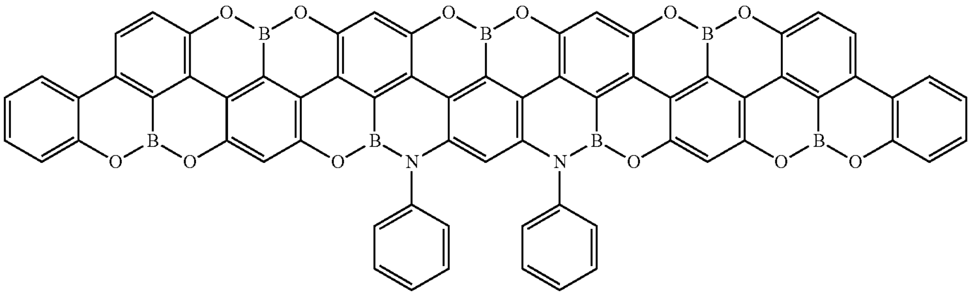
E-3
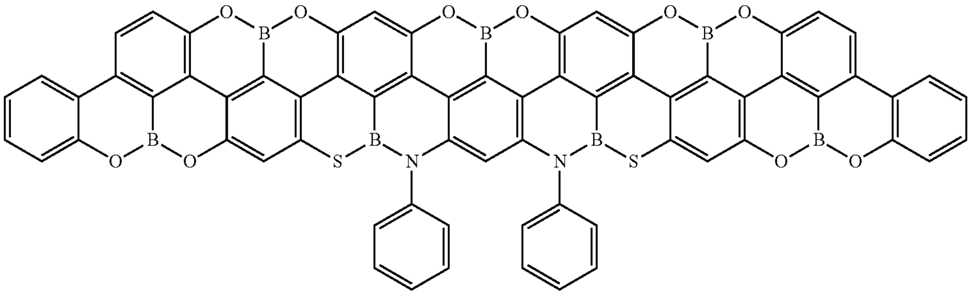
E-4
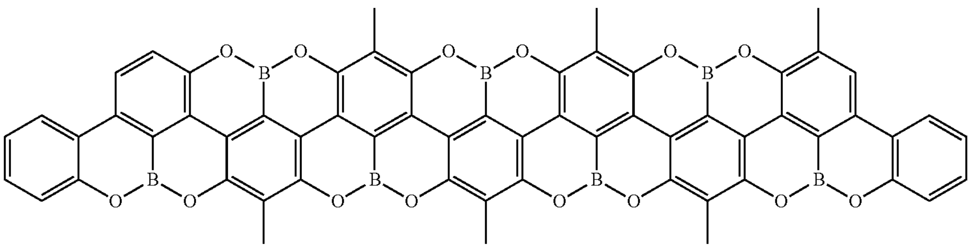

-continued

E-5

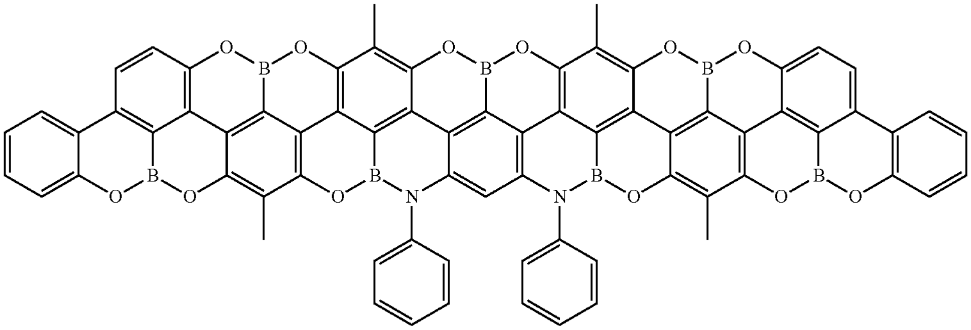

E-6

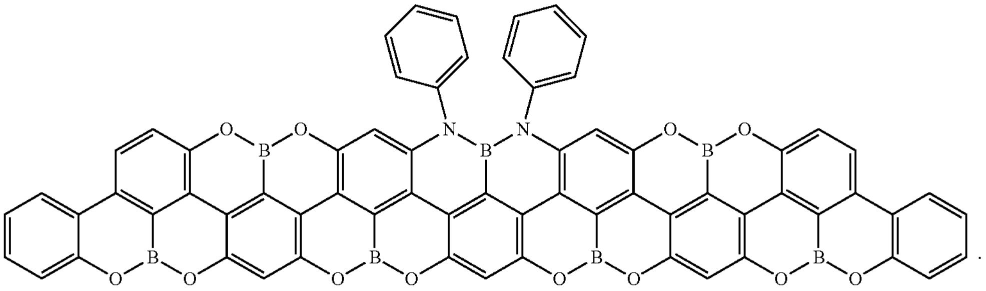

In the light emitting diode ED of an embodiment, the emission layer EML may include a host and a dopant. The dopant may include the above-described polycyclic compound. In an embodiment, the emission layer may emit blue light. In an embodiment, the emission layer may emit thermally activated delayed fluorescence.

In the light emitting diode ED of an embodiment, the emission layer EML may include a host material. For example, the emission layer EML may include anthracene derivatives, pyrene derivatives, fluoranthene derivatives, chrysene derivatives, dihydrobenzanthracene derivatives, or triphenylene derivatives. For example, the emission layer EML may include anthracene derivatives or pyrene derivatives.

In the light emitting diodes ED of embodiments shown in FIG. 3 to FIG. 6, the emission layer EML may include a host and a dopant, and the emission layer EML may include a compound represented by Formula E-1. The compound represented by Formula E-1 may be used as a fluorescence host material.

[Formula E-1]

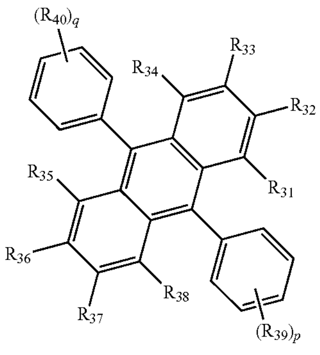

In Formula E-1, $R_{31}$ to $R_{40}$ may each independently be a hydrogen atom, a deuterium atom, a halogen atom, a cyano group, a substituted or unsubstituted thio group, a substituted or unsubstituted oxy group, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula E-1, $R_{31}$ to $R_{40}$ may be combined with an adjacent group to form a saturated hydrocarbon ring, an unsaturated hydrocarbon ring, a saturated heterocycle, or an unsaturated heterocycle.

In Formula E-1, p and q may each independently be an integer from 0 to 5.

The compound represented by Formula E-1 may be any one selected from Compound E1 to Compound E19.

E1

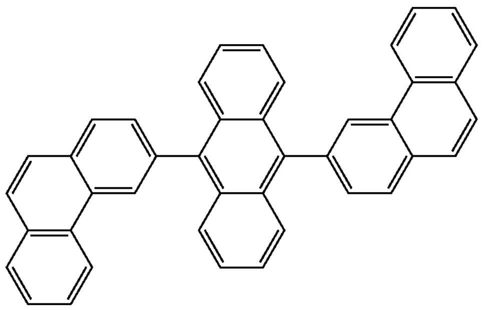

-continued
E2
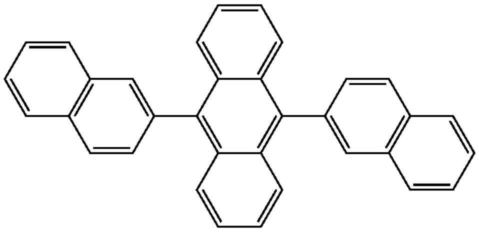
E3
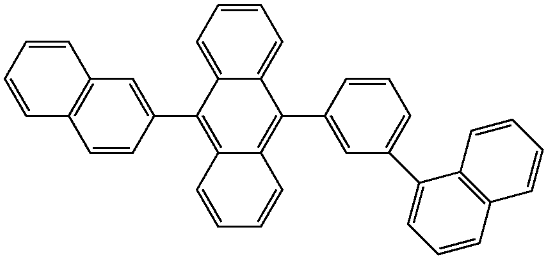
E4
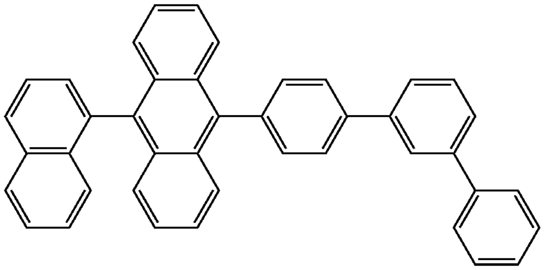
E5
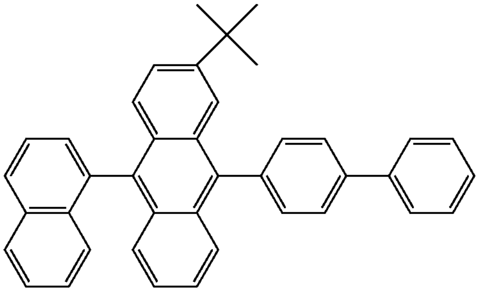
E6
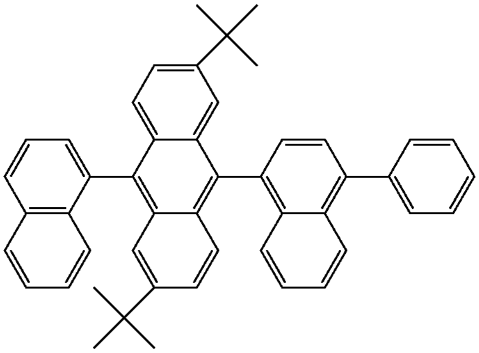
-continued
E7
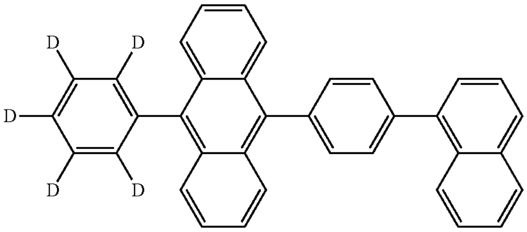
E8
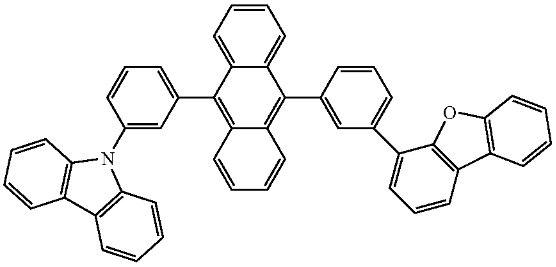
E9
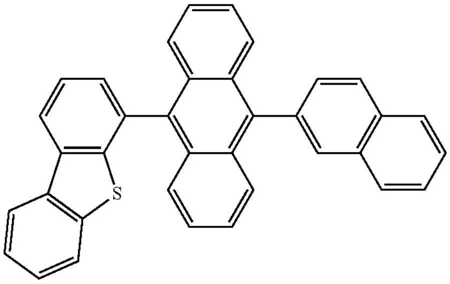
E10
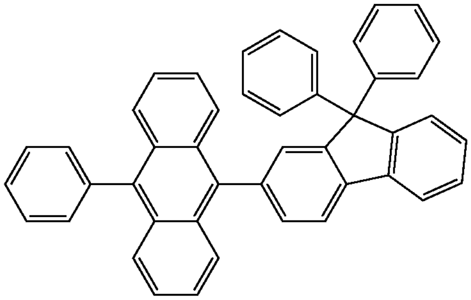
E11
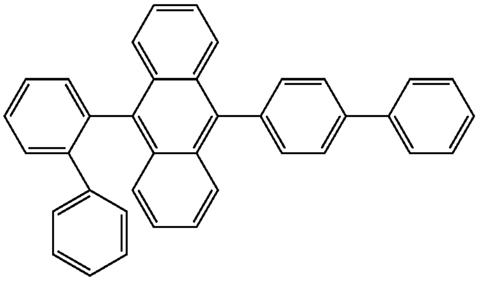

-continued
E12
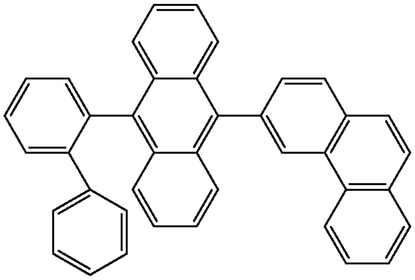
E13
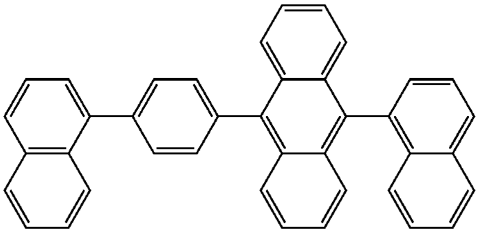
E14
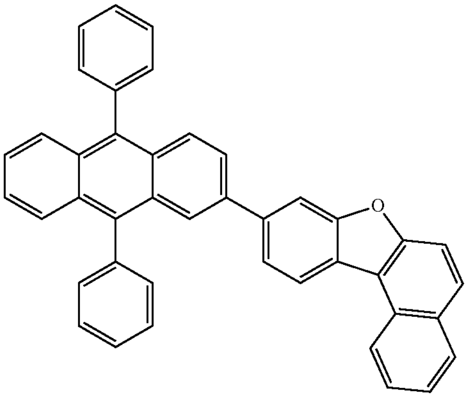
E15
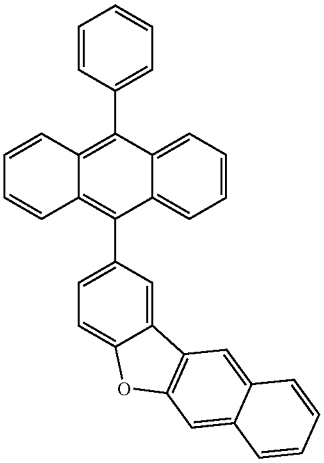
-continued
E16
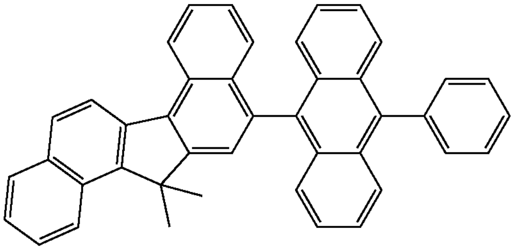
E17
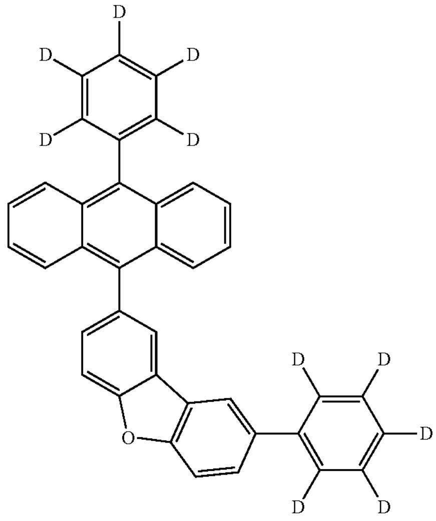
E18
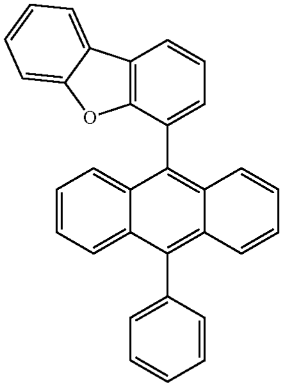
E19
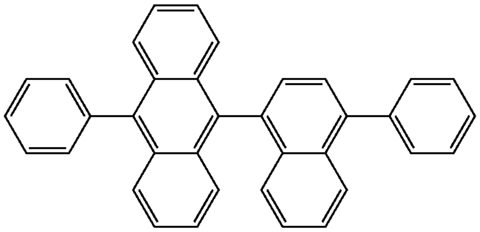
In an embodiment, the emission layer EML may include a compound represented by Formula E-2a or Formula E-2b. The compound represented by Formula E-2a or Formula E-2b may be used as a phosphorescence host material.

[Formula E-2A]

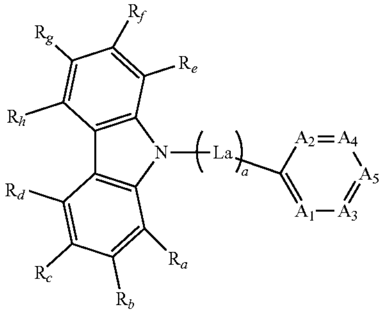

In Formula E-2a, a may be an integer from 0 to 10, and $L_a$ may be a direct linkage, a substituted or unsubstituted arylene group of 6 to 30 ring-forming carbon atoms, or a substituted or unsubstituted heteroarylene group of 2 to 30 ring-forming carbon atoms. If a is 2 or more, multiple $L_a$ groups may each independently be a substituted or unsubstituted arylene group of 6 to 30 ring-forming carbon atoms, or a substituted or unsubstituted heteroarylene group of 2 to 30 ring-forming carbon atoms.

In Formula E-2a, $A_1$ to $A_5$ may each independently be N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. $R_a$ to $R_i$ may be combined with an adjacent group to form a hydrocarbon ring or a heterocycle including N, O, S, etc. as a ring-forming atom.

In Formula E-2a, two or three of $A_1$ to $A_5$ may be N, and the remainder of $A_1$ to $A_5$ may be $C(R_i)$.

[Formula E-2b]

$$(Cbz1)\text{—}(L_b)_b\text{—}(Cbz2)$$

In Formula E-2b, Cbz1 and Cbz2 may each independently BE an unsubstituted carbazole group or a carbazole group which is substituted with an aryl group of 6 to 30 ring-forming carbon atoms. $L_b$ may be a direct linkage, a substituted or unsubstituted arylene group of 6 to 30 ring-forming carbon atoms, or a substituted or unsubstituted heteroarylene group of 2 to 30 ring-forming carbon atoms. In Formula E-2b, b may be an integer from 0 to 10, and if b is 2 or more, multiple $L_b$ groups may each independently be a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be any one selected from Compound Group E-2. However, the compounds listed in Compound Group E-2 are only examples, and the compound represented by Formula E-2a or Formula E-2b is not limited to the compounds listed in Compound Group E-2.

[Compound Group E-2]

E-2-1

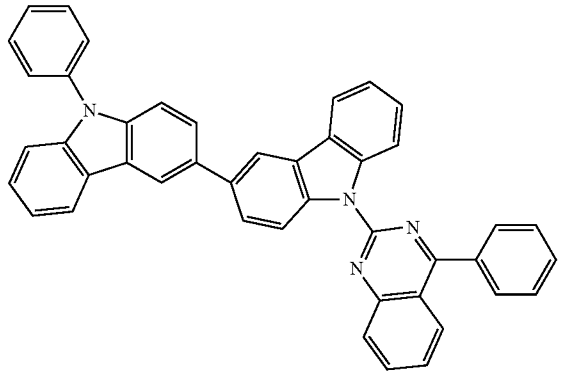

E-2-2

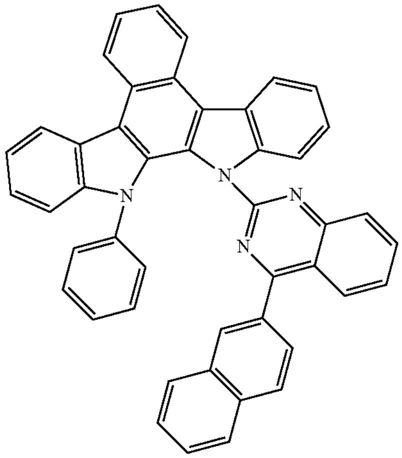

E-2-3

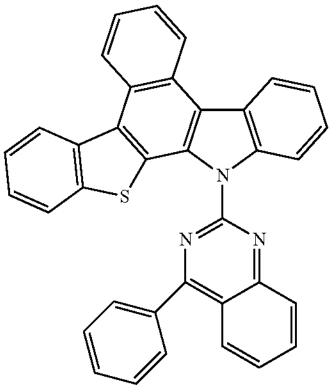

-continued
E-2-4
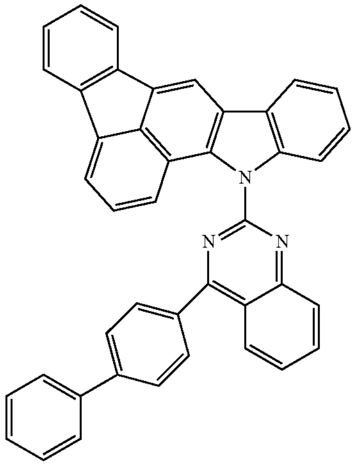
E-2-5
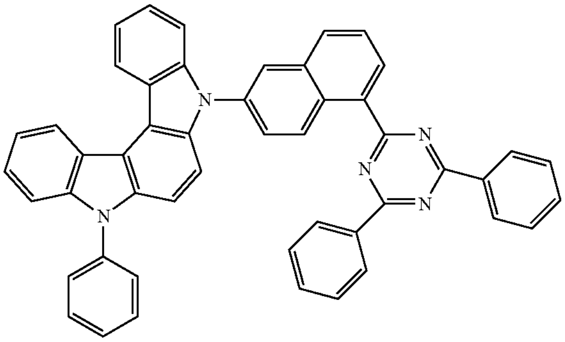
E-2-6
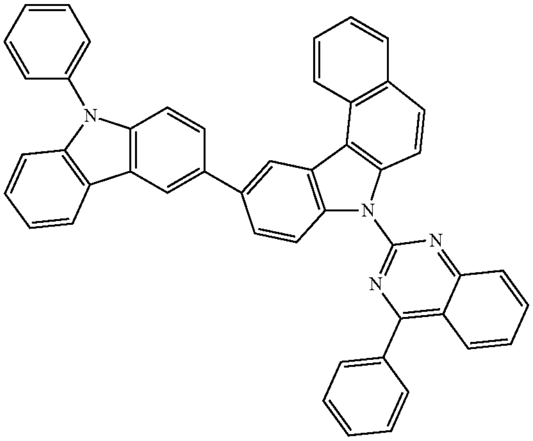
-continued
E-2-7
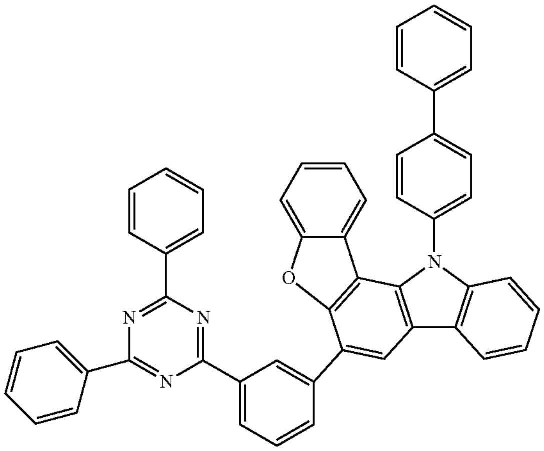
E-2-8
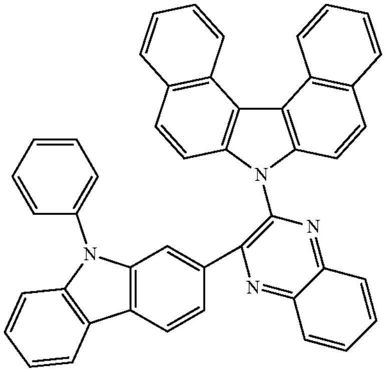
E-2-9
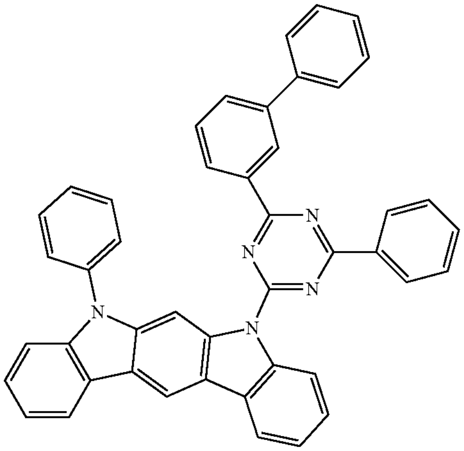

-continued
E-2-10
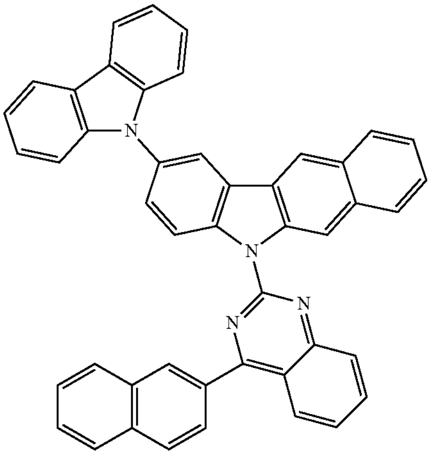
E-2-11
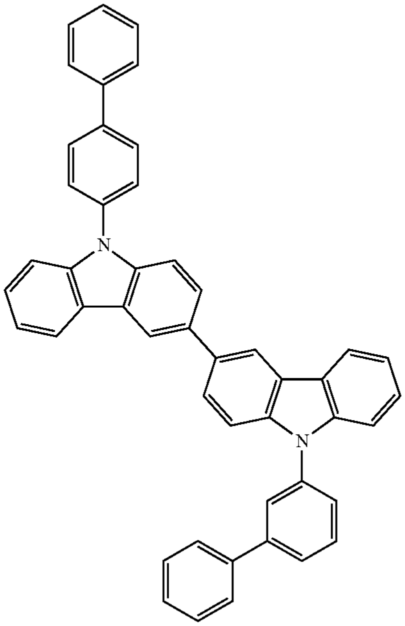
E-2-12
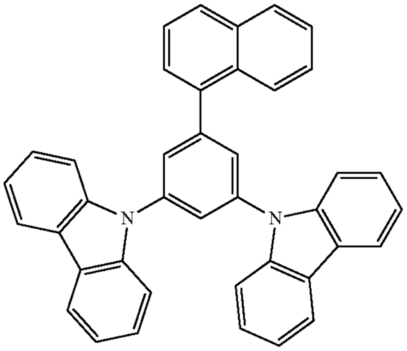
-continued
E-2-13
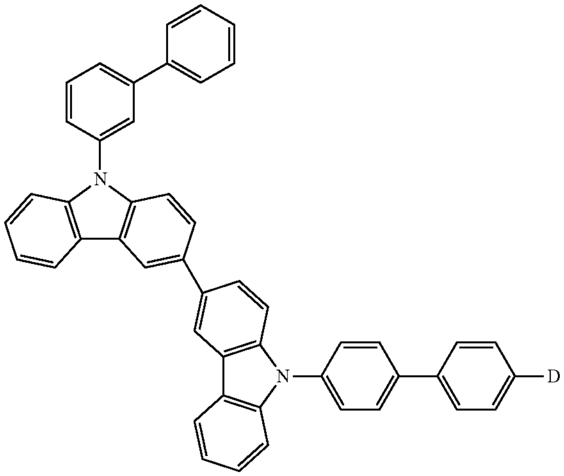
E-2-14
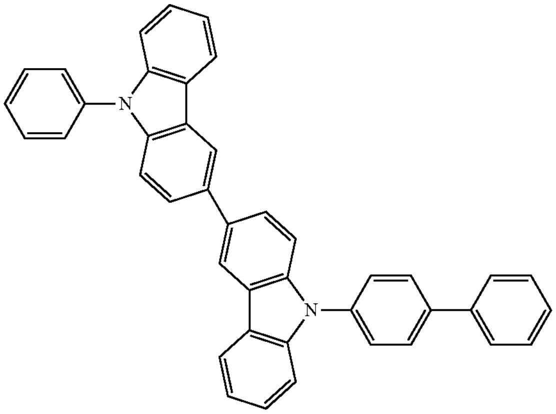
E-2-15
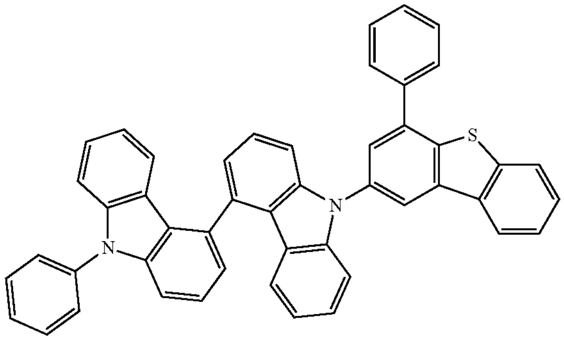

-continued
E-2-16
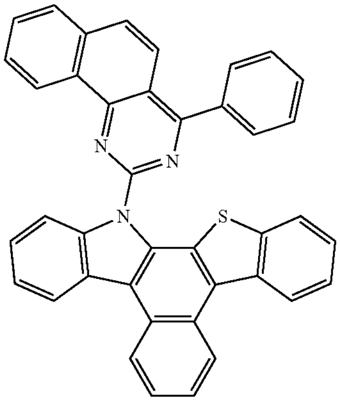
E-2-17
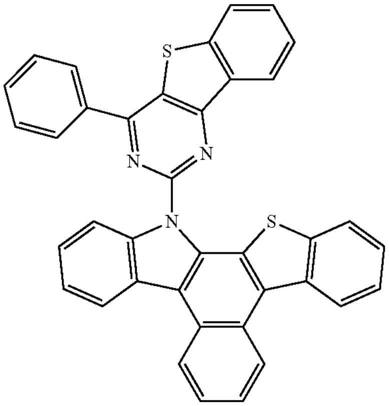
E-2-18
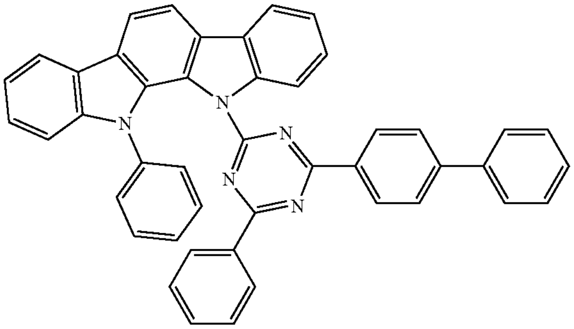
E-2-19
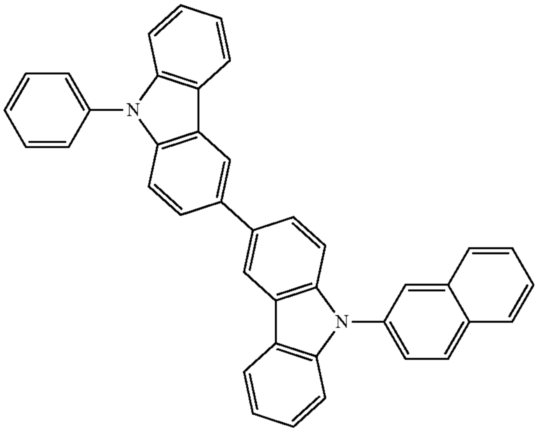
-continued
E-2-20
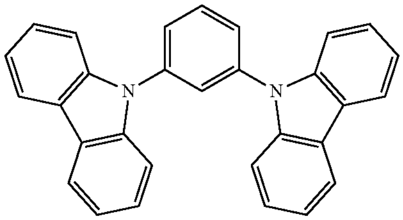
E-2-21
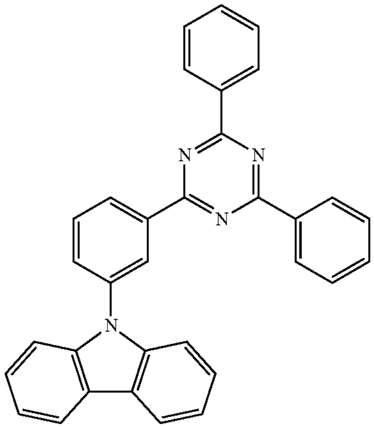
E-2-22
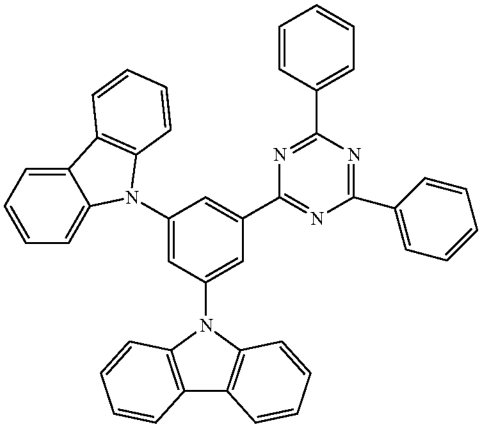
E-2-23
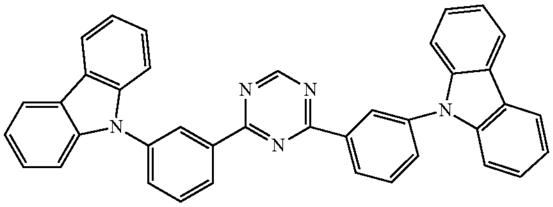

-continued

E-2-24

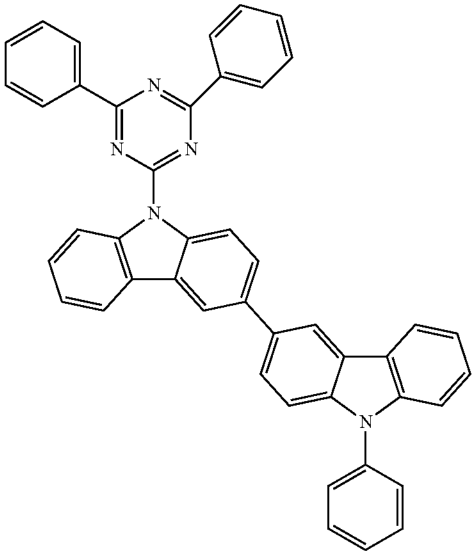

E-2-25

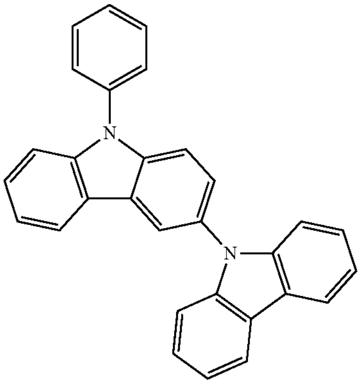

The emission layer EML may further include a material of the art as a host material. For example, the emission layer EML may include as a host material, at least one of bis(4-(9H-carbazol-9-yl)phenyl) diphenylsilane (BCPDS), (4-(1-(4-(diphenylamino)phenyl) cyclohexyl)phenyl) diphenyl-phosphine oxide (POPCPA), bis[2-(diphenylphosphino) phenyl] ether oxide (DPEPO), 4,4'-bis(carbazol-9-yl)biphenyl (CBP), 1,3-bis(carbazol-9-yl)benzene (mCP), 2,8-bis (diphenylphosphoryl)dibenzo[b,d]furan (PPF), 4,4',4"-tris (carbazol-9-yl)-triphenylamine (TCTA), or 1,3,5-tris(1-phenyl-1H-benzo[d]imidazole-2-yl)benzene (TPBi). However, embodiments are not limited thereto. For example, tris(8-hydroxyquinolino)aluminum ($Alq_3$), 9,10-di (naphthalene-2-yl)anthracene (ADN), 2-tert-butyl-9,10-di (naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl) anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as the host material.

The emission layer EML may include a compound represented by Formula M-a or Formula M-b. The compound represented by Formula M-a or Formula M-b may be used as a phosphorescence dopant material.

[Formula M-a]

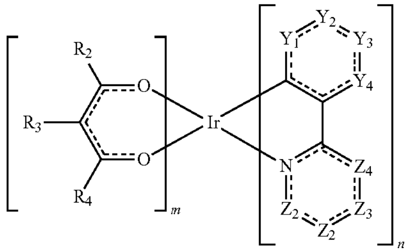

In Formula M-a, $Y_1$ to $Y_4$ and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula M-a, m may be 0 or 1, and n may be 2 or 3. In Formula M-a, if m is 0, n may be 3, and if m is 1, n may be 2.

The compound represented by Formula M-a may be used as a phosphorescence dopant.

The compound represented by Formula M-a may be any one selected from Compounds M-a1 to M-a25. However, Compounds M-a1 to M-a25 are only examples, and the compound represented by Formula M-a is not limited to Compounds M-a1 to M-a25.

M-a1

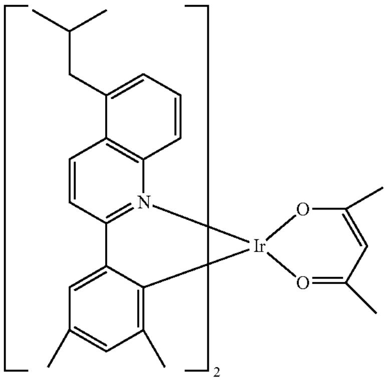

-continued
M-a2
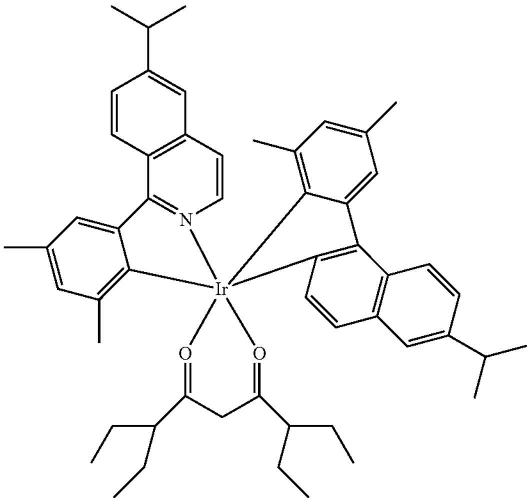
M-a3
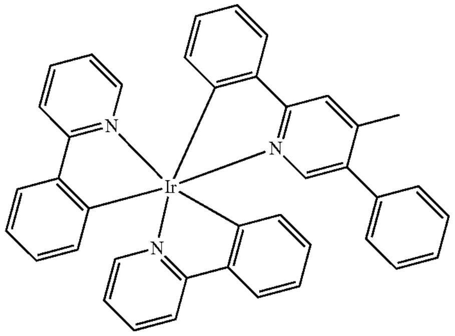
M-a4
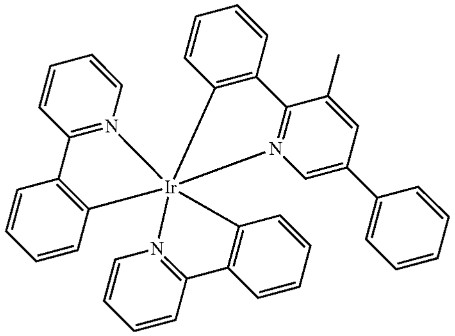
M-a5
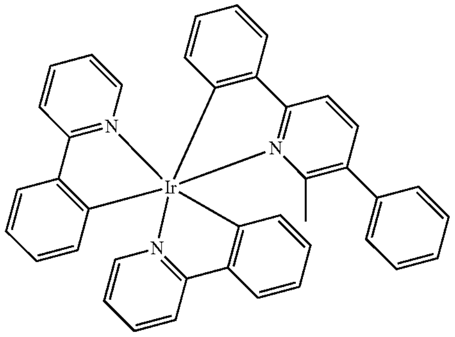
-continued
M-a6
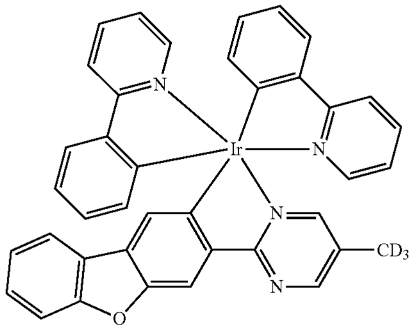
M-a7
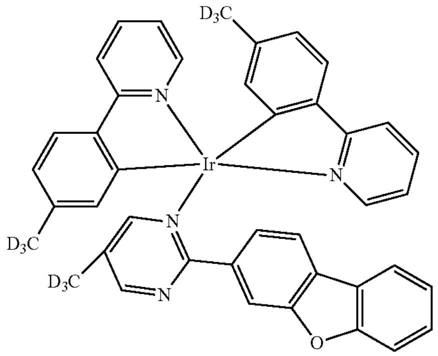
M-a8
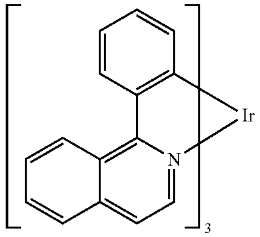
M-a9
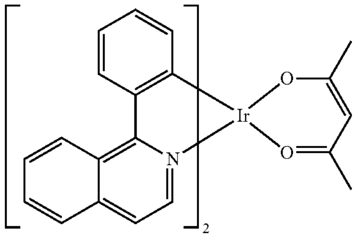
M-a10
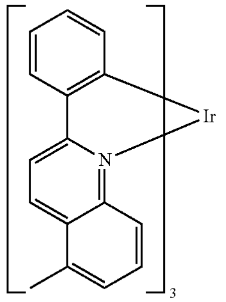

M-a11
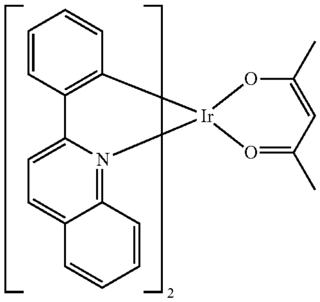
M-a12
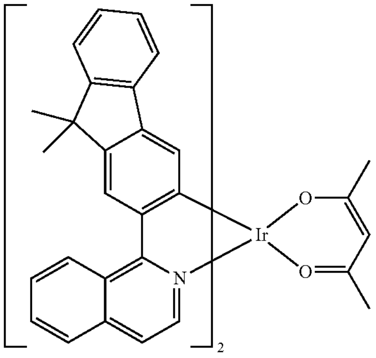
M-a13
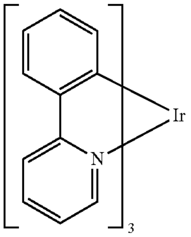
M-a14
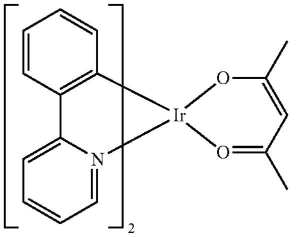
M-a15
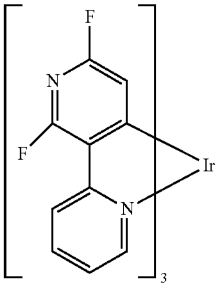
M-a16
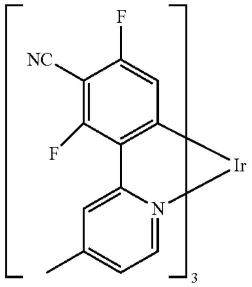
M-a17
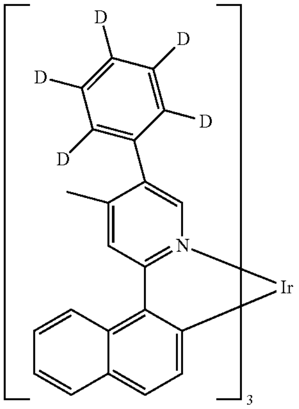
M-a18
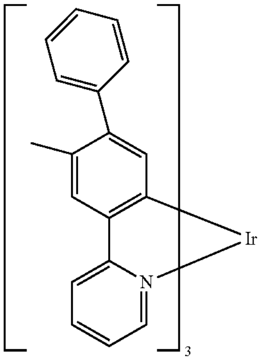
M-a19
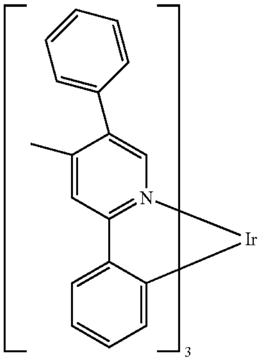

-continued

M-a20

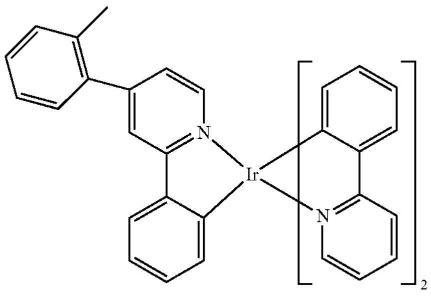

M-a21

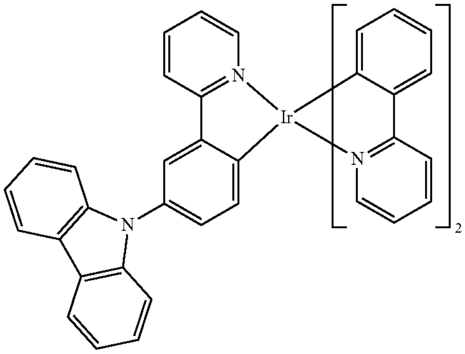

M-a22

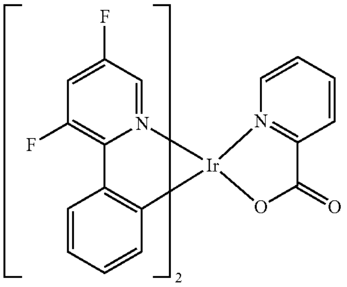

M-a23

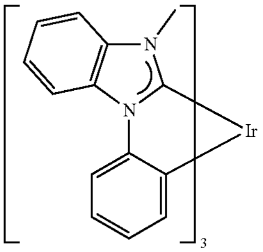

M-a24

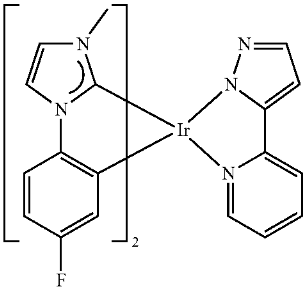

-continued

M-a25

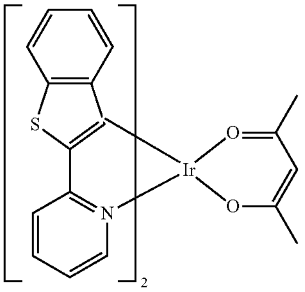

Compound M-a1 and Compound M-a2 may be used as red dopant materials, and Compound M-a3 to Compound M-a7 may be used as green dopant materials.

In an embodiment, the emission layer EML of the light emitting diode ED may include at least one of a polycyclic compound represented by Formula A or Formula B, a compound represented by Formula E-2b, or a compound represented by Formula M-b.

[Formula M-b]

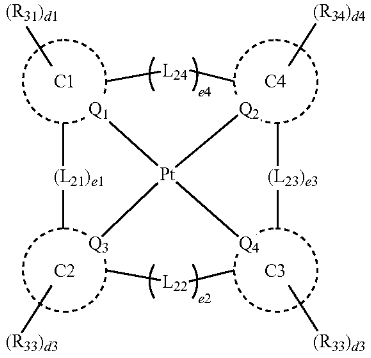

In Formula M-b, $Q_1$ to $Q_4$ may each independently be C or N, C1 to C4 may each independently be a substituted or unsubstituted hydrocarbon ring of 5 to 30 ring-forming carbon atoms, or a substituted or unsubstituted heterocycle of 2 to 30 ring-forming carbon atoms. In Formula M-b, $L_{21}$ to $L_{24}$ may each independently be a direct linkage,

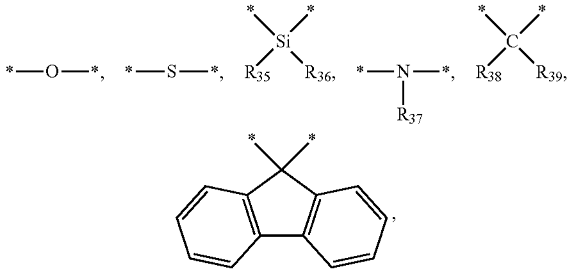

a substituted or unsubstituted divalent alkyl group of 1 to 30 carbon atoms, a substituted or unsubstituted arylene group of 6 to 50 ring-forming carbon atoms, or a substituted or unsubstituted heteroarylene group of 2 to 50 ring-forming carbon atoms, and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, and d1 to d4 may each independently be an integer from 0 to 4.

The compound represented by Formula M-b may be used as a blue phosphorescence dopant or as a green phosphorescence dopant.

The compound represented by Formula M-b may be any one selected from Compound M-b-1 to Compound M-b-11. For example, the compound represented by Formula M-b may be Compound M-b-10. However, Compound M-b-1 to Compound M-b-11 are only examples, and the compound represented by Formula M-b is not limited to Compound M-b-1 to Compound M-b-11.

M-b-1

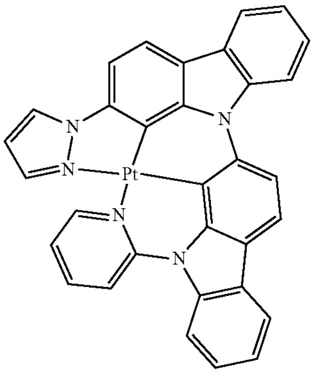

M-b-2

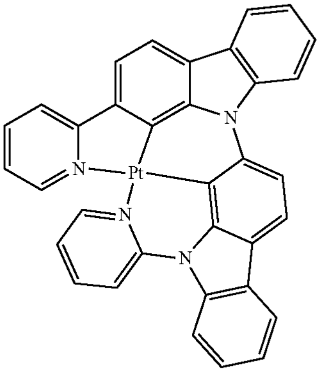

M-b-3

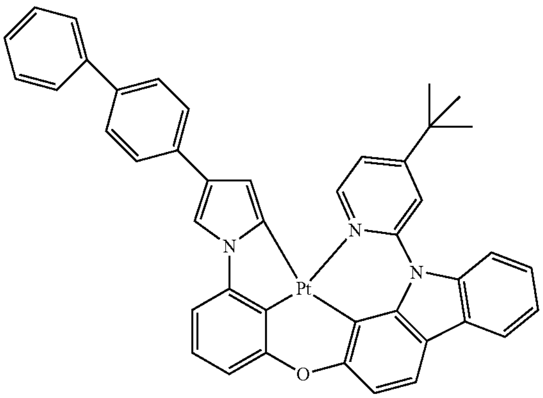

-continued

M-b-4

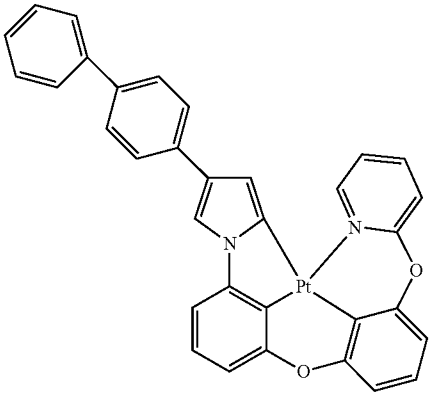

M-b-5

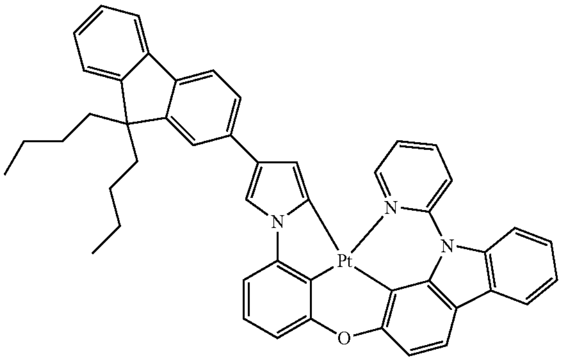

M-b-6

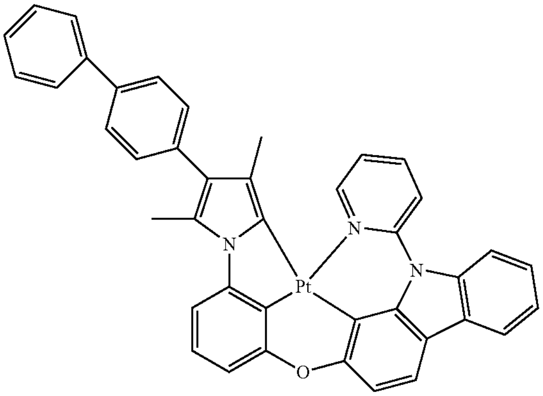

M-b-7

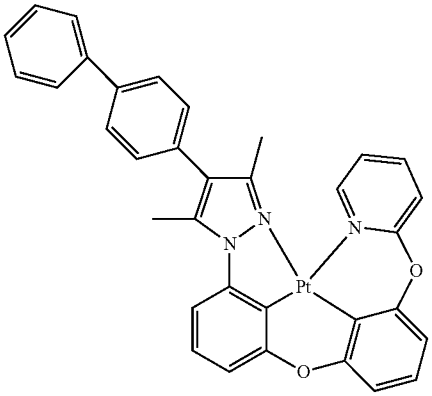

-continued

M-b-8

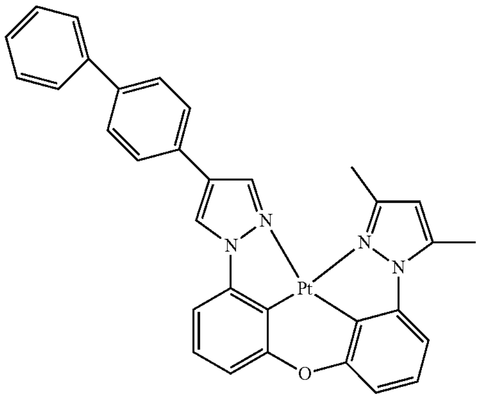

M-b-9

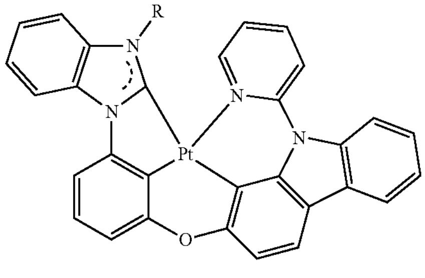

M-b-10

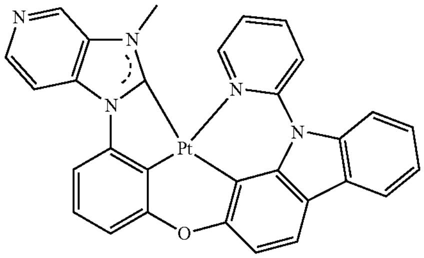

M-b-11

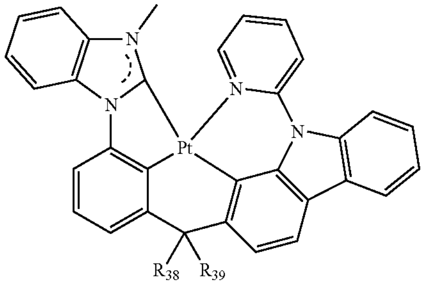

In Compound M-b-1 to Compound M-b-11, R, $R_{38}$, and $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

The emission layer EML may include a compound represented by any one of Formula F-a to Formula F-c. The compounds represented by Formula F-a to Formula F-c may be used as fluorescence dopant materials.

[Formula F-a]

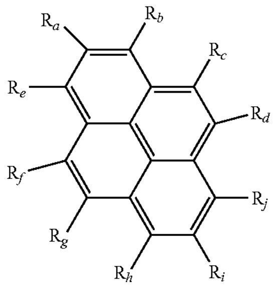

In Formula F-a, two of $R_a$ to $R_j$ may each independently be substituted with a group represented by $*—NAr_1Ar_2$. The remainder of $R_a$ to $R_j$ not substituted with the group represented by $*—NAr_1Ar_2$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In the group represented by $*—NAr_1Ar_2$, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. For example, at least one of $Ar_1$ or $Ar_2$ may be a heteroaryl group including O or S as a ring-forming atom.

The emission layer EML may include at least one of Compounds FD1 to FD22 as a fluorescence dopant.

FD1

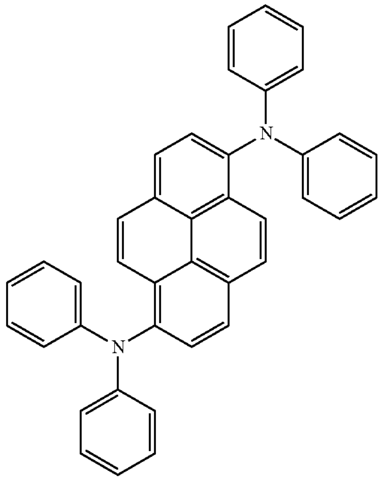

-continued
FD2
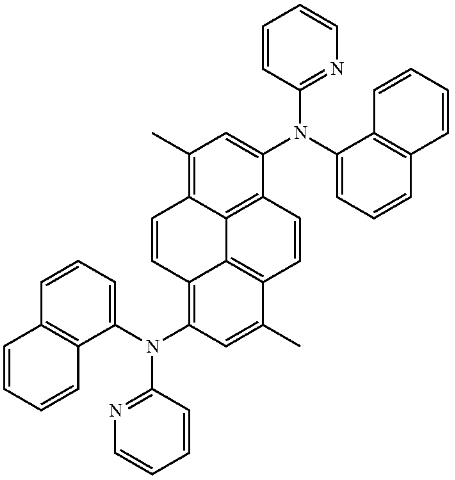
FD3
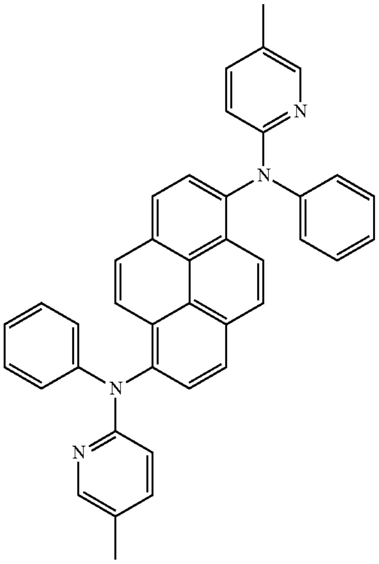
FD4
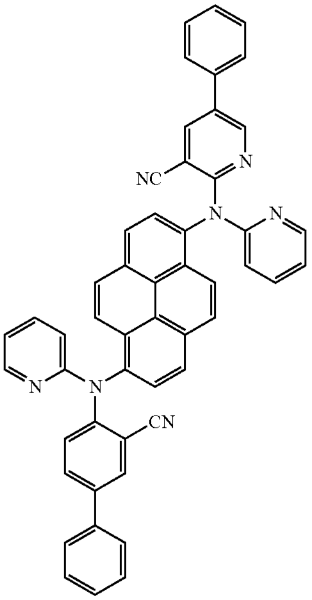
-continued
FD5
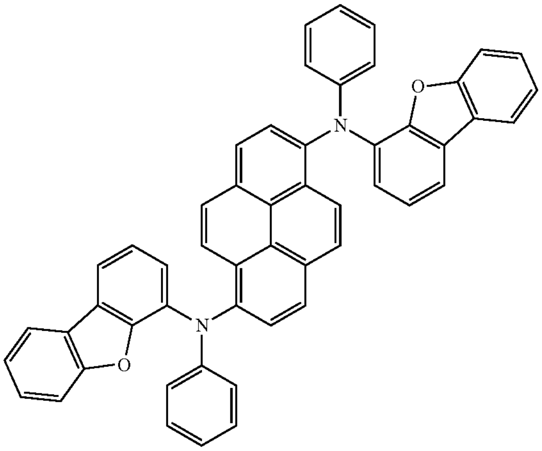
FD6
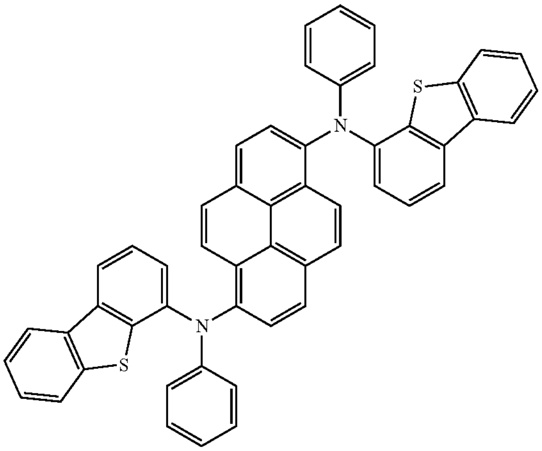
FD7
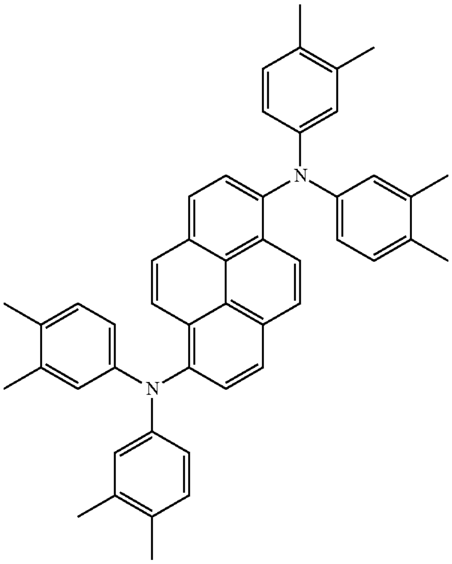

-continued
FD8
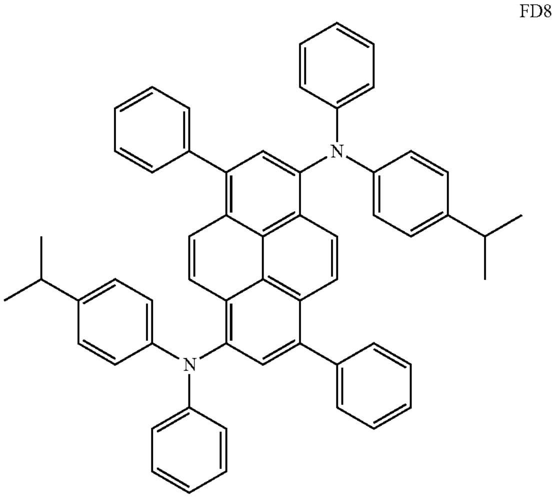
FD9
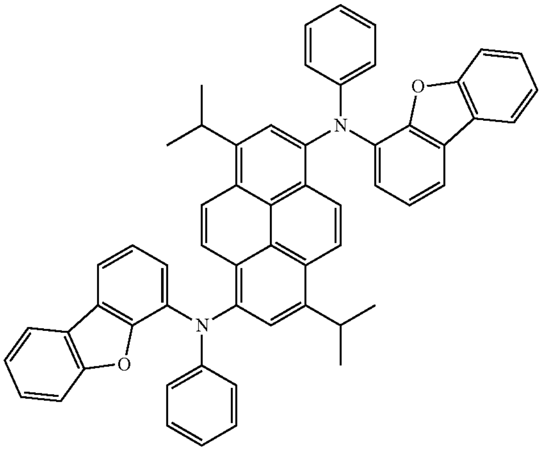
FD10
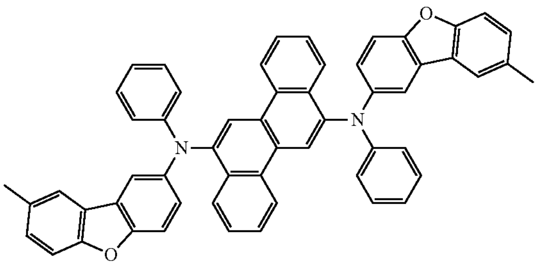
FD11
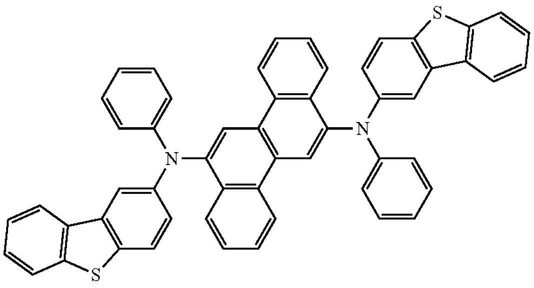
-continued
FD12
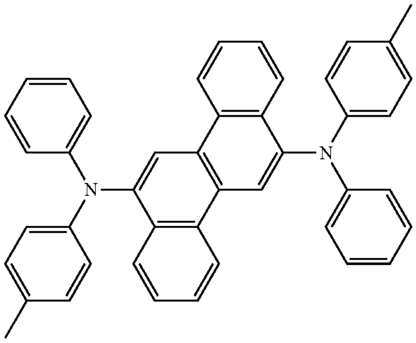
FD13
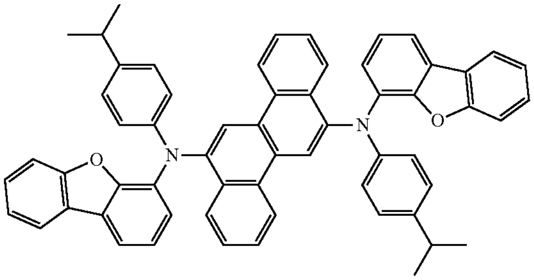
FD14
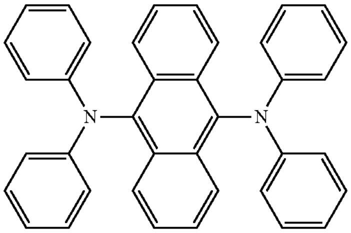
FD15
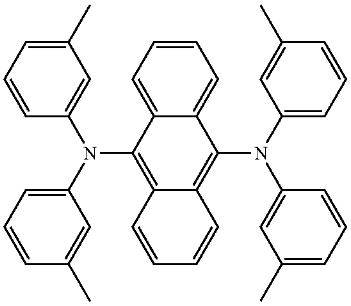
FD16
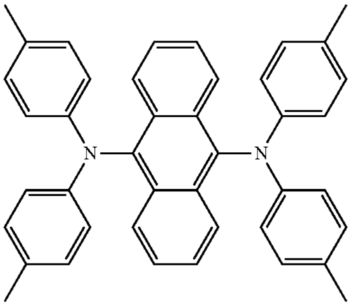

-continued

FD17

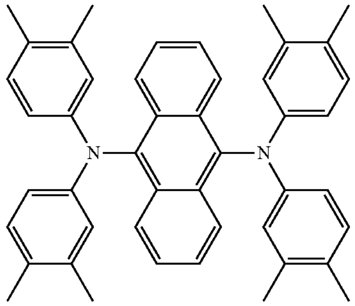

FD18

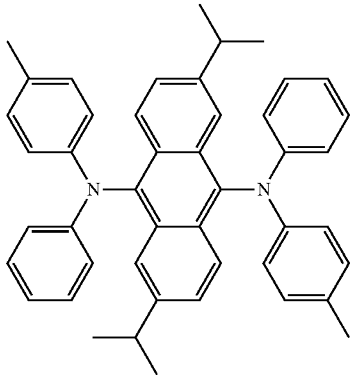

FD19

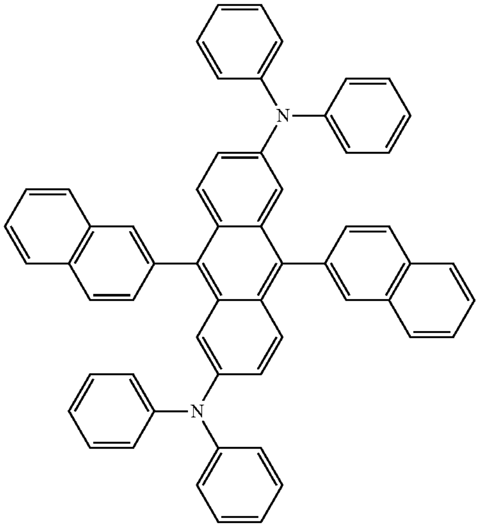

FD20

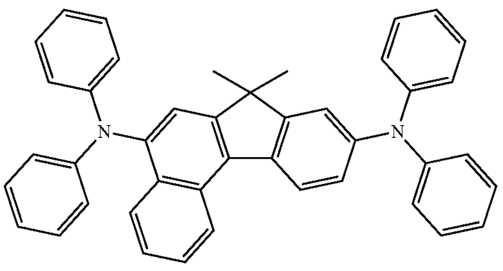

-continued

FD21

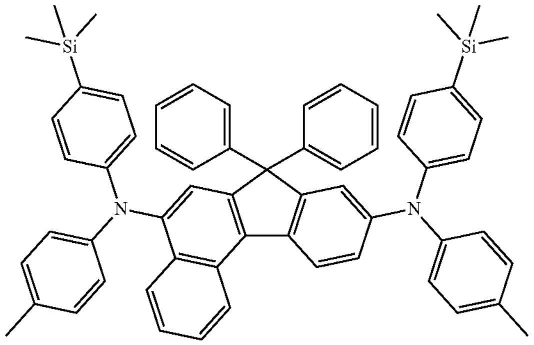

FD22

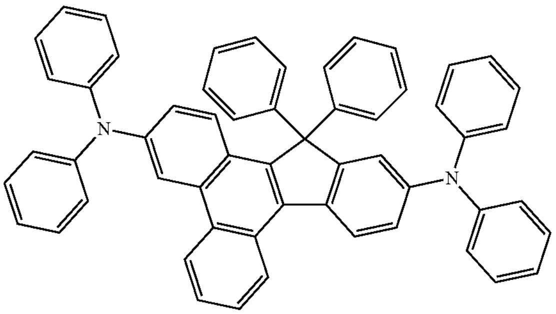

[Formula F-b]

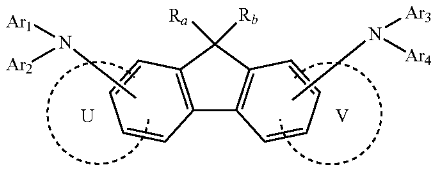

In Formula F-b, $R_a$ and Rb may each independently be a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-b, U and V may each independently be a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may each independently be 0 or 1. For example, in Formula F-b, if the number of U or V is 1, a fused ring may be present at the part designated by U or V, and if the number of U or V is 0, a ring may not be present at the part designated by U or V. If the number of U is 0 and the number of V is 1, or if the number of U is 1 and the number of V is 0, a fused ring having the fluorene core of Formula F-b may be a ring compound with four rings. If the number of both U and V is 0, a fused ring having the fluorene core of Formula F-b may be a ring compound with three rings. If the number of U and V is each 1, a fused ring having the fluorene core of Formula F-b may be a ring compound with five rings.

[Formula F-c]

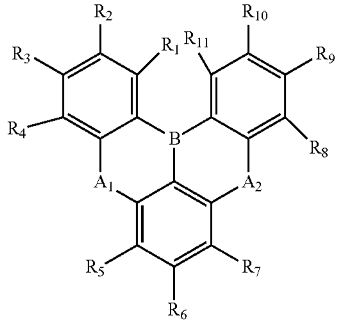

In Formula F-c, $A_1$ and $A_2$ may each independently be O, S, Se, or $N(R_m)$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-c, $A_1$ and $A_2$ may each independently be combined with the substituents of an adjacent ring to form a fused ring. For example, if $A_1$ and $A_2$ are each independently $N(R_m)$, $A_1$ may be combined with $R_4$ or $R_5$ to form a ring. For example, $A_2$ may be combined with $R_7$ or $R_8$ to form a ring.

In an embodiment, the emission layer EML may include as a dopant material, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl) naphthalen-2-yl)vinyl)phenyl)-N-phenylbenzenamine (N-BDAVBi)), 4,4'-bis[2-(4-(N,N-diphenylamino)phenyl) vinyl]biphenyl (DPAVBi), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-diphenylamino)pyrene), etc.

The emission layer EML may include a phosphorescence dopant material. For example, the phosphorescence dopant may include a metal complex including iridium (Ir), platinum (Pt), osmium (Os), gold (Au), titanium (Ti), zirconium (Zr), hafnium (Hf), europium (Eu), terbium (Tb) or thulium (Tm). For example, iridium(III) bis(4,6-difluorophenylpyridinato-N,C2')picolinate (Firpic), bis(2,4-difluorophenylpyridinato)-tetrakis(1-pyrazolyl)borate iridium(III) (Fir6), or platinum octaethyl porphyrin (PtOEP) may be used as the phosphorescence dopant. However, embodiments are not limited thereto.

The emission layer EML may include a quantum dot. The quantum dot may be a Group II-VI compound, a Group III-VI-V compound, a Group I-III-VI compound, a Group III-V compound, a Group III-II-V compound, a Group IV-VI compound, a Group IV element, a Group IV compound, or a combination thereof.

The Group II-VI compound may be selected from: a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof, or any combination thereof.

The Group III-V compound may include a binary compound such as $In_2S_3$, and $In_2Se_3$; a ternary compound such as $InGaS_3$, and $InGaSe_3$; or any combination thereof.

The Group I-III-VI compound may be selected from: a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof; a quaternary compound such as $AgInGaS_2$, and $CuInGaS_2$; or any combination thereof.

The Group III-V compound may be selected from: a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof; a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof, or any combination thereof. The Group III-V compound may further include a Group II metal. For example, InZnP, etc. may be selected as a Group III-II-V compound.

The Group IV-VI compound may be selected from: a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; a quaternary compound selected from the group consisting of SnPbSSe, SnPbSeTe, SnPbSTe, and mixtures thereof; or any combination thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle at a uniform concentration or may be present in a particle at a partially different concentration distribution state. In an embodiment, the quantum dot may have a core/shell structure in which a quantum dot surrounds another quantum dot. An interface between the core and the shell may have a concentration gradient in which the concentration of an element that is present in the shell decreases toward the center.

In embodiments, a quantum dot may have a core-shell structure including a core including a nanocrystal and a shell surrounding the core. The shell of the quantum dot may function as a protection layer that prevents chemical deformation of the core to maintain semiconductor properties and/or may function as a charging layer that imparts the quantum dot with electrophoretic properties. The shell may be a single layer or a multilayer. Examples of the shell of the quantum dot may include a metal oxide, a non-metal oxide, a semiconductor compound, or combinations thereof.

For example, the metal oxide or the non-metal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and NiO; or a ternary compound such as $MgAl_2O_4$, $CoFe_2O_4$, $NiFe_2O_4$ and $CoMn_2O_4$, but embodiments are not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dot may have a full width of half maximum (FWHM) of an emission wavelength spectrum equal to or less than about 45 nm. For example, the quantum dot may have a FWHM of an emission wavelength spectrum equal to or less than about 40 nm. For example, the quantum dot may have a FWHM of an emission wavelength spectrum equal to or less than about 30 nm. Color purity or color reproducibility may be improved within these ranges. Light emitted through the quantum dot may be emitted in all directions, so that light viewing angle properties may be improved.

The form of the quantum dot may be shapes which are in the art, without specific limitation. For example, the quantum dot may have a spherical shape, a pyramidal shape, a multi-arm shape, or a cubic shape, or the quantum dot may be in the form of a nanoparticle, a nanotube, a nanowire, a nanofiber, a nanoplate particle, etc.

The quantum dot may control the color of light emitted according to a particle size thereof, and accordingly, the quantum dot may have various emission colors such as blue, red, or green.

In the light emitting diode ED of an embodiment as shown in FIG. 3 to FIG. 6, the electron transport region ETR is provided on the emission layer EML. The electron transport region ETR may include at least one of an electron blocking layer HBL, an electron transport layer ETL, or an electron injection layer EIL. However, embodiments are not limited thereto.

The electron transport region ETR may be a layer formed of a single material, a layer formed of different materials, or a multilayer structure having layers formed of different materials.

For example, the electron transport region ETR may have a single layer structure of an electron injection layer EIL or an electron transport layer ETL, or a single layer structure formed of an electron injection material and an electron transport material. In other embodiments, the electron transport region ETR may have a single layer structure formed of different materials, or may have a structure in which an electron transport layer ETL/electron injection layer EIL, or a hole blocking layer HBL/electron transport layer ETL/electron injection layer EIL, are stacked in its respective stated order from the light emitting layer EML, but embodiments are not limited thereto. A thickness of the electron transport region ETR may be, for example, in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

The electron transport region ETR may include a compound represented by Formula ET-1.

[Formula ET-1]

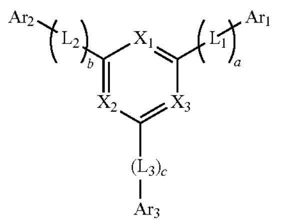

In Formula ET-1, at least one of $X_1$ to $X_3$ may be N, and the remainder of $X_1$ to $X_3$ may be $C(R_a)$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula ET-1, $Ar_1$ to $Ar_3$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms. If a to c are 2 or more, $L_1$ to $L_3$ may each independently be a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl) biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl) anthracene (ADN), 1,3-bis[3,5-di(pyridin-3-yl)phenyl] benzene (BmPyPhB), and mixtures thereof, without limitation.

The electron transport region ETR may include at least one of Compounds ET1 to ET36.

ET1
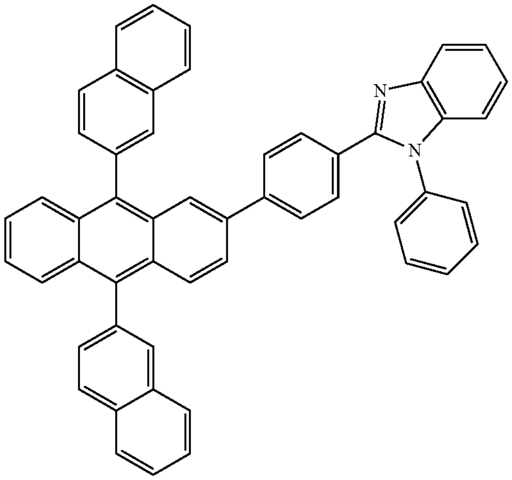
ET2
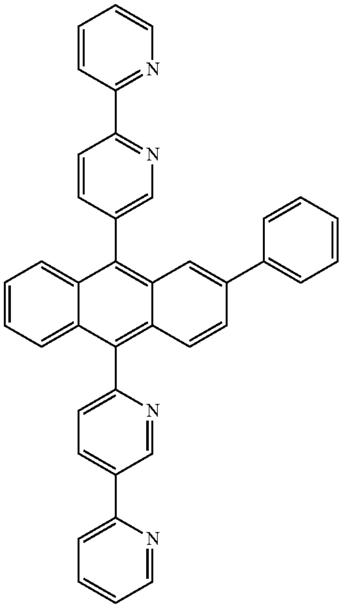
ET3
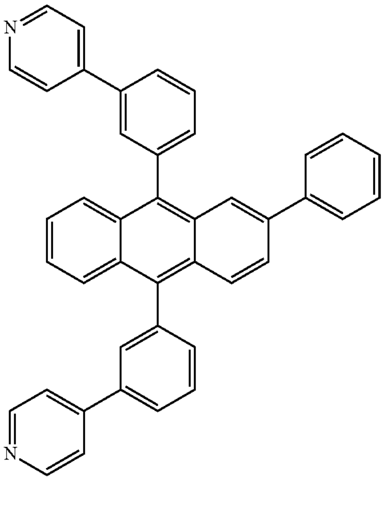
-continued
ET4
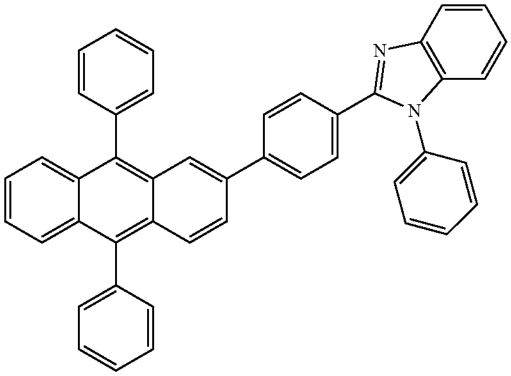
ET5
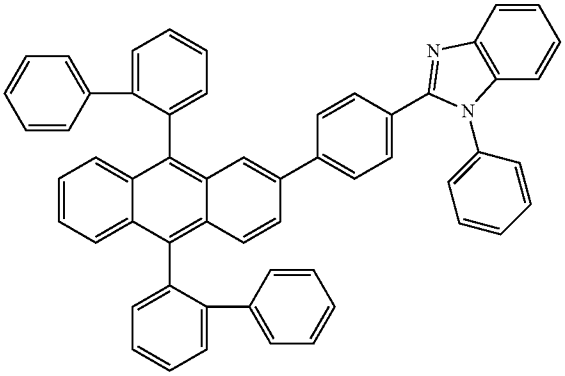
ET6
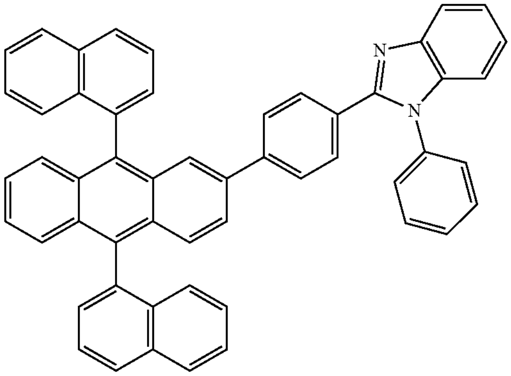
ET7
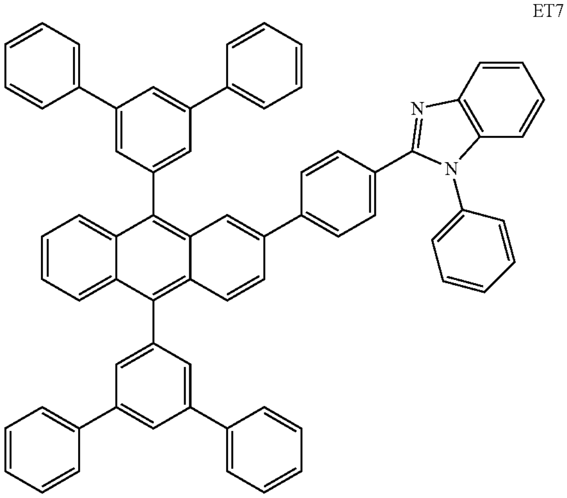

-continued
ET8
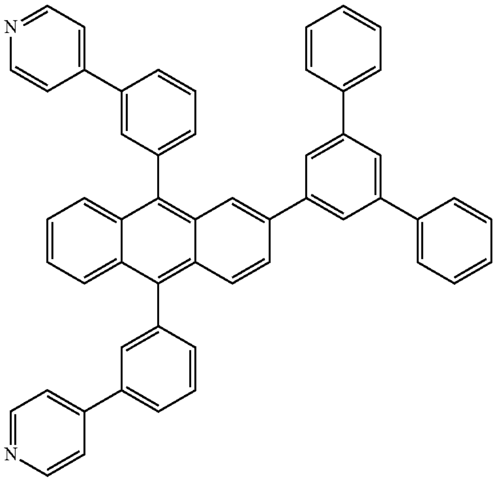
ET9
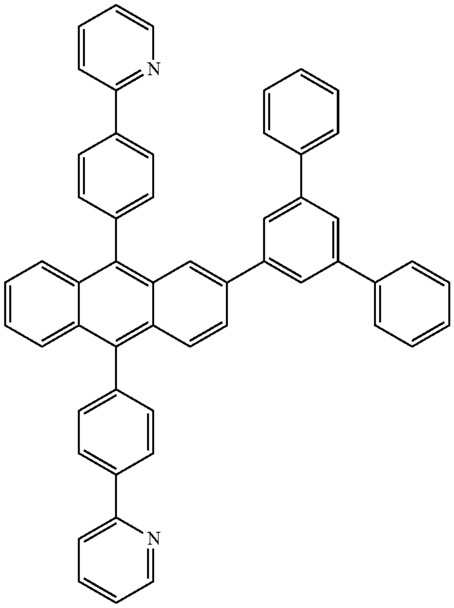
-continued
ET10
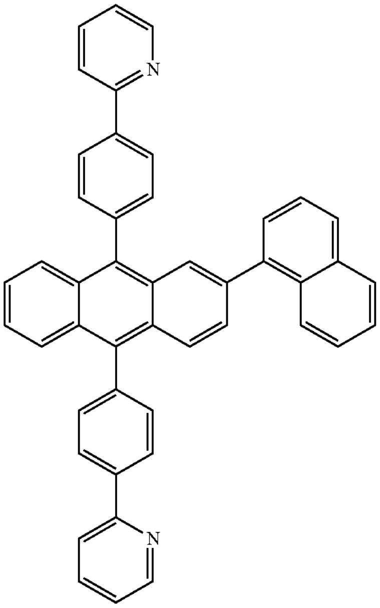
ET11
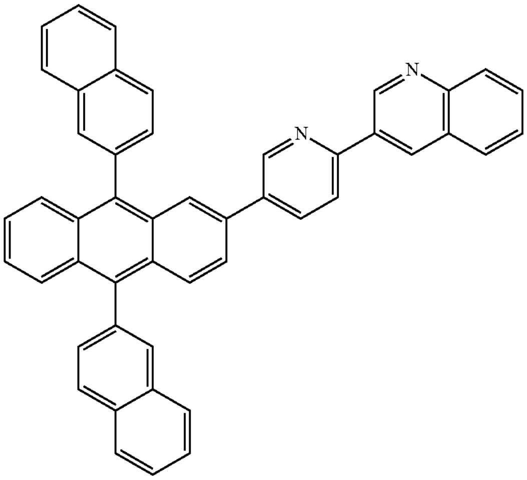
ET12
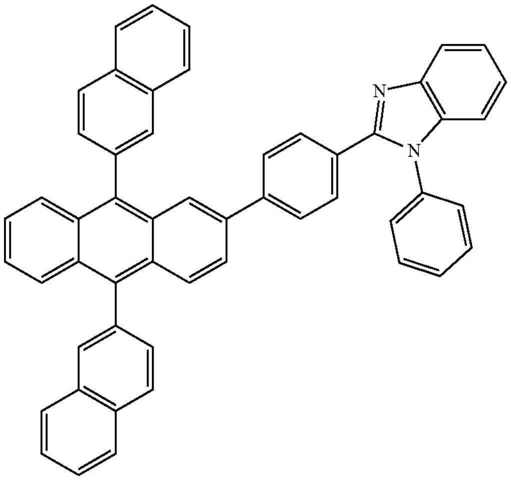

-continued
ET13
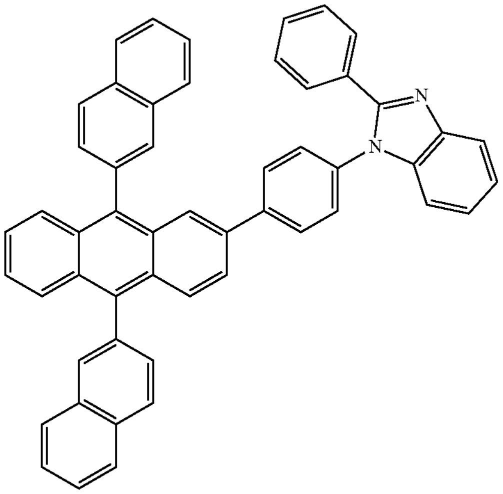
ET14
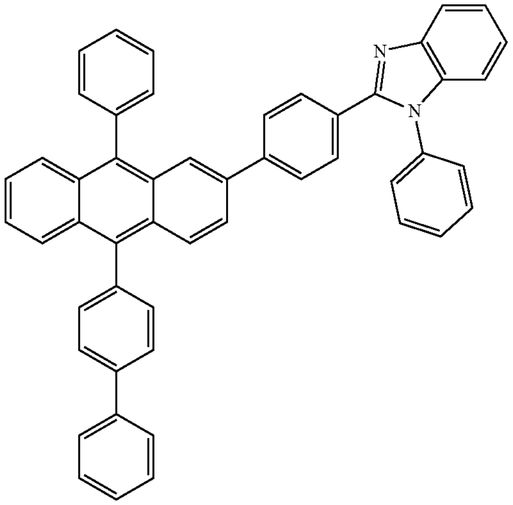
ET15
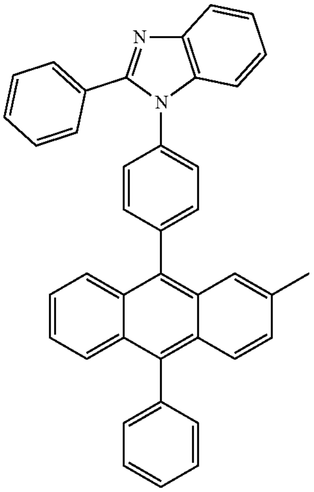
-continued
ET16
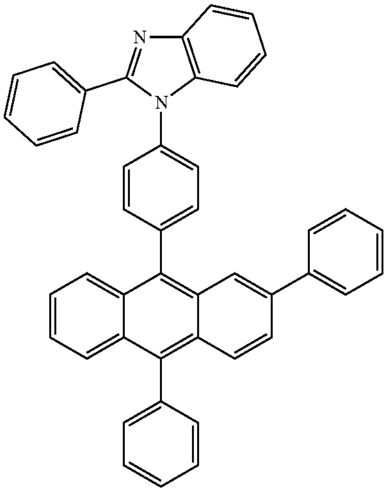
ET17
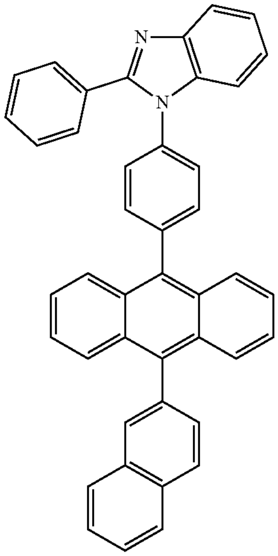
ET18
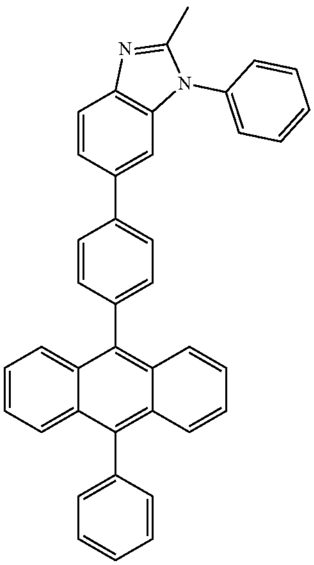

-continued
ET19
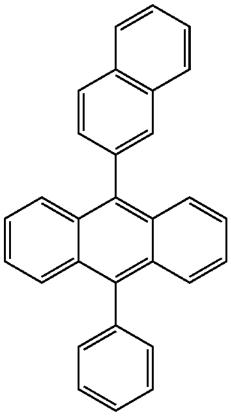
ET20
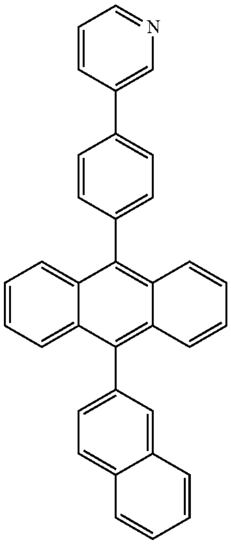
ET21
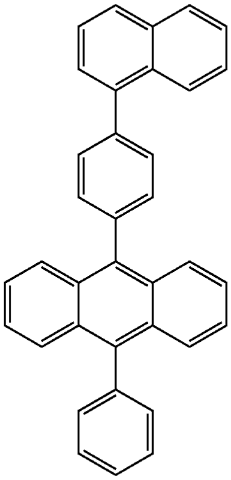
-continued
ET22
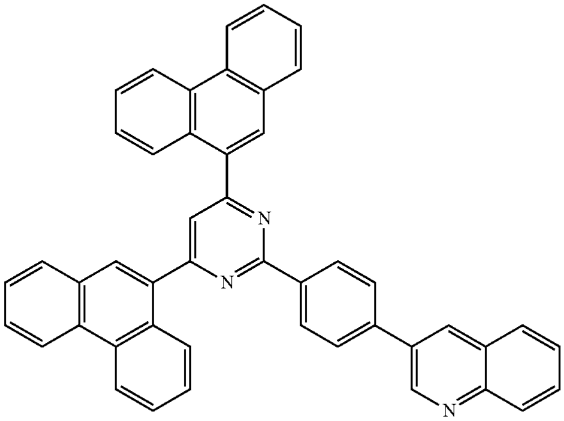
ET23
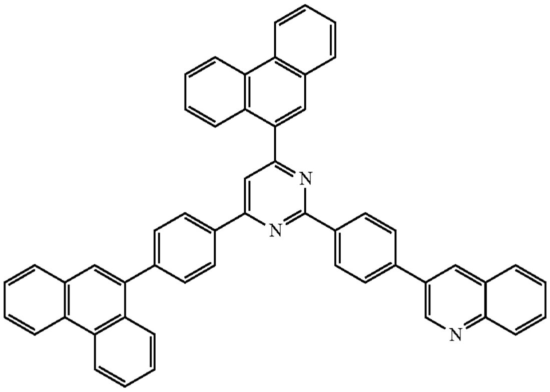
ET24
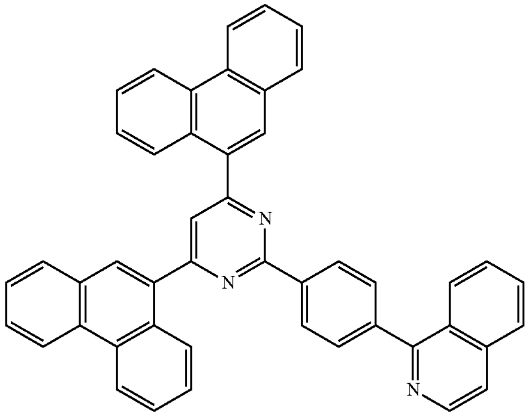

-continued
ET25
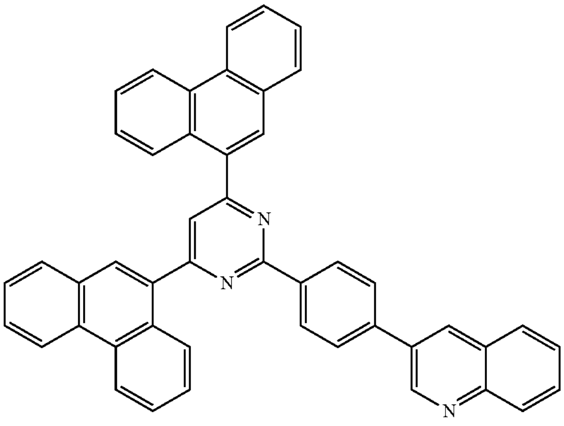
ET26
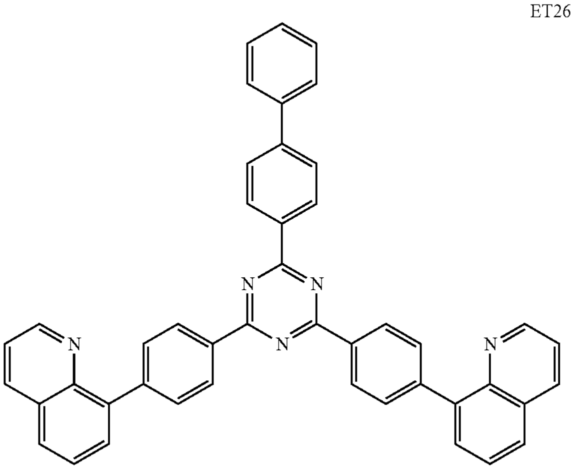
ET27
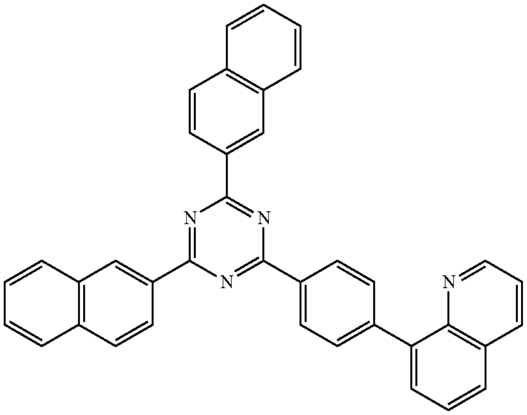
-continued
ET28
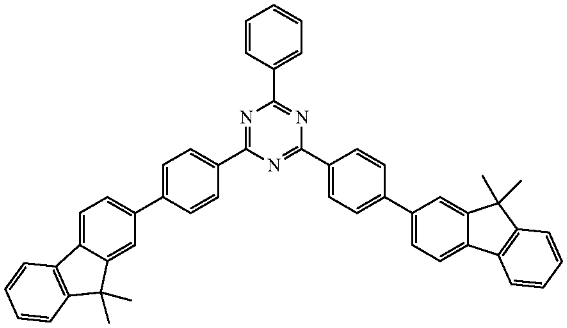
ET29
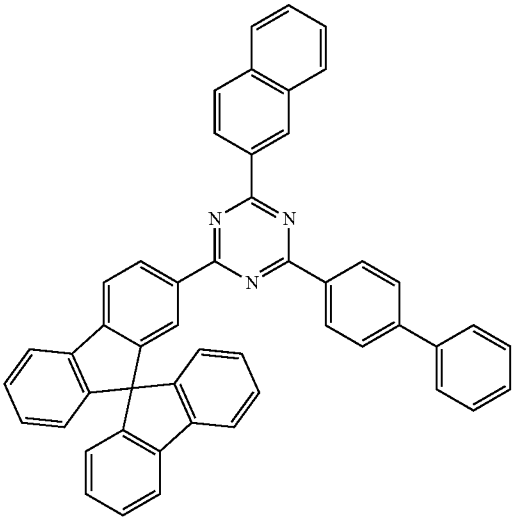
ET30
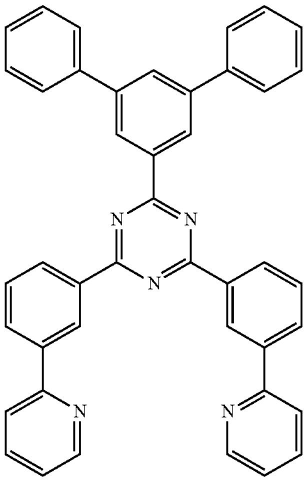

-continued

ET31

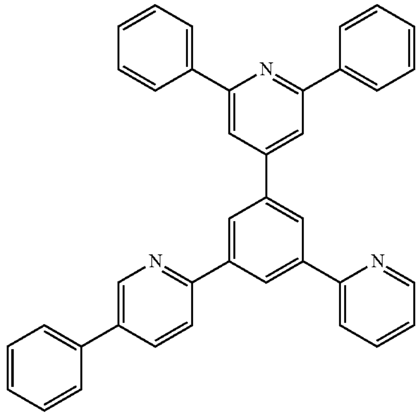

ET32

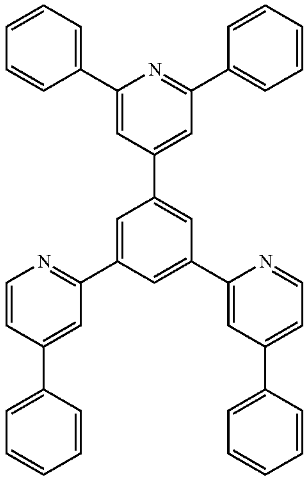

ET33

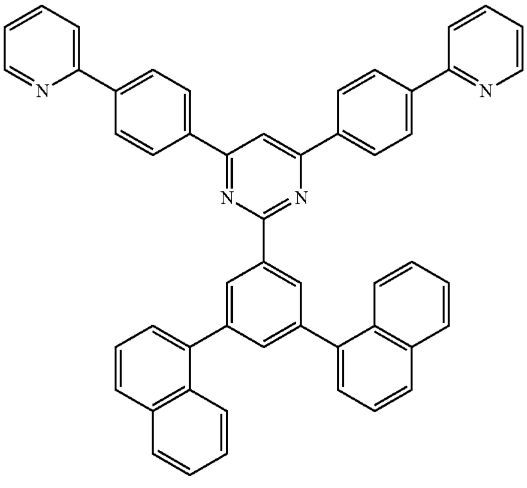

-continued

ET34

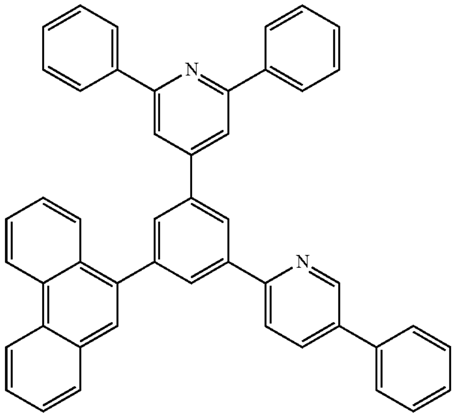

ET35

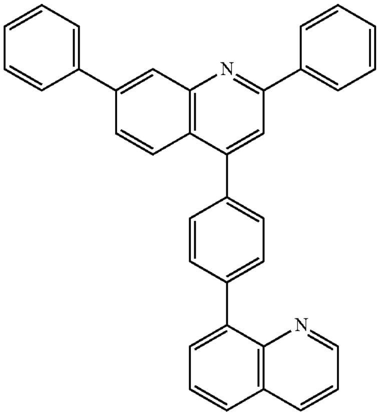

ET36

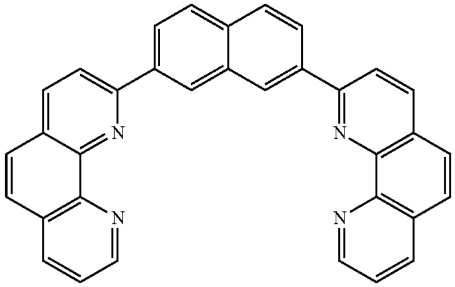

The electron transport region ETR may include a metal halide such as LiF, NaCl, CsF, RbCl, RbI, CuI and KI, a lanthanide such as Yb, or a co-depositing material of the metal halide and the lanthanide. For example, the electron transport region ETR may include KI:Yb, RbI:Yb, etc., as the co-depositing material. The electron transport region ETR may include a metal oxide such as $Li_2O$ and BaO, or 8-hydroxy-lithium quinolate (Liq). However, embodiments are not limited thereto. The electron transport region ETR also may be formed of a mixture material of an electron transport material and an insulating organo metal salt. The organo metal salt may be a material having an energy band gap equal to or greater than about 4 eV. For example, the organo metal salt may include metal acetates, metal benzoates, metal acetoacetates, metal acetylacetonates, or metal stearates.

The electron transport region ETR may include at least one of 2,9-dimethyl-4,7-diphenyl-1,10-phenanthroline (BCP), or 4,7-diphenyl-1,10-phenanthroline (Bphen) in addition to the aforementioned materials. However, embodiments are not limited thereto.

The electron transport region ETR may include the compounds of the electron transport region in at least one of an electron injection layer EIL, an electron transport layer ETL, or a hole blocking layer HBL.

If the electron transport region ETR includes an electron transport layer ETL, a thickness of the electron transport layer ETL may be in a range of about 100 Å to about 1,000 Å. For example, the thickness of the electron transport layer ETL may be in a range of about 150 Å to about 500 Å. If the thickness of the electron transport layer ETL satisfies the above-described range, satisfactory electron transport properties may be obtained without substantial increase of a driving voltage. If the electron transport region ETR includes an electron injection layer EIL, a thickness of the electron injection layer EIL may be in a range of about 1 Å to about 100 Å. For example, the thickness of the electron injection layer EIL may be in a range of about 3 Å to about 90 Å. If the thickness of the electron injection layer EIL satisfies the above described range, satisfactory electron injection properties may be obtained without a substantial increase of driving voltage.

The second electrode EL2 is provided on the electron transport region ETR. The second electrode EL2 may be a common electrode. The second electrode EL2 may be a cathode or an anode, but embodiments are not limited thereto. For example, if the first electrode EL1 is an anode, the second electrode EL2 may be a cathode, and if the first electrode EL1 is a cathode, the second electrode EL2 may be an anode.

The second electrode EL2 may be a transmissive electrode, a transflective electrode, or a reflective electrode. If the second electrode EL2 is a transmissive electrode, the second electrode EL2 may include a transparent metal oxide, for example, ITO, IZO, ZnO, ITZO, etc.

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, compounds thereof, or mixtures thereof (for example, AgMg, AgYb, or MgAg). In another embodiment, the second electrode EL2 may have a multi-layered structure including a reflective layer or a transflective layer formed using the above-described materials and a transparent conductive layer formed using ITO, IZO, ZnO, ITZO, etc. For example, the second electrode EL2 may include the aforementioned metal materials, combinations of two or more metal materials selected from the aforementioned metal materials, or oxides of the aforementioned metal materials.

Although not shown in the drawings, the second electrode EL2 may be electrically connected to an auxiliary electrode. If the second electrode EL2 is electrically connected to the auxiliary electrode, the resistance of the second electrode EL2 may decrease.

In an embodiment, the light emitting diode ED may further include a capping layer CPL disposed on the second electrode EL2. The capping layer CPL may be a multilayer or a single layer.

In an embodiment, the capping layer CPL may include an organic layer or an inorganic layer. For example, if the capping layer CPL includes an inorganic material, the inorganic material may include an alkali metal compound such as LiF, an alkaline earth metal compound such as $MgF_2$, SiON, SiNx, SiOy, etc.

For example, if the capping layer CPL includes an organic material, the organic material may include α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol sol-9-yl)triphenylamine (TCTA), etc., or may include an epoxy resin, or acrylate such as methacrylate. The capping layer CPL may include at least one of Compounds P1 to P5, but embodiments are not limited thereto.

P1

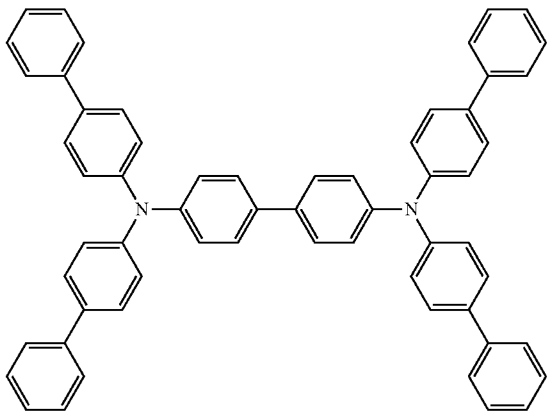

P2

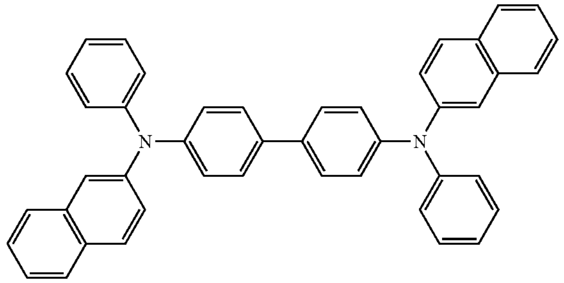

P3

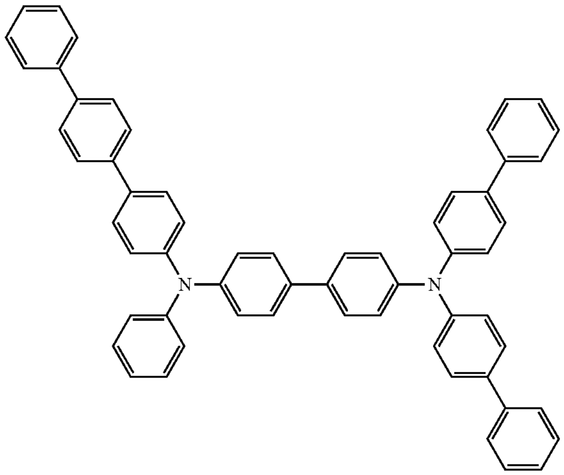

-continued

P4

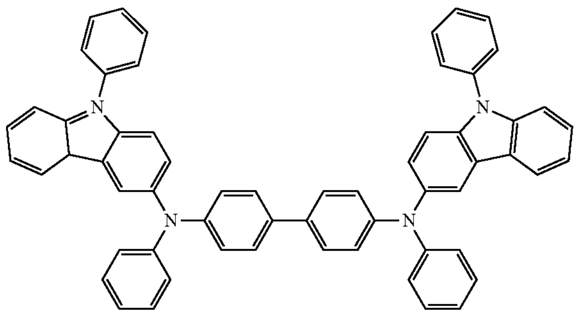

P5

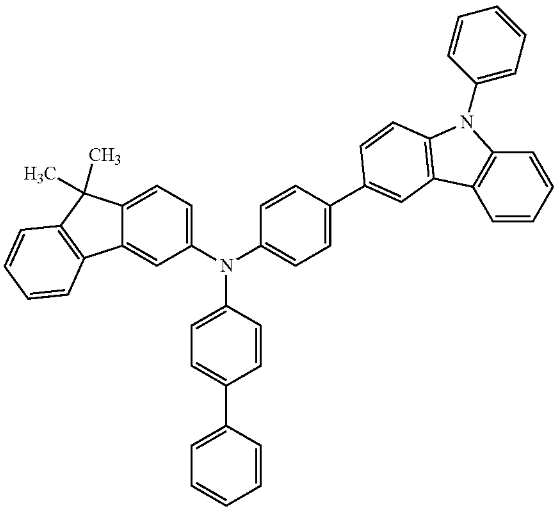

A refractive index of the capping layer CPL may be equal to or greater than about 1.6. For example, the refractive index of the capping layer CPL may be equal to or greater than about 1.6, with respect to light in a wavelength range of about 550 nm to about 660 nm.

Figure 7:
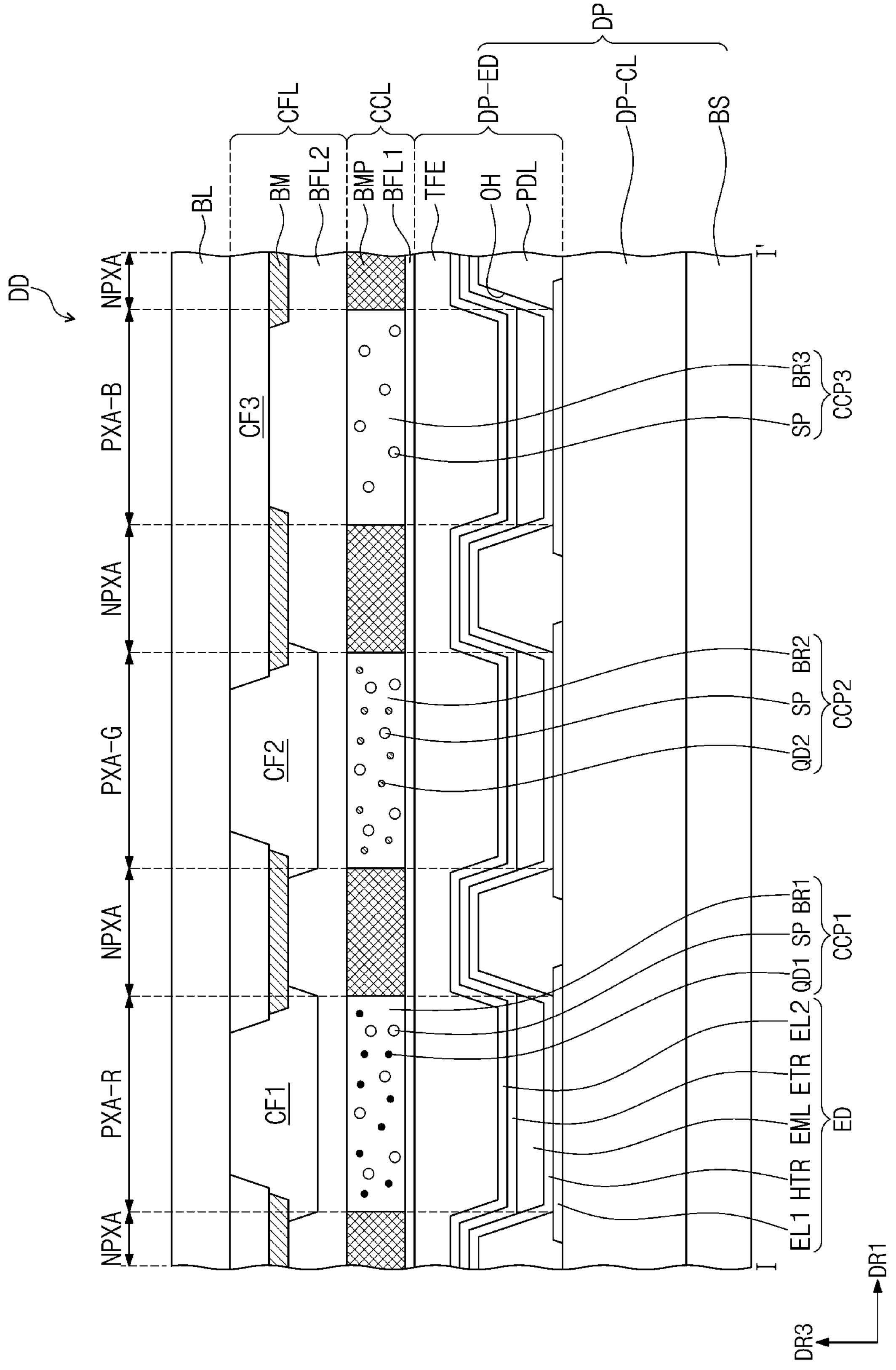
FIG. 7 is a schematic cross-sectional view of a display apparatus according to an embodiment.
Figure 8:
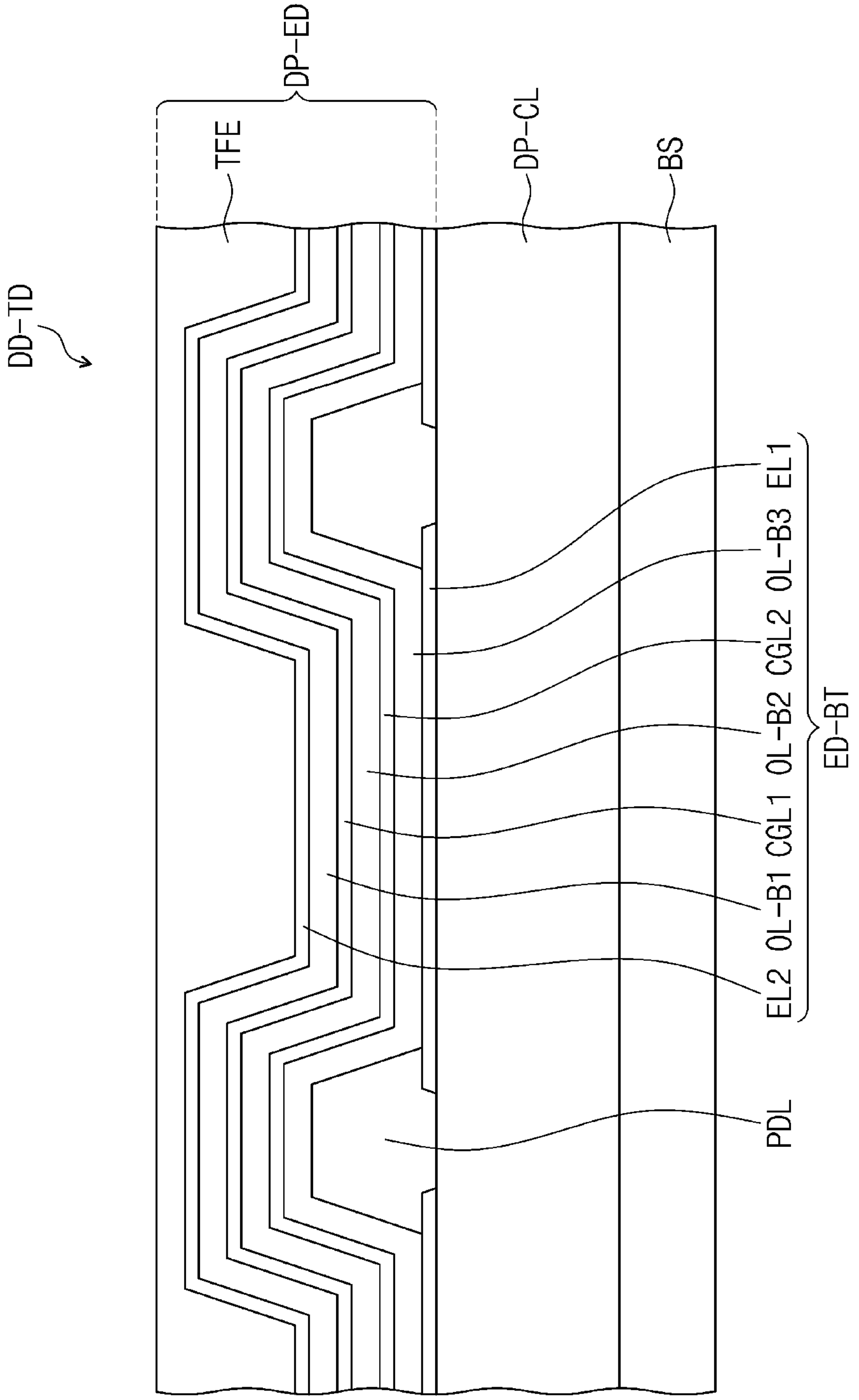
FIG. 8 is a schematic cross-sectional view of a display apparatus according to an embodiment.

FIG. 7 and FIG. 8 are each a schematic cross-sectional view of a display apparatus according to embodiments, respectively. In the explanation on the display apparatuses of embodiments, referring to FIG. 7 and FIG. 8, the overlapping parts with the explanation on FIG. 1 to FIG. 6 will not be explained again, and the differing features will be explained.

Referring to FIG. 7, the display apparatus DD according to an embodiment may include a display panel DP including a display device layer DP-ED, a light controlling layer CCL disposed on the display panel DP, and a color filter layer CFL.

In an embodiment shown in FIG. 7, the display panel DP includes a base layer BS, a circuit layer DP-CL provided on the base layer BS, and a display device layer DP-ED, and the display device layer DP-ED may include a light emitting diode ED.

The light emitting diode ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. A structure of the light emitting diode according to FIG. 3 to FIG. 6 may be applied to the structure of the light emitting diode ED shown in FIG. 7.

Referring to FIG. 7, the emission layer EML may be disposed in an opening OH defined in a pixel definition layer PDL. For example, the emission layer EML which is divided by the pixel definition layer PDL and correspondingly provided to each of the luminous areas PXA-R, PXA-G, and PXA-B may emit light in a same wavelength region. In the display apparatus DD of an embodiment, the emission layer EML may emit blue light. Although not shown in the drawings, in an embodiment, the emission layer EML may be provided as a common layer for all luminous areas PXA-R, PXA-G, and PXA-B.

The light controlling layer CCL may be disposed on the display panel DP. The light controlling layer CCL may include a light converter. The light converter may include a quantum dot or a phosphor. The light converter may transform the wavelength of a provided light and may emit the transformed light. For example, the light controlling layer CCL may be a layer including a quantum dot or a layer including a phosphor.

The light controlling layer CCL may include light controlling parts CCP1, CCP2, and CCP3. The light controlling parts CCP1, CCP2, and CCP3 may be separated from one another.

Referring to FIG. 7, a partition pattern BMP may be disposed between the separated light controlling parts CCP1, CCP2, and CCP3, but embodiments are not limited thereto. In FIG. 7, the partition pattern BMP is shown so that it does not overlap the light controlling parts CCP1, CCP2, and CCP3, but at least a portion of the edge of the light controlling parts CCP1, CCP2, and CCP3 may overlap the partition pattern BMP.

The light controlling layer CCL may include a first light controlling part CCP1 including a first quantum dot QD1 converting first color light provided from the light emitting diode ED into second color light, a second light controlling part CCP2 including a second quantum dot QD2 converting first color light provided from the light emitting diode ED into third color light, and a third light controlling part CCP3 transmitting first color light provided from the light emitting diode ED.

In an embodiment, the first light controlling part CCP1 may provide red light which is the second color light, and the second light controlling part CCP2 may provide green light which is the third color light. The third light controlling part CCP3 may transmit and provide blue light which is the first color light provided from the light emitting diode ED. For example, the first quantum dot QD1 may be a red quantum dot, and the second quantum dot QD2 may be a green quantum dot. The same description as provided above with respect to quantum dots may be applied to quantum dots QD1 and QD2.

The light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but may include the scatterer SP.

The scatterer SP may be an inorganic particle. For example, the scatterer SP may include at least one of $TiO_2$, ZnO, $Al_2O_3$, $SiO_2$, or hollow silica. The scatterer SP may include at least one of $TiO_2$, ZnO, $Al_2O_3$, $SiO_2$, or hollow silica, or may be a mixture of two or more materials selected from $TiO_2$, ZnO, $Al_2O_3$, $SiO_2$, and hollow silica.

The first light controlling part CCP1, the second light controlling part CCP2, and the third light controlling part CCP3 may each include base resins BR1, BR2, and BR3 dispersing the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer particle SP dispersed in the third base resin BR3. The base resins BR1, BR2, and BR3 may each be a medium in which the quantum dots QD1 and QD2 and the scatterer SP are dispersed, and may be composed of various resin compositions which may be generally referred to as a binder. For example, the base resins BR1, BR2, and BR3 may each independently be acrylic resins, urethane-based resins, silicone-based resins, epoxy-based resins, etc. The base resins BR1, BR2, and BR3 may each be transparent resins. In an embodiment, the first base resin BR1, the second base resin BR2, and the third base resin BR3 may be the same as or different from each other.

The light controlling layer CCL may include a barrier layer BFL1. The barrier layer BFL1 may block the penetration of moisture and/or oxygen (hereinafter, will be referred to as "humidity/oxygen"). The barrier layer BFL1 may be disposed on the light controlling parts CCP1, CCP2, and CCP3 to block the exposure of the light controlling parts CCP1, CCP2, and CCP3 to humidity/oxygen. The barrier layer BFL1 may cover the light controlling parts CCP1, CCP2, and CCP3. A barrier layer BFL2 may be provided between the light controlling parts CCP1, CCP2, and CCP3 and a color filter layer CFL.

The barrier layers BFL1 and BFL2 may each include at least one inorganic layer. For example, the barrier layers BFL1 and BFL2 may each be formed of an inorganic material. For example, the barrier layers BFL1 and BFL2 may each include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin film securing light transmittance. The barrier layers BFL1 and BFL2 may each further include an organic layer. The barrier layers BFL1 and BFL2 may be composed of a single layer or of multiple layers.

In the display apparatus DD of an embodiment, the color filter layer CFL may be disposed on the light controlling layer CCL. In an embodiment, the color filter layer CFL may be directly disposed on the light controlling layer CCL. For example, the barrier layer BFL2 may be omitted.

The color filter layer CFL may include a light blocking part BM and filters CF1, CF2, and CF3. The color filter layer CFL may include a first filter CF1 that transmits second color light, a second filter CF2 that transmits third color light, and a third filter CF3 that transmits first color light. For example, the first filter CF1 may be a red filter, the second filter CF2 may be a green filter, and the third filter CF3 may be a blue filter. Each of the filters CF1, CF2, and CF3 may include a polymer photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include a polymer photosensitive resin and may not include a pigment or dye. The third filter CF3 may be transparent. The third filter CF3 may be formed of a transparent photosensitive resin.

In an embodiment, the first filter CF1 and the second filter CF2 may each be yellow filters. The first filter CF1 and the second filter CF2 may be provided in one body without distinction.

The light blocking part BM may be a black matrix. The light blocking part BM may include an organic light blocking material or an inorganic light blocking material including a black pigment or black dye. The light blocking part BM may prevent light leakage and may distinguish the boundaries between adjacent filters CF1, CF2, and $CF_3$. In an embodiment, the light blocking part BM may be formed as a blue filter.

The first to third filters CF1, CF2, and CF3 may be disposed corresponding to each of a red luminous area PXA-R, green luminous area PXA-G, and blue luminous area PXA-B, respectively.

A base substrate BL may be disposed on the color filter layer CFL. The base substrate BL may provide a base surface on which the color filter layer CFL, the light controlling layer CCL, etc. are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

FIG. 8 is a schematic cross-sectional view showing a portion of the display apparatus according to an embodiment. In FIG. 8, a schematic cross-sectional view of a portion corresponding to the display panel DP in FIG. 7 is shown. In a display apparatus DD-TD of an embodiment, the light emitting diode ED-BT may include light emitting structures OL-B1, OL-B2, and OL-B3. The light emitting diode ED-BT may include oppositely disposed first electrode EL1 and second electrode EL2, and the light emitting structures OL-B1, OL-B2, and OL-B3 stacked in a thickness direction and provided between the first electrode EL1 and the second electrode EL2. Each of the light emitting structures OL-B1, OL-B2, and OL-B3 may include an emission layer EML (FIG. 7), and a hole transport region HTR and an electron transport region ETR disposed with the emission layer EML (FIG. 7) therebetween.

For example, the light emitting diode ED-BT included in the display apparatus DD-TD of an embodiment may be a light emitting diode having a tandem structure and including multiple emission layers.

In an embodiment shown in FIG. 8, light emitted from each of the light emitting structures OL-B1, OL-B2, and OL-B3 may be all blue light. However, embodiments are not limited thereto, and the wavelength regions of light emitted from the light emitting structures OL-B1, OL-B2, and OL-B3 may be different from each other. For example, the light emitting diode ED-BT including the light emitting structures OL-B1, OL-B2, and OL-B3 emitting light in different wavelength regions may emit white light.

Charge generating layers CGL1 and CGL2 may be disposed between neighboring light emitting structures OL-B1, OL-B2 and OL-B3. The charge generating layers CGL1 and CGL2 may each independently include a p-type charge generating layer and/or an n-type charge generating layer.

The above-described polycyclic compound of an embodiment may be included in at least one of the light emitting structures OL-B1, OL-B2, and OL-B3 included in the display apparatus DD-TD of an embodiment.

The light emitting diode ED according to an embodiment may include the polycyclic compound of an embodiment in at least one functional layer disposed between a first electrode EL1 and a second electrode EL2, and may show improved life. The light emitting diode ED according to an embodiment may include the polycyclic compound of an embodiment in at least one of a hole transport region HTR, an emission layer EML, or an electron transport region ETR, disposed between the first electrode EL1 and the second electrode EL2, or in a capping layer CPL.

For example, the polycyclic compound according to an embodiment may be included in the emission layer EML of the light emitting diode ED of an embodiment, and the light emitting diode of an embodiment may show high efficiency and long-life characteristics.

The polycyclic compound of an embodiment includes two or more boron atoms to which at least one heteroatom is directly bonded. For example, the polycyclic compound of an embodiment may include one or more W—B—Z (wherein W is N, O, or S, and wherein Z is N, O, S, or C) skeletons. Accordingly, the bond dissociation energy of a molecule of the polycyclic compound of an embodiment may increase, and molecular stability and multiple resonance may be improved.

The light emitting diode of an embodiment may include the polycyclic compound in at least one functional layer, and may have markedly improved diode life and emission efficiency.

Hereinafter, the polycyclic compound according to an embodiment and the light emitting diode of an embodiment including the polycyclic compound will be explained referring to the Examples and the Comparative Examples. The Examples are only provided as illustrations to assist in the understanding of the disclosure, and the scope of the disclosure is not limited thereto.

Example 1. Synthesis of Polycyclic Compound

A synthesis method of a polycyclic compound according to embodiments will be explained with reference to the synthesis methods of Compound B-13 and Compound D-9. The synthesis methods of the polycyclic compounds explained hereinafter are only examples, and the synthesis method of the polycyclic compound according to an embodiment is not limited to the Examples below.

1) Synthesis of Compound B-13

[Reaction 1]

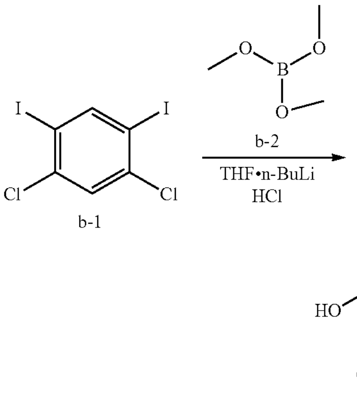

-continued

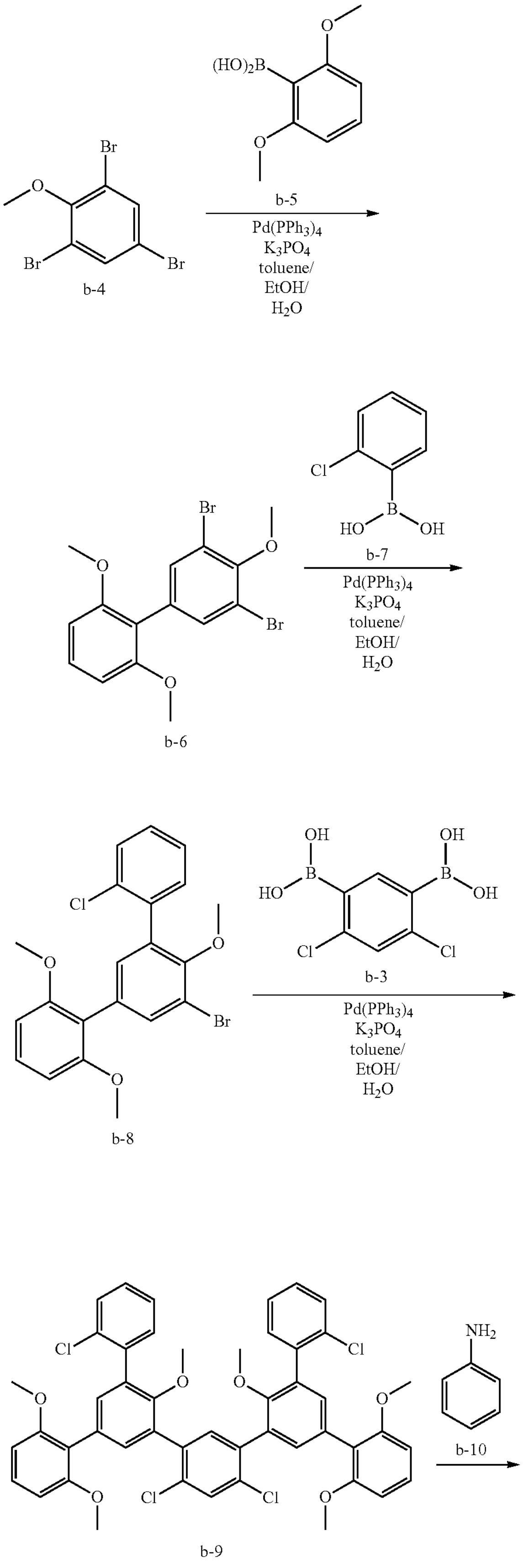

-continued

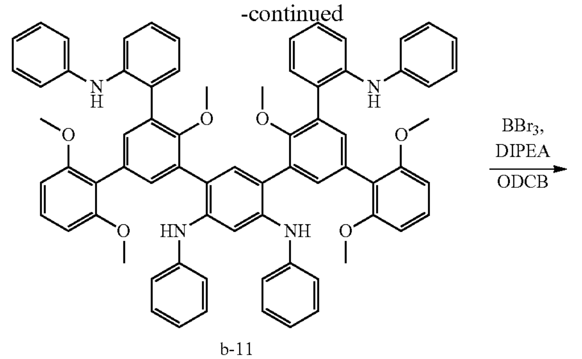

b-11

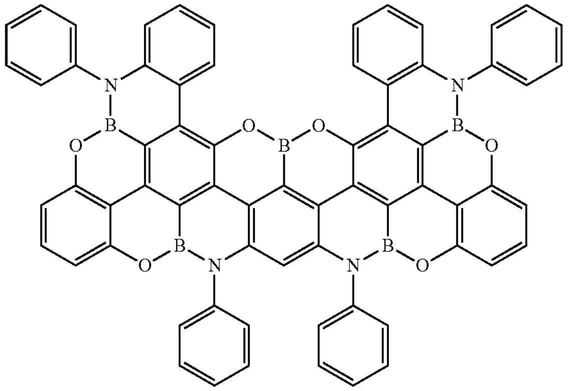

B-13

Synthesis of Intermediate b-3

To a three-necked flask, 50 g (125 mmol) of b-1 was added, Ar substitution was performed, and 600 mL of THF was added, followed by stirring at about −78° C. for about 4 hours. After that, by using a dropping funnel, 39 g (376 mmol) of b-2 was added to a reaction system, and the reaction system was controlled to room temperature and stirred for about 5 hours. n-BuLi and HCl were added to the reaction system and subjected to stirring at room temperature for about 1 hour. An organic layer was extracted using toluene and dried with magnesium sulfate, and the solvent was removed by distillation. The crude product thus obtained was separated by silica gel column chromatography (a mixture solvent of hexane/toluene/EtOH) to obtain 22 g (yield 77%) of a white solid. By the FABMS measurement of the thus obtained product, the molecular weight of 234 was confirmed, and the production of Intermediate b-3 was confirmed.

Synthesis of Intermediate b-6

To a three-necked flask, 60 g (174 mmol) of b-4, 28 g (156 mmol) of b-5, 8 g (7 mmol) of $Pd(PPh_3)_4$, and 110 g (522 mmol) of $K_3PO_4$ were added, Ar substitution was performed, and 1000 mL of toluene, 300 mL of EtOH, and 300 mL of $H_2O$ were added thereto, followed by stirring at about 50° C. for about 24 hours. Water was added to a reaction system, an organic layer was extracted using toluene and dried with magnesium sulfate, and the solvent was removed by distillation. The crude product thus obtained was separated by silica gel column chromatography (a mixture solvent of hexane/toluene) and recrystallization (a mixture solvent of EtOH/toluene) to obtain 39 g (yield 56%) of a white solid. By the FABMS measurement of the thus obtained product, the molecular weight of 402 was confirmed, and the production of Intermediate b-6 was confirmed.

Synthesis of Intermediate b-8

To a three-necked flask, 39 g (97 mmol) of b-6, 15 g (97 mmol) of b-7, 4 g (4 mmol) of $Pd(PPh_3)_4$, and 62 g (291 mmol) of $K_3PO_4$ were added, Ar substitution was performed, and 1000 mL of toluene, 200 mL of EtOH, and 200 mL of $H_2O$ were added thereto, followed by stirring at about 50° C. for about 7 hours. Water was added to a reaction system, an organic layer was extracted using toluene and dried with magnesium sulfate, and the solvent was removed by distillation. The crude product thus obtained was separated by silica gel column chromatography (a mixture solvent of hexane/toluene) and recrystallization (a mixture solvent of ethanol/toluene) to obtain 21 g (yield 50%) of a white solid. By the FABMS measurement of the thus obtained product, the molecular weight of 433 was confirmed, and the production of Intermediate b-8 was confirmed.

Synthesis of Intermediate b-9

To a three-necked flask, 10 g (23 mmol) of b-8, 2.7 g (12 mmol) of b-3, 2 g (2 mmol) of $Pd(PPh_3)_4$, and 15 g (70 mmol) of $K_3PO_4$ were added, Ar substitution was performed, and 200 mL of toluene, 50 mL of EtOH, and 50 mL of $H_2O$ were added thereto, followed by stirring at about 100° C. for about 3 hours. Water was added to a reaction system, an organic layer was extracted using toluene and dried with magnesium sulfate, and the solvent was removed by distillation. The crude product thus obtained was separated by silica gel column chromatography (a mixture solvent of hexane/toluene) and recrystallization (a mixture solvent of ethanol/toluene) to obtain 14 g (yield 71%) of a white solid. By the FABMS measurement of the thus obtained product, the molecular weight of 853 was confirmed, and the production of Intermediate b-9 was confirmed.

Synthesis of Intermediate b-11

To a three-necked flask, 14 g (16 mmol) of b-9, 8 g (82 mmol) of b-10, 19 g (197 mmol) of t-BuONa, 1.1 g (1.2 mmol) of $Pd(dba)_2$, and 1 g (2.5 mmol) of SPhos were added, Ar substitution was performed, and 200 mL of toluene was added thereto, followed by stirring at about 110° C. for about 5 hours. Water was added to a reaction system, an organic layer was extracted using toluene and dried with magnesium sulfate, and the solvent was removed by distillation. The crude product thus obtained was separated by silica gel column chromatography (a mixture solvent of hexane/toluene) and recrystallization (a mixture solvent of ethanol/toluene) to obtain 15 g (yield 87%) of a white solid. By the FABMS measurement of the thus obtained product, the molecular weight of 1079 was confirmed, and the production of Intermediate b-11 was confirmed.

Synthesis of Compound B-13

To a three-necked flask, 15 g (14 mmol) of b-11 was added, Ar substitution was performed, 140 mL of ODCB was added for dissolution, and the internal temperature was reduced to about 0° C. 28 g (112 mmol) of $BBr_3$ was added to the flask dropwise using a dropping funnel and stirring was performed at room temperature for about 2 hours. 39 mL (222 mmol) of DIPEA was added, and stirring was performed at about 160° C. for about 1 hour. The reaction product was washed in installments using a large amount of acetonitrile, and a solid was recovered by filtering. The crude product thus obtained was separated by silica gel column chromatography (a mixture solvent of hexane/dichloromethane) and recrystallization (a mixture solvent of ethanol/toluene) to obtain 6.2 g (yield 43%) of a yellow solid. By the FABMS measurement of the thus obtained product, the molecular weight of 1034 was confirmed, and the production of Compound B-13 was definitely confirmed.

2) Synthesis of Compound D-9

[Reaction 2]

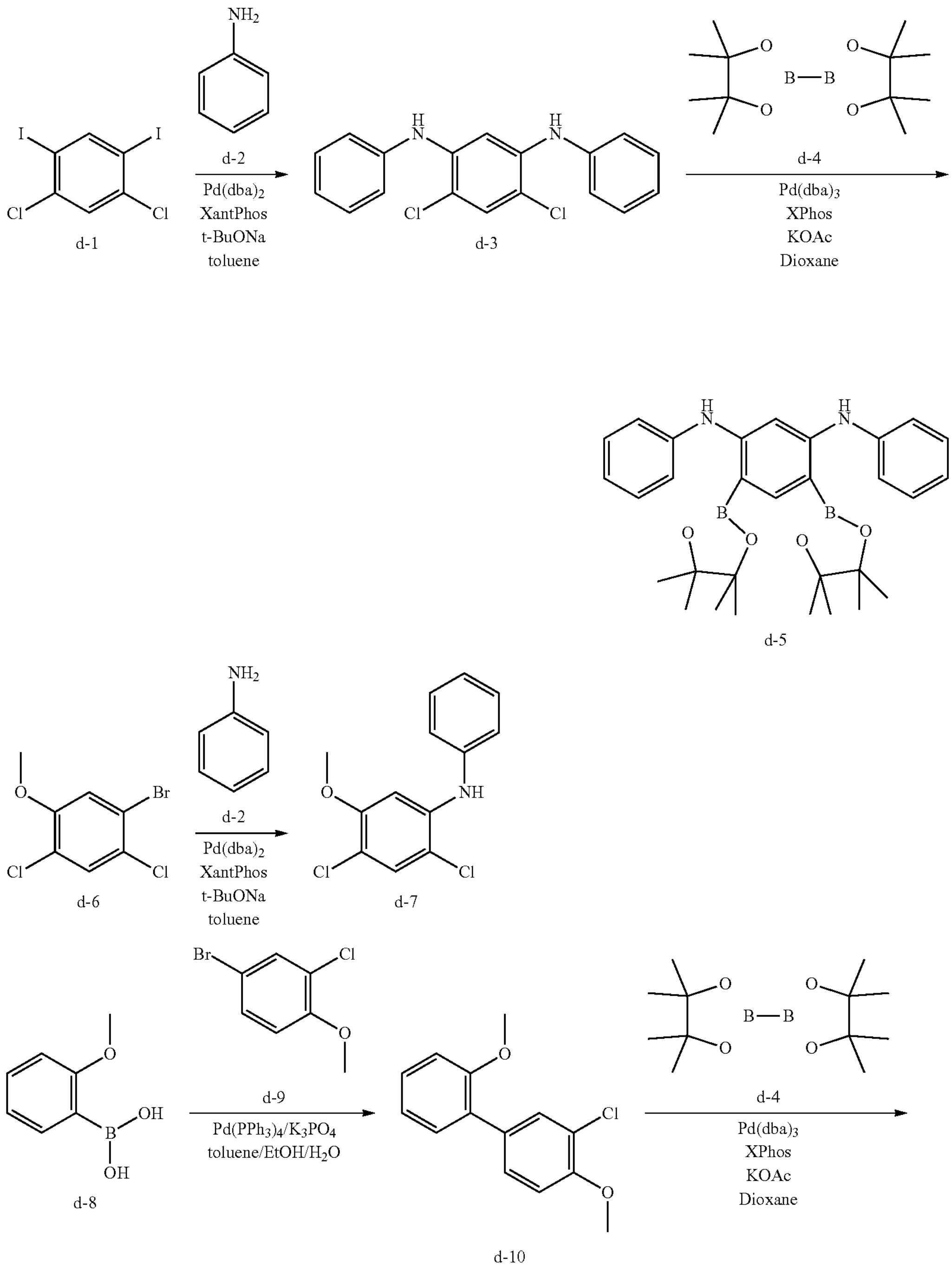

-continued
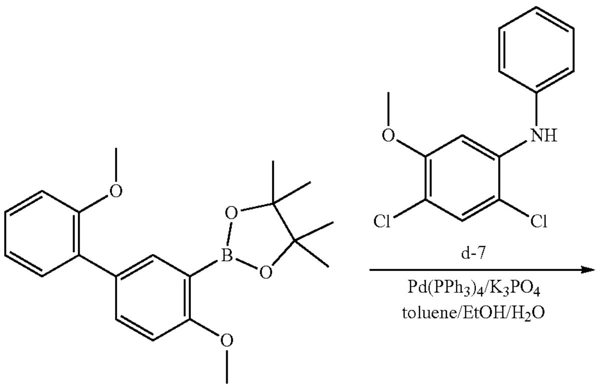
d-11
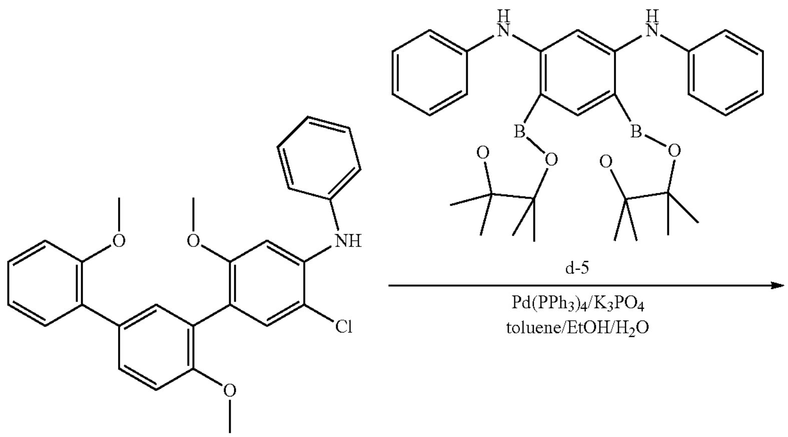
d-12
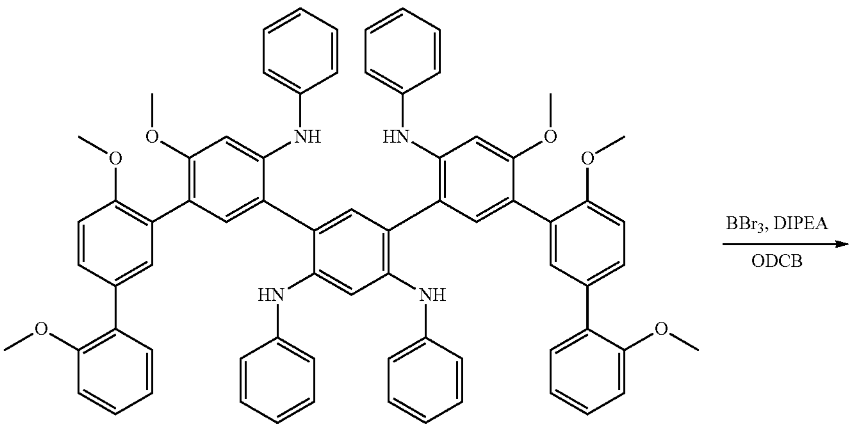
d-13

-continued

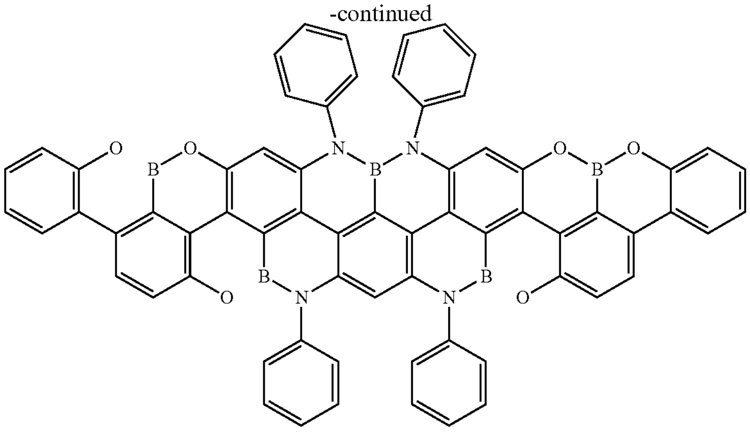

D-9

Synthesis of Intermediate d-3

To a three-necked flask, 50 g (125 mmol) of d-1, 26 g (276 mmol) of d-2, 4 g (7 mmol) of $Pd(dba)_2$, 4.3 g (7.5 mmol) of XantPhos and 36 g (376 mmol) of t-BuONa were added, Ar substitution was performed, and 700 mL of toluene was added thereto, followed by stirring at about 90° C. for about 5 hours. Water was added to a reaction system, an organic layer was extracted using toluene and dried with magnesium sulfate, and the solvent was removed by distillation. The crude product thus obtained was separated by silica gel column chromatography (a mixture solvent of hexane/toluene) and recrystallization (a mixture solvent of ethanol/toluene) to obtain 41 g (yield 64%) of a white solid. By the FABMS measurement of the thus obtained product, the molecular weight of 329 was confirmed, and the production of Intermediate d-3 was confirmed.

Synthesis of Intermediate d-5

To a three-necked flask, 41 g (124 mmol) of d-3, 190 g (747 mmol) of d-4, 5.7 g (6.2 mmol) of $Pd_2(dba)_3$, 5.9 g (12 mmol) of XPhos and 73 g (747 mmol) of KOAc were added, Ar substitution was performed, and 250 mL of dioxane was added thereto, followed by stirring at about 110° C. for about 20 hours. Water was added to a reaction system, an organic layer was extracted using toluene and dried with magnesium sulfate, and the solvent was removed by distillation. The crude product thus obtained was separated by silica gel column chromatography (a mixture solvent of hexane/toluene) and recrystallization (a mixture solvent of ethanol/toluene) to obtain 45 g (yield 71%) of a white solid. By the FABMS measurement of the thus obtained product, the molecular weight of 512 was confirmed, and the production of Intermediate d-5 was confirmed.

Synthesis of Intermediate d-7

To a three-necked flask, 30 g (117 mmol) of d-6, 12 g (129 mmol) of d-2, 2.7 g (4.7 mmol) of $Pd(dba)_2$, 3.4 g (5.9 mmol) of XantPhos and 34 g (352 mmol) of t-BuONa were added, Ar substitution was performed, and 600 mL of toluene was added thereto, followed by stirring at about 100° C. for about 2 hours. Water was added to a reaction system, an organic layer was extracted using toluene and dried with magnesium sulfate, and the solvent was removed by distillation. The crude product thus obtained was separated by silica gel column chromatography (a mixture solvent of hexane/toluene) and recrystallization (a mixture solvent of ethanol/toluene) to obtain 29 g (yield 92%) of a white solid. By the FABMS measurement of the thus obtained product, the molecular weight of 268 was confirmed, and the production of Intermediate d-7 was confirmed.

Synthesis of Intermediate d-10

To a three-necked flask, 30 g (135 mmol) of d-9, 27 g (149 mmol) of d-8, 6.3 g (5.4 mmol) of $Pd(PPh_3)_4$, 86 g (406 mmol) of $K_3PO_4$ were added, Ar substitution was performed, and 800 mL of toluene, 100 mL of EtOH, and 100 mL of $H_2O$ were added thereto, followed by stirring at about 50° C. for about 5 hours. Water was added to a reaction system, an organic layer was extracted using toluene and dried with magnesium sulfate, and the solvent was removed by distillation. The crude product thus obtained was separated by silica gel column chromatography (a mixture solvent of hexane/toluene) and recrystallization (a mixture solvent of ethanol/toluene) to obtain 51 g (yield 94%) of a white solid. By the FABMS measurement of the thus obtained product, the molecular weight of 402 was confirmed, and the production of Intermediate d-10 was confirmed.

Synthesis of Intermediate d-11

To a three-necked flask, 50 g (201 mmol) of d-10, 153 g (603 mmol) of d-4, 9.2 g (10 mmol) of $Pd_2(dba)_3$, 9.6 g (20 mmol) of XPhos and 59 g (603 mmol) of KOAc were added, Ar substitution was performed, and 400 mL of dioxane was added thereto, followed by stirring at about 110° C. for about 10 hours. Water was added to a reaction system, an organic layer was extracted using toluene and dried with magnesium sulfate, and the solvent was removed by distillation. The crude product thus obtained was separated by silica gel column chromatography (a mixture solvent of hexane/toluene) and recrystallization (a mixture solvent of ethanol/toluene) to obtain 46 g (yield 67%) of a white solid. By the FABMS measurement of the thus obtained product, the molecular weight of 340 was confirmed, and the production of Intermediate d-11 was confirmed.

Synthesis of Intermediate d-12

To a three-necked flask, 42 g (123 mmol) of d-11, 30 g (112 mmol) of d-7, 5.2 g (4.5 mmol) of $Pd(PPh_3)_4$, and 36 g (168 mmol) of $K_3PO_4$ were added, Ar substitution was performed, and 1000 mL of toluene, 200 mL of EtOH, and 200 mL of $H_2O$ were added thereto, followed by stirring at about 100° C. for about 24 hours. Water was added to a reaction system, an organic layer was extracted using toluene and dried with magnesium sulfate, and the solvent was removed by distillation. The crude product thus obtained was separated by silica gel column chromatography (a mixture solvent of hexane/toluene) and recrystallization (a mixture solvent of ethanol/toluene) to obtain 30 g (yield 69%) of a white solid. By the FABMS measurement of the thus obtained product, the molecular weight of 384 was confirmed, and the production of Intermediate d-12 was confirmed.

Synthesis of Intermediate d-13

To a three-necked flask, 30 g (78 mmol) of d-12, 13 g (39 mmol) of d-5, 9 g (7.8 mmol) of $Pd(PPh_3)_4$, and 100 g (469 mmol) of $K_3PO_4$ were added, Ar substitution was performed, and 400 mL of toluene, 40 mL of EtOH, and 40 mL of $H_2O$ were added thereto, followed by stirring at about 110° C. for about 24 hours. Water was added to a reaction system, an organic layer was extracted using toluene and dried with magnesium sulfate, and the solvent was removed by distillation. The crude product thus obtained was separated by silica gel column chromatography (a mixture solvent of hexane/toluene) and recrystallization (a mixture solvent of ethanol/toluene) to obtain 46 g (yield 54%) of a white solid. By the FABMS measurement of the thus obtained product, the molecular weight of 1079 was confirmed, and the production of Intermediate d-13 was confirmed.

Synthesis of Compound D-9

To a three-necked flask, 30 g (29 mmol) of d-13 was added, Ar substitution was performed, 300 mL of ODCB was added for dissolution, and the internal temperature was reduced to about 0° C. 56 g (222 mmol) of $BBr_3$ was added to the flask dropwise using a dropping funnel and stirring was performed at room temperature for about 6 hours. 78 mL (444 mmol) of DIPEA was added, and stirring was performed at about 160° C. for about 1 hour. The reaction product was washed in installments using a large amount of acetonitrile, and a solid was recovered by filtering. The crude product thus obtained was separated by silica gel column chromatography (a mixture solvent of hexane/dichloromethane) and recrystallization (a mixture solvent of ethanol/toluene) to obtain 1.7 g (yield 6%) of a yellow solid. By the FABMS measurement of the thus obtained product, the molecular weight of 1034 was confirmed, and the production of Compound D-9 was confirmed.

Example 2. Manufacture of Light Emitting Diode and Evaluation of Polycyclic Compound Light emitting diodes of embodiments including polycyclic compounds of embodiments in an emission layer were manufactured by a method below.

Light emitting diodes were manufactured using Compound B-13 and Compound D-9 as dopant materials of an emission layer.

Light emitting diodes of the Comparative Examples were manufactured using Comparative Compound $R_1$, Comparative Compound $R_2$, Comparative Compound $R_3$, and Comparative Compound $R_4$, as dopant materials of an emission layer.

The compounds used in an emission layer in Example 1, Example 2, and Comparative Example 1 to Comparative Example 4 are as follows.

B-13

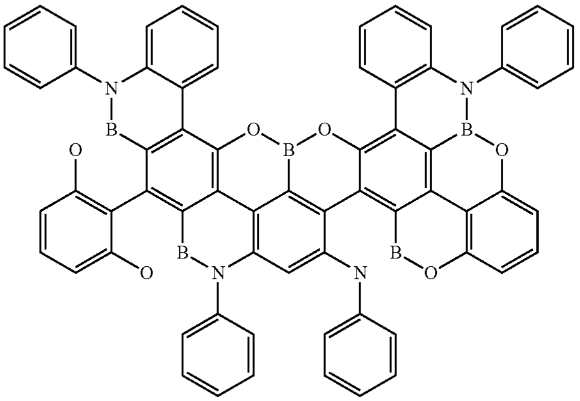

D-9

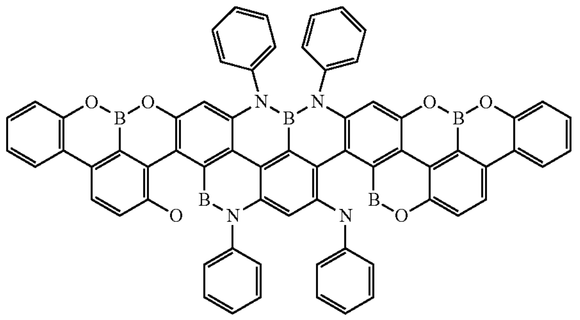

(Comparative Compounds used for the manufacture of diodes)

R1

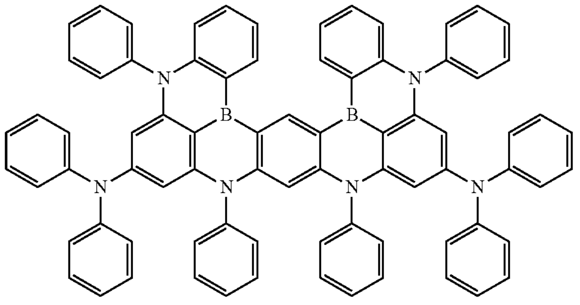

R2

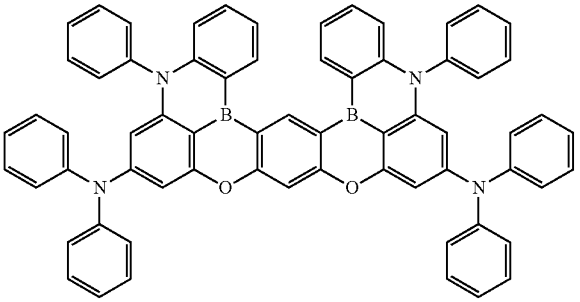

-continued

R3

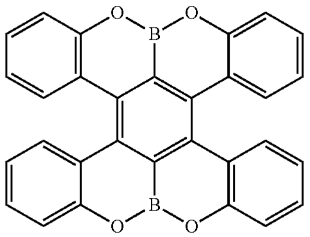

R4

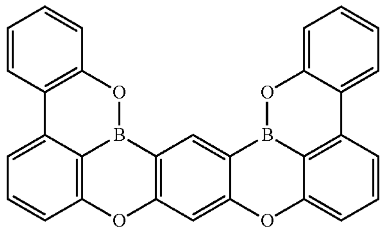

(Calculation of Molecular Orbital of Compound)

Table 1 shows the lowest triplet excitation energy level (Ti energy level), the lowest singlet excitation energy level (S1 energy level), and $\Delta E_{ST}$ for Example Compound B-13, Example Compound D-9, Comparative Compound R1, Comparative Compound R2, Comparative Compound R3, and Comparative Compound R4.

$\Delta E_{ST}$ is a value of the difference between the Si energy level and the Ti energy level.

The values were calculated by a nonempirical molecular orbital method, using Gaussian 09 which is a product of Gaussian Co, using B3LYP as a functional and 6-31G(d) as a basis function.

TABLE 1

| Compound | $S_1$ energy level (eV) | $T_1$ energy level (eV) | $\Delta E_{ST}$ (eV) | Molecular weight |
|---|---|---|---|---|
| Example Compound B-13 | 2.91 | 2.52 | 0.39 | 1034 |
| Example Compound D-9 | 2.89 | 2.46 | 0.43 | 1034 |
| Comparative Compound R1 | 2.90 | 2.58 | 0.32 | 1097 |
| Comparative Compound R2 | 3.04 | 2.71 | 0.33 | 947 |
| Comparative Compound R3 | 3.01 | 2.03 | 0.98 | 462 |
| Comparative Compound R4 | 3.23 | 2.73 | 0.50 | 462 |

Referring to the results of Table 1, the AEST values of Example Compound B-13, Example Compound D-9, Comparative Compound R1, Comparative Compound R2, and Comparative Compound R4 were measured as about 0.32 eV or more and about 0.50 eV or less. The $\Delta E_{ST}$ value of Comparative Compound $R_3$ was measured as about 0.86 eV or more.

(Evaluation of Fluorescence Emission Properties of Compound)

For the evaluation of emission properties, an about 20 wt % of a dope layer was formed on a quartz glass by deposition using PPF as a matrix, and fluorescence emission spectrum was measured using a JASCO V-670 spectrometer. A fluorescence quantum yield was measured using a JASCOILF-835 integrating sphere system.

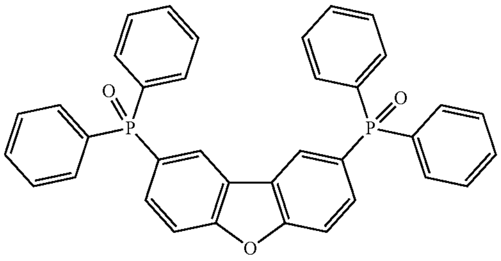

PPF

TABLE 2

| Compound | $\lambda_{max}$ (nm) | Fluorescence quantum yield (%) |
|---|---|---|
| Example Compound B-13 | 463 | 86.4 |
| Example Compound D-9 | 470 | 95.9 |
| Comparative Compound R1 | 467 | 85.5 |
| Comparative Compound R2 | 449 | 83.1 |
| Comparative Compound R3 | 430 | 62.5 |
| Comparative Compound R4 | 425 | 50.2 |

Referring to the results of Table 2, Example Compound B-13, Example Compound D-9, and Comparative Compounds R1 to R4 emitted light in a wavelength region of about 360 nm to about 470 nm. The fluorescence quantum yield was measured as values of about 50.2% or more and about 95.9% or less.

(Manufacture and Evaluation of Light Emitting Diode Including Polycyclic Compound)

The evaluation on the emission properties of the polycyclic compound of an embodiment, and the light emitting diode of an embodiment, including the polycyclic compound of an embodiment in an emission layer, was conducted by the methods below. The manufacturing method of a light emitting diode for evaluating a diode is described below.

(Manufacture of Light Emitting Diode)

For the formation of a first electrode, an ITO glass substrate of about 15 $\Omega/cm^2$ (1200 Å) of Corning Co. was cut into a size of 50 mm×50 mm×0.7 mm, washed by ultrasonic waves using isopropyl alcohol and pure water for about 5 minutes each, and cleaned by exposing to ultraviolet rays for about 10 minutes and exposing to ozone, and the glass substrate was installed in a vacuum deposition apparatus.

On the glass substrate, HAT-CN was vacuum deposited to a thickness of about 100 Å to form a hole injection layer, and on the hole injection layer, Compound a-NPD was vacuum deposited to a thickness of about 400 Å to form a hole transport layer.

On the hole transport layer, mCBP was vacuum deposited to a thickness of about 50 Å to form an electron blocking layer.

On the electron blocking layer, the Example Compound or Comparative Compound as a dopant, and mCBP as a host were co-deposited with a weight ratio of dopant:host of 20:80 to form an emission layer with a thickness of about 200 Å. Here, Comparative Compound R3 had a large AEST value as a dopant material, and was not used for the manufacture of a diode.

On the emission layer, TPBI was vacuum deposited to a thickness of about 300 Å to form an electron transport layer, and Liq was deposited on the electron transport layer to a thickness of about 5 Å to form an electron injection layer.

On the electron injection layer, Al was vacuum deposited to a thickness of about 1000 Å to form a second electrode.

The compounds used for the manufacture of the light emitting diodes are as follows.

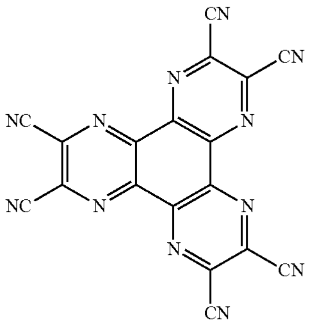

HAT-CN

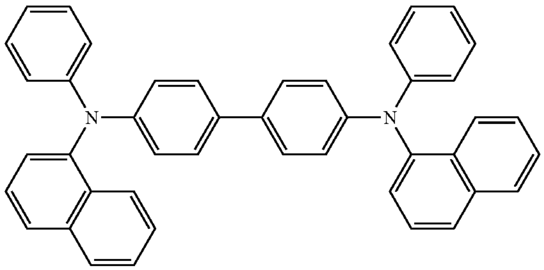

α-NPB

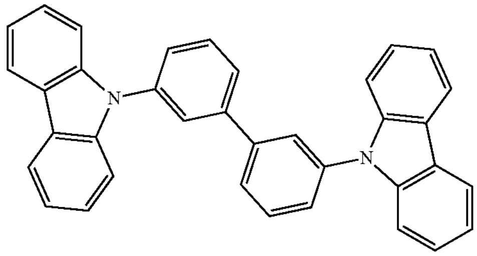

mCBP

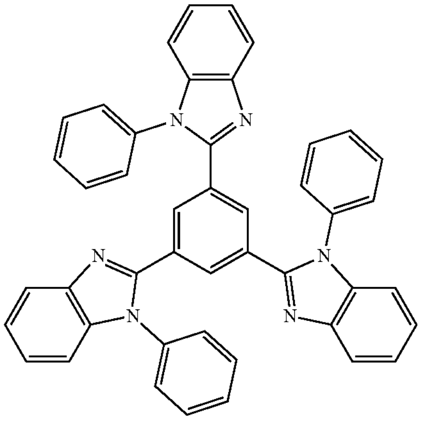

TPBi (Evaluation of Properties of Light Emitting Diode)

In Table 3, the dopant compounds of the light emitting diodes thus manufactured, the maximum emission wavelength ($\lambda_{max}$), the maximum value of the external quantum efficiency ($EQE_{max}$), and the half-life ($LT_{50}$) were evaluated.

In Table 3, the voltage and current density of a light emitting diode was measured using a source meter (Keithley Instrument Co., 2400 series), and the luminance and external quantum efficiency were measured using an external quantum efficiency measurement apparatus, C9920-12 of Hamamatsu Photonics Co.

In Table 3, the half-life ($LT_{50}$) was measured based on a time where a luminance was deteriorated to about 50% from the initial value of luminance if the light emitting diodes of the Examples and Comparative Examples were continuously driven at a current density of about 10 mA/cm$^2$. The half-life ($LT_{50}$) was evaluated as a relative ratio on the basis of 100% of the half-life value of Comparative Example 1.

No light emission was confirmed for the light emitting diodes of Comparative Example 3 and Comparative Example 4.

TABLE 3

| Division | Dopant compound | $\lambda_{max}$ (nm) | $EQE_{max}$ (%) | $LT_{50}$ (%) |
|---|---|---|---|---|
| Example 1 | Example Compound B-12 | 464 | 25 | 132 |
| Example 2 | Example Compound D-9 | 472 | 23 | 180 |
| Comparative Example 1 | Comparative Compound R1 | 469 | 21 | 100 |
| Comparative Example 2 | Comparative Compound R2 | 450 | 15 | 15 |
| Comparative Example 3 | Comparative Compound R3 | — | — | — |
| Comparative Example 4 | Comparative Compound R4 | — | — | — |

Referring to the results of Table 3, it could be found that the light emitting diodes of Example 1 and Example 2, including the polycyclic compound of an embodiment showed excellent half-life and improved emission efficiency when compared to the light emitting diodes of the Comparative Examples. The light emitting diodes of Example 1 and Example 2 emitted light in a blue wavelength region of about 460 nm or more and about 485 nm or less, and showed an $EQE_{max}$ value of about 23% or more and LT50 of about 132% or more.

In contrast, the light emitting diodes of Comparative Example 1 and Comparative Example 2 emitted light in a blue wavelength region of about 460 nm or more to about 485 nm or less, and showed an $EQE_{max}$ value of about 21% or less and $LT_{50}$ of about 100% and 15%. It is thought that Comparative Compound R1 and Comparative Compound R2 does not include a boron atom to which at least one heteroatom is directly bonded, and a structure forming a ring through the combination of the heteroatom directly bonded to the boron atom with an adjacent group, thereby showing lower bond dissociation energy than the polycyclic compound according to embodiments.

The polycyclic compound according to an embodiment may include a structure including two or more boron atoms to which at least one heteroatom is directly bonded. The heteroatom forms a ring with an adjacent group. The polycyclic compound according to an embodiment may include two or more boron atoms to which at least one heteroatom is directly bonded. Accordingly, the bond dissociation energy of the polycyclic compound according to embodiments may increase, and the stability of a molecule may be improved.

The light emitting diode according to an embodiment may include the polycyclic compound in an emission layer, and diode life may increase, and improved emission efficiency may be shown.

The light emitting diode according to an embodiment may show improved emission efficiency and excellent life.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light emitting diode, comprising:

a first electrode;

a second electrode disposed on the first electrode; and an emission layer disposed between the first electrode and the second electrode, and comprising a polycyclic compound, wherein the polycyclic compound comprises:

a first aromatic hydrocarbon ring;

a second aromatic hydrocarbon ring directly bonded to the first aromatic hydrocarbon ring;

a first atom directly bonded to the first aromatic hydrocarbon ring;

a second atom directly bonded to the first aromatic hydrocarbon ring or to the second aromatic hydrocarbon ring;

a first compound directly bonded to the first atom;

a second compound directly bonded to the first atom;

a third compound directly bonded to the second atom; and a fourth compound directly bonded to the second atom, the first atom and the second atom are each independently B, Al, or Ga, at least one of the first compound or the second compound comprises a heteroatom, at least one of the third compound or the fourth compound comprises a heteroatom, at least one of the first to fourth compounds is combined with an adjacent group to form a ring, and the first electrode and the second electrode each independently comprises at least one selected from Ag, Mg, Cu, Al, Pt, Pd, Au, Ni, Nd, Ir, Cr, Li, Ca, LiF, Mo, Ti, W, In, Sn, Zn, oxides thereof, compounds thereof, and mixtures thereof, wherein the first aromatic hydrocarbon ring and the second aromatic hydrocarbon ring are each independently a substituted or unsubstituted benzene ring.

2. The light emitting diode of claim 1, wherein the first atom and the second atom are each a boron atom (B).

3. The light emitting diode of claim 1, wherein the first compound to the fourth compound are each independently $O(R_{1a})_{m1}$, $N(R_{1b})_{m2}$, $P(R_{1c})_{m3}$, $P(=O)(R_{1d})_{m4}$, $P(=S)(R_{1e})_{m5}$, $S(R_{1f})_{m6}$, $Si(R_{1g})_{m7}$, $Al(R_{1h})_{m8}$, $Ga(R_{1i})_{m9}$, $As(R_{1j})_{m10}$, $Ge(R_{1k})_{m11}$, or $C(R_{1l})_{m12}$, $R_{1a}$ to $R_{1l}$ are each independently a hydrogen atom, a deuterium atom, a halogen atom, a cyano group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, m1 and m6 are each independently 0 or 1, m2, m3, m4, m5, m8, m9, and m10 are each independently an integer from 0 to 2, and m7, m11, and m12 are each independently an integer from 0 to 3.

4. The light emitting diode of claim 1, wherein the first compound or the second compound is directly bonded to the second aromatic hydrocarbon ring to form a ring.

5. The light emitting diode of claim 1, wherein in the case where the second atom is directly bonded to the first aromatic hydrocarbon ring, the third compound or the fourth compound is directly bonded to the second aromatic hydrocarbon ring to form a ring.

6. A light emitting diode, comprising:

a first electrode;

a second electrode disposed on the first electrode; and an emission layer disposed between the first electrode and the second electrode, and comprising a polycyclic compound, wherein the polycyclic compound comprises:

a first aromatic hydrocarbon ring;

a second aromatic hydrocarbon ring directly bonded to the first aromatic hydrocarbon ring;

a first atom directly bonded to the first aromatic hydrocarbon ring;

a second atom directly bonded to the first aromatic hydrocarbon ring or to the second aromatic hydrocarbon ring;

a first compound directly bonded to the first atom;

a second compound directly bonded to the first atom;

a third compound directly bonded to the second atom; and a fourth compound directly bonded to the second atom, the first atom and the second atom are each independently B, Al, or Ga, at least one of the first compound or the second compound comprises a heteroatom, at least one of the third compound or the fourth compound comprises a heteroatom, at least one of the first to fourth compounds is combined with an adjacent group to form a ring, and the first electrode and the second electrode each independently comprises at least one selected from Ag, Mg, Cu, Al, Pt, Pd, Au, Ni, Nd, Ir, Cr, Li, Ca, LiF, Mo, Ti, W, In, Sn, Zn, oxides thereof, compounds thereof, and mixtures thereof, wherein in the case where the second atom is directly bonded to the second aromatic hydrocarbon ring, and the third compound or the fourth compound is directly bonded to the first aromatic hydrocarbon ring to form a ring.

7. The light emitting diode of claim 1, wherein the second aromatic hydrocarbon ring is directly bonded to the first aromatic hydrocarbon ring at an ortho position with respect to the first atom.

8. The light emitting diode of claim 1, wherein the polycyclic compound is represented by Formula A or Formula B:

[Formula A]

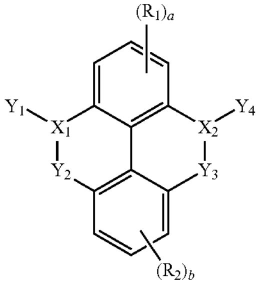

[Formula B]

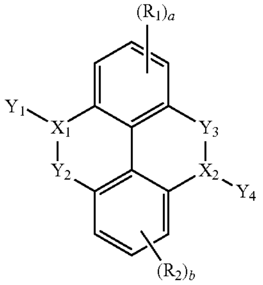

wherein in Formula A and Formula B, $X_1$ and $X_2$ are each independently B, Al, or Ga, $Y_1$, $Y_2$, $Y_3$, and $Y_4$ are each independently $O(R_{1a})_{m1}$, $N(R_{1b})_{m2}$, $P(R_{1c})_{m3}$, $P(=O)(R_{1d})_{m4}$, $P(=S)(R_{1e})_{m5}$, $S(R_{1f})_{m6}$, $Si(R_{1g})_{m7}$, $Al(R_{1h})_{m8}$, $Ga(R_{1i})_{m9}$, $As(R_{1j})_{m10}$, $Ge(R_{1k})_{m11}$, or $C(R_{1l})_{m12}$, $R_1$, $R_2$, and $R_{1a}$ to $R_{1l}$ are each independently a hydrogen atom, a deuterium atom, a halogen atom, a cyano group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, a and b are each independently an integer from 0 to 3, m1 and m6 are each independently 0 or 1, m2, m3, m4, m5, m8, m9, and m10 are each independently an integer from 0 to 2, and m7, m11, and m12 are each independently an integer from 0 to 3.

9. The light emitting diode of claim 1, wherein the emission layer comprises a dopant and a host, and the dopant comprises the polycyclic compound.

10. The light emitting diode of claim 1, wherein the emission layer emits blue light.

11. The light emitting diode of claim 1, wherein the emission layer emits thermally activated delayed fluorescence.

12. The light emitting diode of claim 1, wherein the polycyclic compound comprises one selected from Compound Group 1:

[Compound Group 1]

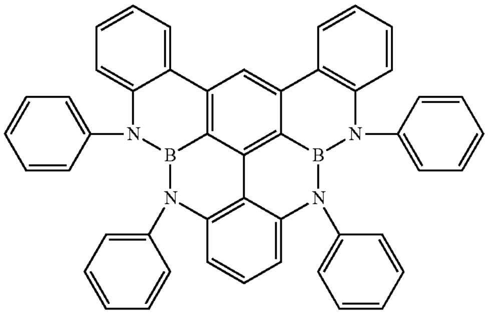

A-1

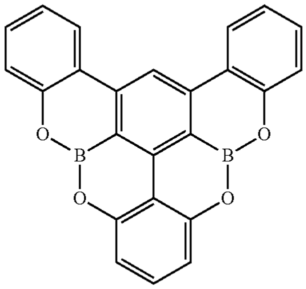

A-2

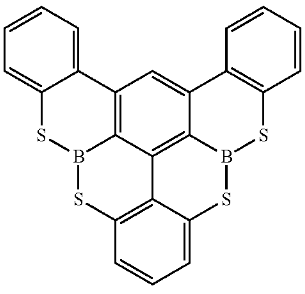

A-3

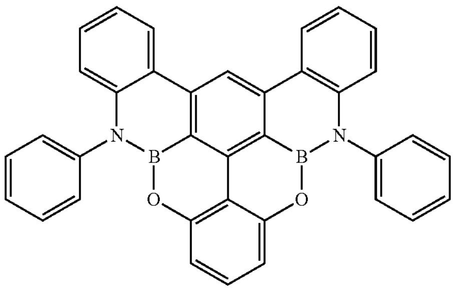

A-4

-continued
A-5
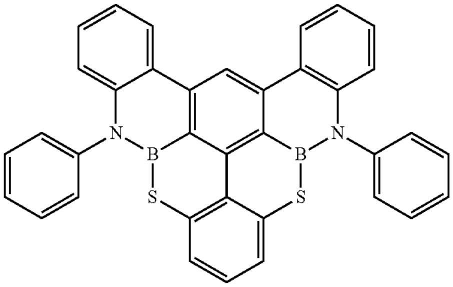
A-6
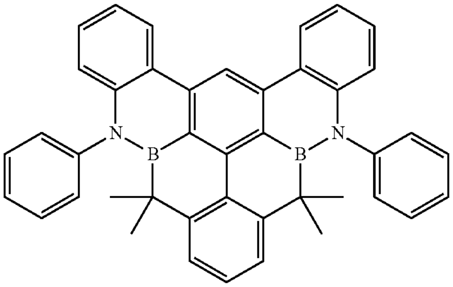
A-7
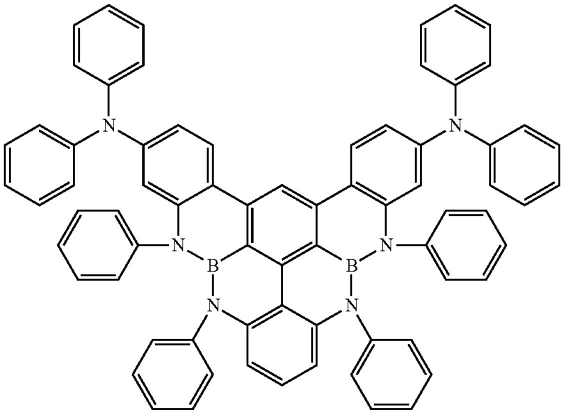
A-8
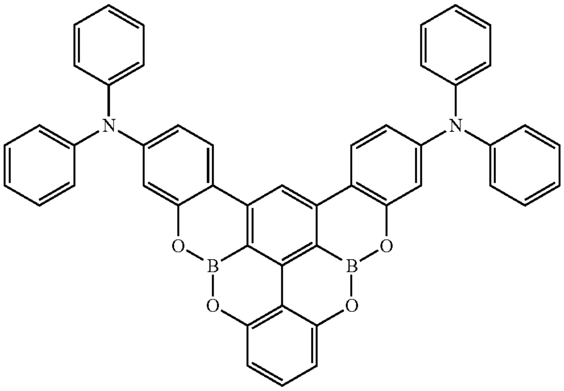
A-9
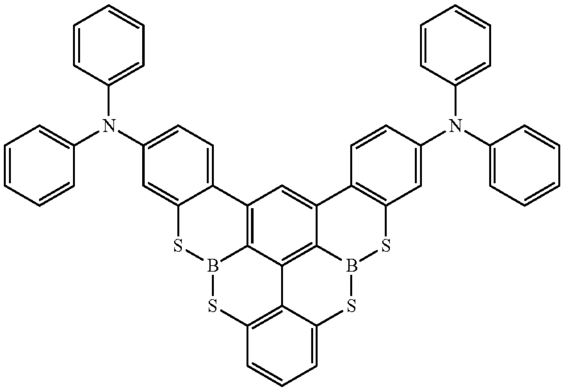
A-10
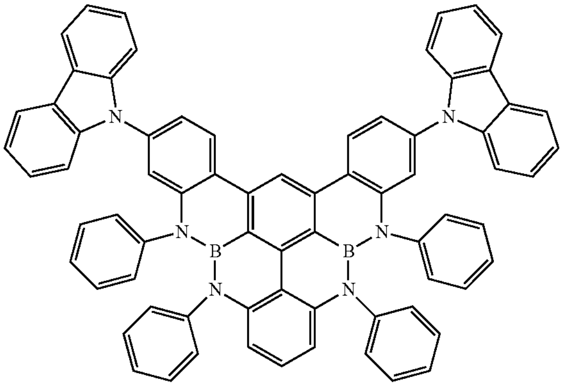
A-11
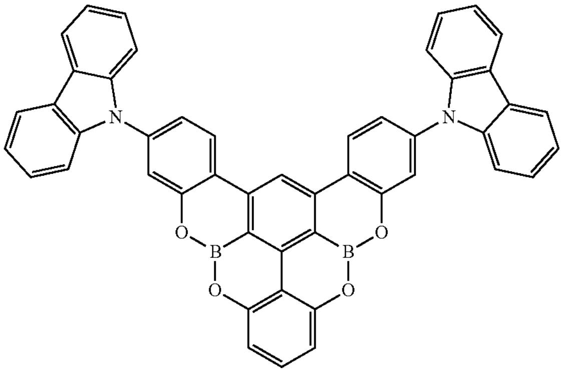
A-12
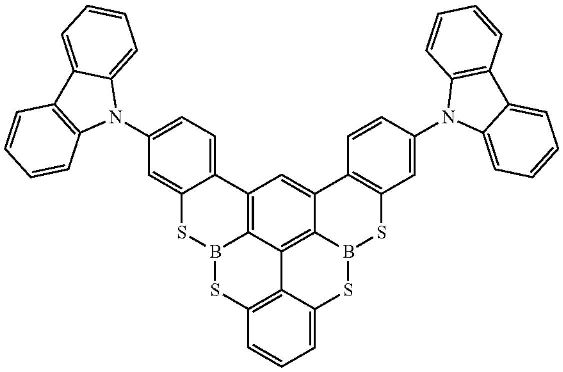

-continued
A-13
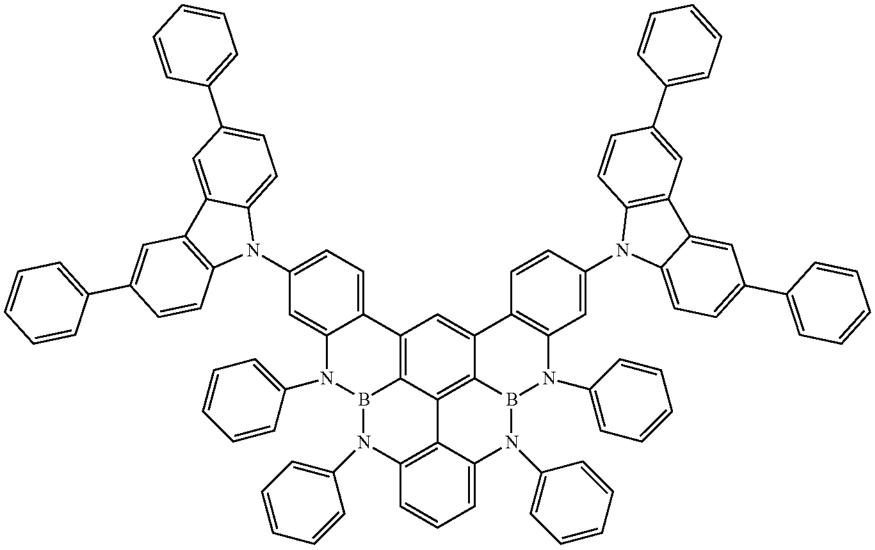
A-14
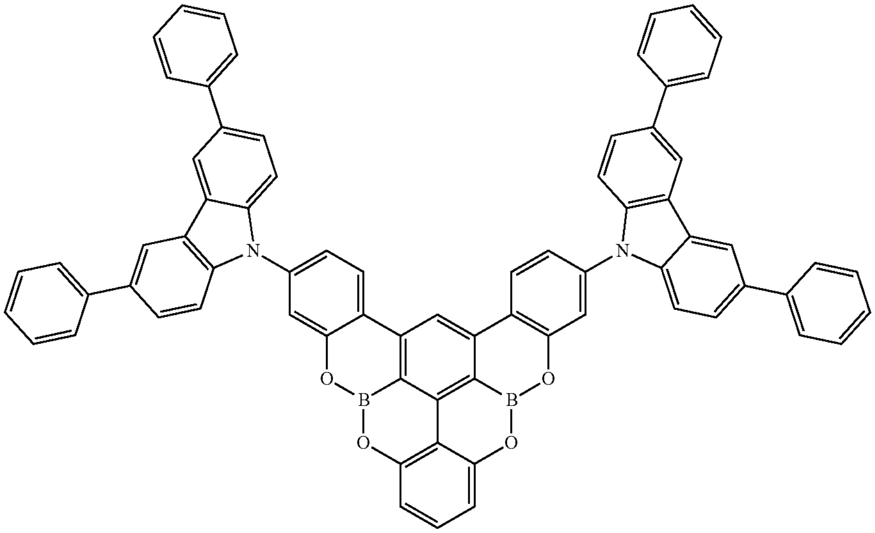
A-15
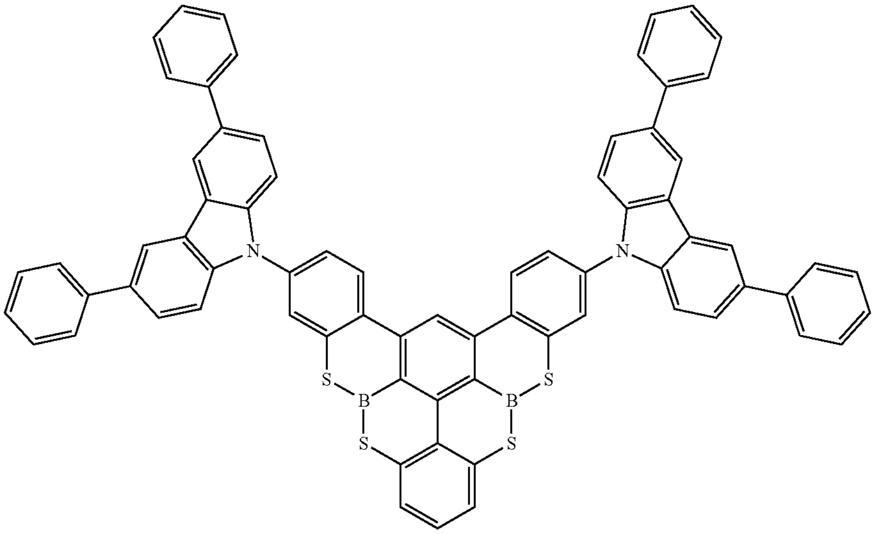

-continued
A-16
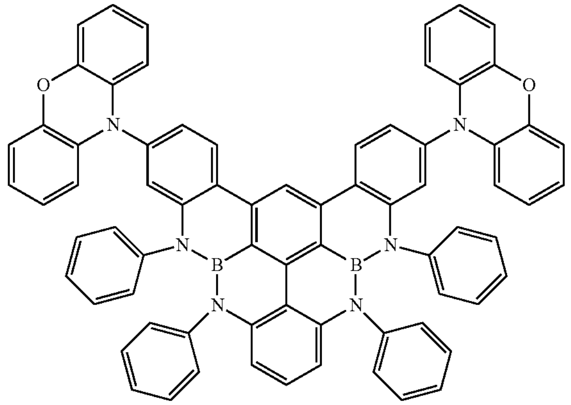
A-17
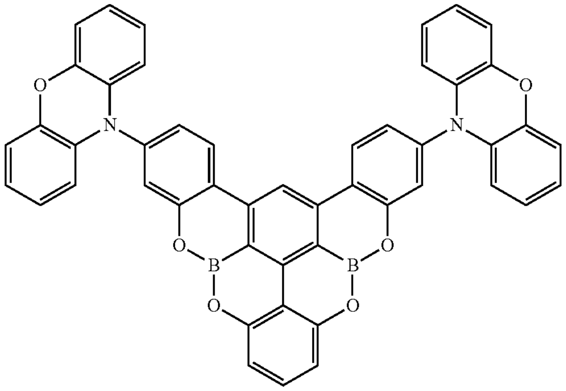
A-18
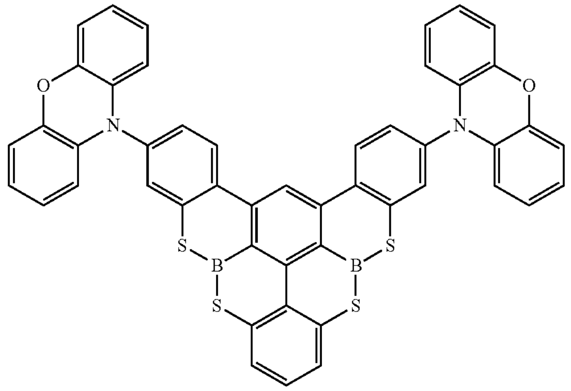
A-19
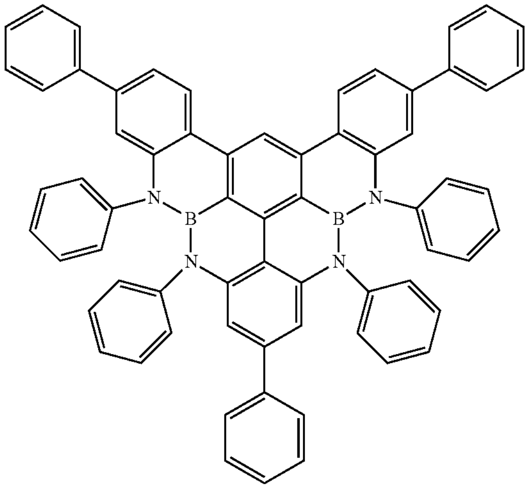
A-20
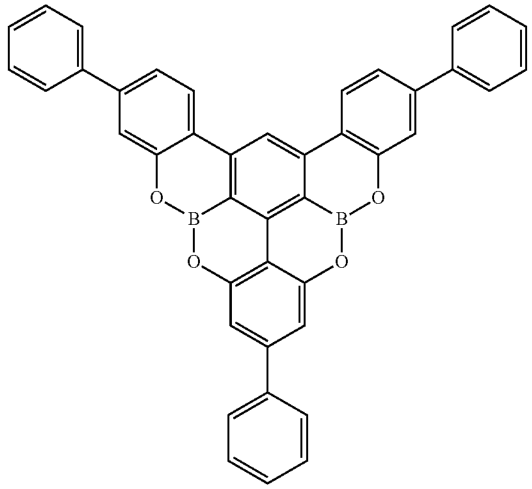
A-21
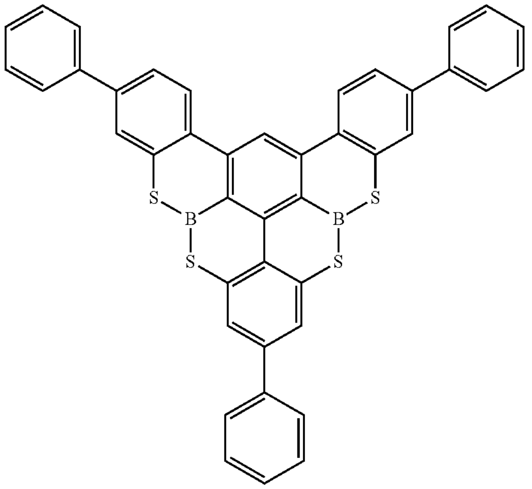

-continued
A-22
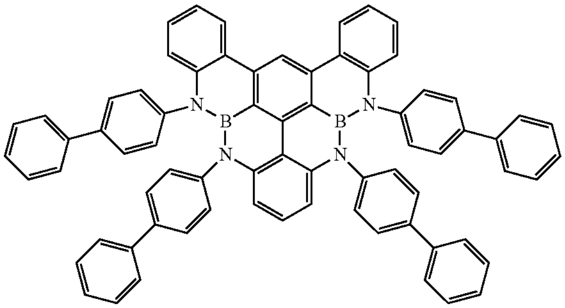
A-23
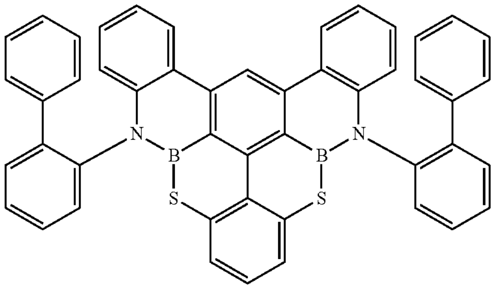
A-24
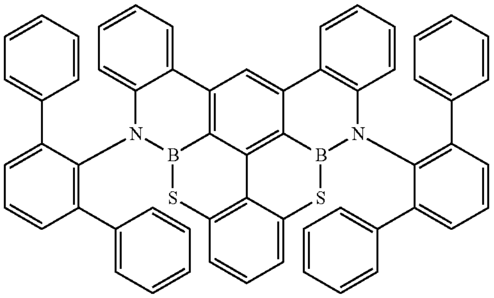
A-25
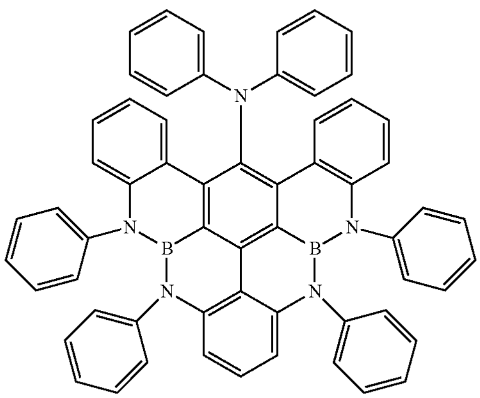
A-26
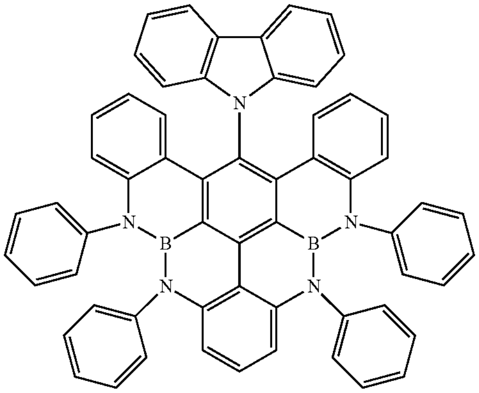
A-27
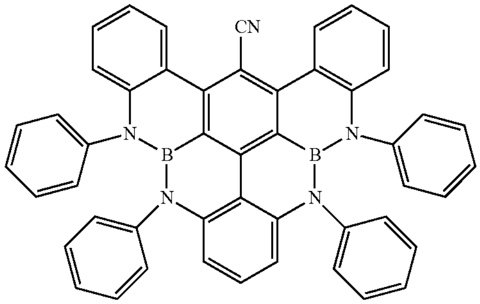
B-1
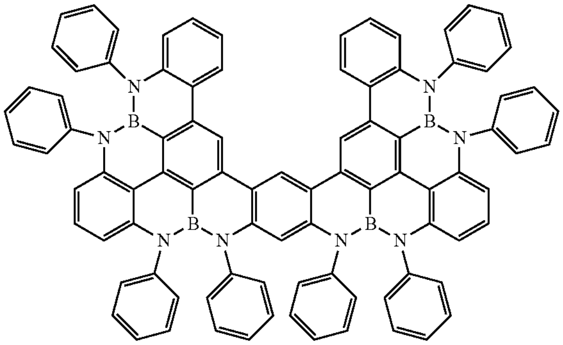
B-2
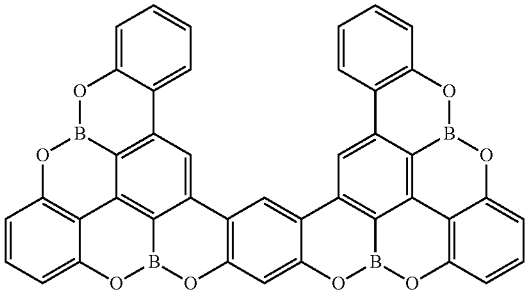

-continued
B-3
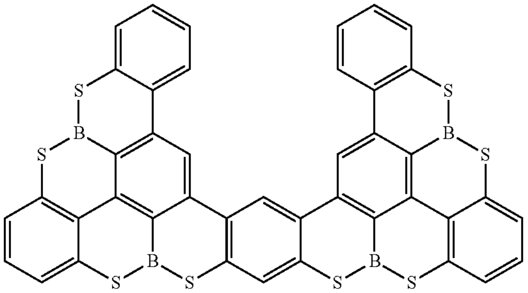
B-4
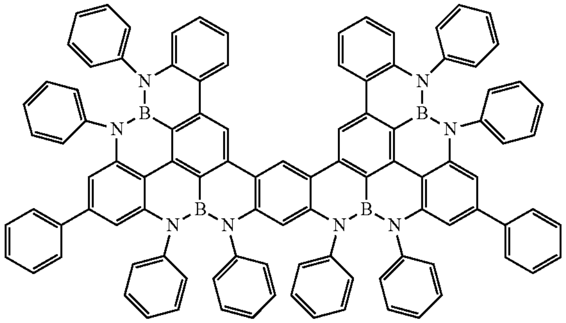
B-5
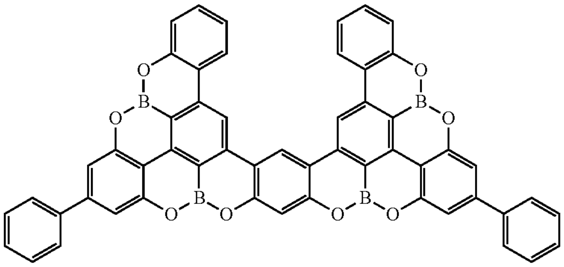
B-6
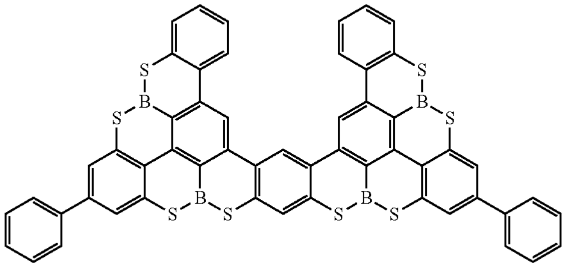
B-7
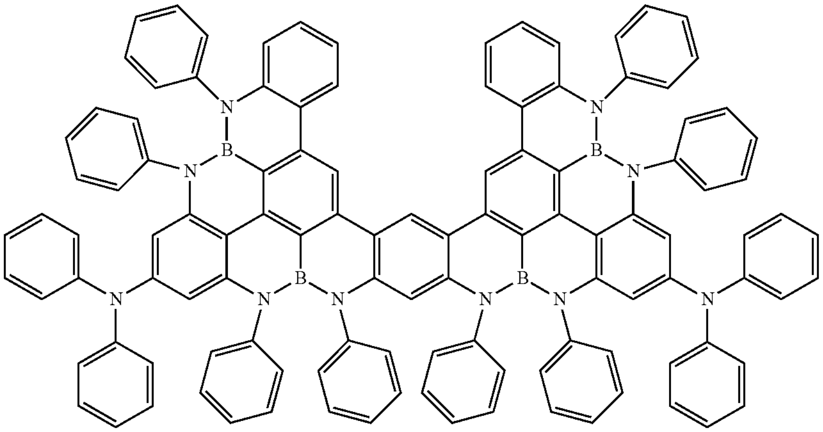
B-8
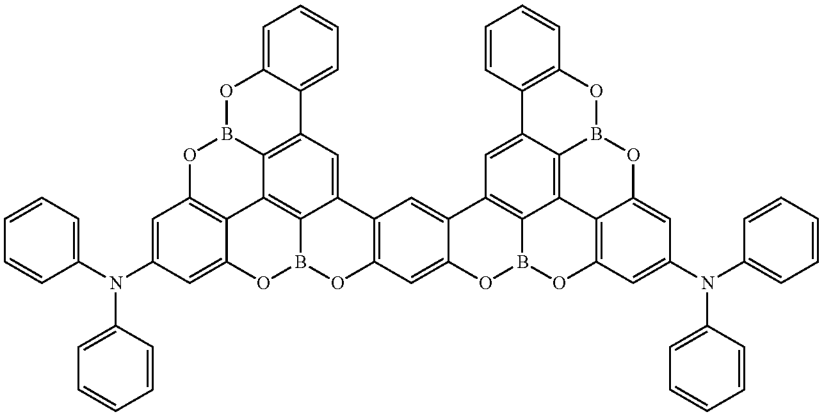

-continued
B-9
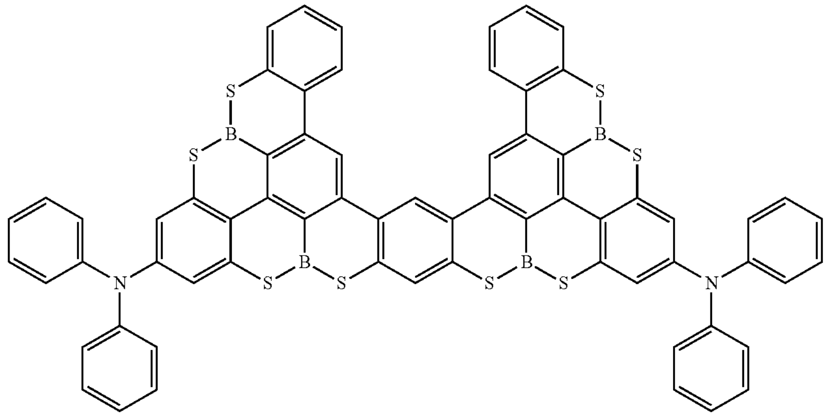
B-10
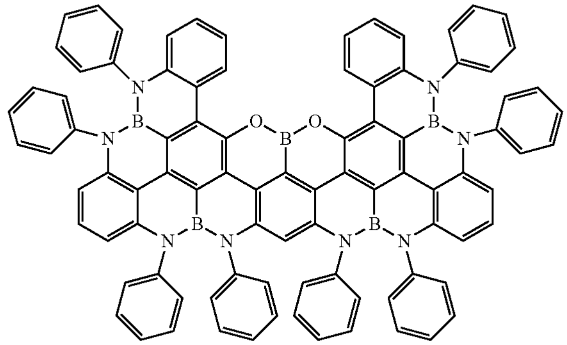
B-11
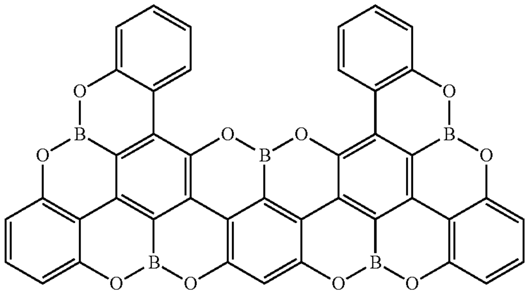
B-12
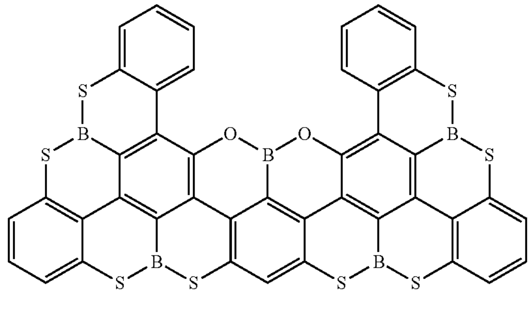
B-13
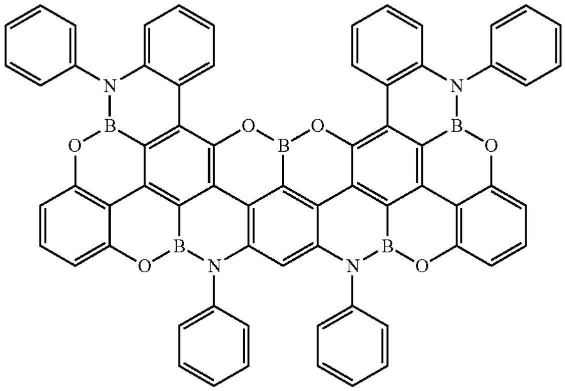
B-14
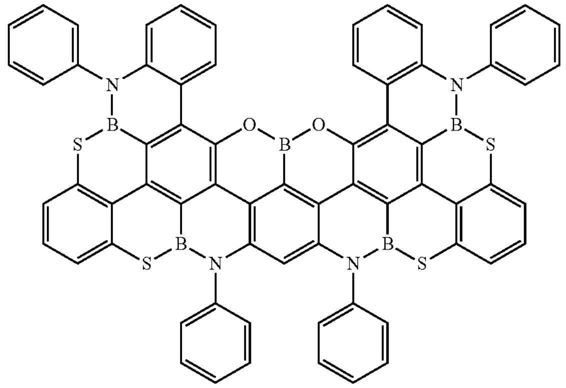
B-15
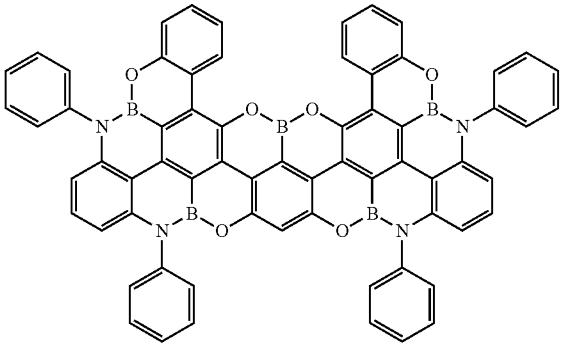

-continued
B-16
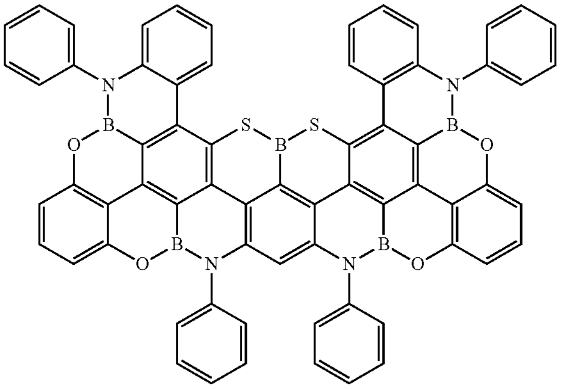
B-17
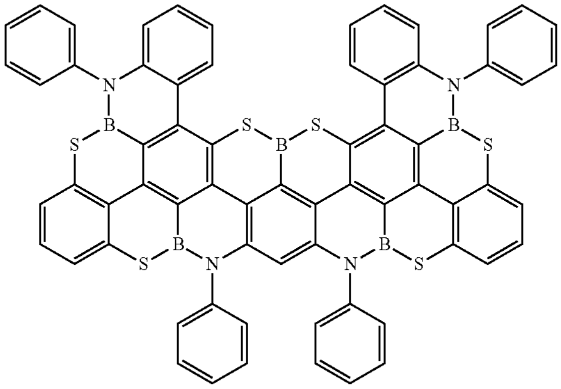
B-18
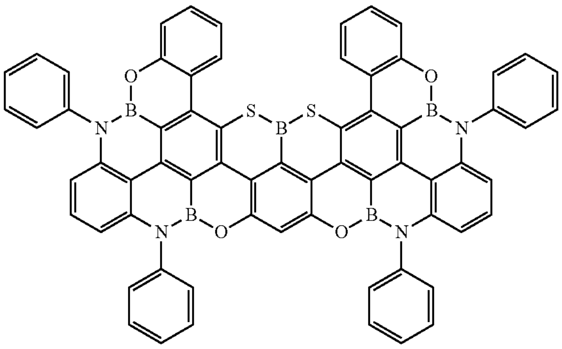
B-19
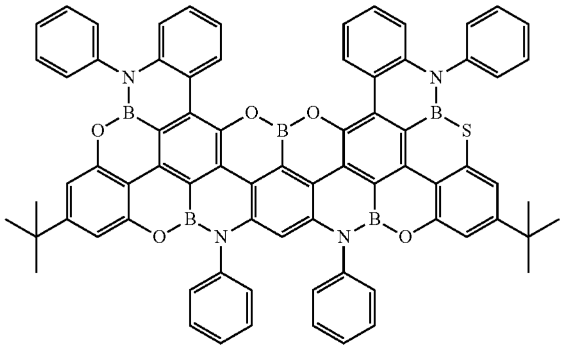
B-20
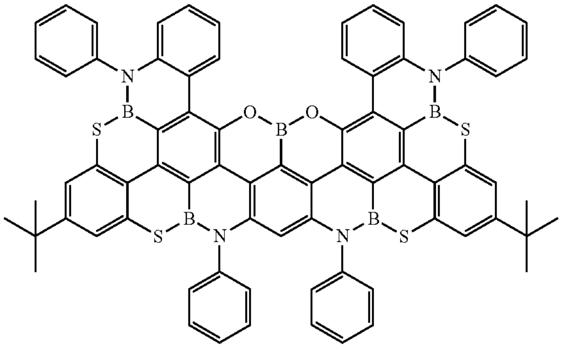
B-21
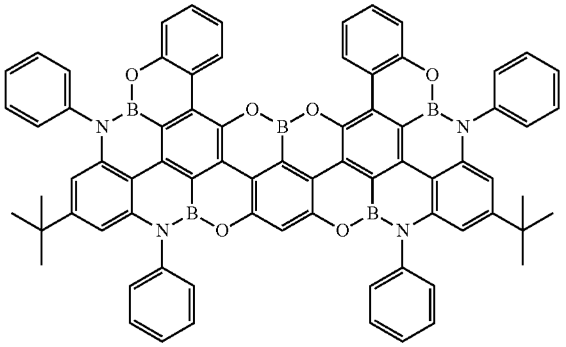
B-22
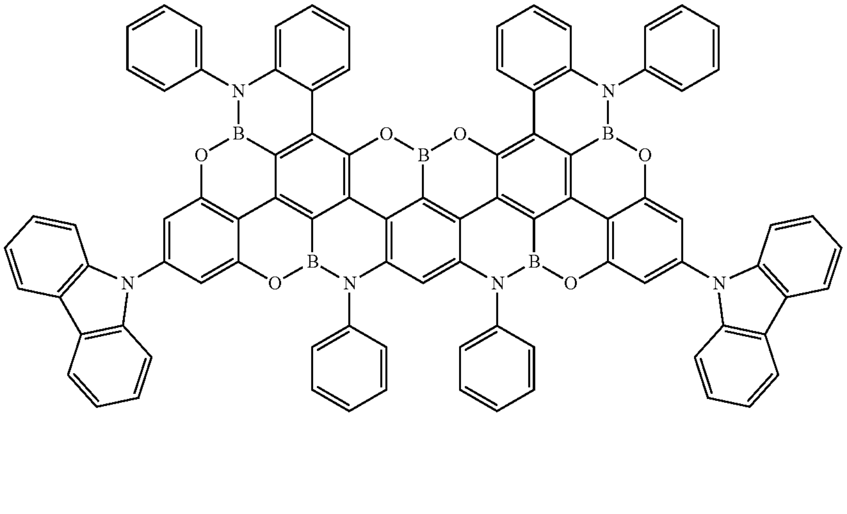

-continued
B-23
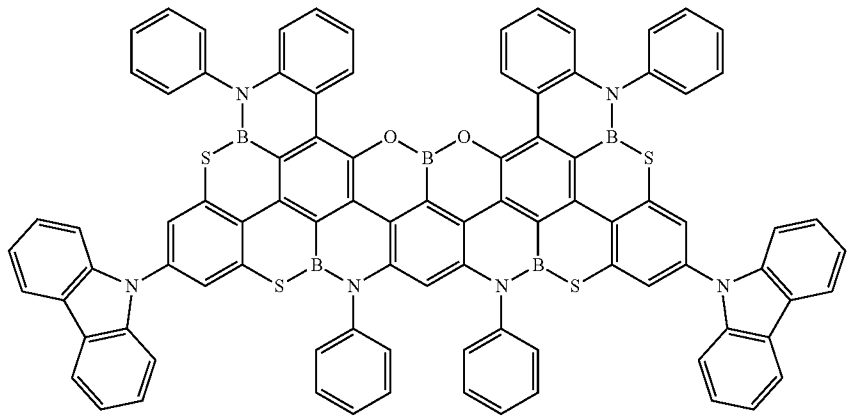
B-24
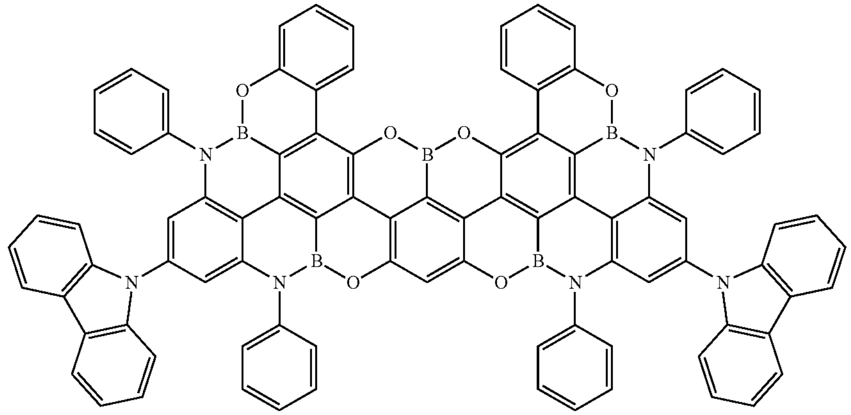
B-25
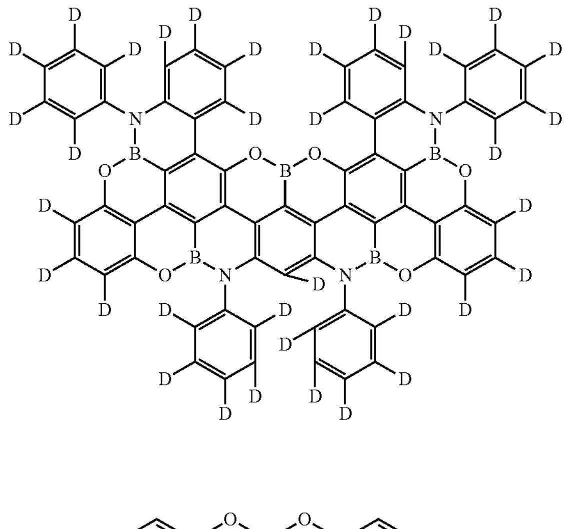
C-1
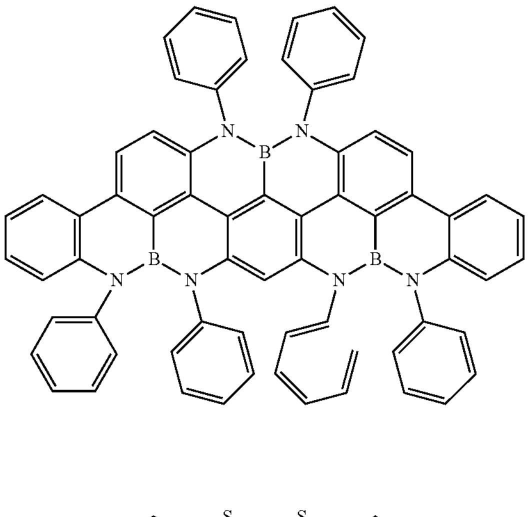
C-2
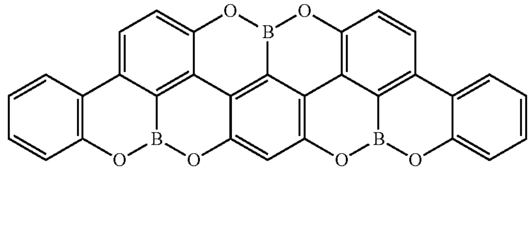
C-3
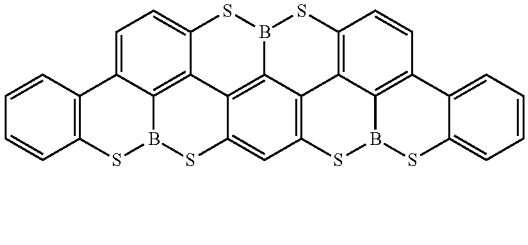

-continued
C-4
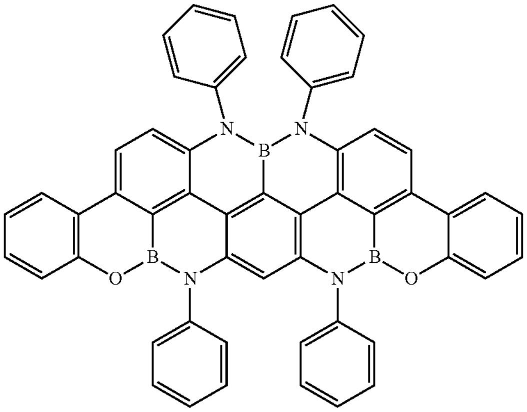
C-5
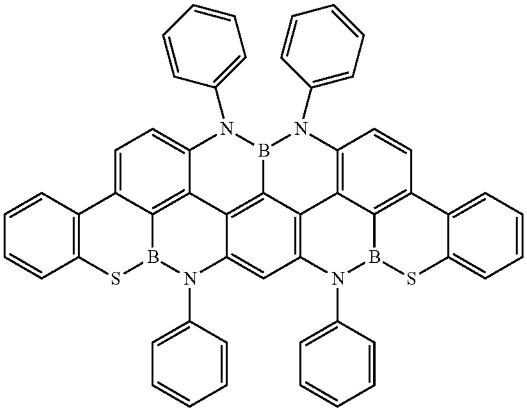
C-6
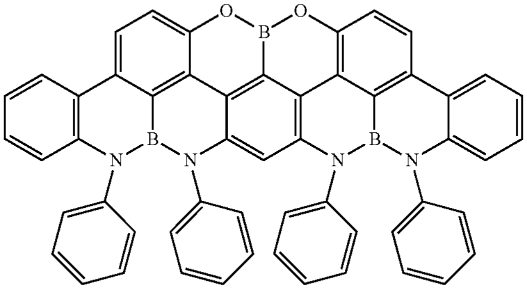
C-7
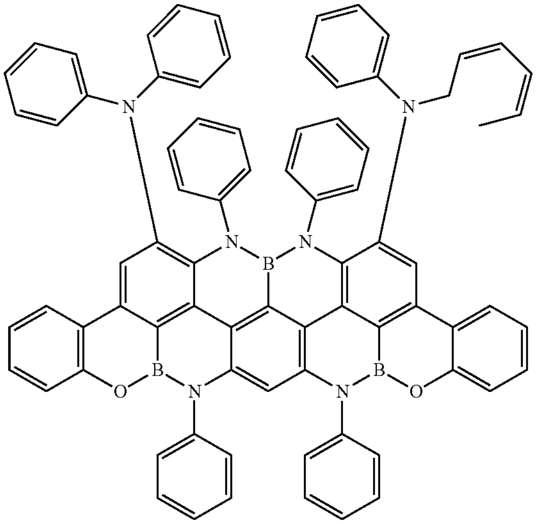
C-8
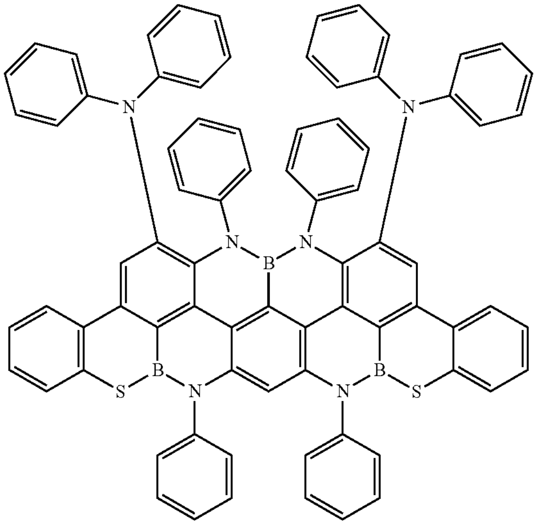
C-9
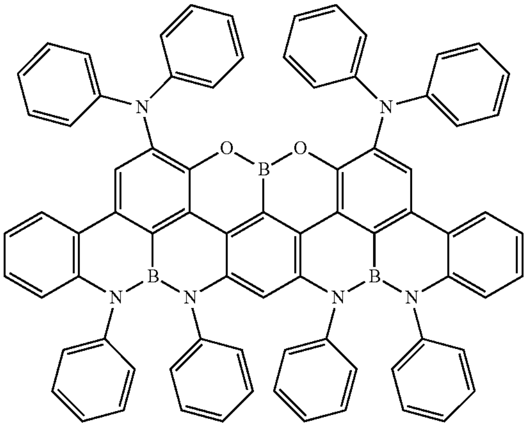

-continued
C-10
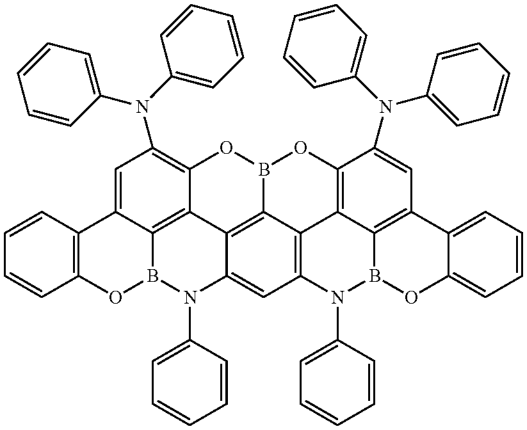
C-11
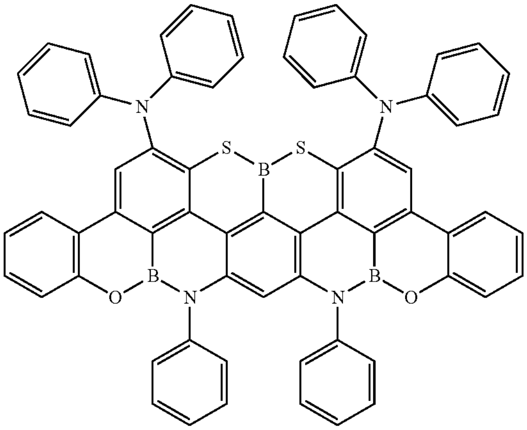
C-12
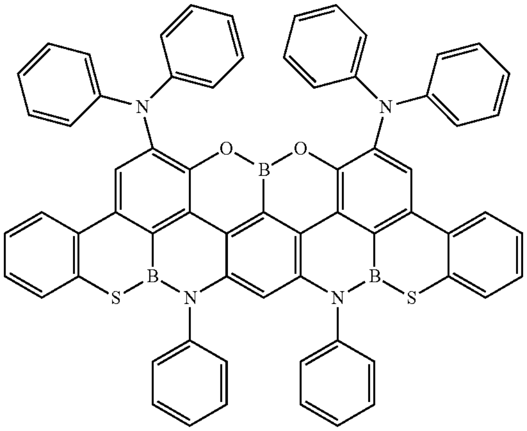
C-13
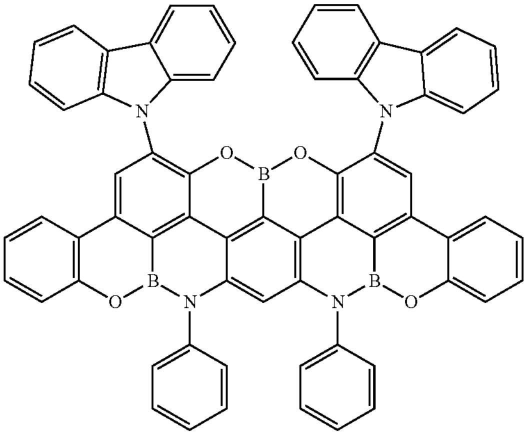
C-14
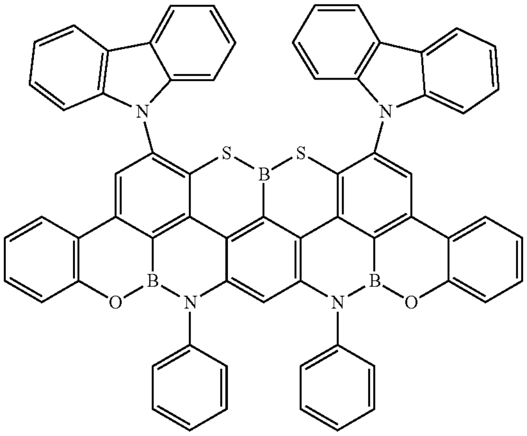
C-15
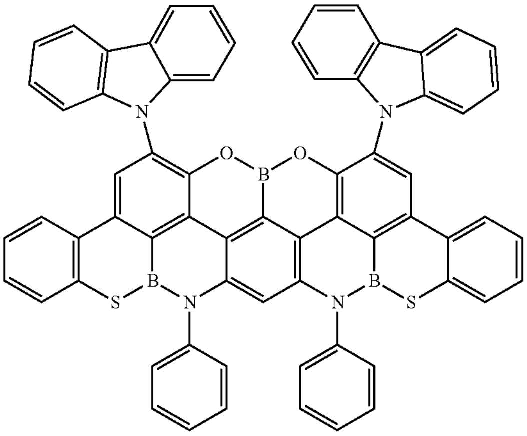

-continued
C-16
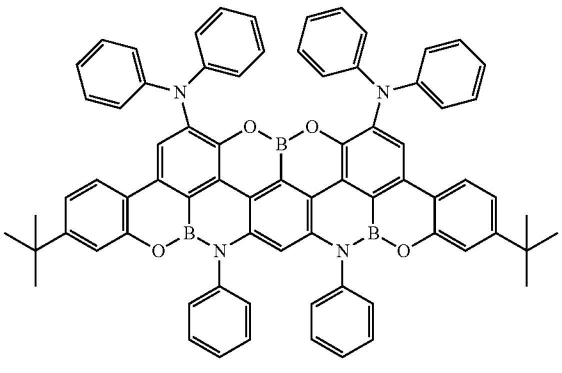
C-17
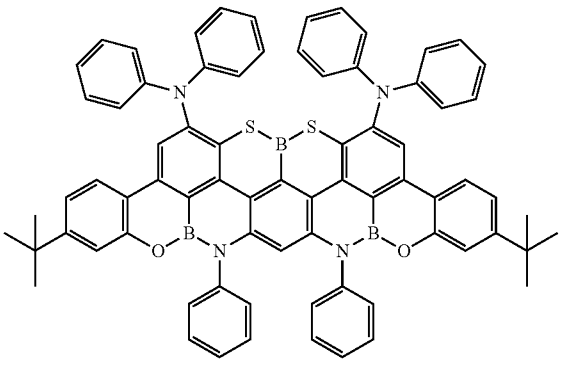
C-18
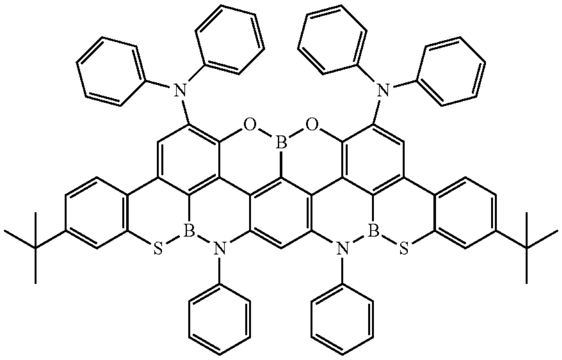
D-1
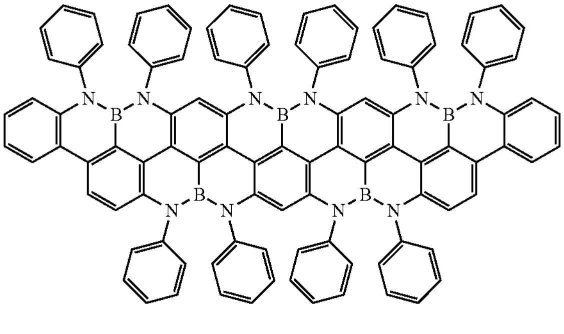
D-2
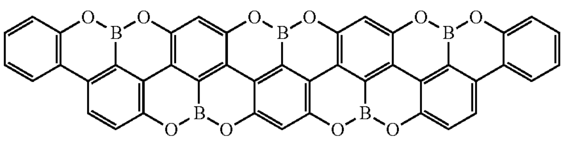
D-3
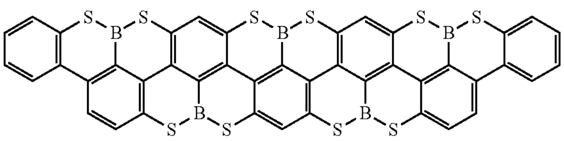
D-4
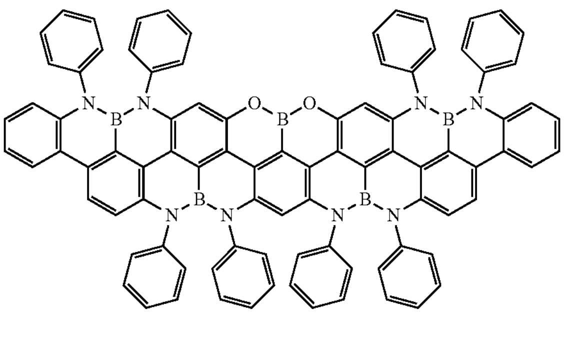
D-5
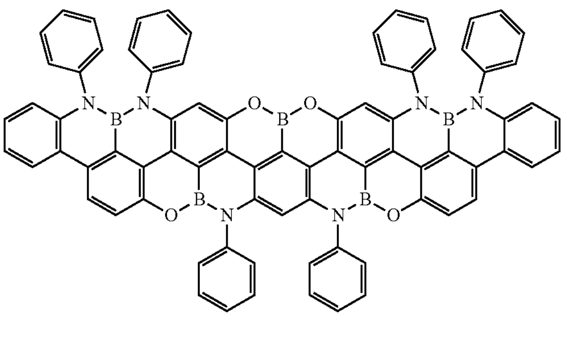
D-6
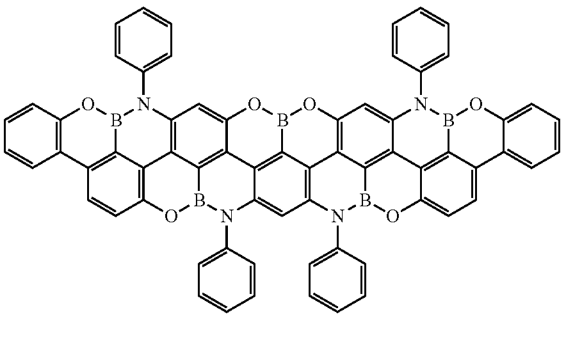
D-7
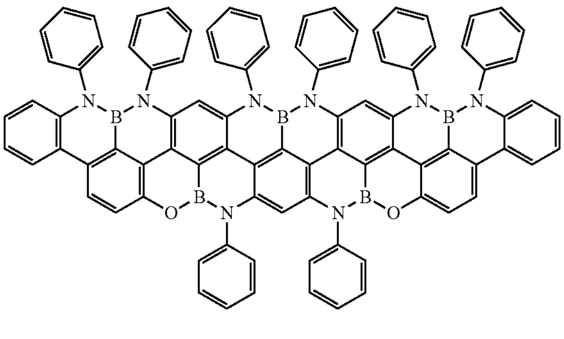

-continued
D-8
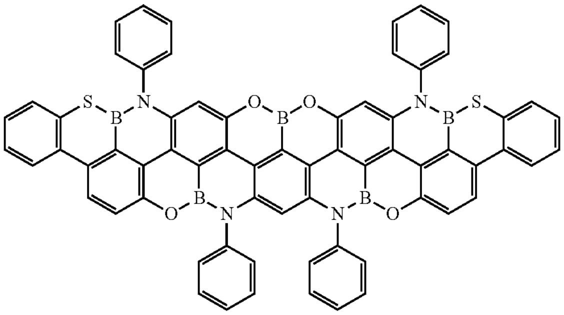
D-9
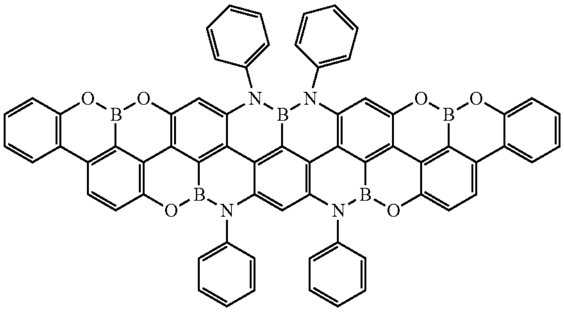
D-10
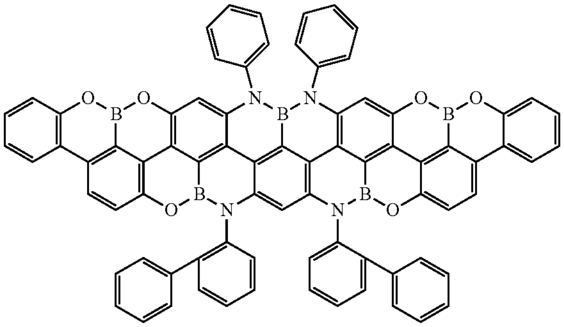
D-11
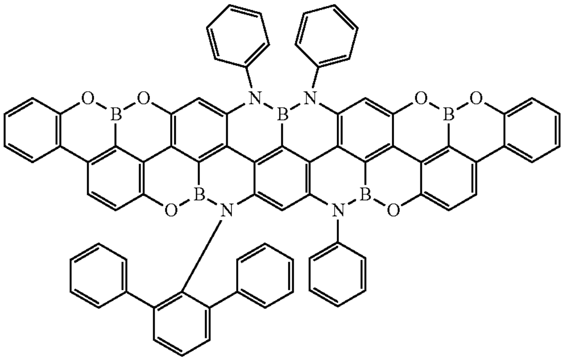
D-12
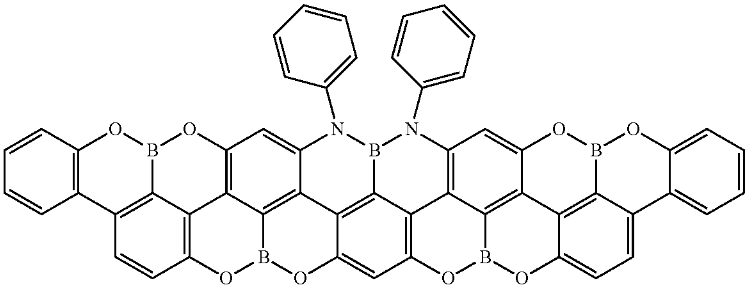
E-1
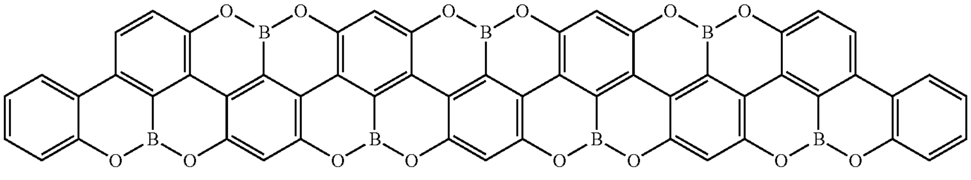
E-2
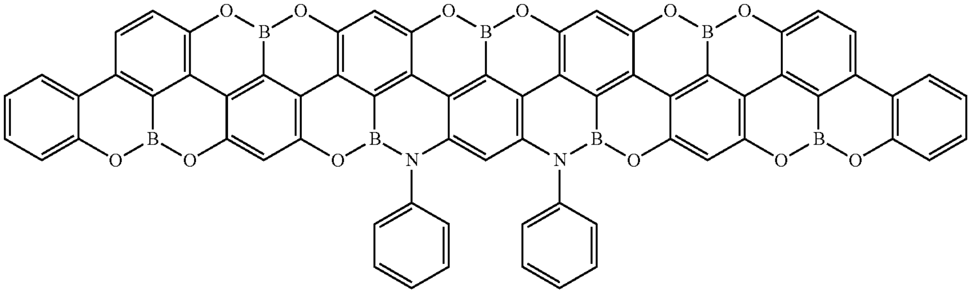

-continued

E-3

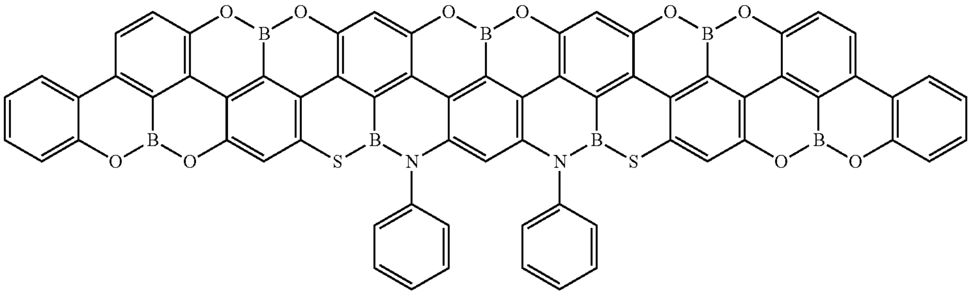

E-4

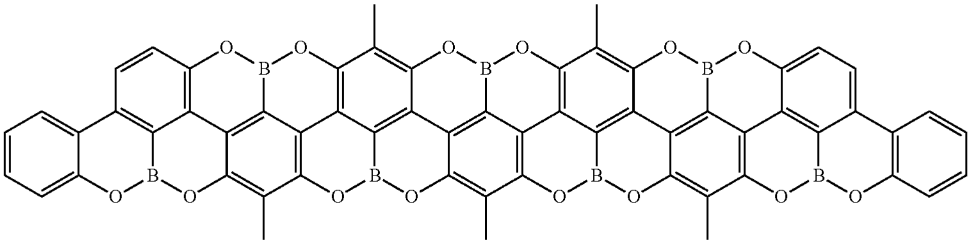

E-5

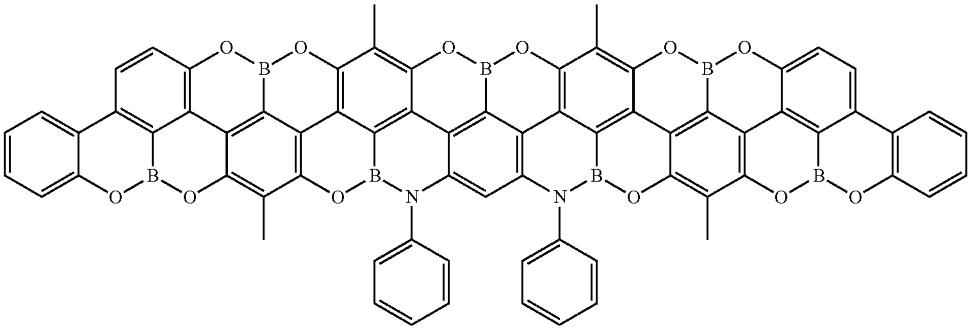

E-6

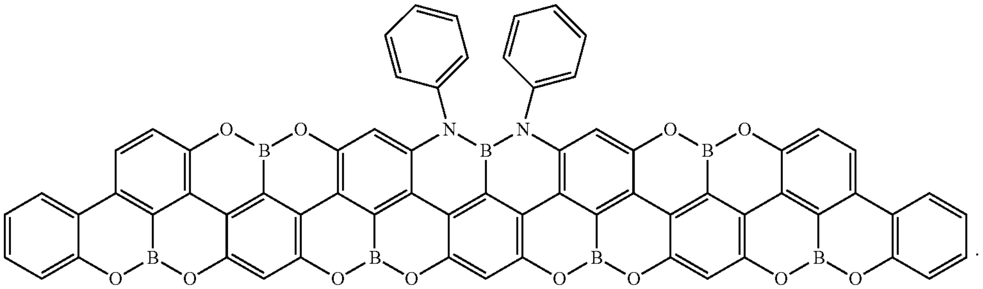

13. A light emitting diode, comprising:

a first electrode;

a second electrode disposed on the first electrode; and at least one functional layer disposed between the first electrode and the second electrode, wherein the first electrode and the second electrode each independently comprises at least one selected from Ag, Mg, Cu, Al, Pt, Pd, Au, Ni, Nd, Ir, Cr, Li, Ca, LiF, Mo, Ti, W, In, Sn, Zn, oxides thereof, compounds thereof, and mixtures thereof, and the at least one functional layer comprises a polycyclic compound represented by Formula A or Formula B:

[Formula A]

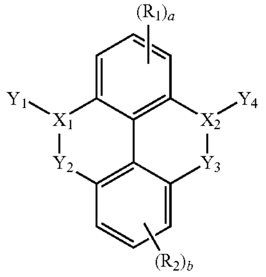

-continued

[Formula B]

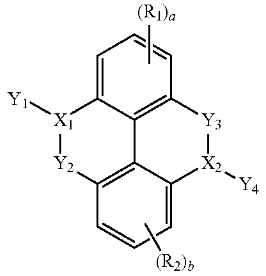

wherein in Formula A and Formula B, $X_1$ and $X_2$ are each independently B, Al, or Ga, $Y_1$, $Y_2$, $Y_3$, and $Y_4$ are each independently $O(R_{1a})_{m1}$, $N(R_{1b})_{m2}$, $P(R_{1c})_{m3}$, $P(=O)(R_{1d})_{m4}$, $P(=S)(R_{1e})_{m5}$, $S(R_{1f})_{m6}$, $Si(R_{1g})_{m7}$, $Al(R_{1h})_{m8}$, $Ga(R_{1i})_{m9}$, $As(R_{1j})_{m10}$, $Ge(R_{1k})_{m11}$, or $C(R_{1l})_{m12}$, $R_1$, $R_2$, and $R_{1a}$ to $R_{1l}$ are each independently a hydrogen atom, a deuterium atom, a halogen atom, a cyano group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, a and b are each independently an integer from 0 to 3, m1 and m6 are each independently 0 or 1, m2, m3, m4, m5, m8, m9, and m10 are each independently an integer from 0 to 2, and m7, m11, and m12 are each independently an integer from 0 to 3.

14. The light emitting diode of claim 13, wherein the polycyclic compound represented by Formula A is represented by Formula A-1, and the polycyclic compound represented by Formula B is represented by Formula B-1:

[Formula A-1]

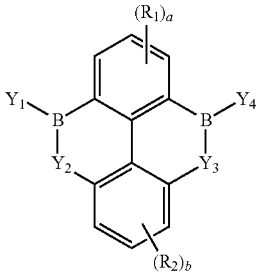

-continued

[Formula B-1]

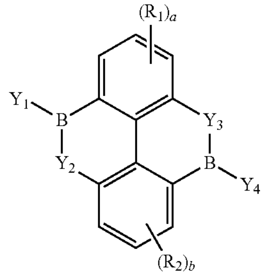

wherein in Formula A-1 and Formula B-1, $Y_1$ to $Y_4$, $R_1$, $R_2$, a, and b are the same as defined in Formula A and Formula B.

15. The light emitting diode of claim 13, wherein the polycyclic compound represented by Formula A is represented by Formula A-2, and the polycyclic compound represented by Formula B is represented by Formula B-2:

[Formula A-2]

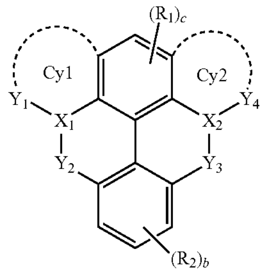

[Formula B-2]

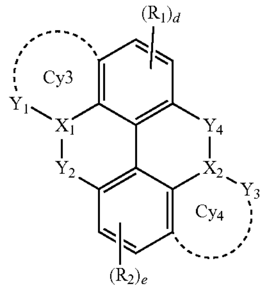

wherein in Formula A-2 and Formula B-2, $Cy_1$, $Cy_2$, $Cy_3$, and $Cy_4$ are each independently a substituted or unsubstituted aromatic hydrocarbon ring, c is 0 or 1, d and e are each independently an integer from 0 to 2, and $X_1$, $X_2$, $Y_1$ to $Y_4$, $R_1$, $R_2$, and b are the same as defined in Formula A and Formula B.

16. The light emitting diode of claim 13, wherein the polycyclic compound represented by Formula A or Formula B is represented by one of Formula C-1 to Formula C-6:

[Formula C-1]

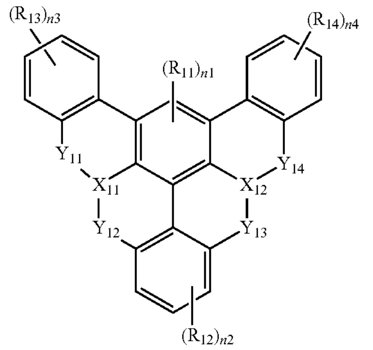

[Formula C-2]

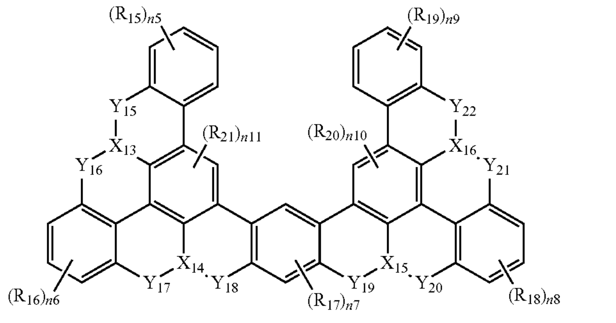

[Formula C-3]

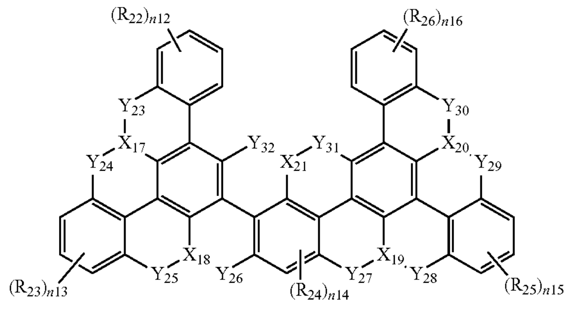

[Formula C-4]

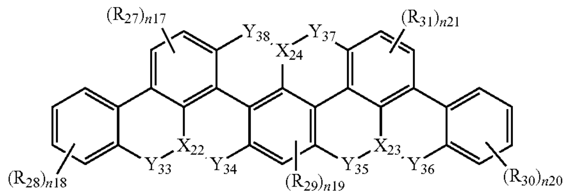

[Formula C-5]

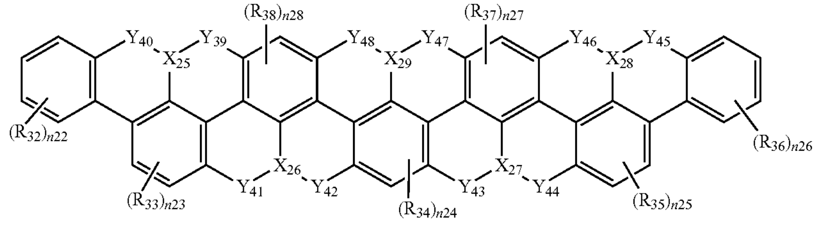

[Formula C-6]

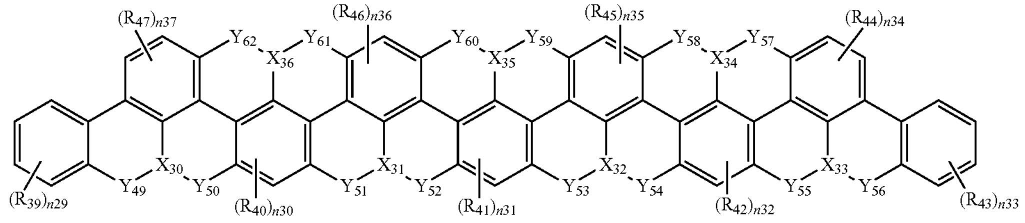

wherein in Formula C-1 to Formula C-6, $X_{11}$ to $X_{36}$ are each independently B, Al, or Ga, $Y_{11}$ to $Y_{62}$ are each independently $O(R_{1a})_{m1}$, $N(R_{1b})_{m2}$, $P(R_{1c})_{m3}$, $P(=O)(R_{1d})_{m4}$, $P(=S)(R_{1e})_{m5}$, $S(R_{1f})_{m6}$, $Si(R_{1g})_{m7}$, $Al(R_{1h})_{m8}$, $Ga(R_{1})_{m9}$, $As(R_{1j})_{m10}$, $Ge(R_{1k})_{m11}$, or $C(R_{1l})_{m12}$, $R_{11}$ to $R_{47}$, and $R_{1a}$ to $R_{1l}$ are each independently a hydrogen atom, a deuterium atom, a halogen atom, a cyano group, a substituted or unsubstituted boron group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, n1, n10, n11, n14, n19, n24, n27, n28, n30, n31, n32, n35, and n36 are each independently 0 or 1, n7, n17, n21, n23, n25, n34, and n37 are each independently an integer from 0 to 2, n2, n6, and n8 are each independently an integer from 0 to 3, n3, n4, n5, n9, n12, n13, n15, n16, n18, n20, n22, n26, n29, and n33 are each independently an integer from 0 to 4, m1 and m6 are each independently 0 or 1, m2, m3, m4, m5, m8, m9, and m10 are each independently an integer from 0 to 2, and m7, m11, and m12 are each independently an integer from 0 to 3.

17. The light emitting diode of claim 16, wherein the polycyclic compound represented by one of Formula C-1 to Formula C-6 is represented by one of Formula D-1 to Formula D-6:

[Formula D-1]
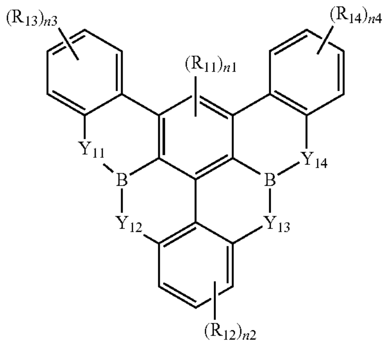
[Formula D-2]
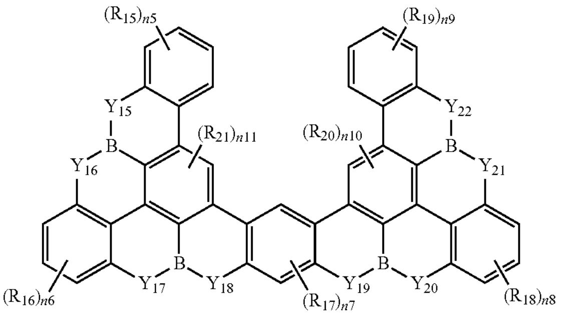
[Formula D-3]
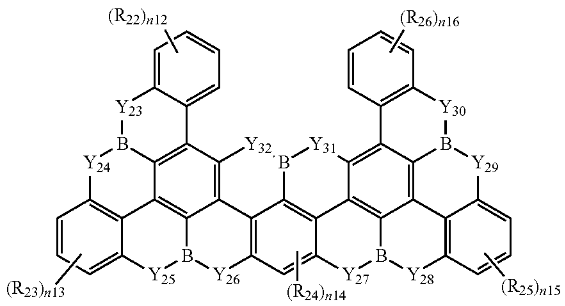
[Formula D-4]
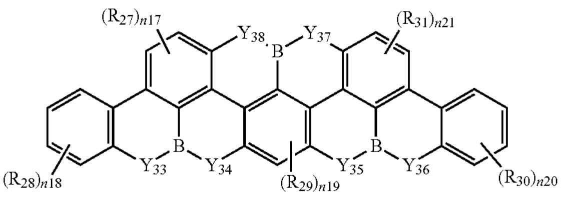
[Formula D-5]
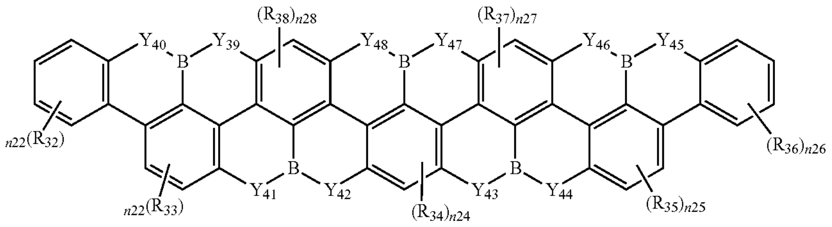
[Formula D-6]
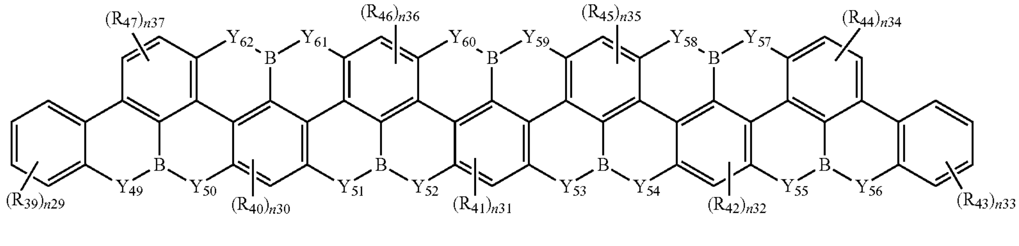
wherein in Formula D-1 to Formula D-6,
$Y_{11}$ to $Y_{62}$, $R_{11}$ to $R_{47}$, and n1 to n37 are the same as defined in Formula C-1 to Formula C-6.
18. The light emitting diode of claim 16, wherein $Y_{11}$ to $Y_{62}$ are each independently $O(R_{1a})_{m1}$, $N(R_{1b})_{m2}$, $S(R_{1f})_{m6}$, or $C(R_{1l})_{m12}$.

19. The light emitting diode of claim 13, wherein the polycyclic compound represented by Formula A or Formula B comprises one selected from Compound Group 1:
[Compound Group 1]
A-1
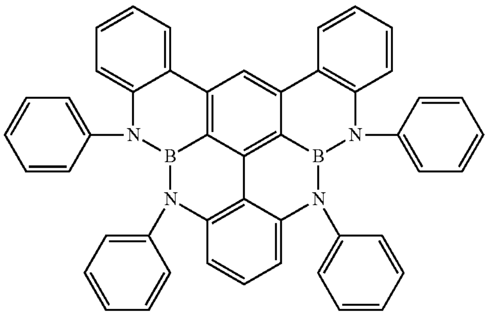
A-2
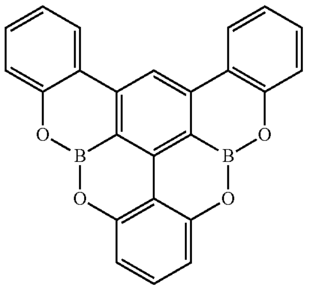
A-3
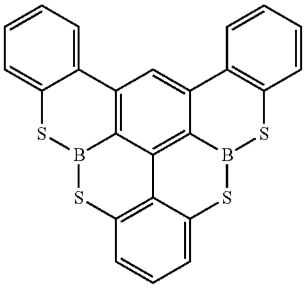
A-4
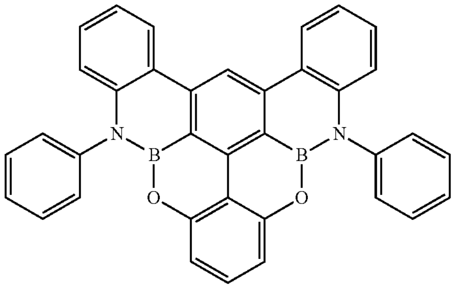
A-5
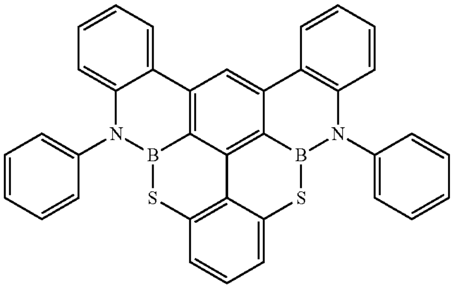
A-6
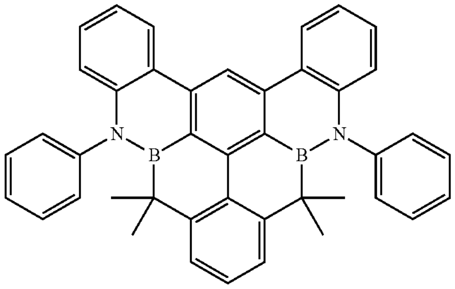
A-7
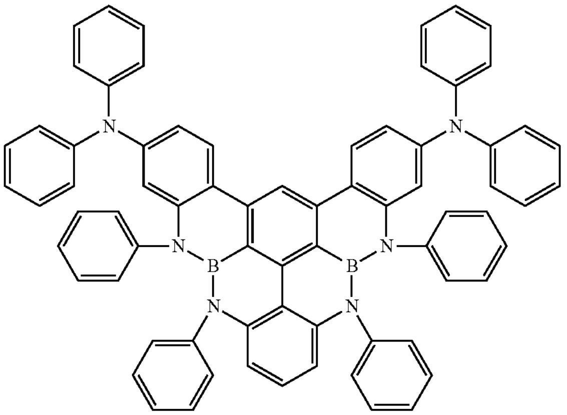
A-8
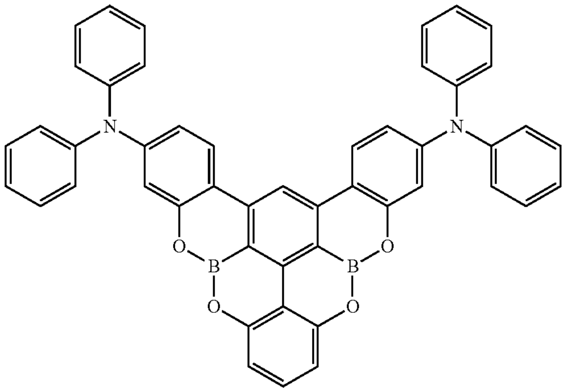

-continued
A-9
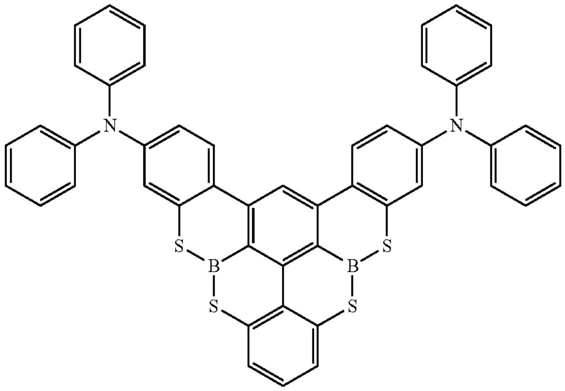
A-10
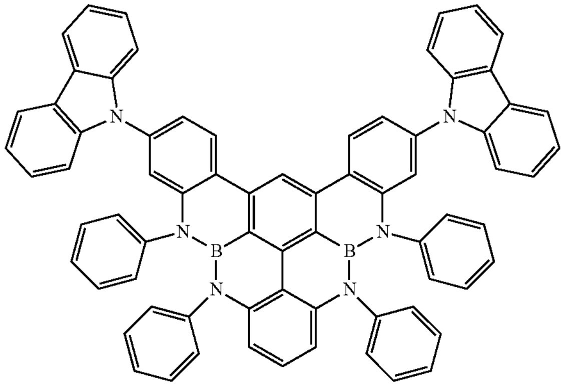
A-11
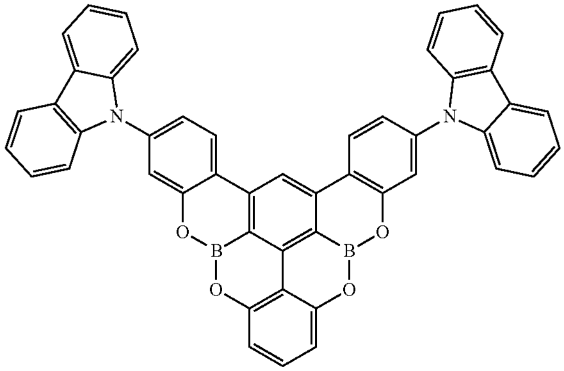
A-12
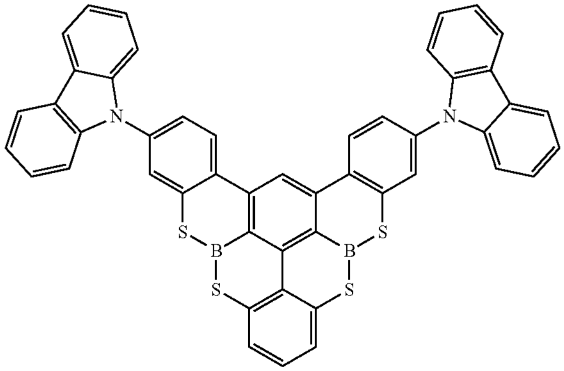
A-13
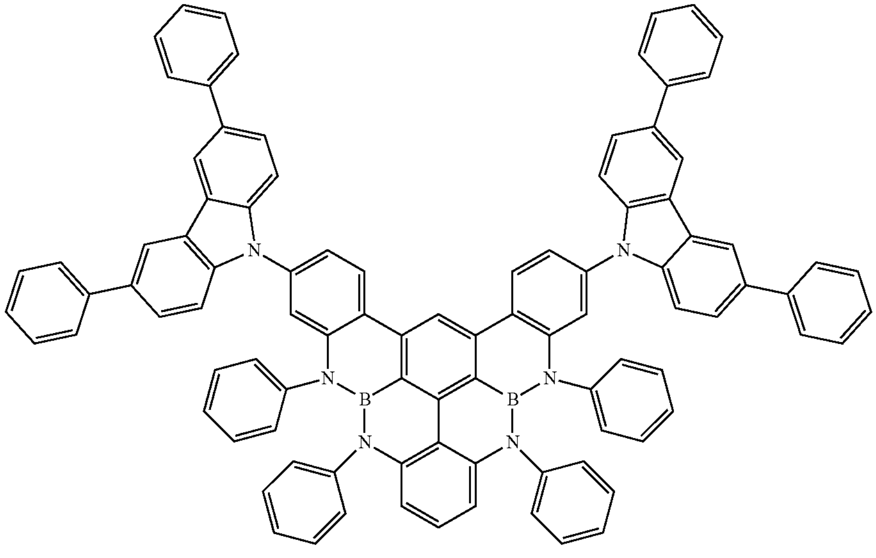

-continued
A-14
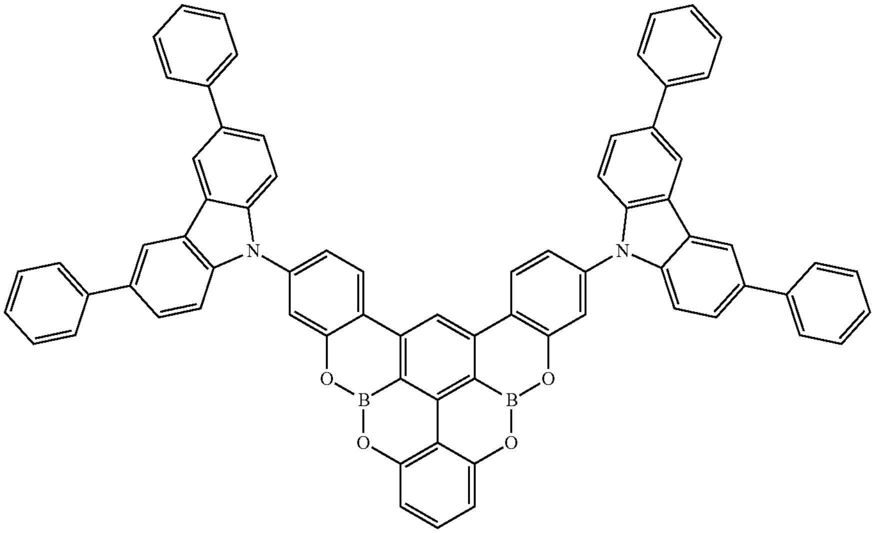
A-15
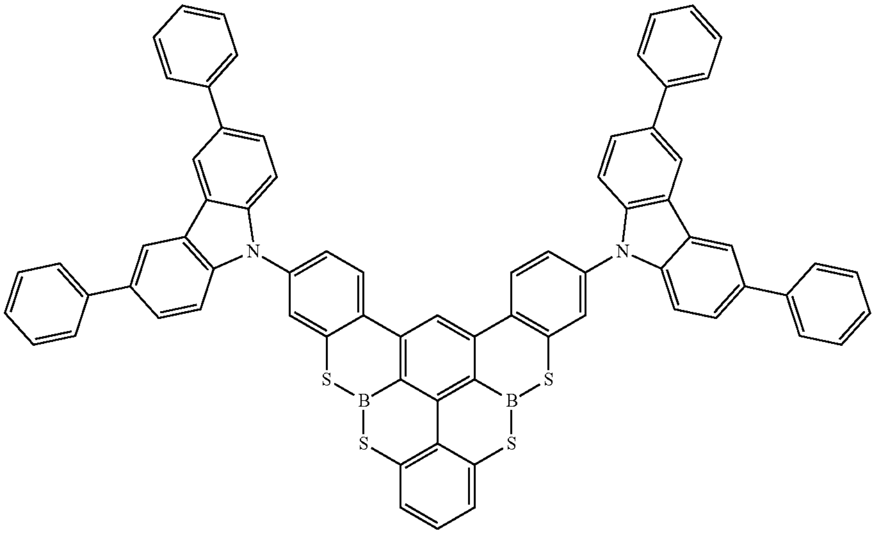
A-16
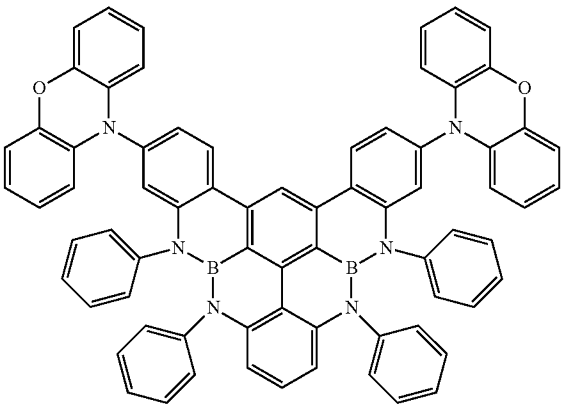
A-17
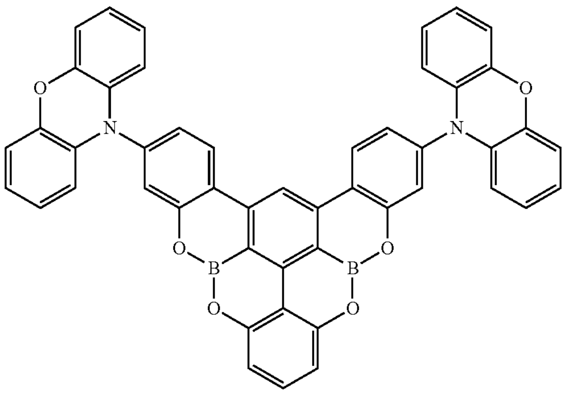

-continued
A-18
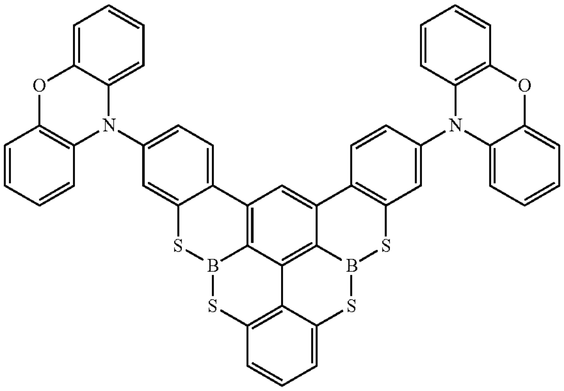
A-19
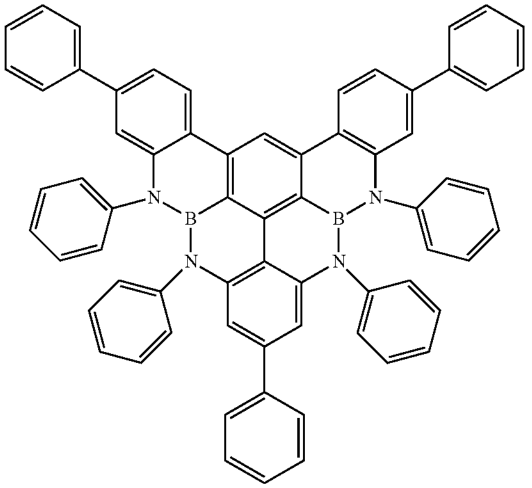
A-20
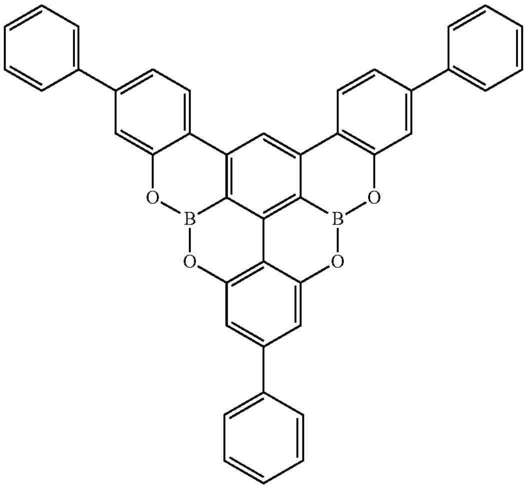
A-21
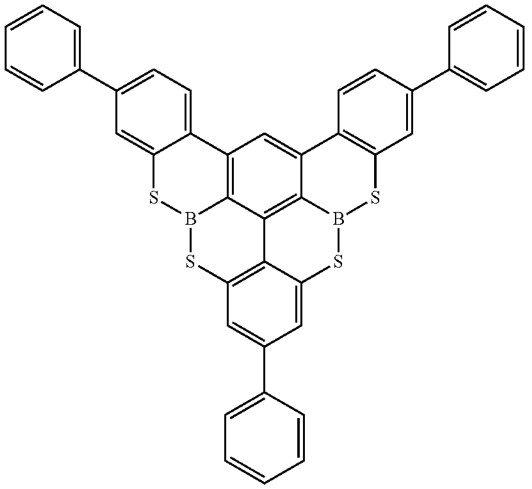
A-22
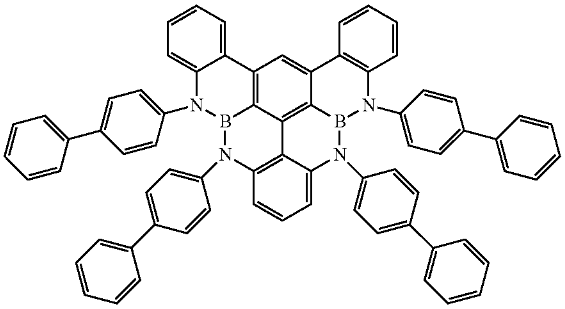
A-23
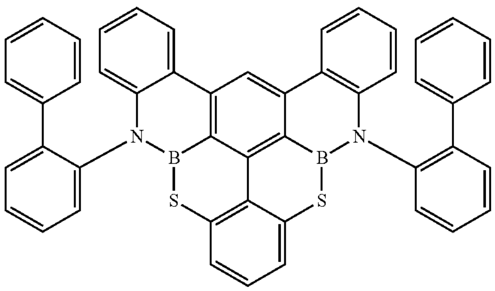

-continued
A-24
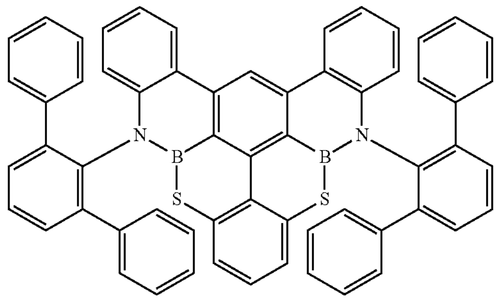
A-25
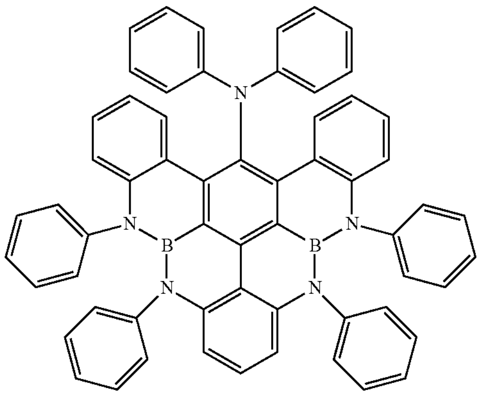
A-26
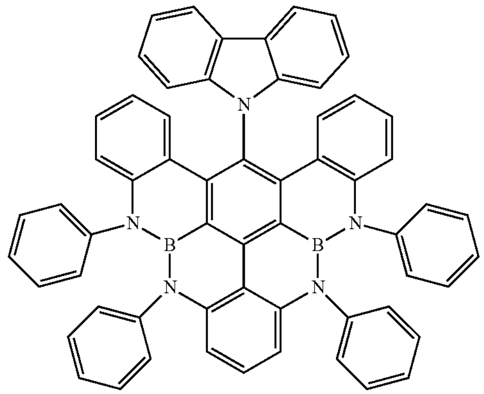
A-27
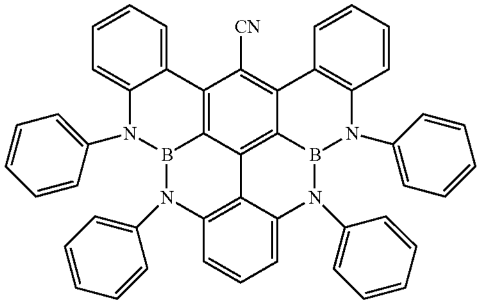
B-1
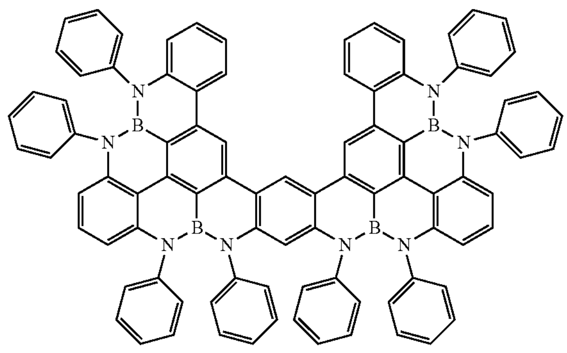
B-2
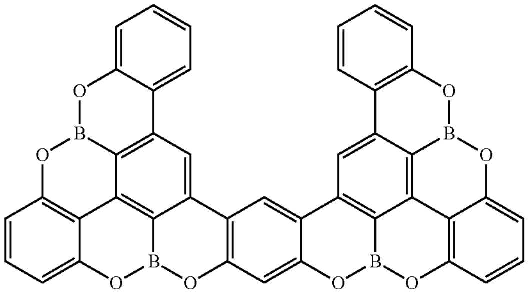
B-3
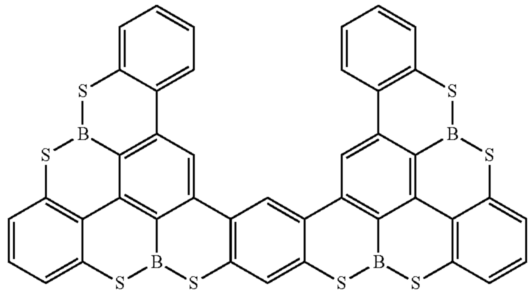
B-4
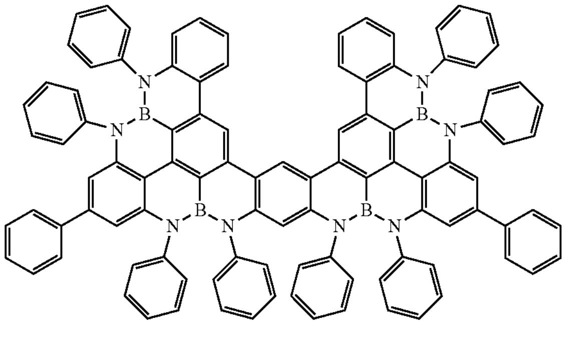

-continued
B-5
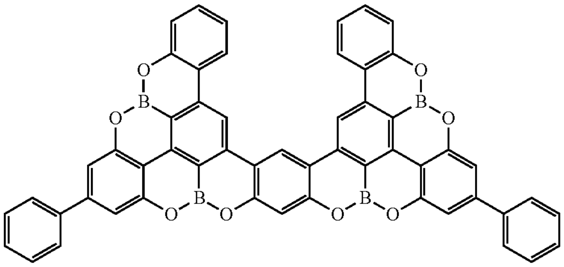
B-6
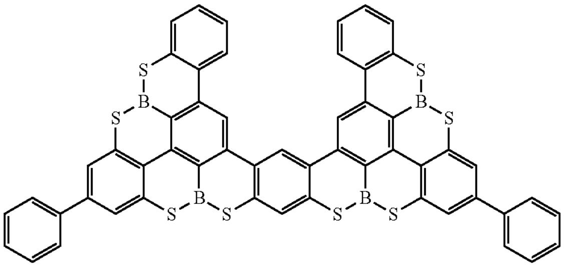
B-7
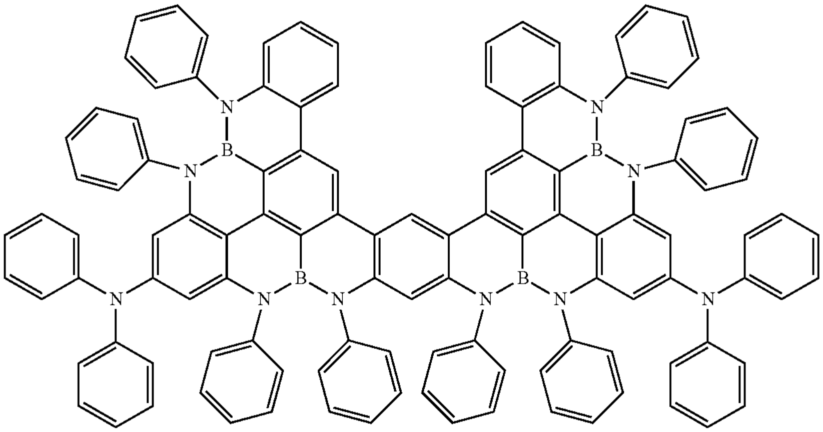
B-8
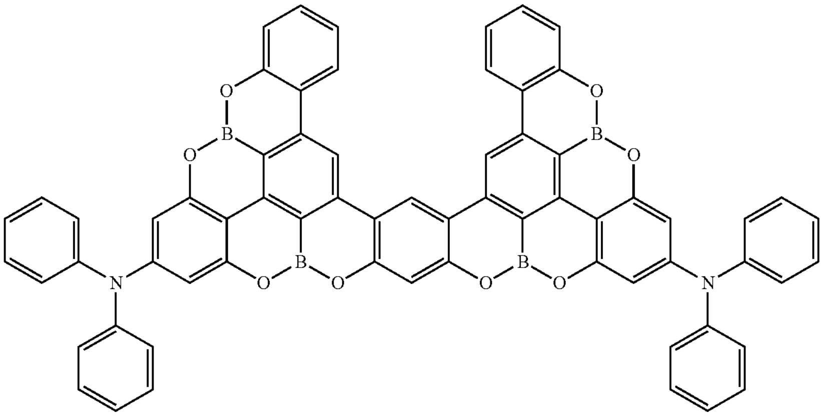
B-9
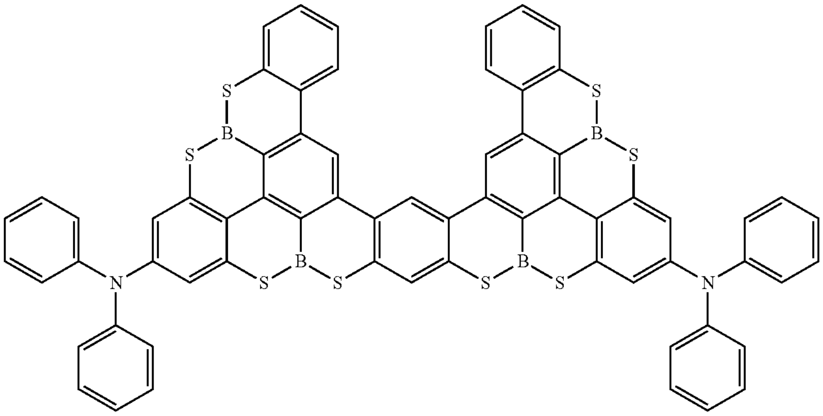

-continued
B-10
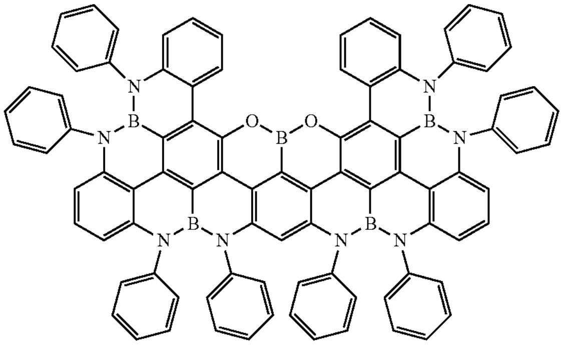
B-11
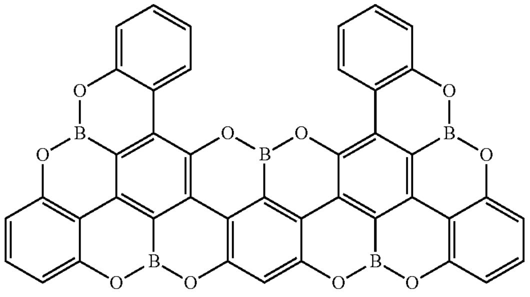
B-12
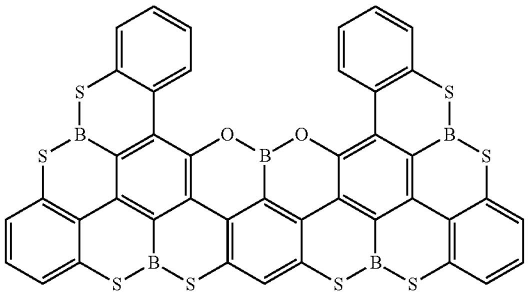
B-13
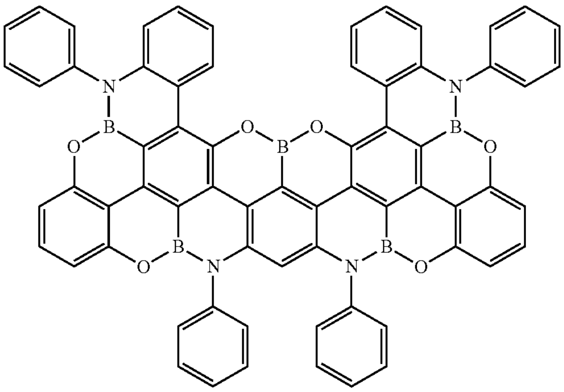
B-14
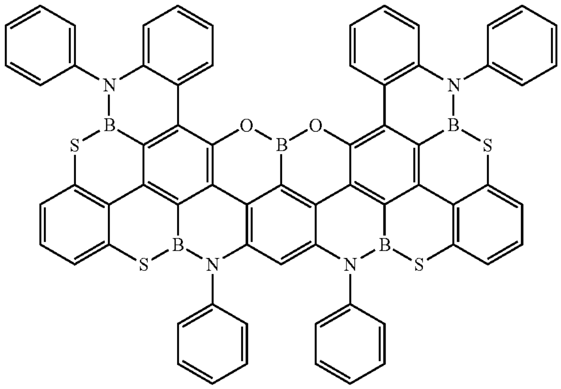
B-15
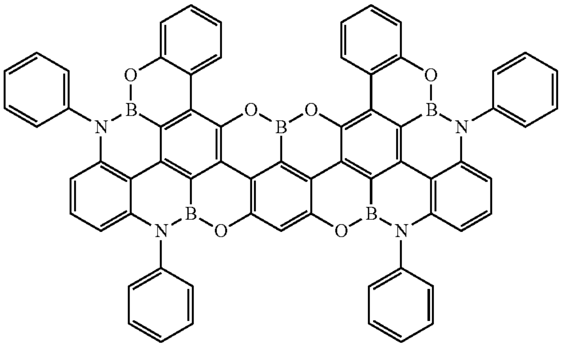
B-16
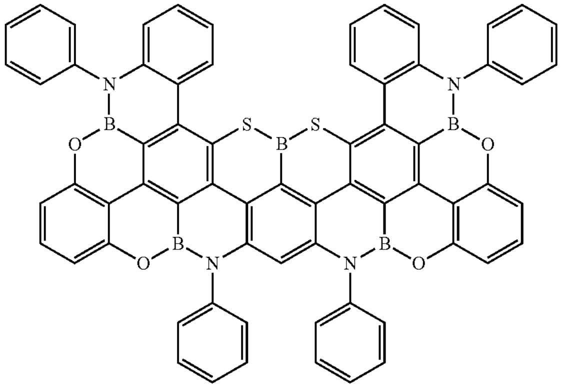
B-17
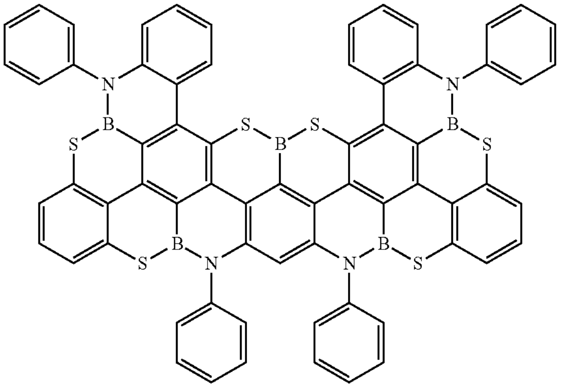

-continued
B-18
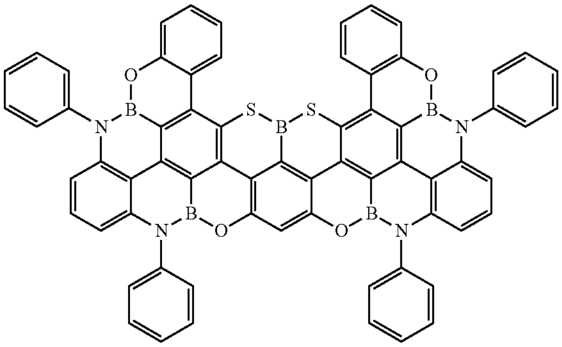
B-19
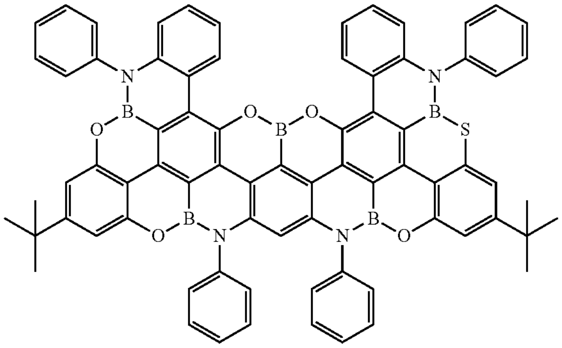
B-20
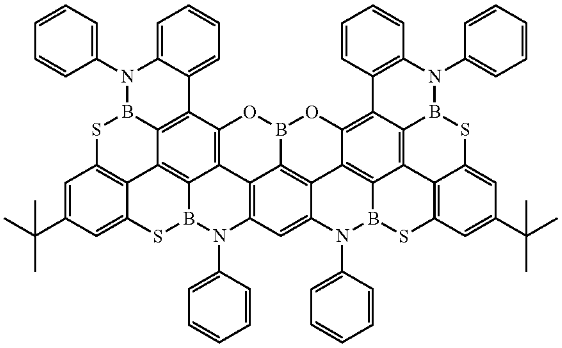
B-21
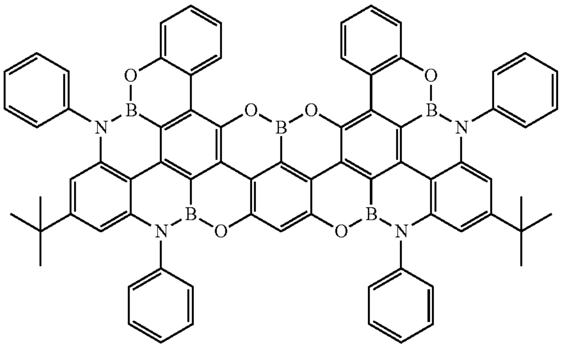
B-22
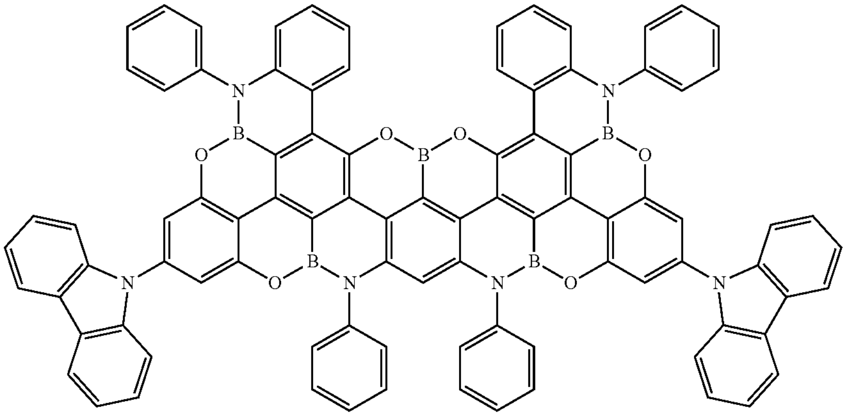
B-23
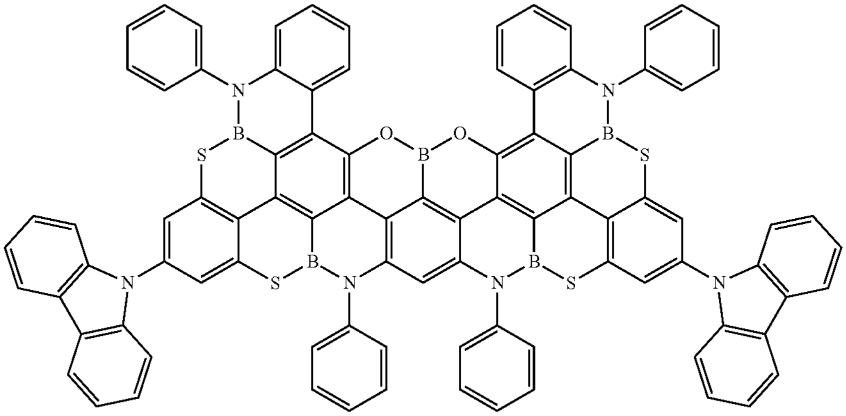

-continued
B-24
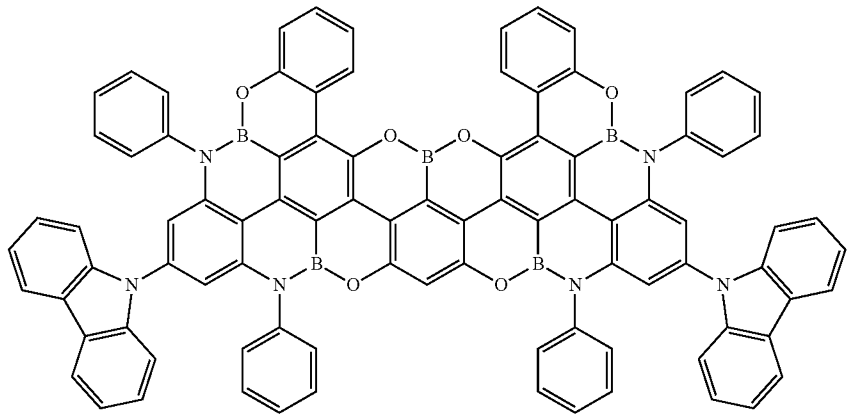
B-25
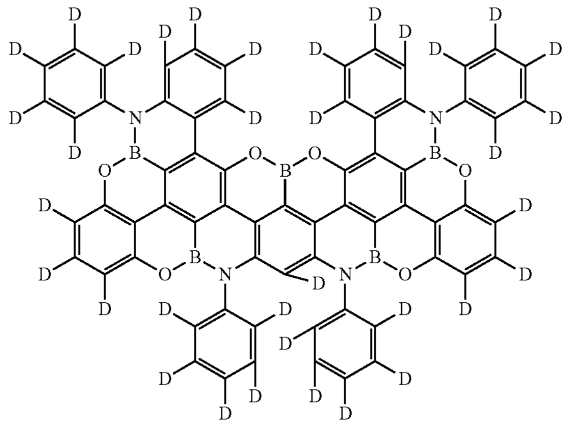
C-1
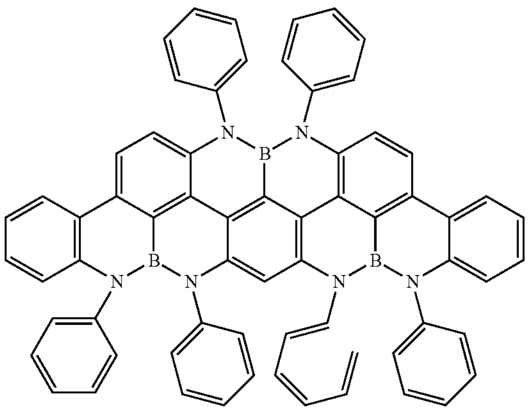
C-2
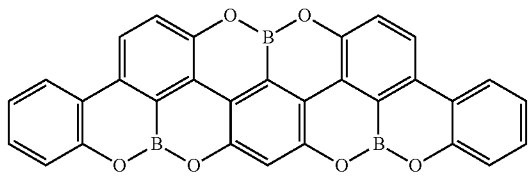
C-3
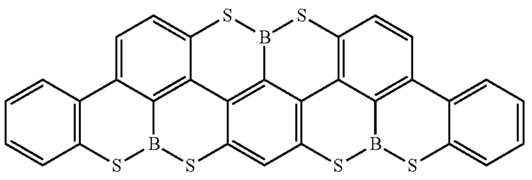
C-4
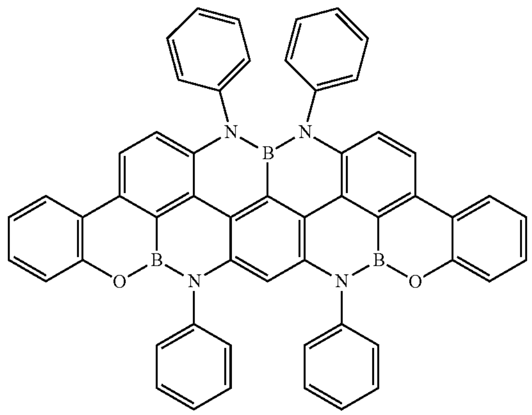
C-5
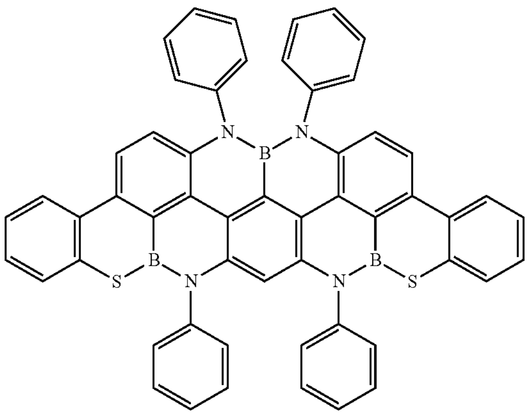

-continued
C-6
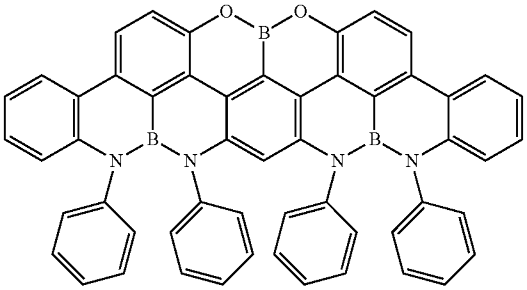
C-7
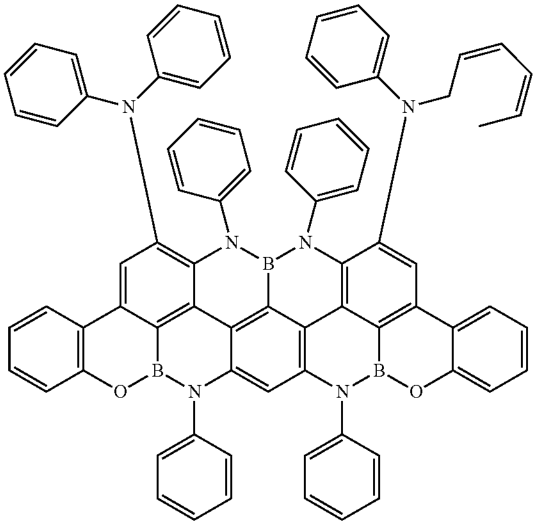
C-8
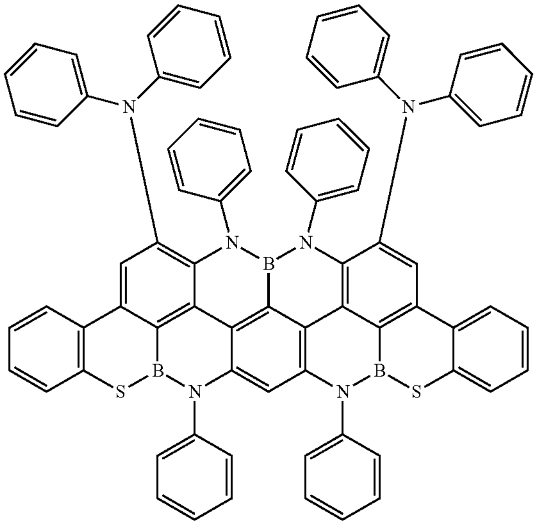
C-9
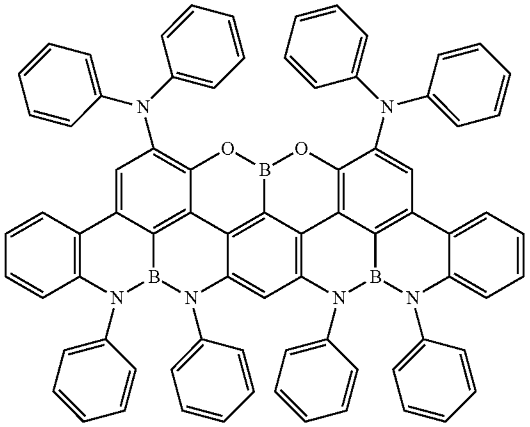
C-10
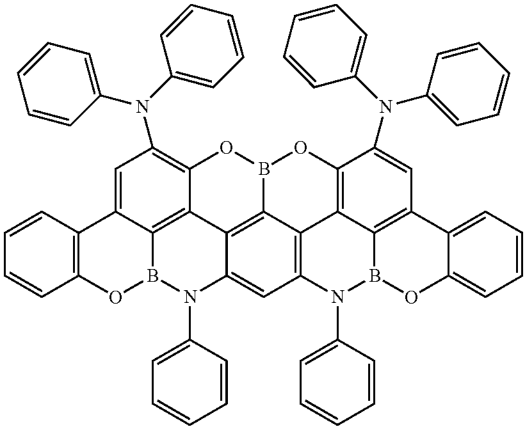
C-11
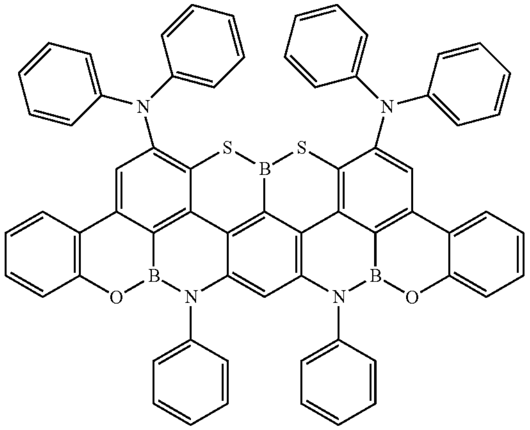

-continued
C-12
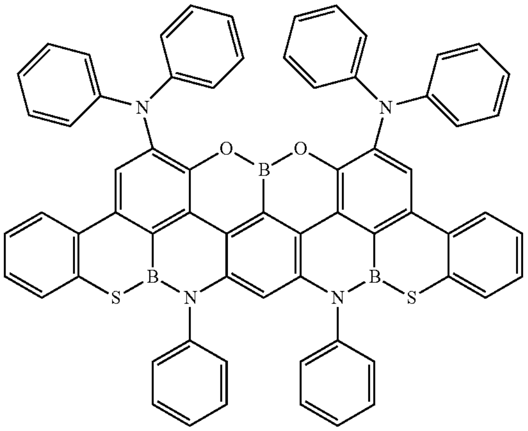
C-13
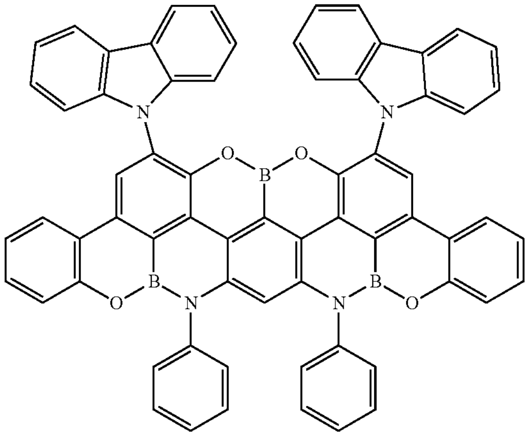
C-14
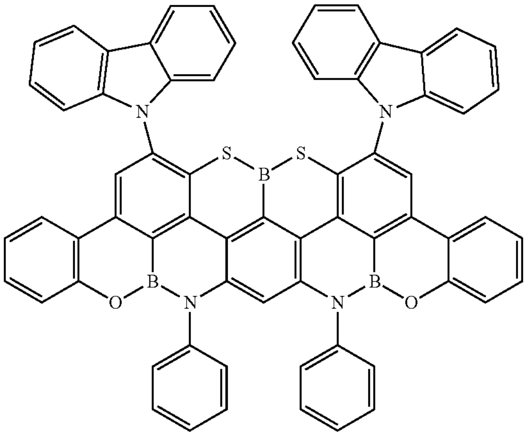
C-15
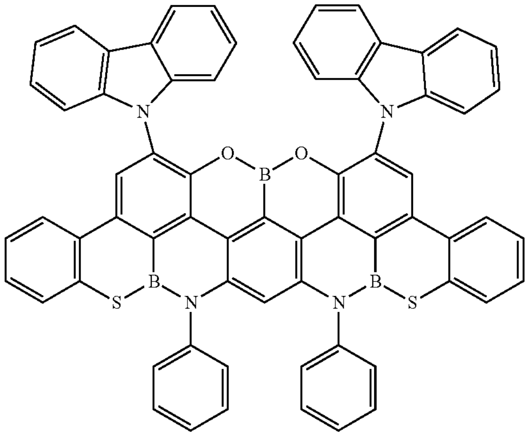
C-16
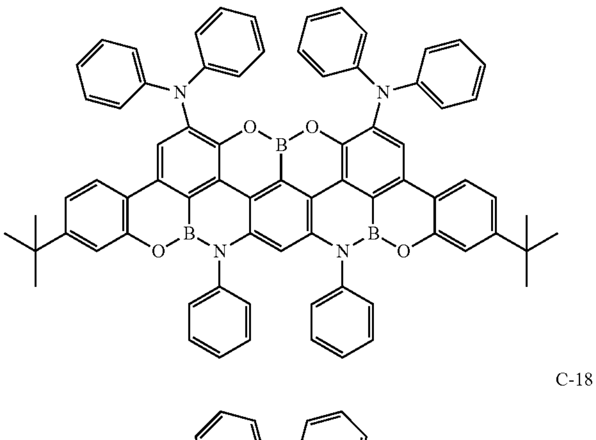
C-17
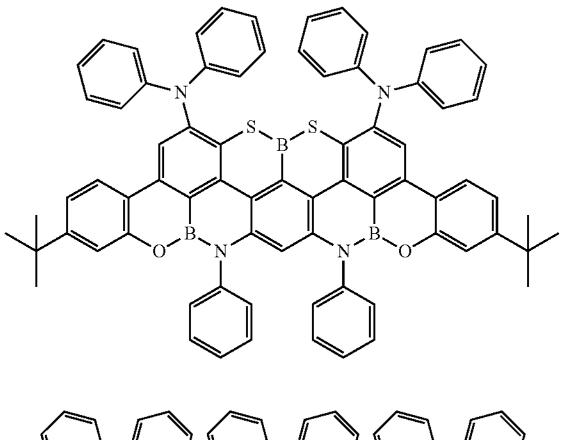
C-18
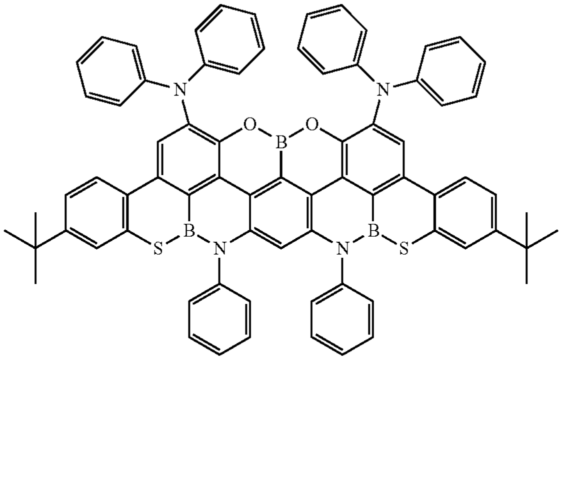
D-1
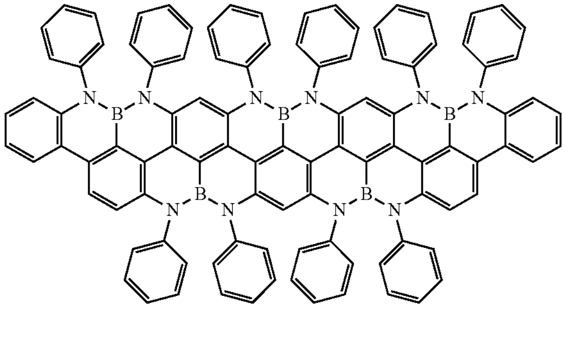

-continued
D-2
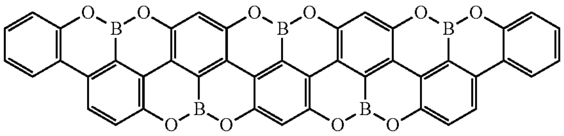
D-3
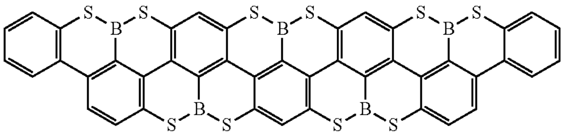
D-4
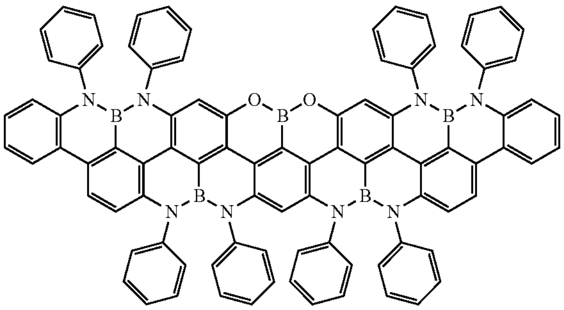
D-5
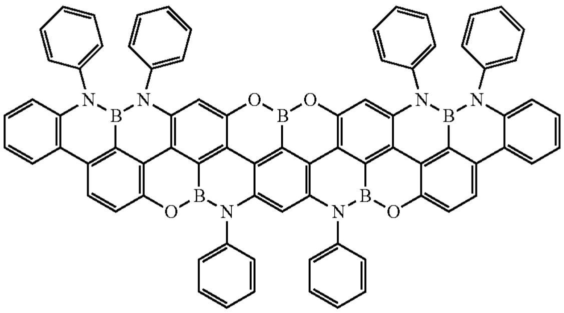
D-6
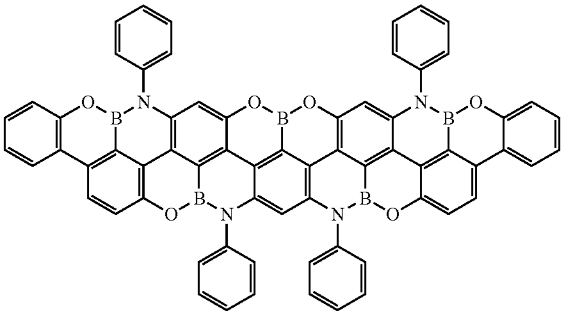
D-7
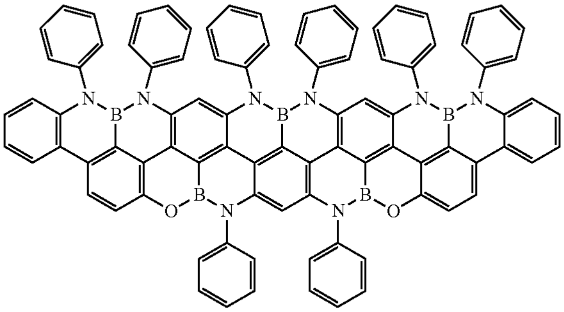
D-8
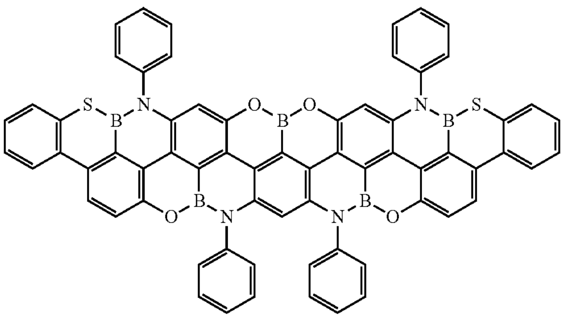
D-9
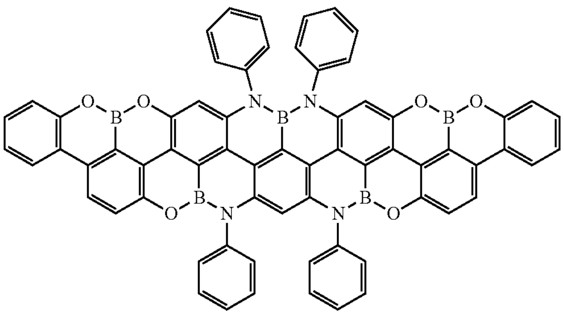
D-10
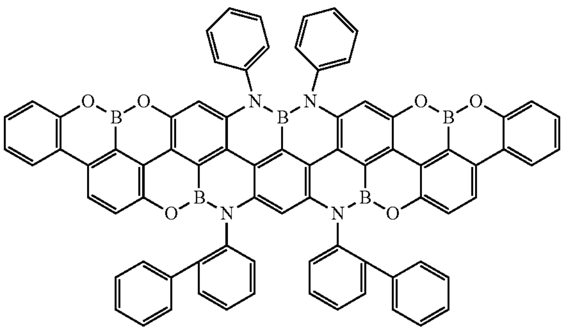
D-11
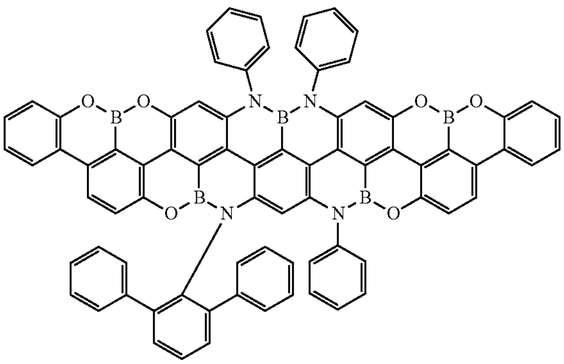

-continued
D-12
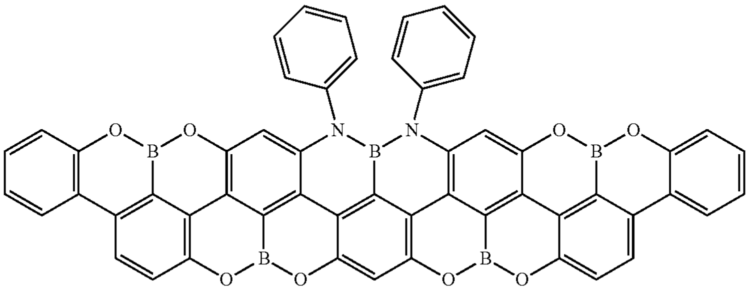
E-1
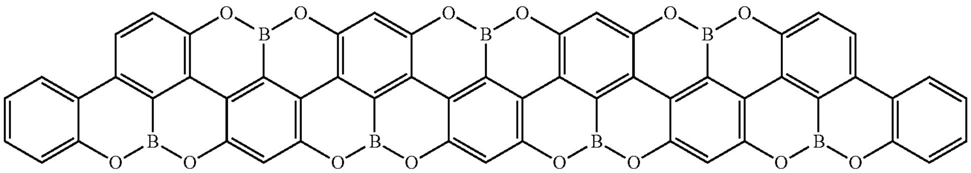
E-2
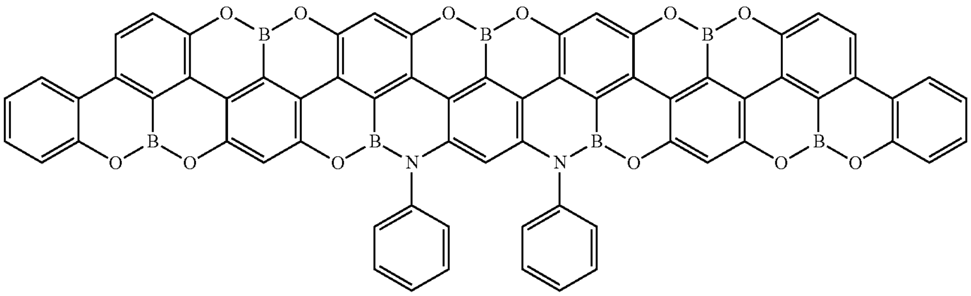
E-3
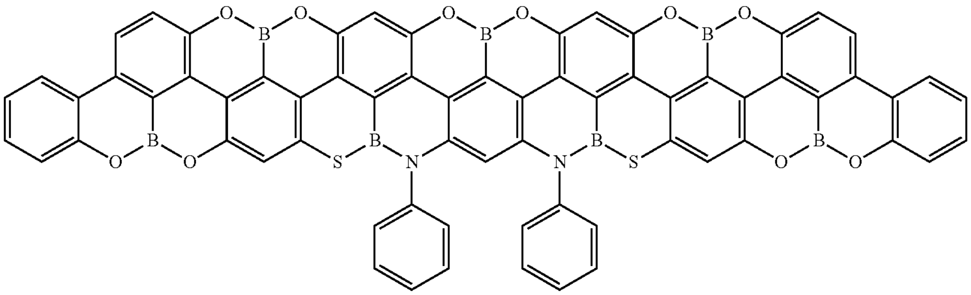
E-4
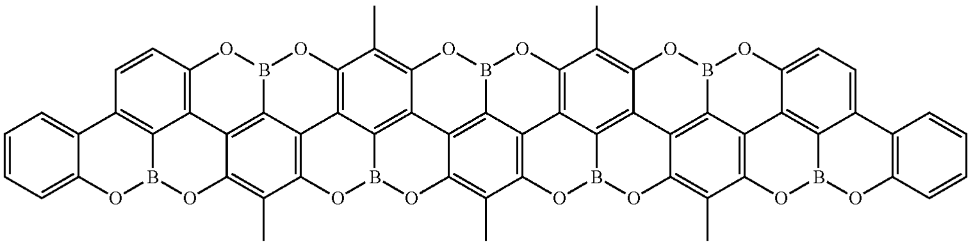

-continued
E-5
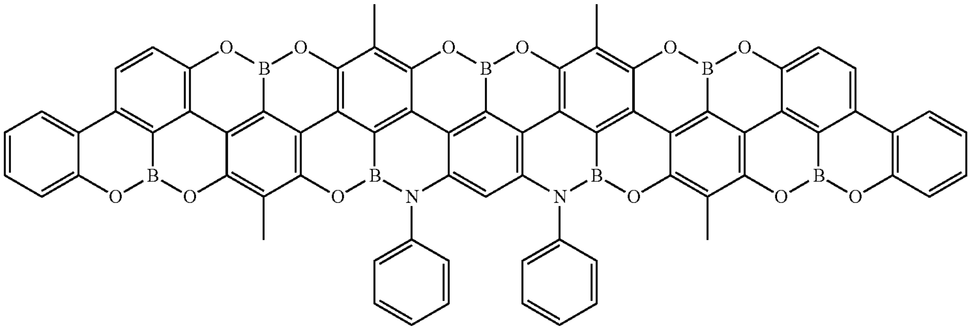
E-6
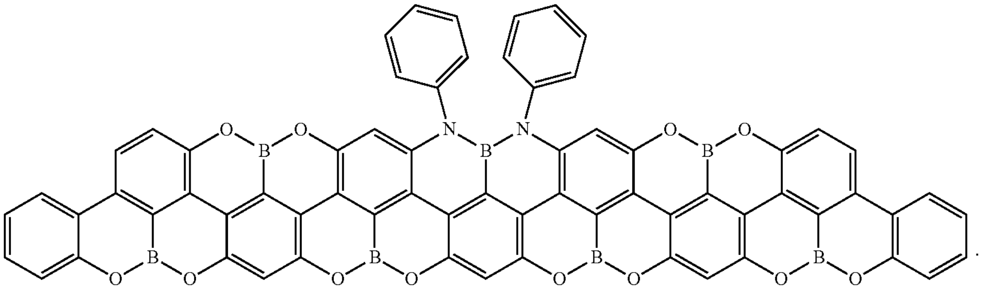
.
* * * * *